US010797249B2

(12) United States Patent
Lee et al.

(10) Patent No.: US 10,797,249 B2
(45) Date of Patent: Oct. 6, 2020

(54) ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

(71) Applicant: Samsung Electronics Co., Ltd., Suwon-si, Gyeonggi-do (KR)

(72) Inventors: Jiyoun Lee, Anyang-si (KR); Soyeon Kim, Seoul (KR); Bumwoo Park, Hwaseong-si (KR); Sunghun Lee, Hwaseong-si (KR); Seokhwan Hong, Seoul (KR); Yoonhyun Kwak, Seoul (KR); Ohyun Kwon, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 333 days.

(21) Appl. No.: 15/973,594

(22) Filed: May 8, 2018

(65) Prior Publication Data

US 2018/0342686 A1 Nov. 29, 2018

(30) Foreign Application Priority Data

May 23, 2017 (KR) ........................ 10-2017-0063624

(51) Int. Cl.

| | |
|---|---|
| ***H01L 51/00*** | (2006.01) |
| ***C07F 15/00*** | (2006.01) |
| ***C09K 11/06*** | (2006.01) |
| *H01L 51/50* | (2006.01) |

(52) U.S. Cl.

CPC ...... *H01L 51/0087* (2013.01); *C07F 15/0086* (2013.01); *C09K 11/06* (2013.01); *C09K 2211/1029* (2013.01); *C09K 2211/1044* (2013.01); *C09K 2211/185* (2013.01); *H01L 51/0081* (2013.01); *H01L 51/5016* (2013.01); *H01L 51/5024* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 2251/308* (2013.01)

(58) Field of Classification Search

CPC ............. H01L 51/0087; H01L 51/5016; H01L 51/0081; H01L 51/5024; H01L 51/5088; H01L 51/5096; H01L 51/5072; H01L 51/5092; H01L 51/5056; H01L 2251/308; C07F 15/0086; C09K 11/06; C09K 2211/1044; C09K 2211/185; C09K 2211/1029

See application file for complete search history.

(56) References Cited

U.S. PATENT DOCUMENTS

| | | | | |
|---|---|---|---|---|
| 9,085,579 | B2 | 7/2015 | Stoessel et al. | |
| 2006/0202197 | A1 | 9/2006 | Nakayama et al. | |
| 2011/0315933 | A1* | 12/2011 | Stoessel | C07D 471/16 252/500 |
| 2013/0172561 | A1* | 7/2013 | Tsai | C07F 15/0086 546/4 |
| 2014/0135498 | A1 | 5/2014 | Fukuzaki | |
| 2016/0268519 | A1 | 9/2016 | Choi et al. | |
| 2016/0285014 | A1* | 9/2016 | Kottas | H01L 51/0054 |
| 2017/0305881 | A1* | 10/2017 | Li | H01L 51/50 |

FOREIGN PATENT DOCUMENTS

| | | | |
|---|---|---|---|
| JP | 2005-053502 | A | 3/2005 |
| JP | 2006-232784 | A | 9/2006 |
| JP | 2009-223455 | A | 10/2009 |
| JP | 2010-185068 | A | 8/2010 |
| KR | 10-2011-0128343 | A | 11/2011 |
| KR | 10-2016-0109909 | A | 9/2016 |

OTHER PUBLICATIONS

Johnson, K.R.D., et al.; Organometallics, 2014, vol. 33, p. 3005-3011.*

Arnold, L., et al.; Chemical Communications, 2011, vol. 47, p. 970-972.*

* cited by examiner

*Primary Examiner* — Robert S Jones

(74) *Attorney, Agent, or Firm* — Cantor Colburn LLP

(57) ABSTRACT

An organometallic compound represented by Formula 1:

Formula 1

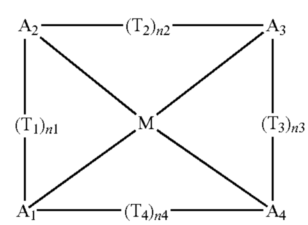

wherein in Formula 1, groups and variables are the same as described in the specification.

20 Claims, 1 Drawing Sheet

ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

CROSS-REFERENCE TO RELATED APPLICATION

This application claims priority to Korean Patent Application No. 10-2017-0063624, filed on May 23, 2017, in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have superior characteristics in terms of a viewing angle, a response time, a brightness, a driving voltage, and a response speed, and which produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

Aspects of the present disclosure provide an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

An aspect of the present disclosure provides an organometallic compound represented by Formula 1 below:

Formula 1

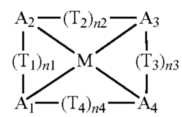

Formula A1-1

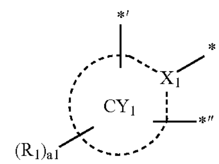

Formula A1-2

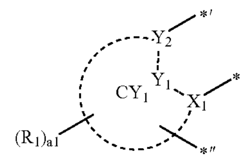

Formula A1-3

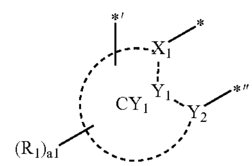

Formula A2-1

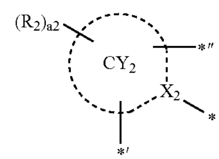

Formula A2-2

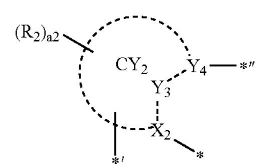

Formula A2-3

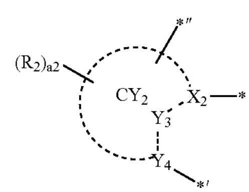

Formula A3-1

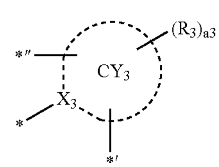

Formula A3-2

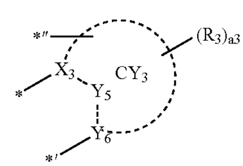

-continued

Formula A3-3

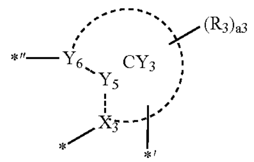

Formula A4

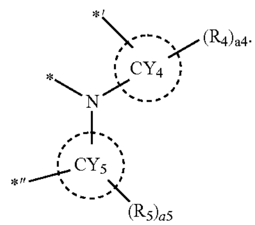

In Formula 1, M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), in Formula 1, a bond between $A_4$ and M may be a covalent bond, two bonds selected from a bond between $A_1$ and M, a bond between $A_2$ and M, and a bond between $A_3$ and M may each be a coordinate bond, and the other thereof may be a covalent bond, $A_1$ in Formula 1 may be ring $CY_1$ represented by one of Formulae A1-1 to A1-3,

* in Formulae A1-1 to A1-3 indicates a binding site to M in Formula 1, and when n1 is 1, *' indicates a binding site to $T_1$ in Formula 1, when n1 is 0, *' is absent, when n4 is 1, *" indicates a binding site to $T_4$ in Formula 1, and when n4 is 0, *" is absent, $A_2$ in Formula 1 may be ring $CY_2$ represented by one of Formulae A2-1 to A2-3,

* in Formulae A2-1 to A2-3 indicates a binding site to M in Formula 1, and when n1 is 1, *' indicates a binding site to $T_1$ in Formula 1, when n1 is 0, *' is absent, when n2 is 1, *" indicates a binding site to $T_2$ in Formula 1, and when n2 is 0, *" is absent, $A_3$ in Formula 1 may be ring $CY_3$ represented by one of Formulae A3-1 to A3-3,

* in Formulae A3-1 to A3-3 indicates a binding site to M in Formula 1, and when n2 is 1, *" indicates a binding site to $T_2$ in Formula 1, when n2 is 0, *" is absent, when n3 is 1, *' indicates a binding site to $T_3$ in Formula 1, and when n3 is 0, *' is absent, $A_4$ in Formula 1 may be ring $CY_4$ represented by Formula A4,

* in Formula A4 indicates a binding site to M in Formula 1, and when n3 is 1, *' indicates a binding site to $T_3$ in Formula 1, when n3 is 0, *' is absent, when n4 is 1, *" indicates a binding site to $T_4$ in Formula 1, and when n4 is 0, *" is absent, $X_1$ to $X_3$ and $Y_1$ to $Y_6$ in Formulae A1-1 to A1-3, A2-1 to A2-3, and A3-1 to A3-3 may each independently be C or N, rings $CY_1$ to $CY_5$ in Formula A1-1 to A1-3, A2-1 to A2-3, A3-1 to A3-3, and A4 may each independently be a $C_5$-$C_{30}$ carbocyclic group or a $C_1$-$C_{30}$ heterocyclic group, $T_1$ to $T_4$ in Formula 1 may each independently be selected from a single bond, a double bond, *—N($R_7$)—*', *—B($R_7$)—*', *—P($R_7$)—*', *—C($R_7$)($R_8$)—*', *—Si($R_7$)($R_8$)—*', *—Ge($R_7$)($R_8$)—*', *—S—*', *—Se—*', *—O—*', *—C(═O)—*', *—S(═O)—*', *—S(═O)$_2$—*', *—C($R_7$)═*', *═C($R_7$)—*', *—C($R_7$)═C($R_8$)—*', *—C(═S)—*', and *—C≡C—*', and * and *' each indicate a binding site to a neighboring atom, $R_7$ and $R_8$ may optionally be linked via a single bond, a double bond, or a first linking group to form a substituted or unsubstituted $C_5$-$C_{30}$ carbocyclic group or a substituted or unsubstituted $C_1$-$C_{30}$ heterocyclic group, n1 to n4 may each independently be 0 or 1, wherein, when n1 is 0, $T_1$ is absent and thus $A_1$ and $A_2$ are not linked to each other, when n2 is 0, $T_2$ is absent and thus $A_2$ and $A_3$ are not linked to each other, when n3 is 0, $T_3$ is absent and thus $A_3$ and $A_4$ are not linked to each other, and when n4 is 0, $T_4$ is absent and thus $A_4$ and $A_1$ are not linked to each other, the sum of n1, n2, n3, and n4 is 3, $R_1$ to $R_5$, $R_7$, and $R_8$ may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(═O)($Q_8$)($Q_9$), a1 to a5 in Formulae A1-1 to A1-3, A2-1 to A2-3, A3-1 to A3-3, and A4 may each independently be an integer from 0 to 20, two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_5$ may optionally be linked to form a substituted or unsubstituted $C_5$-$C_{30}$ carbocyclic group or a substituted or unsubstituted $C_1$-$C_{30}$ heterocyclic group, two or more neighboring groups selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group, two or more neighboring groups selected from $R_1$ to $R_3$ and $R_5$ may optionally be linked to form a substituted or unsubstituted $C_5$-$C_{30}$ carbocyclic group or a substituted or unsubstituted $C_1$-$C_{30}$ heterocyclic group, rings $CY_4$ and $CY_5$ are not linked to or condensed with each other, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, and $—P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, and $—P(=O)(Q_{28})(Q_{29})$; and $—N(Q_{31})(Q_{32})$, $—Si(Q_{33})(Q_{34})(Q_{35})$, $—B(Q_{36})(Q_{37})$, and $—P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Another aspect of the present disclosure provides an organic light-emitting device including:

a first electrode, a second electrode, and an organic layer disposed between the first electrode and the second electrode, wherein the organic layer includes an emission layer and at least one of the organometallic compounds.

The organometallic compounds may act as a dopant in the emission layer.

Another aspect of the present disclosure provides a diagnostic composition including at least one organometallic compound represented by Formula 1.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
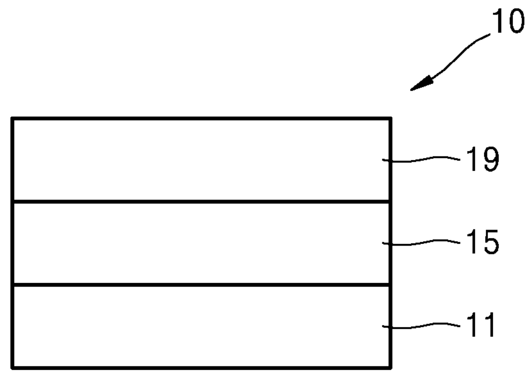
FIG. 1 is a schematic view of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organometallic compound according to an embodiment is represented by Formula 1 below:

Formula 1

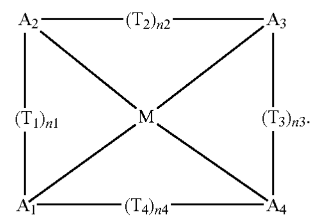

M in Formula 1 may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

For example, M may be Pd or Pt, but embodiments of the present disclosure are not limited thereto.

In Formula 1, a bond between $A_4$ and M may be a covalent bond, two bonds selected from a bond between $A_1$ and M, a bond between $A_2$ and M, and a bond between $A_3$ and M may each be a coordinate bond, and the other thereof may be a covalent bond. Therefore, the organometallic compound represented by Formula 1 may be electrically neutral.

For example, i) a bond between $A_2$ and M may be a covalent bond, and a bond between $A_1$ and M and a bond between $A_3$ and M may each be a coordinate bond, ii) a bond between $A_3$ and M may be a covalent bond, and a bond between $A_1$ and M and a bond between $A_2$ and M may each be a coordinate bond, or iii) a bond between $A_1$ and M may be a covalent bond, and a bond between $A_2$ and M and a bond between $A_3$ and M may each be a coordinate bond.

In an embodiment, a bond between $A_2$ and M may be a covalent bond, and a bond between $A_1$ and M and a bond between $A_3$ and M may each be a coordinate bond, but embodiments of the present disclosure are not limited thereto.

$A_1$ in Formula 1 may be ring $CY_1$ represented by one of Formulae A1-1 to A1-3, * in Formulae A1-1 to A1-3 indicates a binding site to M in Formula 1, and when n1 is 1, *' indicates a binding site to $T_1$ in Formula 1, when n1 is 0, *' is absent, when n4 is 1, *" indicates a binding site to $T_4$ in Formula 1, and when n4 is 0, *" is absent, $A_2$ in Formula 1 may be ring $CY_2$ represented by one of Formulae A2-1 to A2-3, * in Formulae A2-1 to A2-3 indicates a binding site to M in Formula 1, and when n1 is 1, *' indicates a binding site to $T_1$ in Formula 1, when n1 is 0, *' is absent, when n2 is 1, *" indicates a binding site to $T_2$ in Formula 1, and when n2 is 0, *" is absent, $A_3$ in Formula 1 may be ring $CY_3$ represented by one of Formulae A3-1 to A3-3, * in Formulae A3-1 to A3-3 indicates a binding site to M in Formula 1, and when n2 is 1, *" indicates a binding site to $T_2$ in Formula 1, when n2 is 0, *" is absent, when n3 is 1, *' indicates a binding site to $T_3$ in Formula 1, and when n3 is 0, *' is absent, $A_4$ in Formula 1 may be ring $CY_4$ represented by Formula A4, * in Formula A4 indicates a binding site to M in Formula 1, and when n3 is 1, *' indicates a binding site to $T_3$ in Formula 1, when n3 is 0, *' is absent, when n4 is 1, *" indicates a binding site to $T_4$ in Formula 1, and when n4 is 0, *" is absent:

Formula A1-1

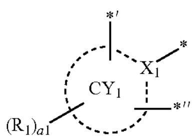

Formula A1-2

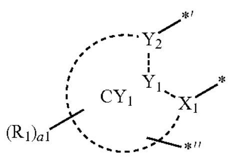

Formula A1-3

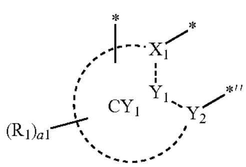

Formula A2-1

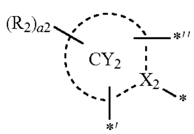

Formula A2-2

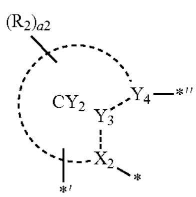

Formula A2-3

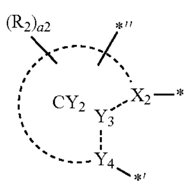

Formula A3-1

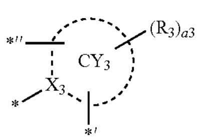

Formula A3-2

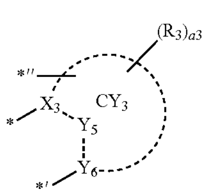

-continued

Formula A3-3

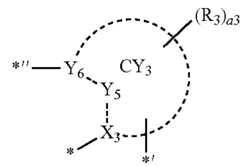

Formula A4

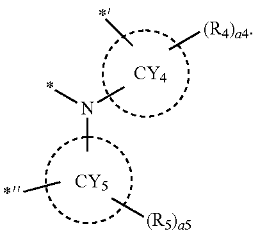

For example, i) in Formula A1-1, the two atoms to which *' and *" are linked are adjacent to $X_1$, ii) in Formula A2-1, the two atoms to which *' and *" are linked are adjacent to $X_2$, and iii) in Formula A3-1, the two atoms to which *' and *" are linked are adjacent to $X_3$.

$X_1$ to $X_3$ and $Y_1$ to $Y_6$ in Formulae A1-1 to A1-3, A2-1 to A2-3, and A3-1 to A3-3 may each independently be C or N.

For example, $X_1$ and $X_3$ may each be N, and $X_2$ may be C, but embodiments of the present disclosure are not limited thereto.

Rings $CY_1$ to $CY_5$ in Formulae A1-1 to A1-3, A2-1 to A2-3, A3-1 to A3-3, and A4 may each independently be a $C_5$-$C_{30}$ carbocyclic group or a $C_1$-$C_{30}$ heterocyclic group.

For example, rings $CY_1$ to $CY_5$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, a 4,5,6,7-tetrahydroindazole group, a pyrrolopyridine group, an imidazopyridine group, and an imidazopyrimidine group.

In one or more embodiments, rings $CY_1$ to $CY_5$ may each independently be selected from i) a 5-membered ring, ii) a 6-membered ring, iii) a condensed ring with two or more 6-membered rings, and iv) a condensed ring with at least one 5-membered ring and at least one 6-membered ring, the 5-membered ring may be selected from a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, azasilole group, a diazasilole group, and a triazasilole group, and the 6-membered ring may be selected from a cyclohexane group, a cyclohexene group, an admantane group, a norbornane group, a norbornene group, a benzene group, a pyridine group, a pyrimidine group, a pyrazine group, a pyridazine group, and a triazine group.

In an embodiment, at least one of rings $CY_1$ to $CY_3$ may be a condensed ring with two or more 6-membered rings or a condensed ring with at least one 5-membered ring and at least one 6-membered ring. The 5-membered ring and the 6-membered ring are the same as described above.

In an embodiment, when $A_1$ is the condensed ring with at least one 5-membered ring and at least one 6-membered ring, the 5-membered ring in the condensed ring may be linked to $T_1$ in Formula 1.

In one or more embodiments, when $A_1$ is the condensed ring with at least one 5-membered ring and at least one 6-membered ring, the 6-membered ring in the condensed ring may be linked to $T_1$ in Formula 1.

In one or more embodiments, when $A_2$ is the condensed ring with at least one 5-membered ring and at least one 6-membered ring, the 5-membered ring in the condensed ring may be linked to $T_1$ in Formula 1.

In one or more embodiments, when $A_2$ is the condensed ring with at least one 5-membered ring and at least one 6-membered ring, the 6-membered ring in the condensed ring may be linked to $T_1$ in Formula 1.

In one or more embodiments, when $A_3$ is the condensed ring with at least one 5-membered ring and at least one 6-membered ring, the 5-membered ring in the condensed ring may be linked to $T_2$ in Formula 1.

In one or more embodiments, when $A_3$ is the condensed ring with at least one 5-membered ring and at least one 6-membered ring, the 6-membered ring in the condensed ring may be linked to $T_2$ in Formula 1.

$T_1$ to $T_4$ in Formula 1 may each independently be selected from a single bond, a double bond, *—N($R_7$)—*', *—B($R_7$)—*', *—P($R_7$)—*', *—C($R_7$)($R_8$)—*', *—Si($R_7$)($R_8$)—*', *—Ge($R_7$)($R_8$)—*', *—S—*', *—Se—*', *—O—*', *—C(=O)—*', *—S(=O)—*', *—S(=O)$_2$—*', *—C($R_7$)=*', *=C($R_7$)—*', *—C($R_7$)=C($R_8$)—*', *—C(=S)—*', and *—C≡C—*', * and *' each indicate a binding site to a neighboring atom. $R_7$ and $R_8$ are the same as described above, and $R_7$ and $R_8$ may optionally be linked via a single bond, a double bond, or a first linking group to form a substituted or unsubstituted $C_5$-$C_{30}$ carbocyclic group or a substituted or unsubstituted $C_1$-$C_{30}$ heterocyclic group.

The first linking group may be selected from *—N($R_9$)—*', *—B($R_9$)—*', *—P($R_9$)—*', *—C($R_9$)($R_{10}$)—*', *—Si($R_9$)($R_{10}$)—*', *—Ge($R_9$)($R_{10}$)—*', *—S—*', *—Se—*',*—O—*', *—C(=O)—*', *—S(=O)—*', *—S(=O)$_2$—*', *—C($R_9$)=*', *=C($R_9$)—*', *—C($R_9$)=C($R_{10}$)—*', *—C(=S)—*', and *—C≡C—*', $R_9$ and $R_{10}$ are the same as described in connection with $R_7$, and * and *' each indicate a bonding site to a neighboring atom.

In an embodiment, $T_1$ to $T_4$ may each be a single bond.

n1 to n4 in Formula 1 may each independently be 0 or 1, wherein, when n1 is 0, $T_1$ is absent and thus $A_1$ and $A_2$ are not linked to each other, when n2 is 0, $T_2$ is absent and thus $A_2$ and $A_3$ are not linked to each other, when n3 is 0, $T_3$ is absent and thus $A_3$ and $A_4$ are not linked to each other, and when n4 is 0, $T_4$ is absent and thus $A_4$ and $A_1$ are not linked to each other.

The sum of n1, n2, n3, and n4 in Formula 1 is 3. That is, the organometallic compound represented by Formula 1 has three cyclometallated rings sharing M with one another.

For example, in Formula 1, i) n2, n3, and n4 are each 1, and n1 is 0, ii) n1, n3, and n4 are each 1, and n2 is 0, iii) n1, n2, and n4 are each 1, and n3 is 0, or iv) n1, n2, and n3 are each 1, and n4 is 0.

In an embodiment, in Formula 1, i) n2, n3, and n4 are each 1, and n1 is 0, or ii) n1, n3, and n4 are each 1, and n2 is 0, but embodiments of the present disclosure are not limited thereto.

$R_1$ to $R_5$, $R_7$, and $R_8$ may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$).

For example, $R_1$ to $R_5$, $R_7$, and $R_8$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and $—Si(Q_{33})(Q_{34})(Q_{35})$; and $—N(Q_1)(Q_2)$, $—Si(Q_3)(Q_4)(Q_5)$, $—B(Q_6)(Q_7)$, and $—P(=O)(Q_8)(Q_9)$, and $Q_1$ to $Q_9$ and $Q_{33}$ to $Q_{35}$ may each independently be selected from:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

In an embodiment, $R_1$ to $R_5$, $R_7$, and $R_8$ may each independently be selected from hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, groups represented by Formulae 9-1 to 9-19, groups represented by Formulae 10-1 to 10-162, $—N(Q_1)(Q_2)$, $—Si(Q_3)(Q_4)(Q_5)$, $—B(Q_6)(Q_7)$, and $—P(=O)(Q_8)(Q_9)$ (wherein $Q_1$ to $Q_9$ are the same as described herein), but embodiments of the present disclosure are not limited thereto:

Formula 9-1

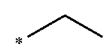

Formula 9-2

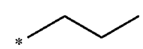

Formula 9-3

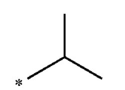

Formula 9-4

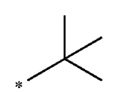

Formula 9-5

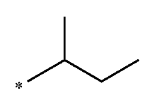

Formula 9-6

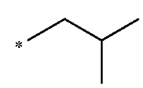

Formula 9-7

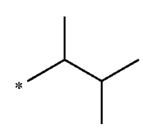

Formula 9-8

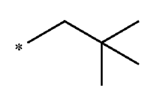

Formula 9-9

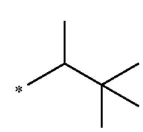

Formula 9-10

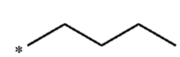

-continued
Formula 9-11
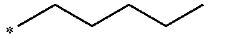
Formula 9-12
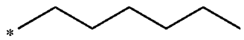
Formula 9-13
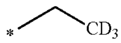
Formula 9-14
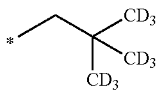
Formula 9-15
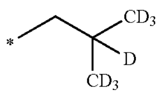
Formula 9-16
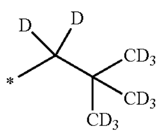
Formula 9-17
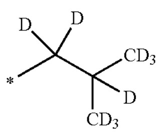
Formula 9-18
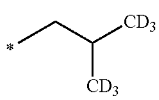
ormula 9-19
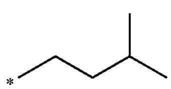
Formula 10-1
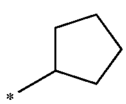
Formula 10-2
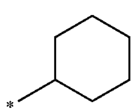
Formula 10-3
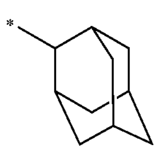
Formula 10-4
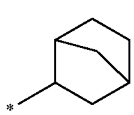
Formula 10-5
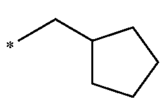
-continued
Formula 10-6
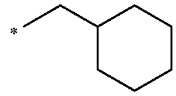
Formula 10-7
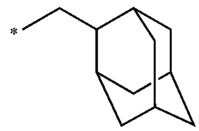
Formula 10-8
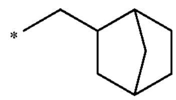
Formula 10-9
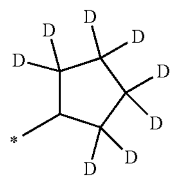
Formula 10-10
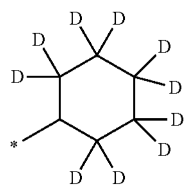
Formula 10-11
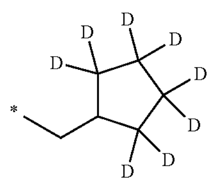
Formula 10-12
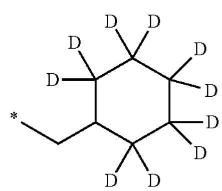
Formula 10-13
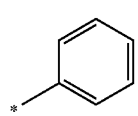
Formula 10-14
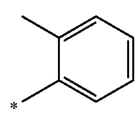
Formula 10-15
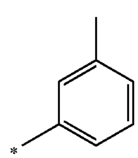

-continued
Formula 10-16
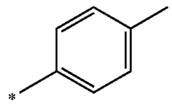
Formula 10-17
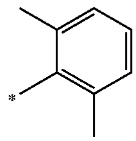
Formula 10-18
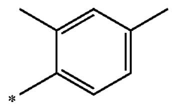
Formula 10-19
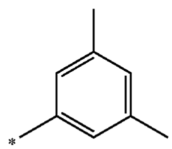
Formula 10-20
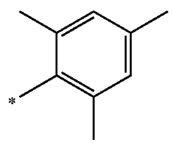
Formula 10-21
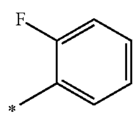
Formula 10-22
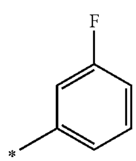
Formula 10-23
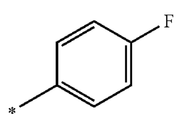
Formula 10-24
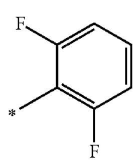
Formula 10-25
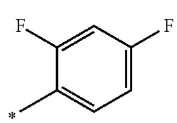
Formula 10-26
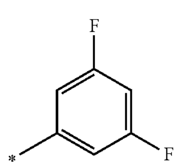
-continued
Formula 10-27
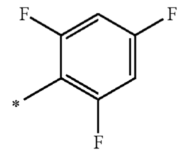
Formula 10-28
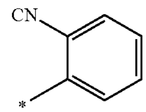
Formula 10-29
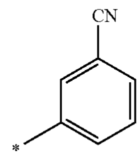
Formula 10-30
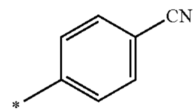
Formula 10-31
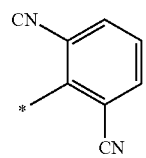
Formula 10-32
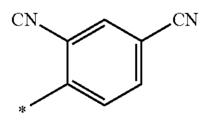
Formula 10-33
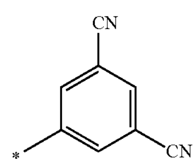
Formula 10-34
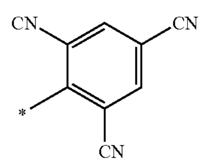
Formula 10-35
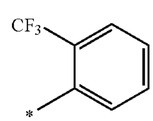
Formula 10-36
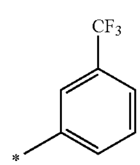

-continued
Formula 10-37
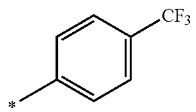
Formula 10-38
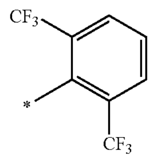
Formula 10-39
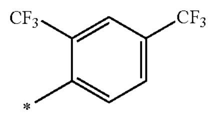
Formula 10-40
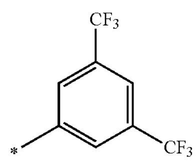
Formula 10-41
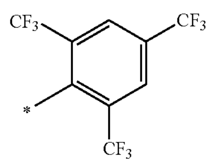
Formula 10-42
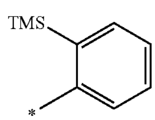
Formula 10-43
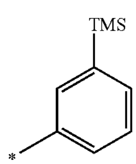
Formula 10-44
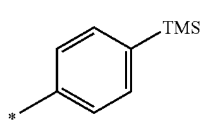
Formula 10-45
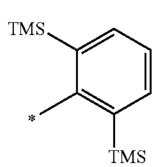
Formula 10-46
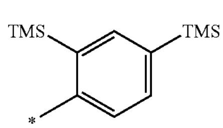
-continued
Formula 10-47
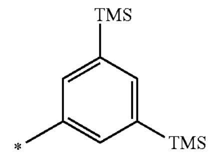
Formula 10-48
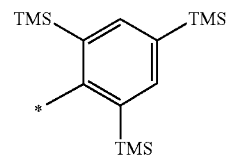
Formula 10-49
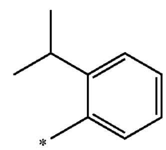
Formula 10-50
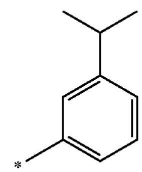
Formula 10-51
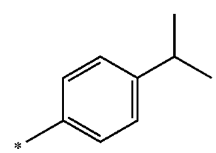
Formula 10-52
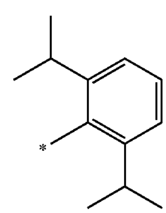
Formula 10-53
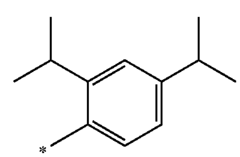
Formula 10-54
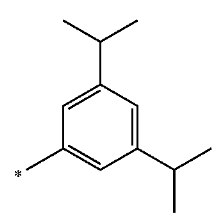

Formula 10-55
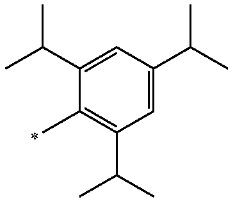
Formula 10-56
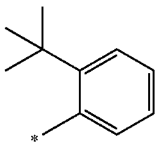
Formula 10-57
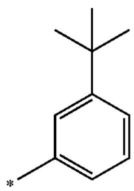
Formula 10-58
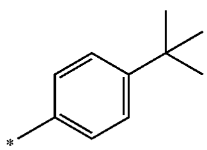
Formula 10-59
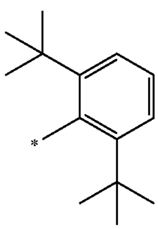
Formula 10-60
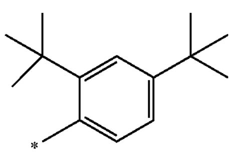
Formula 10-61
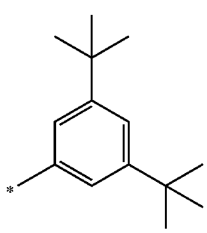
Formula 10-62
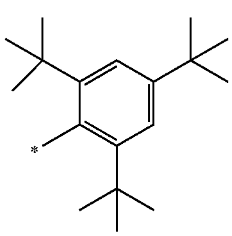
Formula 10-63
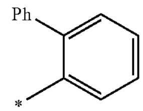
Formula 10-64
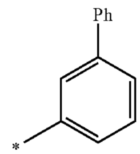
Formula 10-65
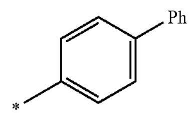
Formula 10-66
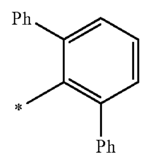
Formula 10-67
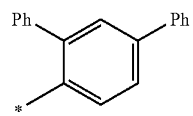
Formula 10-68
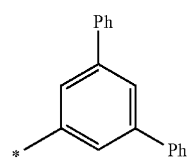
Formula 10-69
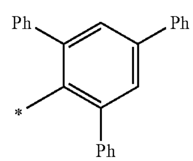
Formula 10-70
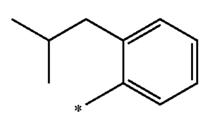
Formula 10-71
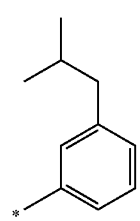
Formula 10-72
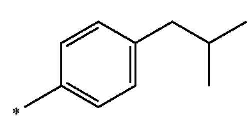

-continued
Formula 10-73
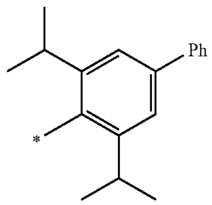
Formula 10-74
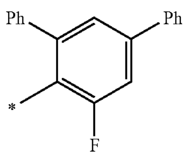
Formula 10-75
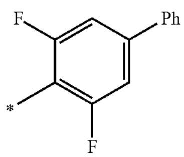
Formula 10-76
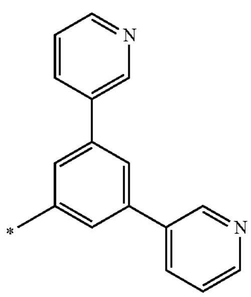
Formula 10-77
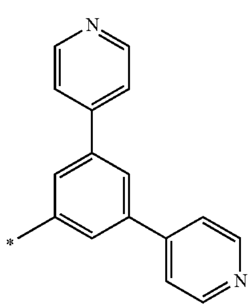
Formula 10-78
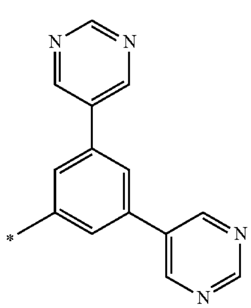
-continued
Formula 10-79
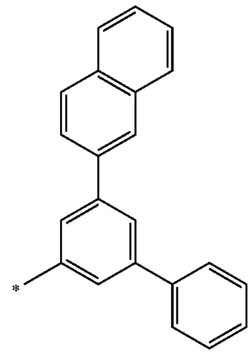
Formula 10-80
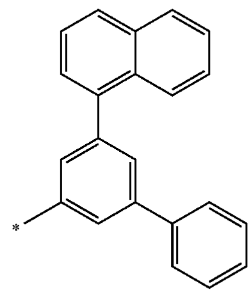
Formula 10-81
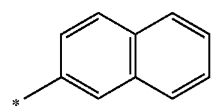
Formula 10-82
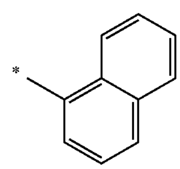
Formula 10-83
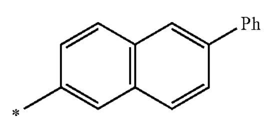
Formula 10-84
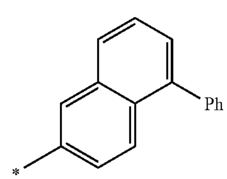
Formula 10-85
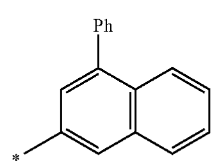
Formula 10-86
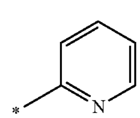

-continued
Formula 10-87
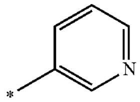
Formula 10-88
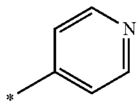
Formula 10-89
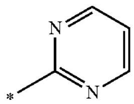
Formula 10-90
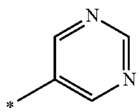
Formula 10-91
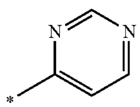
Formula 10-92
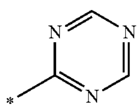
Formula 10-93
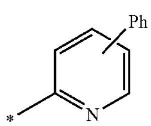
Formula 10-94
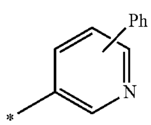
Formula 10-95
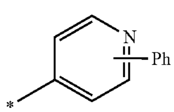
Formula 10-96
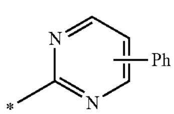
Formula 10-97
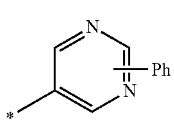
Formula 10-98
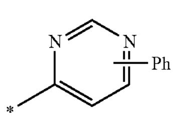
-continued
Formula 10-99
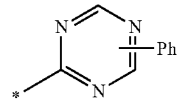
Formula 10-100
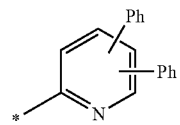
Formula 10-101
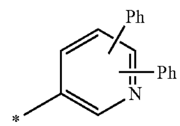
Formula 10-102
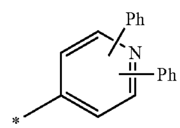
Formula 10-103
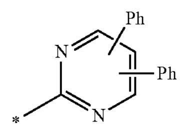
Formula 10-104
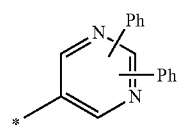
Formula 10-105
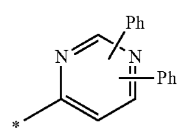
Formula 10-106
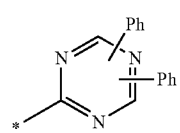
Formula 10-107
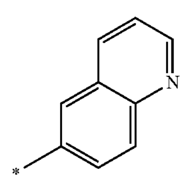
Formula 10-108
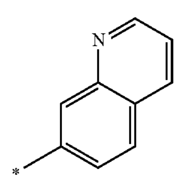

-continued
Formula 10-109
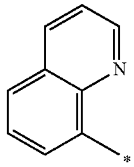
Formula 10-110
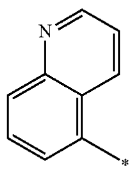
Formula 10-111
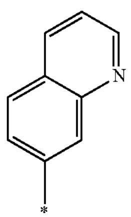
Formula 10-112
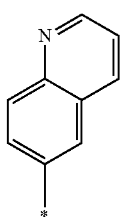
Formula 10-113
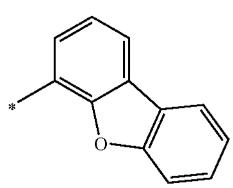
Formula 10-114
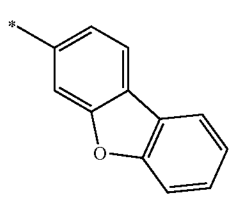
Formula 10-115
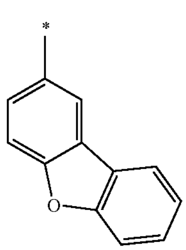
-continued
Formula 10-116
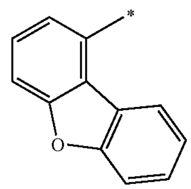
Formula 10-117
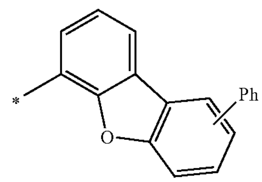
Formula 10-118
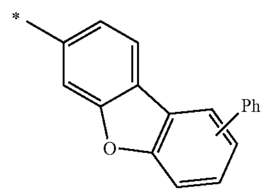
Formula 10-119
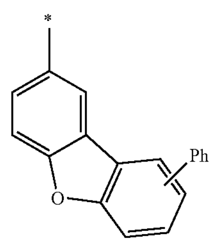
Formula 10-120
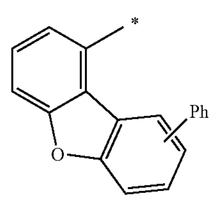
Formula 10-121
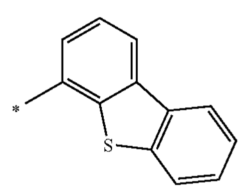
Formula 10-122
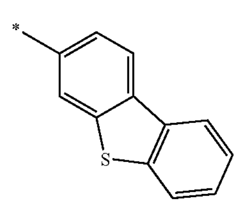

-continued
Formula 10-123
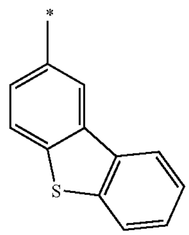
Formula 10-124
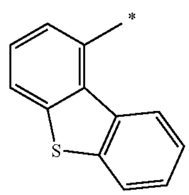
Formula 10-125
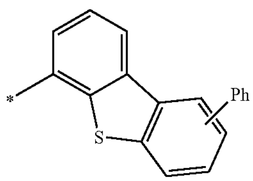
Formula 10-126
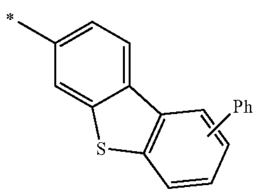
Formula 10-127
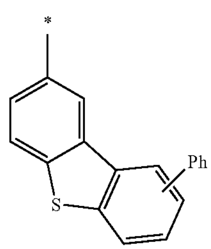
Formula 10-128
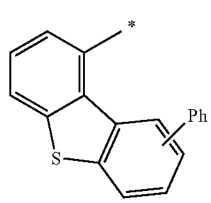
Formula 10-129
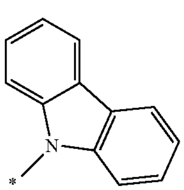
-continued
Formula 10-130
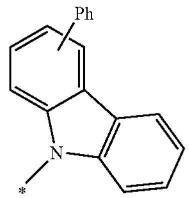
Formula 10-131
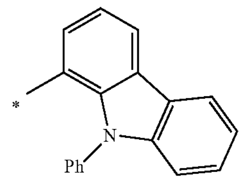
Formula 10-132
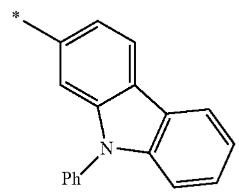
Formula 10-133
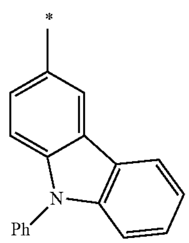
Formula 10-134
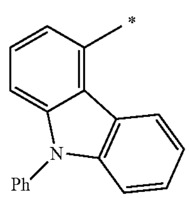
Formula 10-135
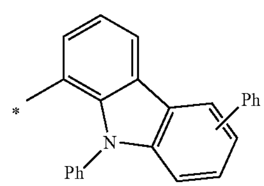
Formula 10-136
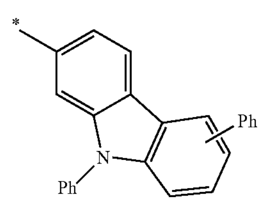

Formula 10-137
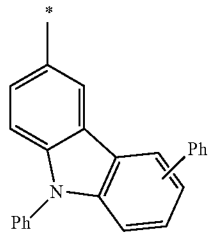
Formula 10-138
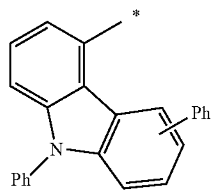
Formula 10-139
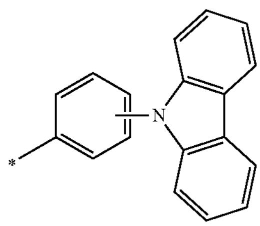
Formula 10-140
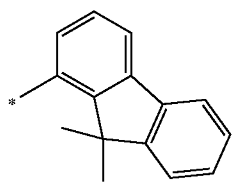
Formula 10-141
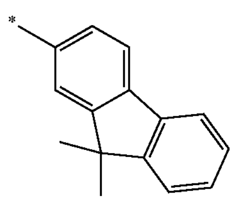
Formula 10-142
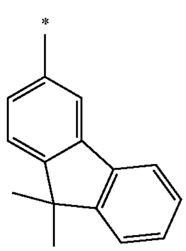
Formula 10-143
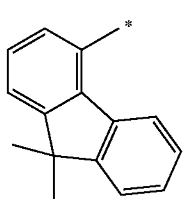
Formula 10-144
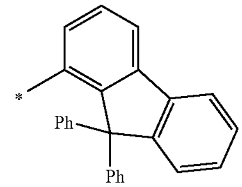
Formula 10-145
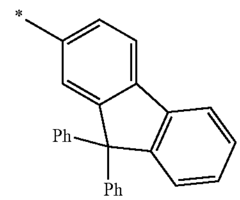
Formula 10-146
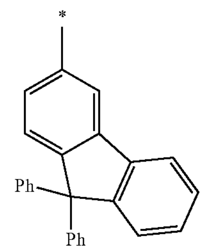
Formula 10-147
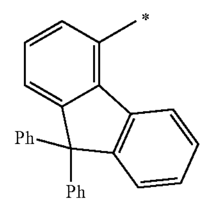
Formula 10-148
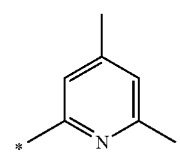
Formula 10-149
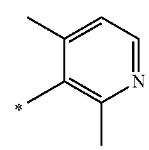
Formula 10-150
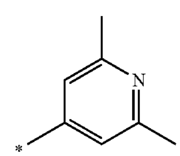
Formula 10-151
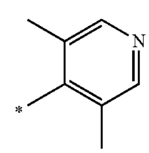

-continued

Formula 10-152

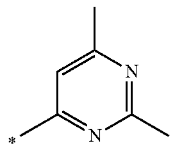

Formula 10-153

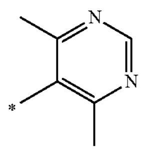

Formula 10-154

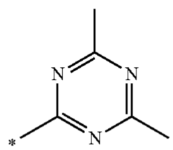

Formula 10-155

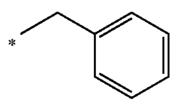

Formula 10-156

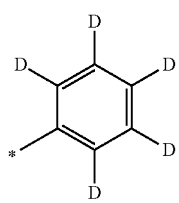

Formula 10-157

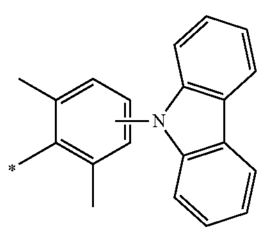

Formula 10-158

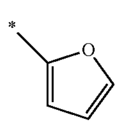

Formula 10-159

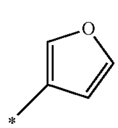

Formula 10-160

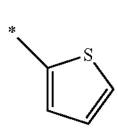

Formula 10-161

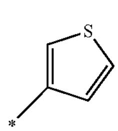

-continued

Formula 10-162

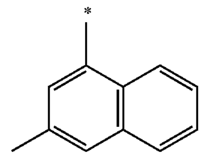

In Formulae 9-1 to 9-19 and 10-1 to 10-162, "Ph" indicates a phenyl group, "TMS" indicates a trimethylsilyl group, and "*" indicates a binding site to a neighboring atom.

a1, a2, a3, a4, and a5 in Formulae A1-1 to A1-3, A2-1 to A2-3, A3-1 to A3-3, and A4 respectively indicate the number of groups $R_1$, the number of groups $R_2$, the number of groups $R_3$, the number of groups $R_4$, and the number of groups $R_5$, and may each independently be an integer from 0 to 20 (for example, 0, 1, 2, 3, and 4). When a1 is two or more, two or more groups $R_1$ may be identical to or different from each other, when a2 is two or more, two or more groups $R_2$ may be identical to or different from each other, when a3 is two or more, two or more groups $R_3$ may be identical to or different from each other, when a4 is two or more, two or more groups $R_4$ may be identical to or different from each other, and when a5 is two or more, two or more groups $R_5$ may be identical to or different from each other.

i) Two of a plurality of neighboring groups $R_1$ in Formulae A1-1 to A1-3 may optionally be linked to form a substituted or unsubstituted $C_5$-$C_{30}$ carbocyclic group or a substituted or unsubstituted $C_1$-$C_{30}$ heterocyclic group, ii) two of a plurality of neighboring groups $R_2$ in Formulae A2-1 to A2-3 may optionally be linked to form a substituted or unsubstituted $C_5$-$C_{30}$ carbocyclic group or a substituted or unsubstituted $C_1$-$C_{30}$ heterocyclic group, iii) two of a plurality of neighboring groups $R_3$ in Formulae A3-1 to A3-3 may optionally be linked to form a substituted or unsubstituted $C_5$-$C_{30}$ carbocyclic group or a substituted or unsubstituted $C_1$-$C_{30}$ heterocyclic group, iv) two of a plurality of neighboring groups $R_4$ in Formula A4 may optionally be linked to form a substituted or unsubstituted $C_5$-$C_{30}$ carbocyclic group or a substituted or unsubstituted $C_1$-$C_{30}$ heterocyclic group, v) two of a plurality of neighboring groups $R_5$ in Formula A4 may optionally be linked to form a substituted or unsubstituted $C_5$-$C_{30}$ carbocyclic group or a substituted or unsubstituted $C_1$-$C_{30}$ heterocyclic group, vi) two or more neighboring groups selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group, and vii) two or more neighboring groups selected from $R_1$ to $R_3$ and $R_5$ may optionally be linked to form a substituted or unsubstituted $C_5$-$C_{30}$ carbocyclic group or a substituted or unsubstituted $C_1$-$C_{30}$ heterocyclic group.

For example, i) a substituted or unsubstituted $C_5$-$C_{30}$ carbocyclic group or a substituted or unsubstituted $C_1$-$C_{30}$ heterocyclic group, formed by linking two of a plurality of neighboring groups $R_1$ in Formulae A1-1 to A1-3, ii) a substituted or unsubstituted $C_5$-$C_{30}$ carbocyclic group or a substituted or unsubstituted $C_1$-$C_{30}$ heterocyclic group, formed by linking two of a plurality of neighboring groups $R_2$ in Formulae A2-1 to A2-3, iii) a substituted or unsubstituted $C_5$-$C_{30}$ carbocyclic group or a substituted or unsubstituted $C_1$-$C_{30}$ heterocyclic group, formed by linking two of a plurality of neighboring groups $R_3$ in Formulae A3-1 to A3-3, iv) a substituted or unsubstituted $C_5$-$C_{30}$ carbocyclic group or a substituted or unsubstituted $C_1$-$C_{30}$ heterocyclic group, formed by linking two of a plurality of neighboring groups $R_4$ in Formula A4, v) a substituted or unsubstituted $C_5$-$C_{30}$ carbocyclic group or a substituted or unsubstituted $C_1$-$C_{30}$ heterocyclic group, formed by linking two of a plurality of neighboring groups $R_5$ in Formula A4, vi) a substituted or unsubstituted $C_5$-$C_{30}$ carbocyclic group or a substituted or unsubstituted $C_1$-$C_{30}$ heterocyclic group, formed by linking two neighboring groups selected from $R_1$ to $R_4$, and vii) a substituted or unsubstituted $C_5$-$C_{30}$ carbocyclic group or a substituted or unsubstituted $C_1$-$C_{30}$ heterocyclic group, formed by linking two neighboring groups selected from $R_1$ to $R_3$ and $R_5$ may each independently be selected from:

a pentadiene group, a cyclohexane group, a cycloheptane group, an adamantane group, a bicycloheptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group;

a pentadiene group, a cyclohexane group, a cycloheptane group, an adamantane group, a bicycloheptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one $R_{10a}$, but embodiments of the present disclosure are not limited thereto.

$R_{10a}$ is the same as described in connection with $R_1$.

"An azabenzothiophene group, an azabenzofuran group, an azaindene group, an azaindole group, an azabenzosilole group, an azadibenzothiophene group, an azadibenzofuran group, an azafluorene group, an azacarbazole group, and an azadibenzosilole group" as used herein mean heteroatom-containing rings that respectively have the same structure as "a benzothiophene group, a benzofuran group, an indene group, an indole group, an benzosilole group, a dibenzothiophene group, a dibenzofuran group, a fluorene group, a carbazole group, and a dibenzosilole group", except that at least one of carbons forming the rings thereof is substituted with nitrogen.

Rings $CY_4$ and $CY_5$ are not linked to or condensed with each other. For example, $R_4$ and $R_5$ in Formula 4 are not linked to each other.

In an embodiment, $A_1$ in Formula 1 may be represented by one of Formulae A1-1(1) to A1-1(51), A1-2(1) to A1-2(58), and A1-3(1) to A1-3(58):

Formula A1-1(1)

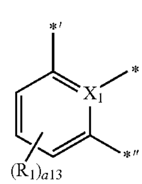

-continued

Formula A1-1(2)

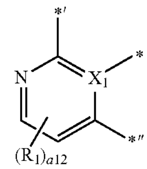

Formula A1-1(3)

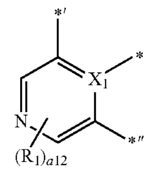

Formula A1-1(4)

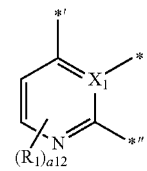

Formula A1-1(5)

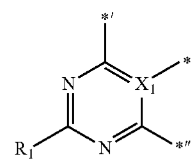

Formula A1-1(6)

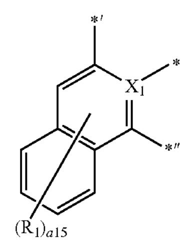

Formula A1-1(7)

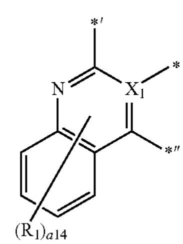

Formula A1-1(8)

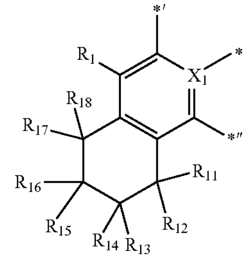

-continued
Formula A1-1(9)
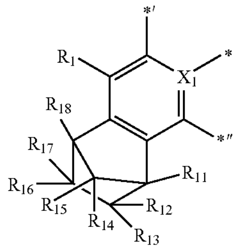
Formula A1-1(10)
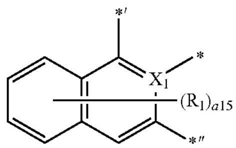
Formula A1-1(11)
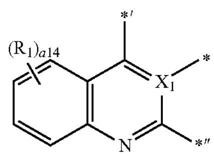
Formula A1-1(12)
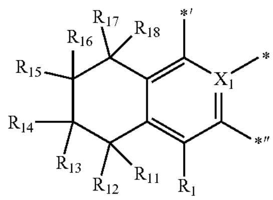
Formula A1-1(13)
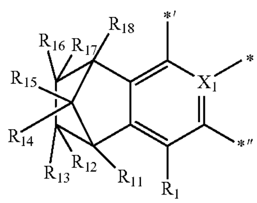
Formula A1-1(14)
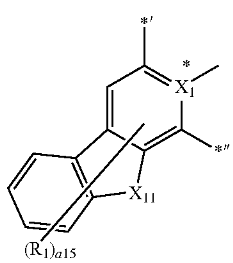
Formula A1-1(15)
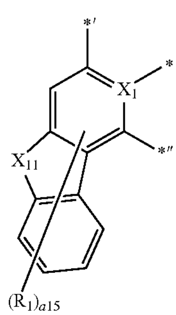
-continued
Formula A1-1(16)
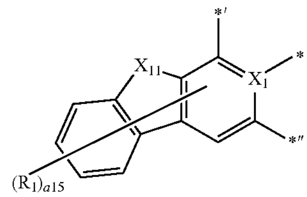
Formula A1-1(17)
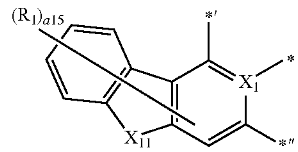
Formula A1-1(18)
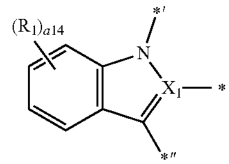
Formula A1-1(19)
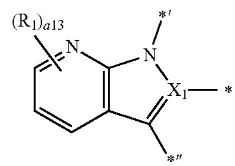
Formula A1-1(20)
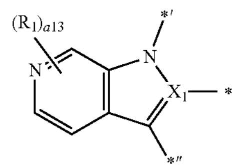
Formula A1-1(21)
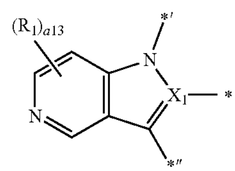
Formula A1-1(22)
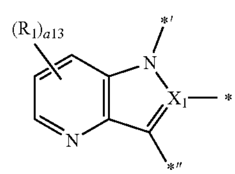
Formula A1-1(23)
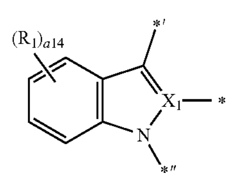
Formula A1-1(24)
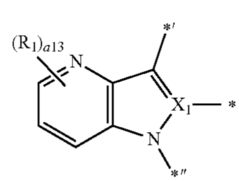

-continued
Formula A1-1(25)
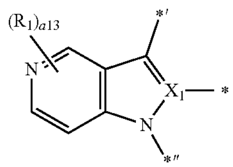
Formula A1-1(26)
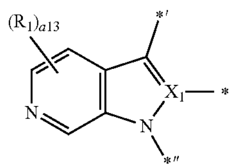
Formula A1-1(27)
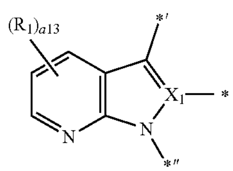
Formula A1-1(28)
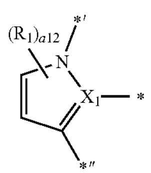
Formula A1-1(29)
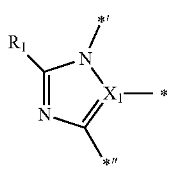
Formula A1-1(30)
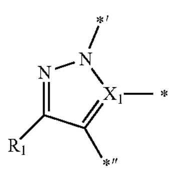
Formula A1-1(31)
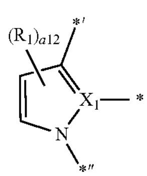
Formula A1-1(32)
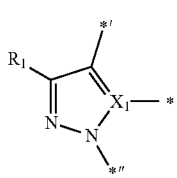
Formula A1-1(33)
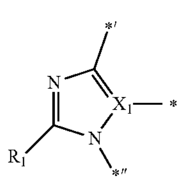
-continued
Formula A1-1(34)
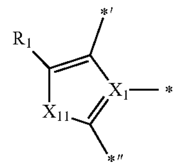
Formula A1-1(35)
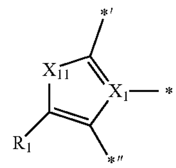
Formula A1-1(36)
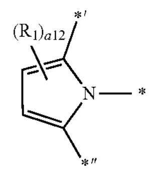
Formula A1-1(37)
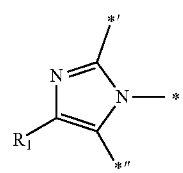
Formula A1-1(38)
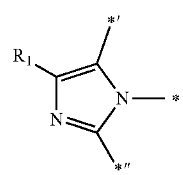
Formula A1-1(39)
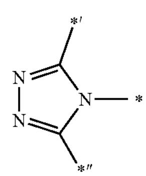
Formula A1-1(40)
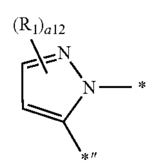
Formula A1-1(41)
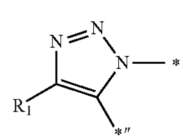
Formula A1-1(42)
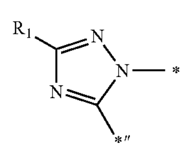
Formula A1-1(43)
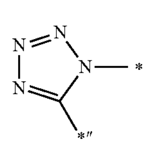

-continued
Formula A1-1(44)
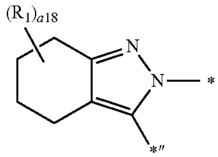
Formula A1-1(45)
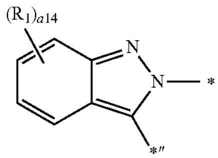
Formula A1-1(46)
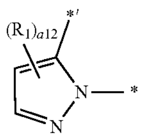
Formula A1-1(47)
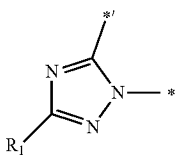
Formula A1-1(48)
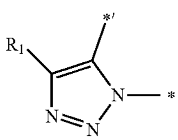
Formula A1-1(49)
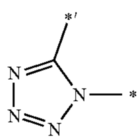
Formula A1-1(50)
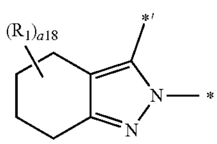
Formula A1-1(51)
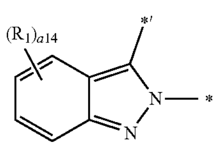
Formula A1-2(1)
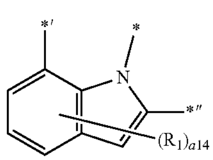
Formula A1-2(2)
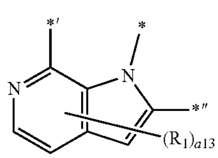
-continued
Formula A1-2(3)
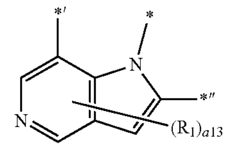
Formula A1-2(4)
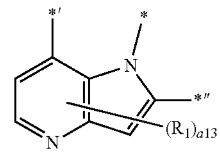
Formula A1-2(5)
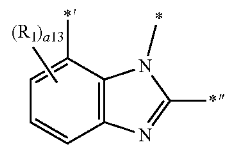
Formula A1-2(6)
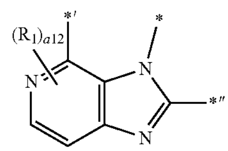
Formula A1-2(7)
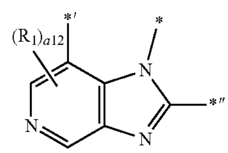
Formula A1-2(8)
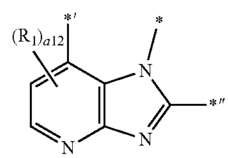
Formula A1-2(9)
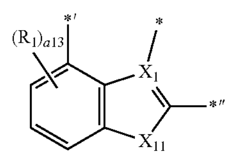
Formula A1-2(10)
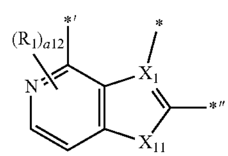
Formula A1-2(11)
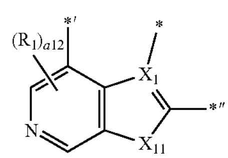
Formula A1-2(12)
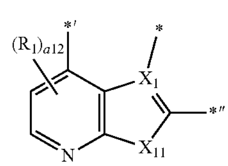

-continued
Formula A1-2(13)
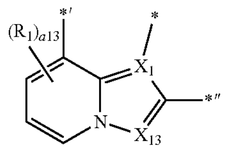
Formula A1-2(14)
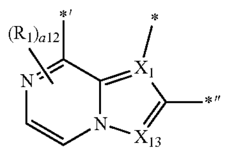
Formula A1-2(15)
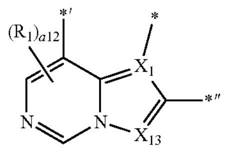
Formula A1-2(16)
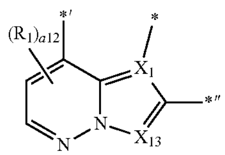
Formula A1-2(17)
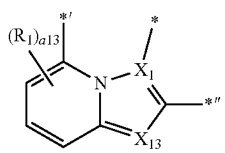
Formula A1-2(18)
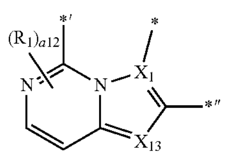
Formula A1-2(19)
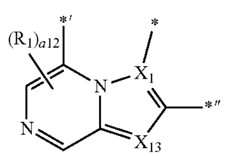
Formula A1-2(20)
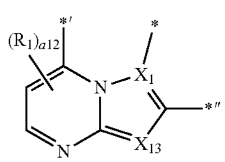
Formula A1-2(21)
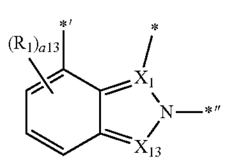
Formula A1-2(22)
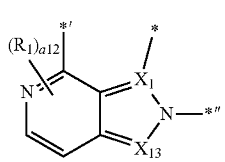
-continued
Formula A1-2(23)
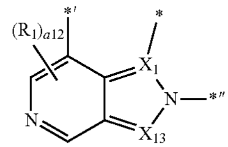
Formula A1-2(24)
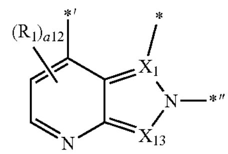
Formula A1-2(25)
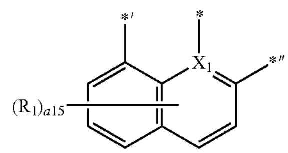
Formula A1-2(26)
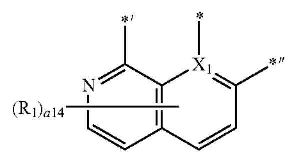
Formula A1-2(27)
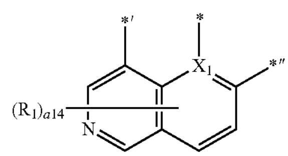
Formula A1-2(28)
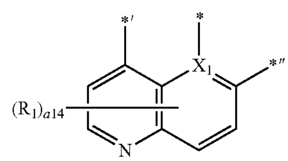
Formula A1-2(29)
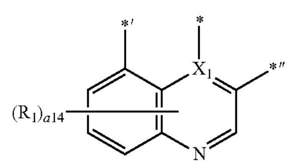
Formula A1-2(30)
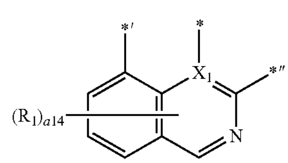
Formula A1-2(31)
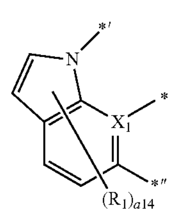

Formula A1-2(32)
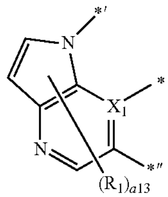
Formula A1-2(33)
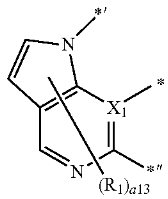
Formula A1-2(34)
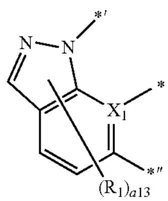
Formula A1-2(35)
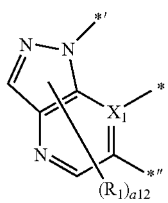
Formula A1-2(36)
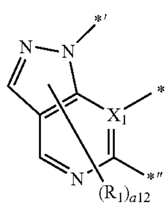
Formula A1-2(37)
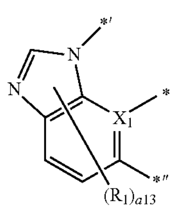
Formula A1-2(38)
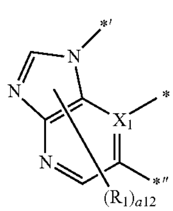
Formula A1-2(39)
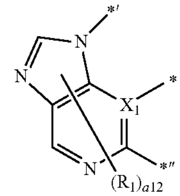
Formula A1-2(40)
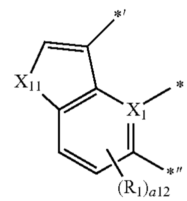
Formula A1-2(41)
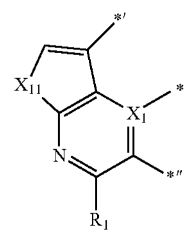
Formula A1-2(42)
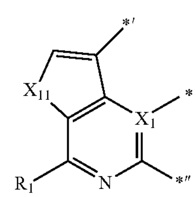
Formula A1-2(43)
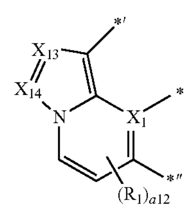
Formula A1-2(44)
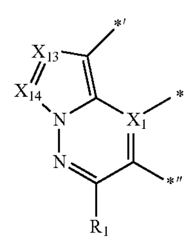
Formula A1-2(45)
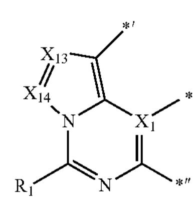

-continued
Formula A1-2(46)
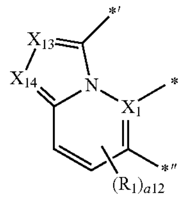
Formula A1-2(47)
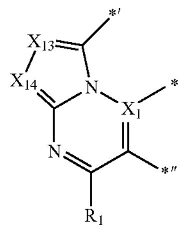
Formula A1-2(48)
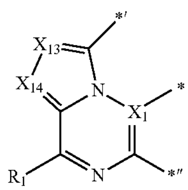
Formula A1-2(49)
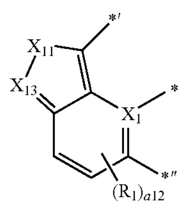
Formula A1-2(50)
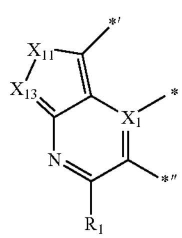
Formula A1-2(51)
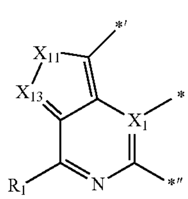
Formula A1-2(52)
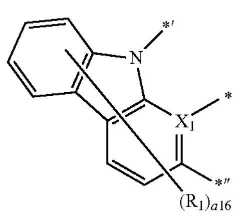
-continued
Formula A1-2(53)
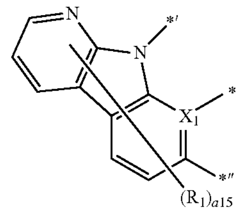
Formula A1-2(54)
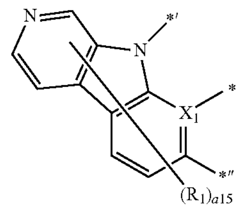
Formula A1-2(55)
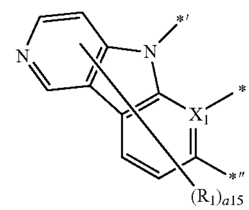
Formula A1-2(56)
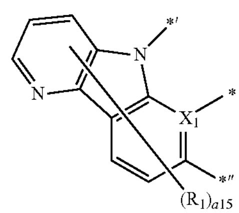
Formula A1-2(57)
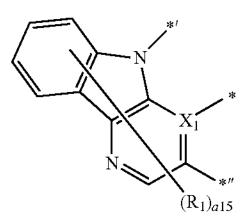
Formula A1-2(58)
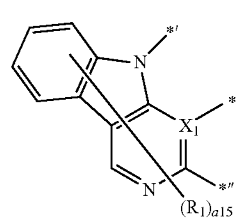
Formula A1-3(1)
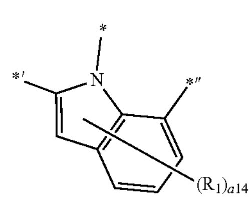

-continued
Formula A1-3(2)
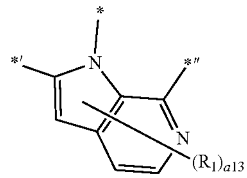
Formula A1-3(3)
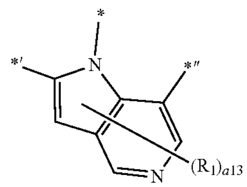
Formula A1-3(4)
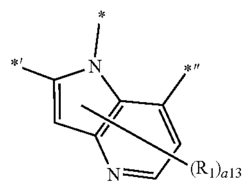
Formula A1-3(5)
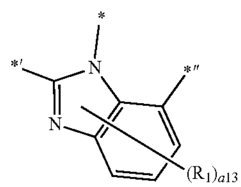
Formula A1-3(6)
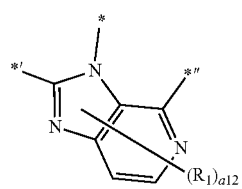
Formula A1-3(7)
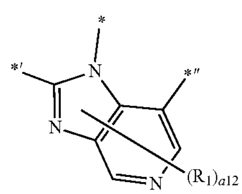
Formula A1-3(8)
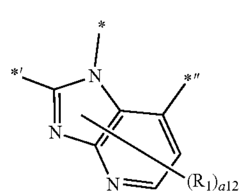
Formula A1-3(9)
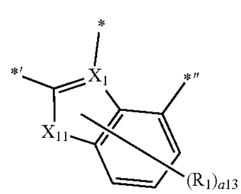
-continued
Formula A1-3(10)
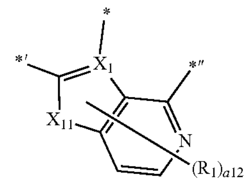
Formula A1-3(11)
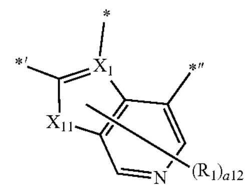
Formula A1-3(12)
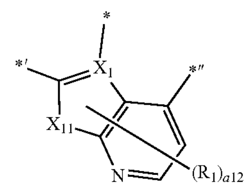
Formula A1-3(13)
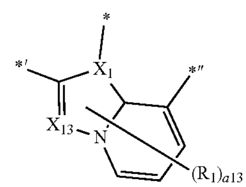
Formula A1-3(14)
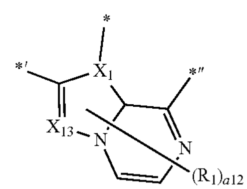
Formula A1-3(15)
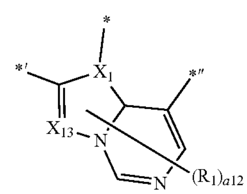
Formula A1-3(16)
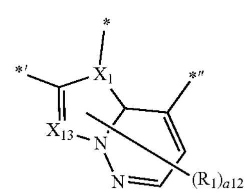
Formula A1-3(17)
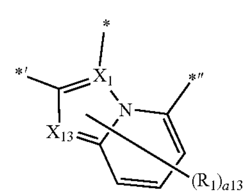

-continued
Formula A1-3(18)
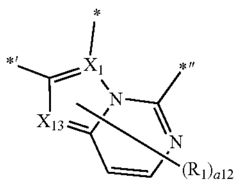
Formula A1-3(19)
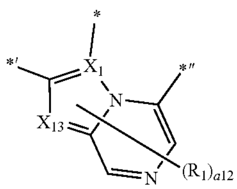
Formula A1-3(20)
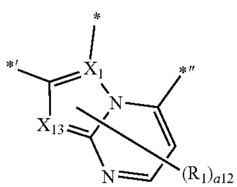
Formula A1-3(21)
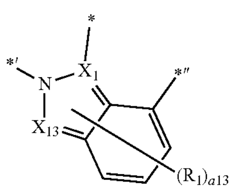
Formula A1-3(22)
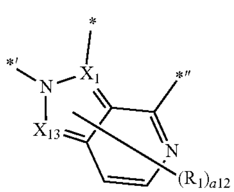
Formula A1-3(23)
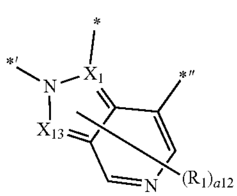
Formula A1-3(24)
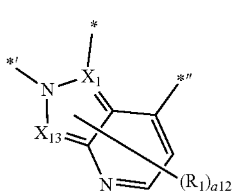
Formula A1-3(25)
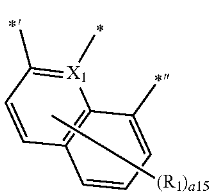
-continued
Formula A1-3(26)
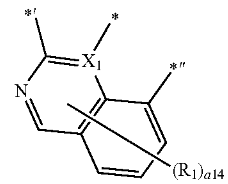
Formula A1-3(27)
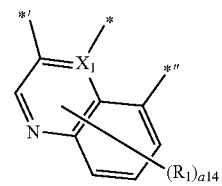
Formula A1-3(28)
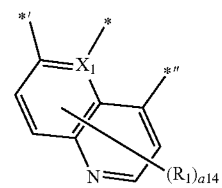
Formula A1-3(29)
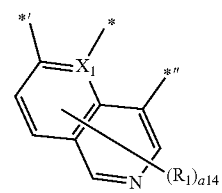
Formula A1-3(30)
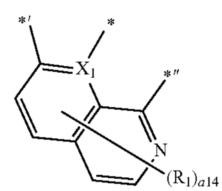
Formula A1-3(31)
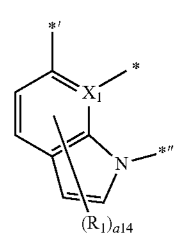
Formula A1-3(32)
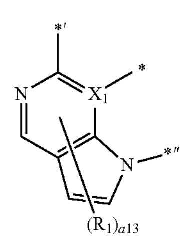

-continued
Formula A1-3(33)
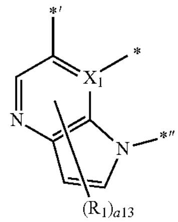
Formula A1-3(34)
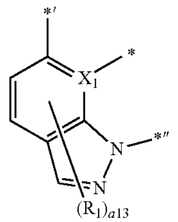
Formula A1-3(35)
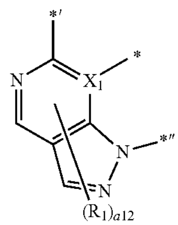
Formula A1-3(36)
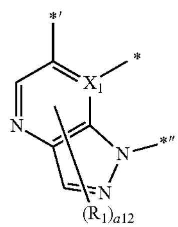
Formula A1-3(37)
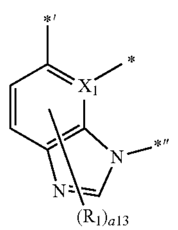
Formula A1-3(38)
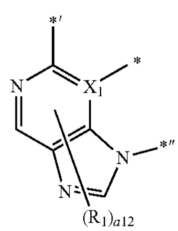
Formula A1-3(39)
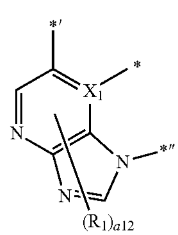
-continued
Formula A1-3(40)
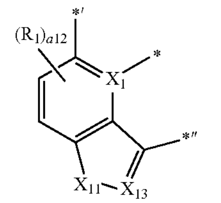
Formula A1-3(41)
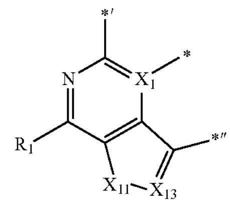
Formula A1-3(42)
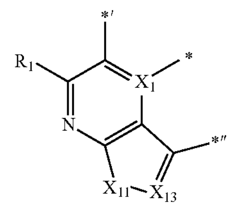
Formula A1-3(43)
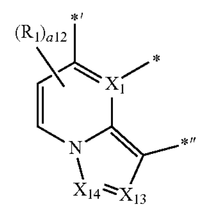
Formula A1-3(44)
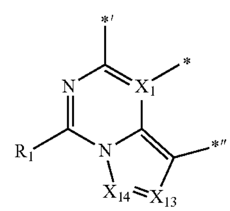
Formula A1-3(45)
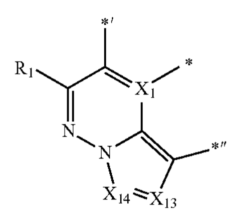
Formula A1-3(46)
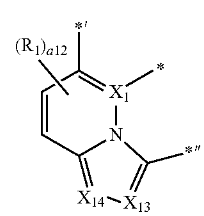

-continued
Formula A1-3(47)
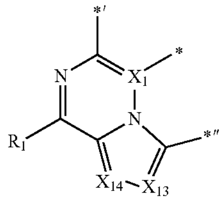
Formula A1-3(48)
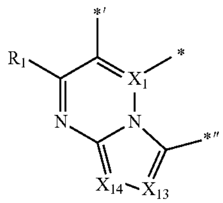
Formula A1-3(49)
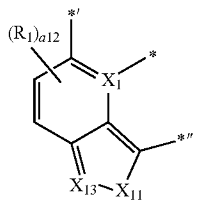
Formula A1-3(50)
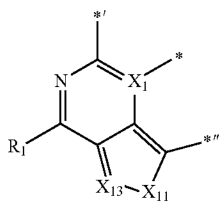
Formula A1-3(51)
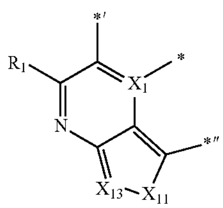
Formula A1-3(52)
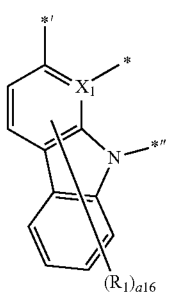
Formula A1-3(53)
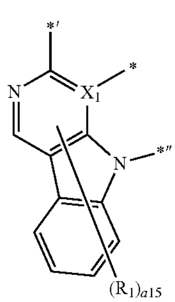
-continued
Formula A1-3(54)
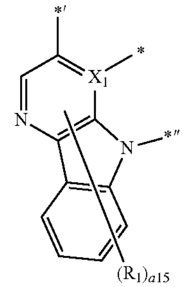
Formula A1-3(55)
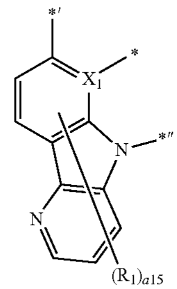
Formula A1-3(56)
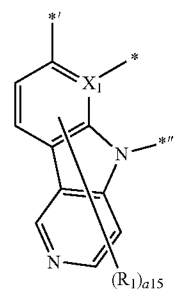
Formula A1-3(57)
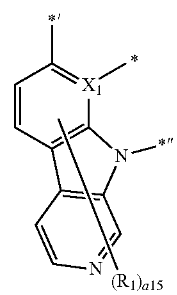
Formula A1-3(58)
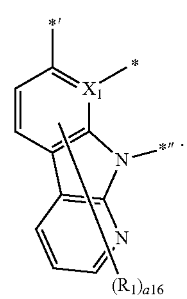
In Formulae A1-1(1) to A1-1(51), A1-2(1) to A1-2(58), and A1-3(1) to A1-3(58),
$X_1$ and $R_1$ are each independently the same as described herein,
$X_{11}$ may be O, S, $N(R_{11})$, $C(R_{11})(R_{12})$, or $Si(R_{11})(R_{12})$,
$X_{13}$ may be N or $C(R_{13})$,
$X_{14}$ may be N or $C(R_{14})$, $R_{11}$ to $R_{18}$ are each independently the same as described in connection with $R_1$, a18 may be an integer from 0 to 8, a17 may be an integer from 0 to 7, a16 may be an integer from 0 to 6, a15 may be an integer from 0 to 5, a14 may be an integer from 0 to 4, a13 may be an integer from 0 to 3, a12 may be an integer from 0 to 2, and

*, *', and *" are the same as described in connection with *, *', and *" in Formula A1-1.

In one or more embodiments, $A_2$ in Formula 1 may be represented by one of Formulae A2-1(1) to A2-1(51), A2-2(1) to A2-2(58), and A2-3(1) to A2-3(58):

Formula A2-1(1)

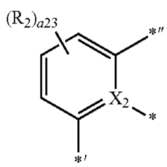

Formula A2-1(2)

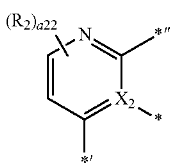

Formula A2-1(3)

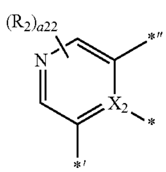

Formula A2-1(4)

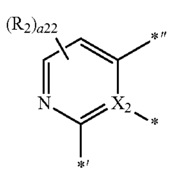

Formula A2-1(5)

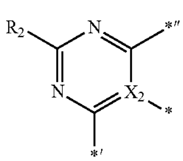

Formula A2-1(6)

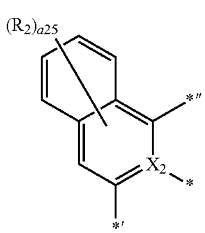

-continued

Formula A2-1(7)

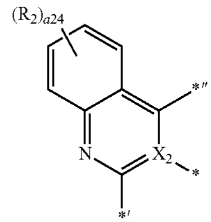

Formula A2-1(8)

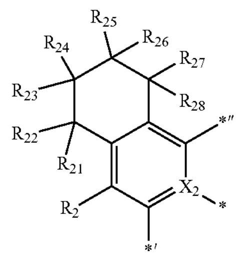

Formula A2-1(9)

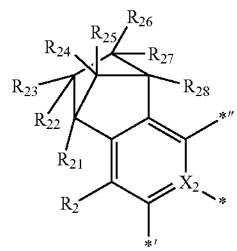

Formula A2-1(10)

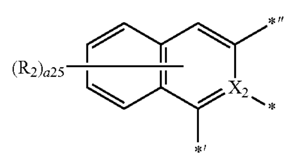

Formula A2-1(11)

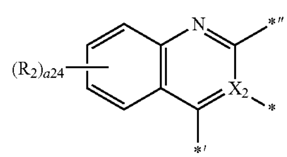

Formula A2-1(12)

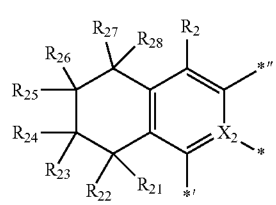

Formula A2-1(13)

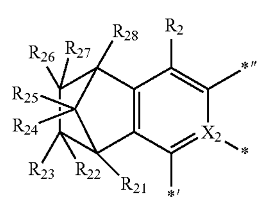

-continued
Formula A2-1(14)
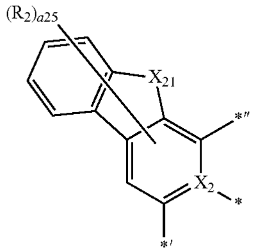
Formula A2-1(15)
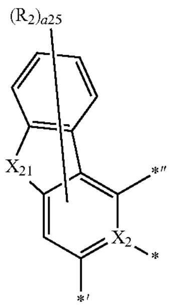
Formula A2-1(16)
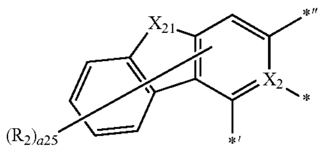
Formula A2-1(17)
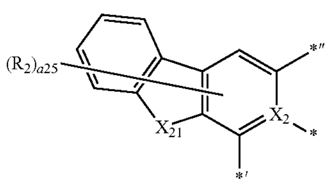
Formula A2-1(18)
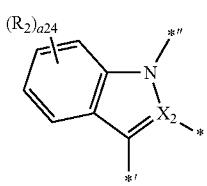
Formula A2-1(19)
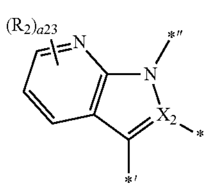
Formula A2-1(20)
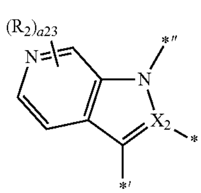
-continued
Formula A2-1(21)
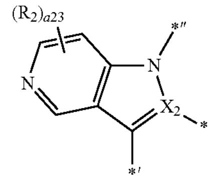
Formula A2-1(22)
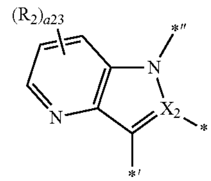
Formula A2-1(23)
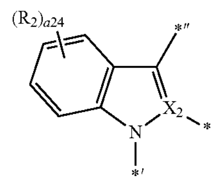
Formula A2-1(24)
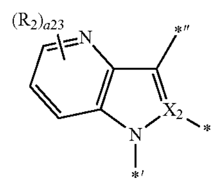
Formula A2-1(25)
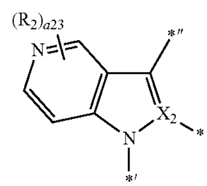
Formula A2-1(26)
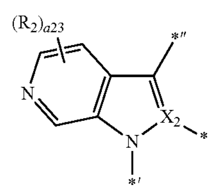
Formula A2-1(27)
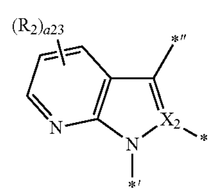
Formula A2-1(28)
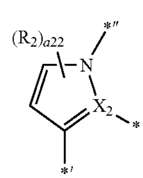

Formula A2-1(29)
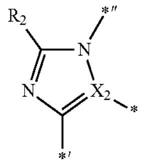
Formula A2-1(30)
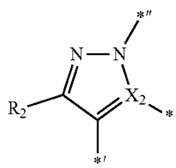
Formula A2-1(31)
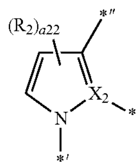
Formula A2-1(32)
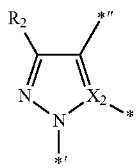
Formula A2-1(33)
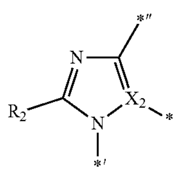
Formula A2-1(34)
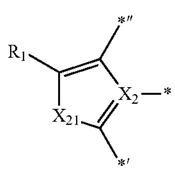
Formula A2-1(35)
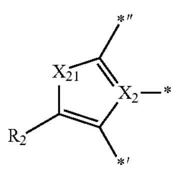
Formula A2-1(36)
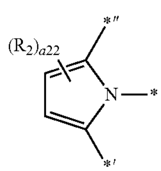
Formula A2-1(37)
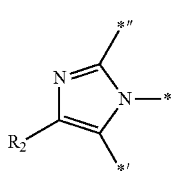
Formula A2-1(38)
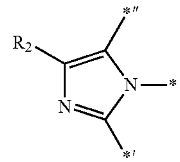
Formula A2-1(39)
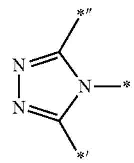
Formula A2-1(40)
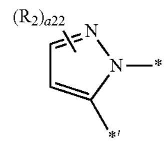
Formula A2-1(41)
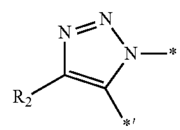
Formula A2-1(42)
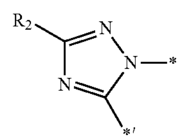
Formula A2-1(43)
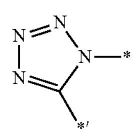
Formula A2-1(44)
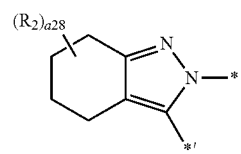
Formula A2-1(45)
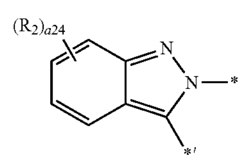
Formula A2-1(46)
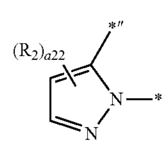
Formula A2-1(47)
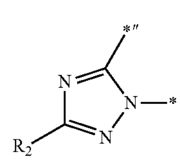

-continued
Formula A2-1(48)
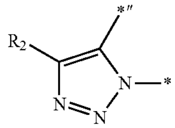
Formula A2-1(49)
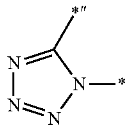
Formula A2-1(50)
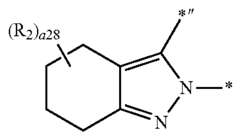
Formula A2-1(51)
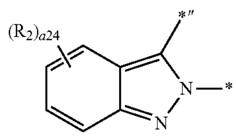
Formula A2-2(1)
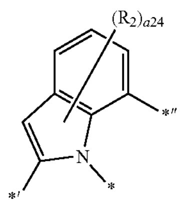
Formula A2-2(2)
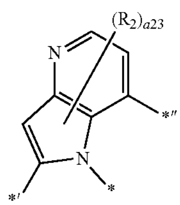
Formula A2-2(3)
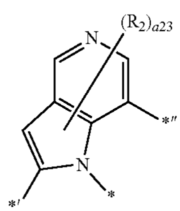
Formula A2-2(4)
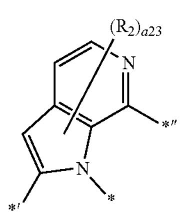
Formula A2-2(5)
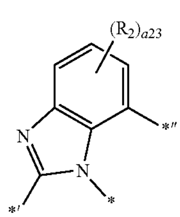
-continued
Formula A2-2(6)
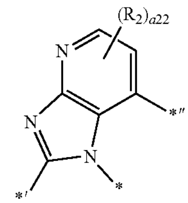
Formula A2-2(7)
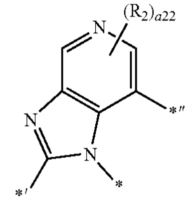
Formula A2-2(8)
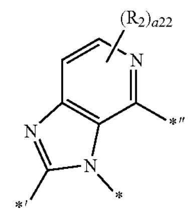
Formula A2-2(9)
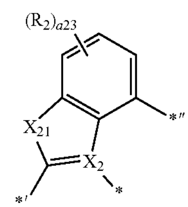
Formula A2-2(10)
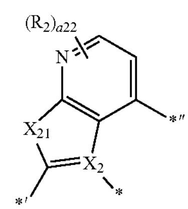
Formula A2-2(11)
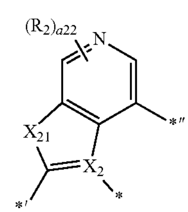
Formula A2-2(12)
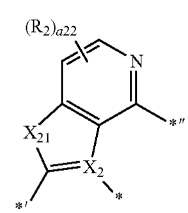

-continued
Formula A2-2(13)
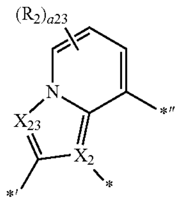
Formula A2-2(14)
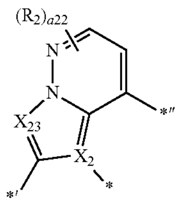
Formula A2-2(15)
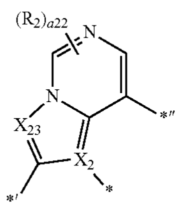
Formula A2-2(16)
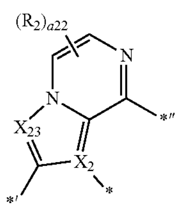
Formula A2-2(17)
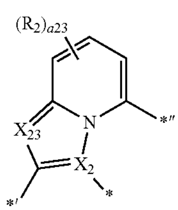
Formula A2-2(18)
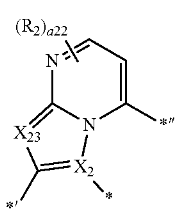
Formula A2-2(19)
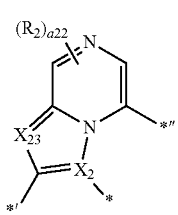
-continued
Formula A2-2(20)
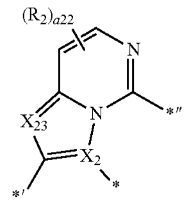
Formula A2-2(21)
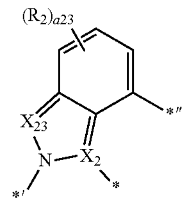
Formula A2-2(22)
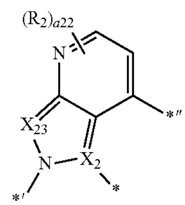
Formula A2-2(23)
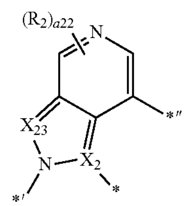
Formula A2-2(24)
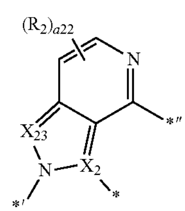
Formula A2-2(25)
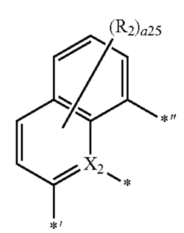
Formula A2-2(26)
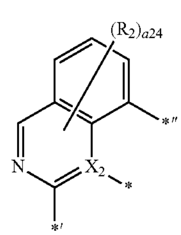

Formula A2-2(27)
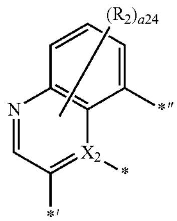
Formula A2-2(28)
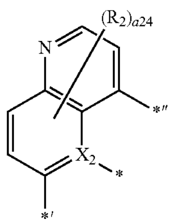
Formula A2-2(29)
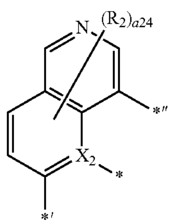
Formula A2-2(30)
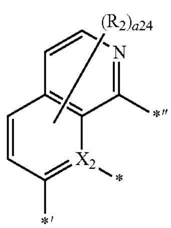
Formula A2-2(31)
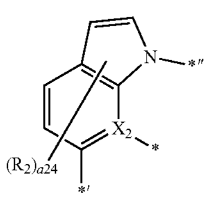
Formula A2-2(32)
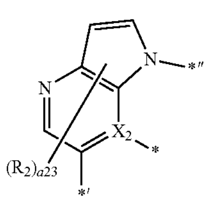
Formula A2-2(33)
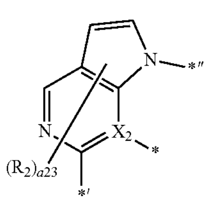
Formula A2-2(34)
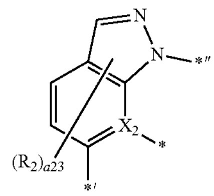
Formula A2-2(35)
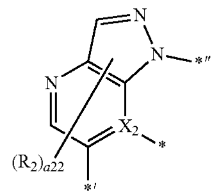
Formula A2-2(36)
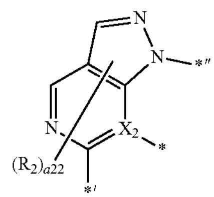
Formula A2-2(37)
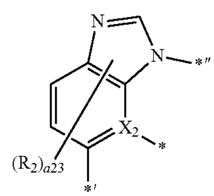
Formula A2-2(38)
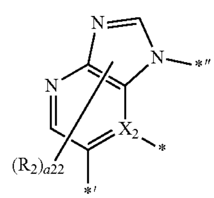
Formula A2-2(39)
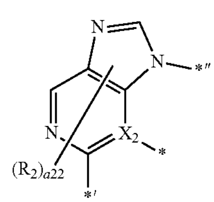
Formula A2-2(40)
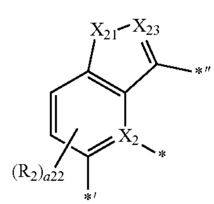
Formula A2-2(41)
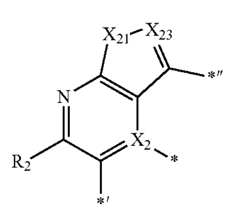

-continued
Formula A2-2(42)
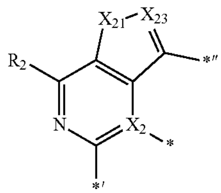
Formula A2-2(43)
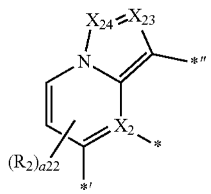
Formula A2-2(44)
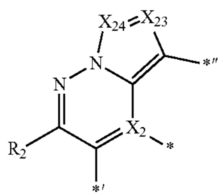
Formula A2-2(45)
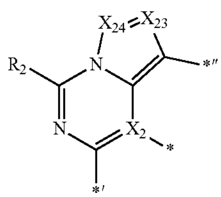
Formula A2-2(46)
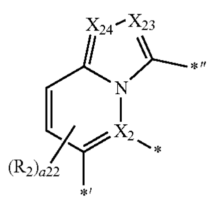
Formula A2-2(47)
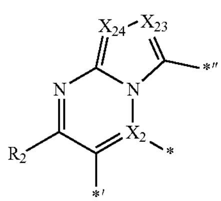
Formula A2-2(48)
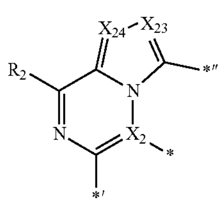
Formula A2-2(49)
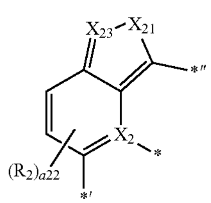
-continued
Formula A2-2(50)
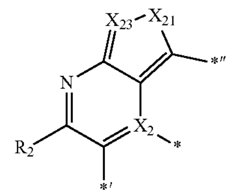
Formula A2-2(51)
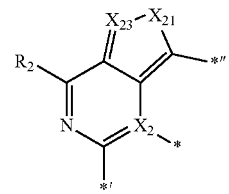
Formula A2-2(52)
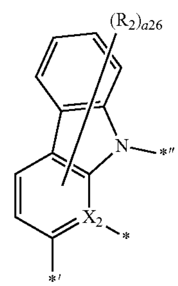
Formula A2-2(53)
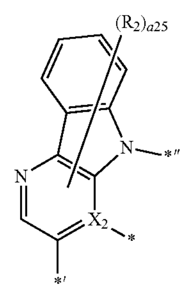
Formula A2-2(54)
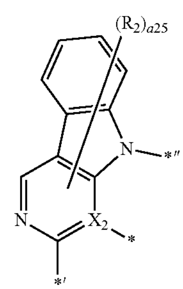
Formula A2-2(55)
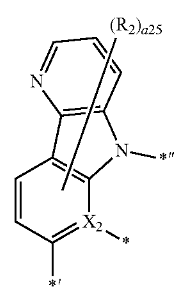

-continued
Formula A2-2(56)
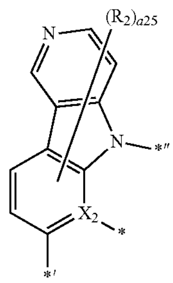
Formula A2-2(57)
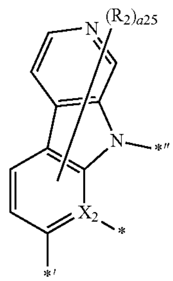
Formula A2-2(58)
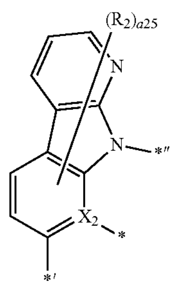
Formula A2-3(1)
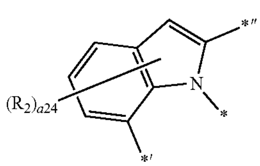
Formula A2-3(2)
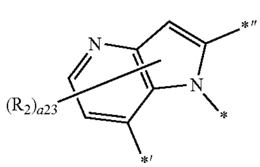
Formula A2-3(3)
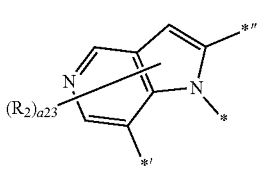
Formula A2-3(4)
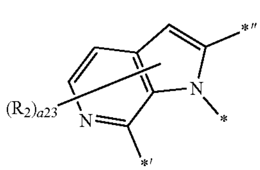
-continued
Formula A2-3(5)
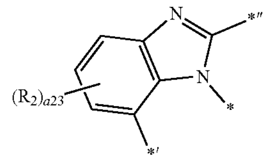
Formula A2-3(6)
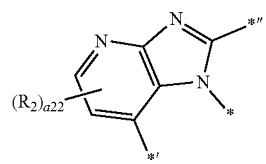
Formula A2-3(7)
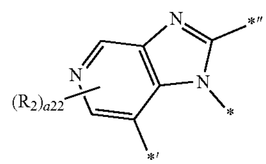
Formula A2-3(8)
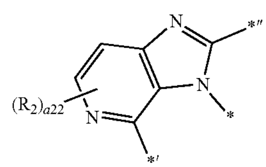
Formula A2-3(9)
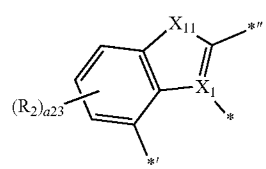
Formula A2-3(10)
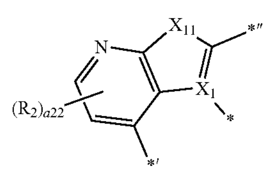
Formula A2-3(11)
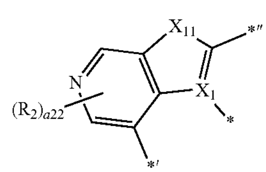
Formula A2-3(12)
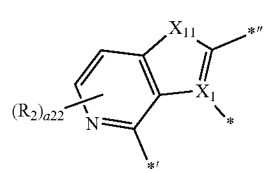
Formula A2-3(13)
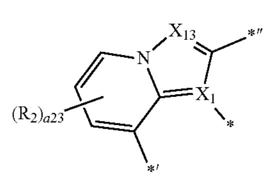

-continued
Formula A2-3(14)
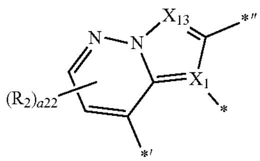
Formula A2-3(15)
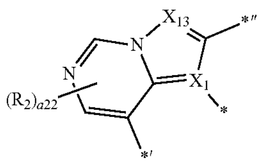
Formula A2-3(16)
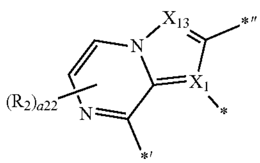
Formula A2-3(17)
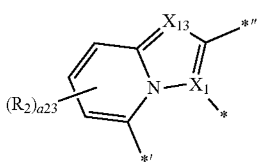
Formula A2-3(18)
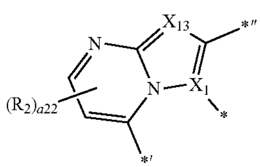
Formula A2-3(19)
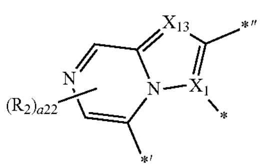
Formula A2-3(20)
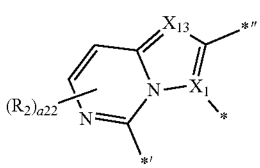
Formula A2-3(21)
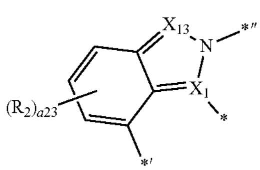
Formula A2-3(22)
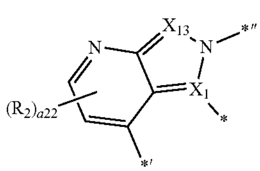
-continued
Formula A2-3(23)
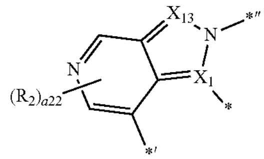
Formula A2-3(24)
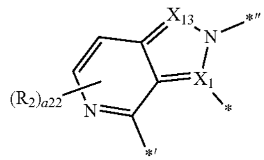
Formula A2-3(25)
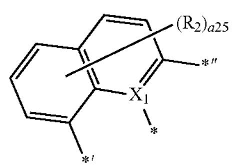
Formula A2-3(26)
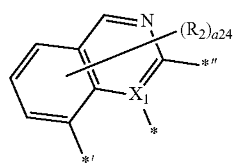
Formula A2-3(27)
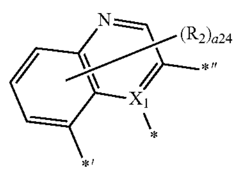
Formula A2-3(28)
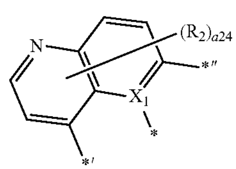
Formula A2-3(29)
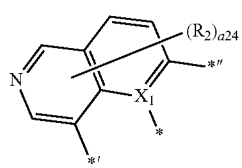
Formula A2-3(30)
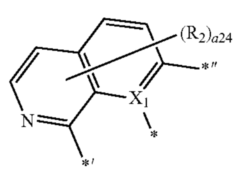
Formula A2-3(31)
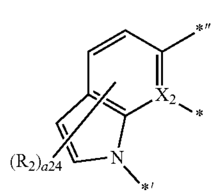

Formula A2-3(32)
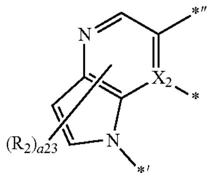
Formula A2-3(33)
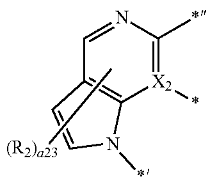
Formula A2-3(34)
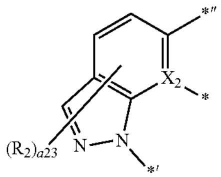
Formula A2-3(35)
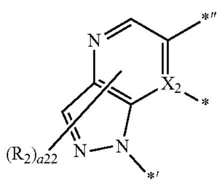
Formula A2-3(36)
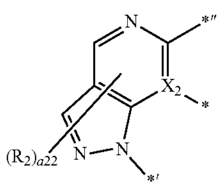
Formula A2-3(37)
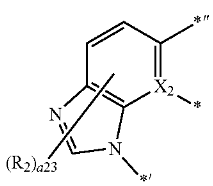
Formula A2-3(38)
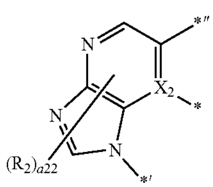
Formula A2-3(39)
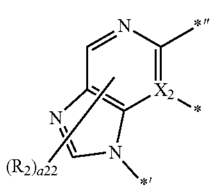
Formula A2-3(40)
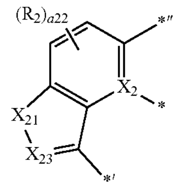
Formula A2-3(41)
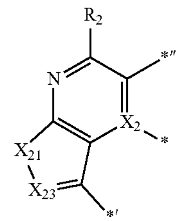
Formula A2-3(42)
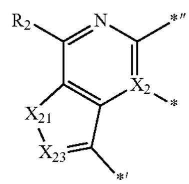
Formula A2-3(43)
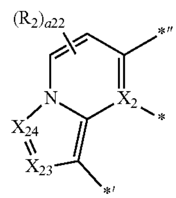
Formula A2-3(44)
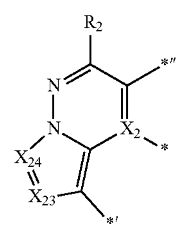
Formula A2-3(45)
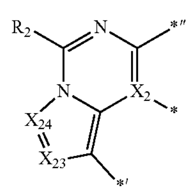
Formula A2-3(46)
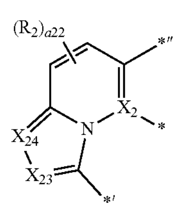

-continued

Formula A2-3(47)

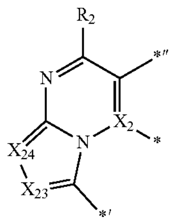

Formula A2-3(48)

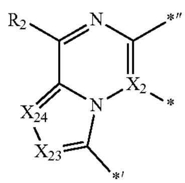

Formula A2-3(49)

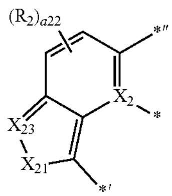

Formula A2-3(50)

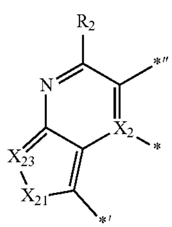

Formula A2-3(51)

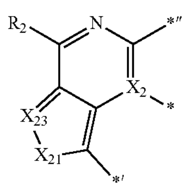

Formula A2-3(52)

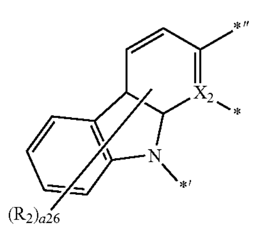

Formula A2-3(53)

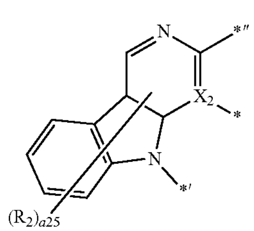

-continued

Formula A2-3(54)

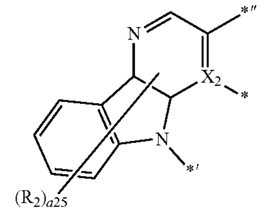

Formula A2-3(55)

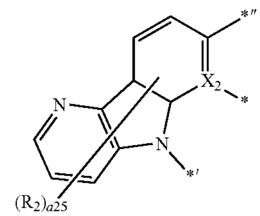

Formula A2-3(56)

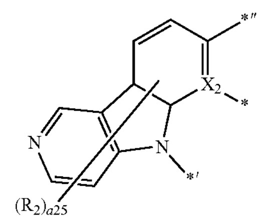

Formula A2-3(57)

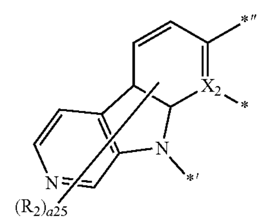

Formula A2-3(58)

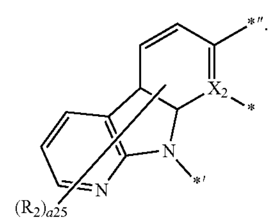

In Formulae A2-1(1) to A2-1(51), A2-2(1) to A2-2(58), and A2-3(1) to A2-3(58), $X_2$ and $R_2$ are each independently the same as described herein, $X_{21}$ may be O, S, $N(R_{21})$, $C(R_{21})(R_{22})$, or $Si(R_{21})(R_{22})$, $X_{23}$ may be N or $C(R_{23})$, $X_{24}$ may be N or $C(R_{24})$, $R_{21}$ to $R_{28}$ are each independently the same as described in connection with $R_2$, a28 may be an integer from 0 to 8, a26 may be an integer from 0 to 6, a25 may be an integer from 0 to 5, a24 may be an integer from 0 to 4, a23 may be an integer from 0 to 3, a22 may be an integer from 0 to 2, and

*, *', and *" are the same as described in connection with *, *', and *" in Formula A2-1.

In one or more embodiments, A3 in Formula 1 may be represented by one of Formulae A3-1(1) to A3-1(25), A3-2(1) to A3-2(58), and A3-3(1) to A3-3(58):

Formula A3-1(1)
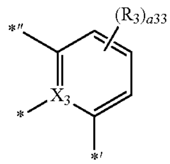
Formula A3-1(2)
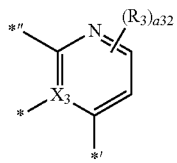
Formula A3-1(3)
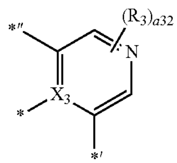
Formula A3-1(4)
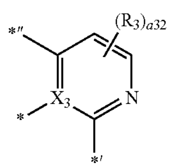
Formula A3-1(5)
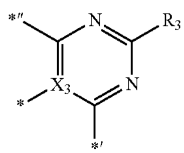
Formula A3-1(6)
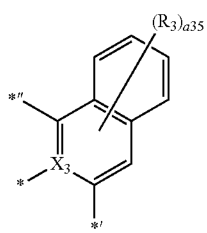
Formula A3-1(7)
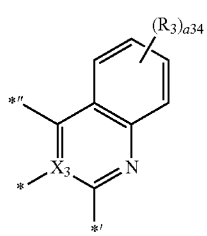
Formula A3-1(8)
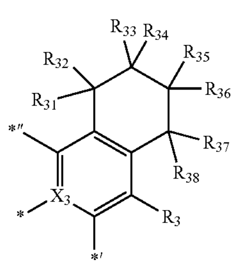
-continued
Formula A3-1(9)
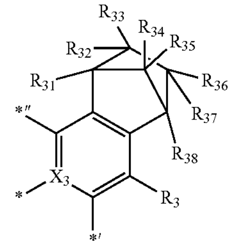
Formula A3-1(10)
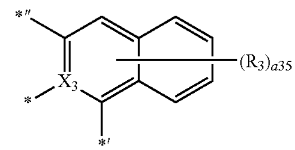
Formula A3-1(11)
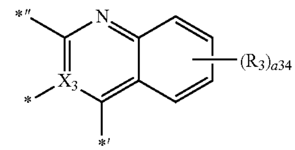
Formula A3-1(12)
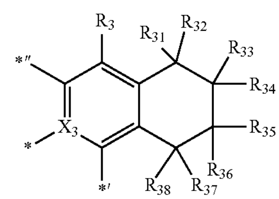
Formula A3-1(13)
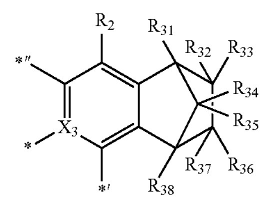
Formula A3-1(14)
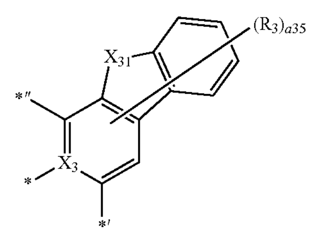
Formula A3-1(15)
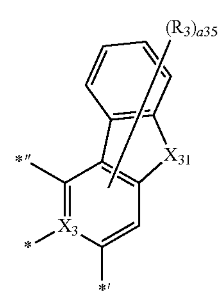
Formula A3-1(16)
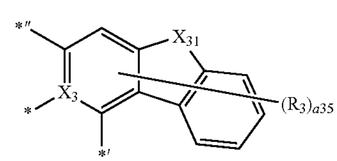

-continued
Formula A3-1(17)
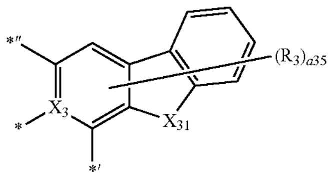
Formula A3-1(18)
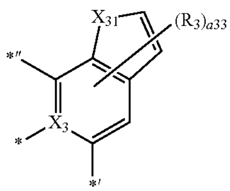
Formula A3-1(19)
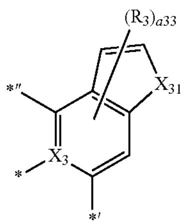
Formula A3-1(20)
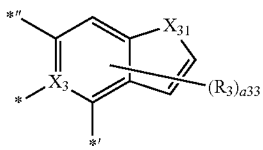
Formula A3-1(21)
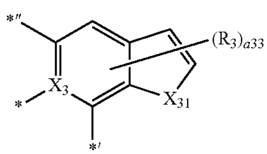
Formula A3-1(22)
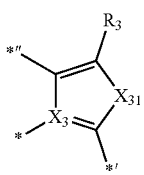
Formula A3-1(23)
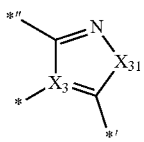
Formula A3-1(24)
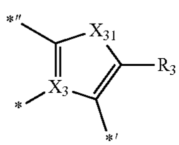
Formula A3-1(25)
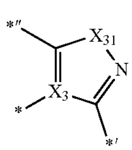
-continued
Formula A3-2(1)
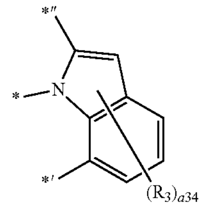
Formula A3-2(2)
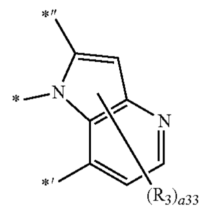
Formula A3-2(3)
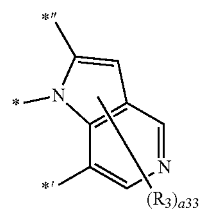
Formula A3-2(4)
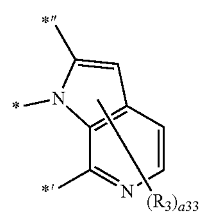
Formula A3-2(5)
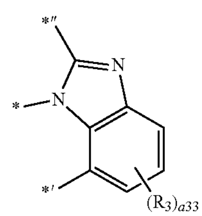
Formula A3-2(6)
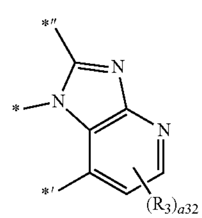
Formula A3-2(7)
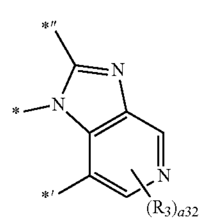

-continued
Formula A3-2(8)
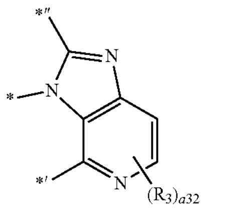
Formula A3-2(9)
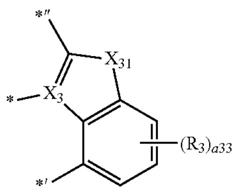
Formula A3-2(10)
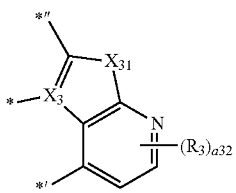
Formula A3-2(11)
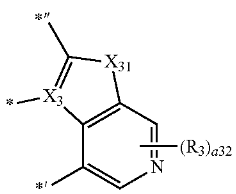
Formula A3-2(12)
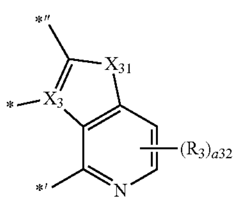
Formula A3-2(13)
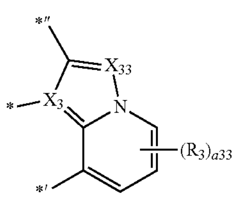
Formula A3-2(14)
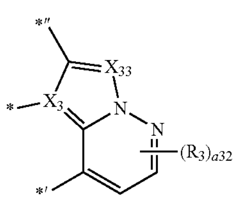
Formula A3-2(15)
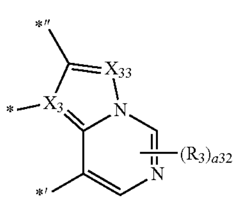
-continued
Formula A3-2(16)
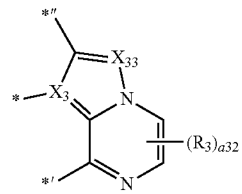
Formula A3-2(17)
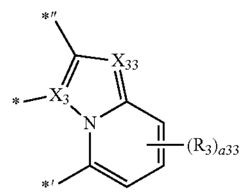
Formula A3-2(18)
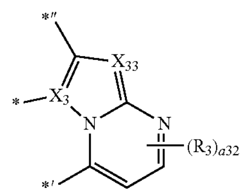
Formula A3-2(19)
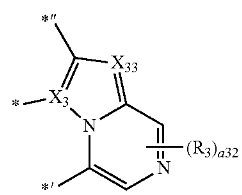
Formula A3-2(20)
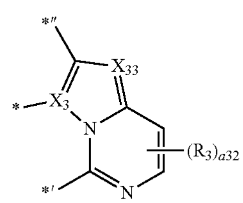
Formula A3-2(21)
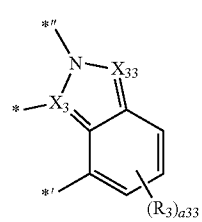
Formula A3-2(22)
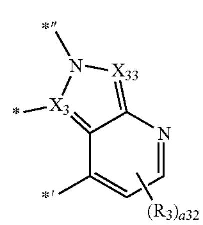

Formula A3-2(23)
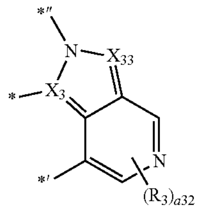
Formula A3-2(24)
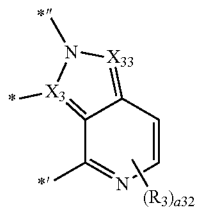
Formula A3-2(25)
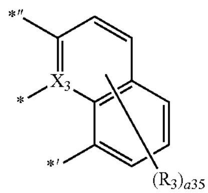
Formula A3-2(26)
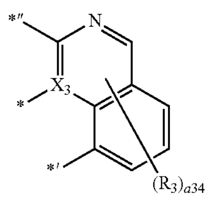
Formula A3-2(27)
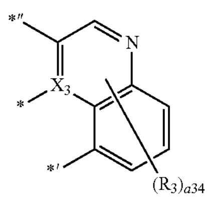
Formula A3-2(28)
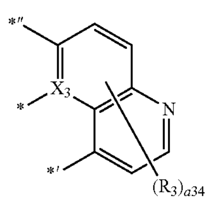
Formula A3-2(29)
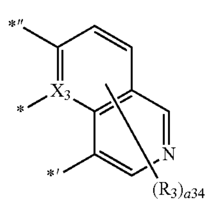
Formula A3-2(30)
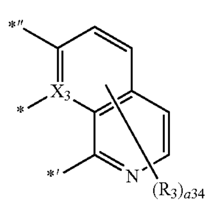
Formula A3-2(31)
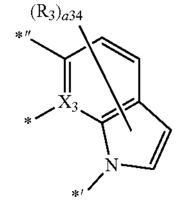
Formula A3-2(32)
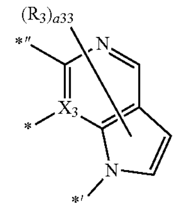
Formula A3-2(33)
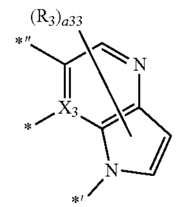
Formula A3-2(34)
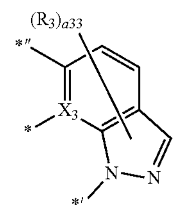
Formula A3-2(35)
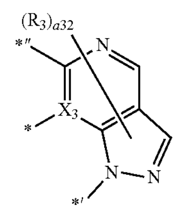
Formula A3-2(36)
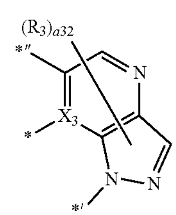
Formula A3-2(37)
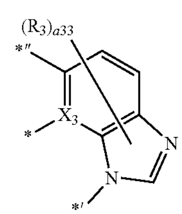

-continued
Formula A3-2(38)
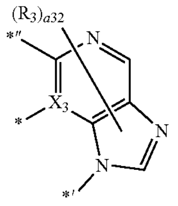
Formula A3-2(39)
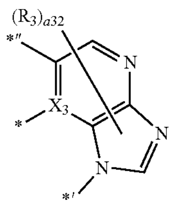
Formula A3-2(40)
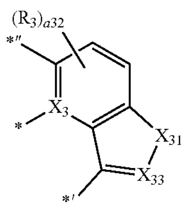
Formula A3-2(41)
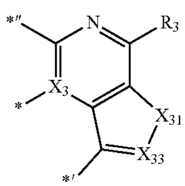
Formula A3-2(42)
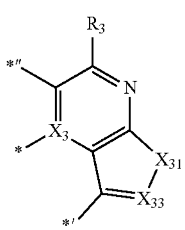
Formula A3-2(43)
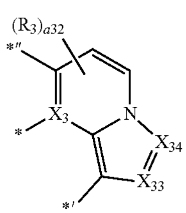
Formula A3-2(44)
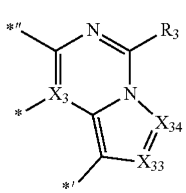
-continued
Formula A3-2(45)
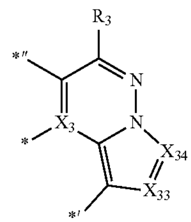
Formula A3-2(46)
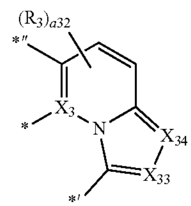
Formula A3-2(47)
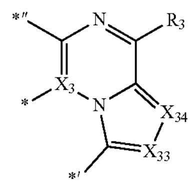
Formula A3-2(48)
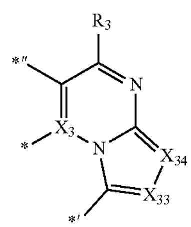
Formula A3-2(49)
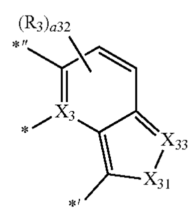
Formula A3-2(50)
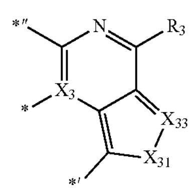
Formula A3-2(51)
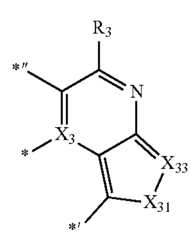

-continued
Formula A3-2(52)
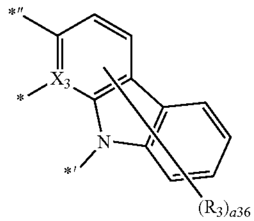
Formula A3-2(53)
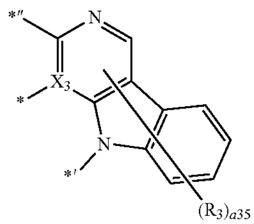
Formula A3-2(54)
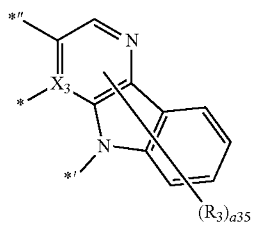
Formula A3-2(55)
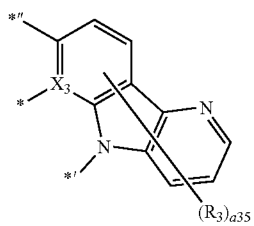
Formula A3-2(56)
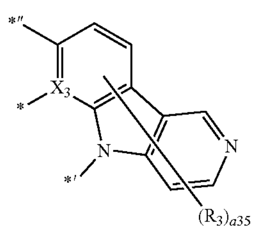
Formula A3-2(57)
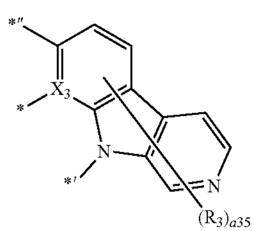
Formula A3-2(58)
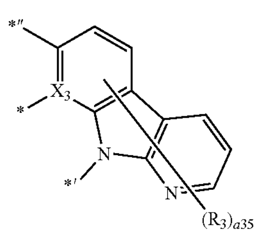
-continued
Formula A3-3(1)
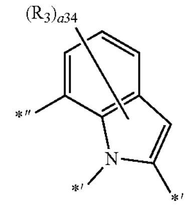
Formula A3-3(2)
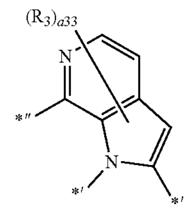
Formula A3-3(3)
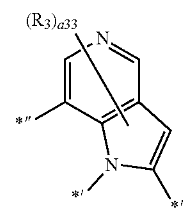
Formula A3-3(4)
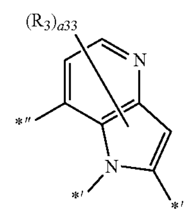
Formula A3-3(5)
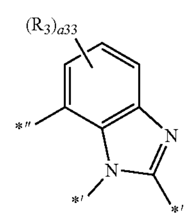
Formula A3-3(6)
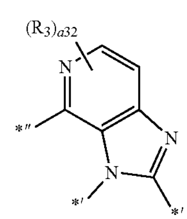
Formula A3-3(7)
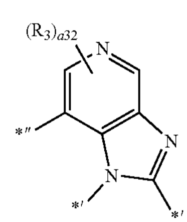

-continued
Formula A3-3(8)
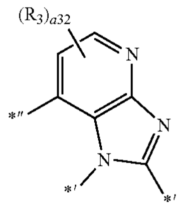
Formula A3-3(9)
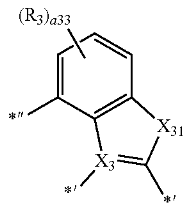
Formula A3-3(10)
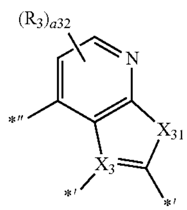
Formula A3-3(11)
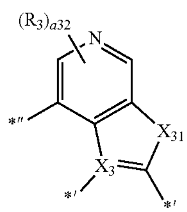
Formula A3-3(12)
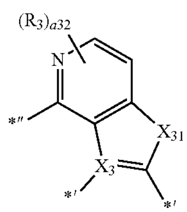
Formula A3-3(13)
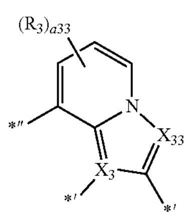
Formula A3-3(14)
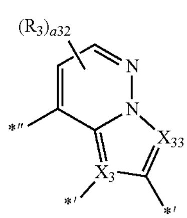
-continued
Formula A3-3(15)
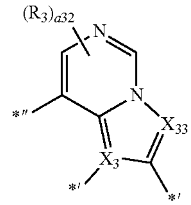
Formula A3-3(16)
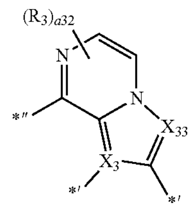
Formula A3-3(17)
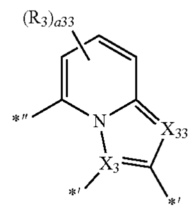
Formula A3-3(18)
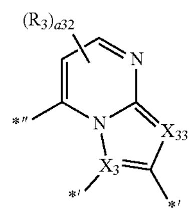
Formula A3-3(19)
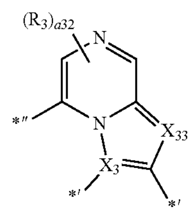
Formula A3-3(20)
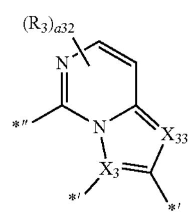
Formula A3-3(21)
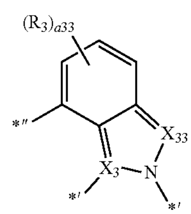

-continued
Formula A3-3(22)
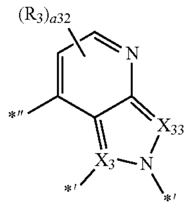
Formula A3-3(23)
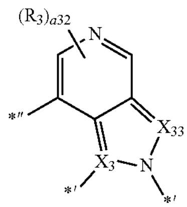
Formula A3-3(24)
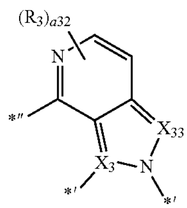
Formula A3-3(25)
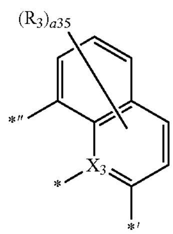
Formula A3-3(26)
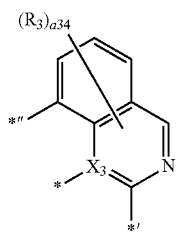
Formula A3-3(27)
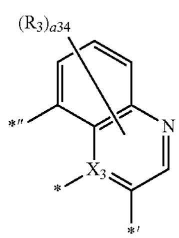
Formula A3-3(28)
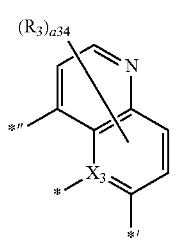
-continued
Formula A3-3(29)
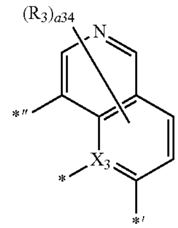
Formula A3-3(30)
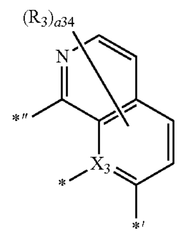
Formula A3-3(31)
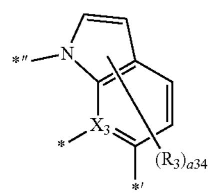
Formula A3-3(32)
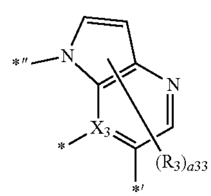
Formula A3-3(33)
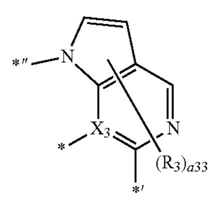
Formula A3-3(34)
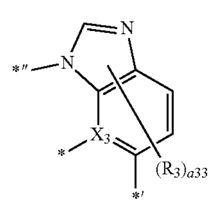
Formula A3-3(35)
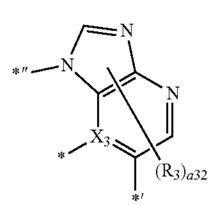

-continued
Formula A3-3(36)
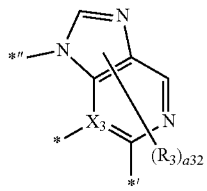
Formula A3-3(37)
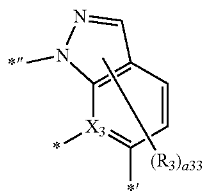
Formula A3-3(38)
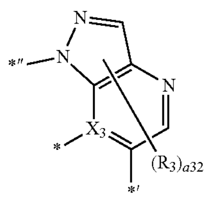
Formula A3-3(39)
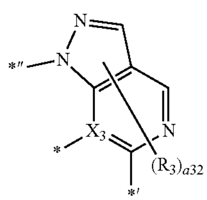
Formula A3-3(40)
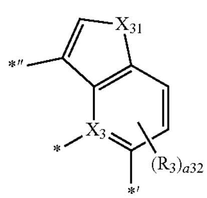
Formula A3-3(41)
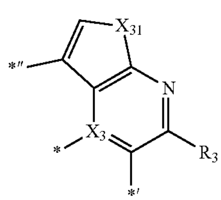
Formula A3-3(42)
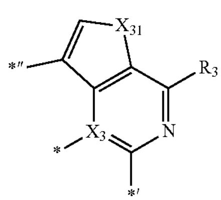
Formula A3-3(43)
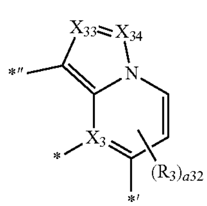
-continued
Formula A3-3(44)
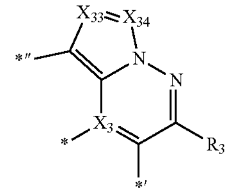
Formula A3-3(45)
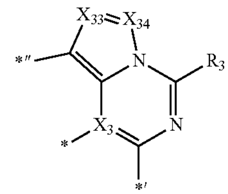
Formula A3-3(46)
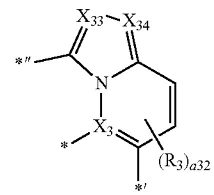
Formula A3-3(47)
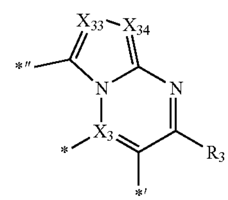
Formula A3-3(48)
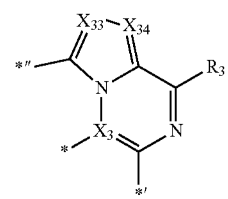
Formula A3-3(49)
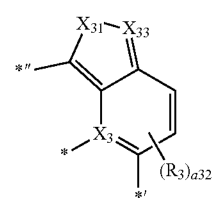
Formula A3-3(50)
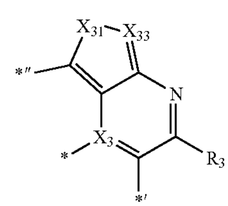
Formula A3-3(51)
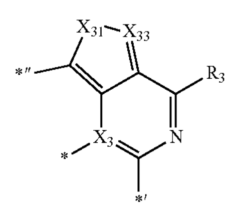

-continued

Formula A3-3(52)

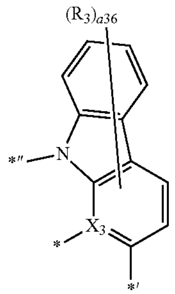

Formula A3-3(53)

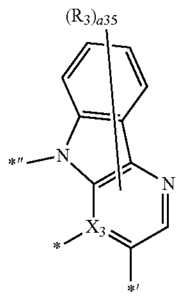

Formula A3-3(54)

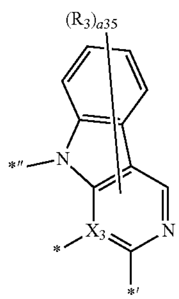

Formula A3-3(55)

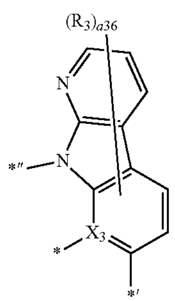

Formula A3-3(56)

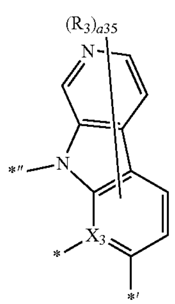

-continued

Formula A3-3(57)

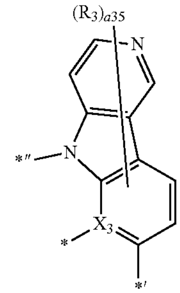

Formula A3-3(58)

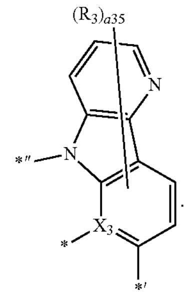

In Formulae A3-1(1) to A3-1(25), A3-2(1) to A3-2(58), and A3-3(1) to A3-3(58), $X_3$ and $R_3$ are each independently the same as described herein, $X_{31}$ may be O, S, $N(R_{31})$, $C(R_{31})(R_{32})$, or $Si(R_{31})(R_{32})$, $X_{33}$ may be N or $C(R_{33})$, $X_{34}$ may be N or $C(R_{34})$, $R_{31}$ to $R_{38}$ are each independently the same as described in connection with $R_3$, a36 may be an integer from 0 to 6, a35 may be an integer from 0 to 5, a34 may be an integer from 0 to 4, a33 may be an integer from 0 to 3, a32 may be an integer from 0 to 2, and

*, *', and *" are the same as described in connection with *, *', and *" in Formula A3-1.

In one or more embodiments, $A_4$ in Formula 1 may be represented by Formula A4-1:

Fomula A4-1

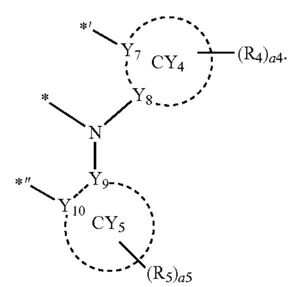

In Formula A4-1, $CY_4$, $CY_5$, $R_4$, $R_5$, a4, and a5 are each independently the same as described herein, $Y_7$ to $Y_{10}$ may each independently be C or N, and

*, *', and *" are the same as described in connection with *, *', and *" in Formula A4.

In one or more embodiments, $A_4$ in Formula 1 may be represented by one of Formulae A4-1(1) to A4-1(36):

-continued
Formula A4-1(1)
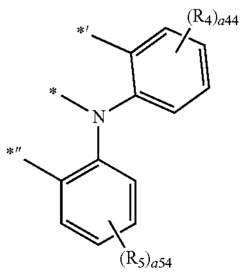
Formula A4-1(6)
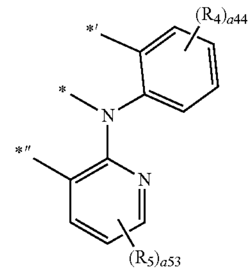
Formula A4-1(2)
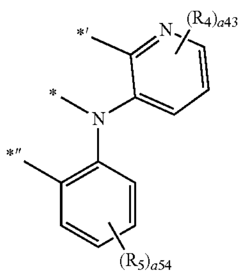
Formula A4-1(7)
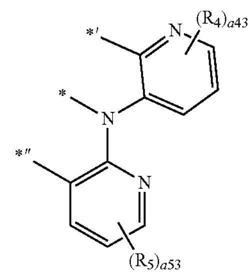
Formula A4-1(3)
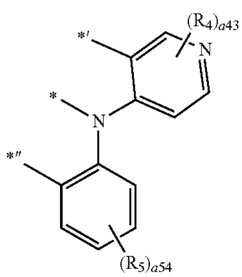
Formula A4-1(8)
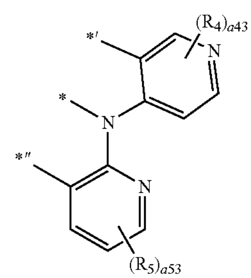
Formula A4-1(4)
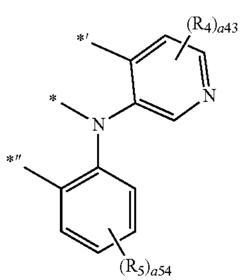
Formula A4-1(9)
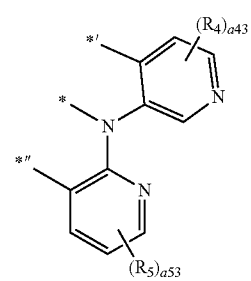
Formula A4-1(5)
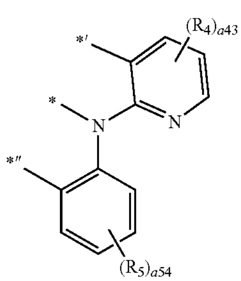
Formula A4-1(10)
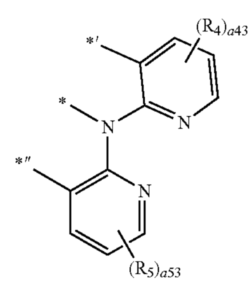

Formula A4-1(11)
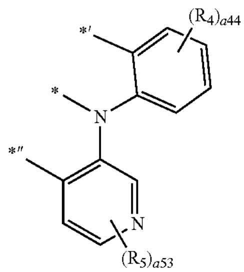
Formula A4-1(12)
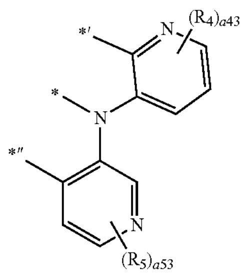
Formula A4-1(13)
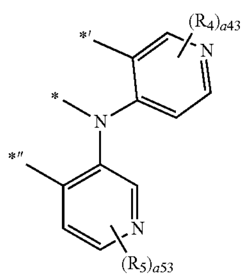
Formula A4-1(14)
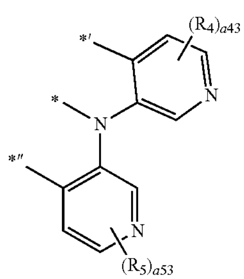
Formula A4-1(15)
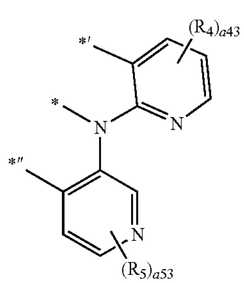
Formula A4-1(16)
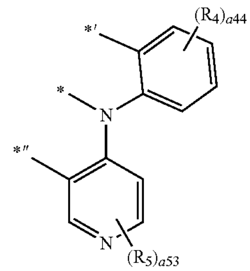
Formula A4-1(17)
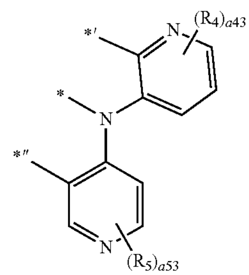
Formula A4-1(18)
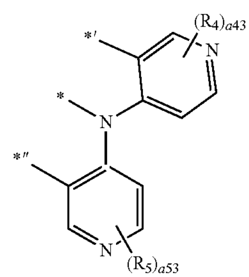
Formula A4-1(19)
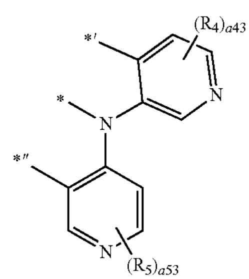
Formula A4-1(20)
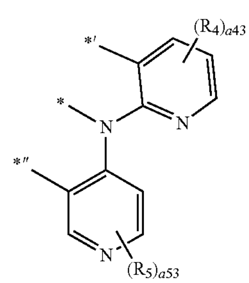

-continued
Formula A4-1(21)
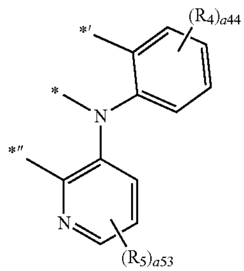
Formula A4-1(22)
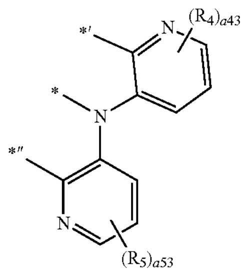
Formula A4-1(23)
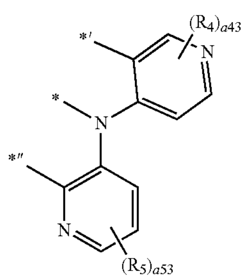
Formula A4-1(24)
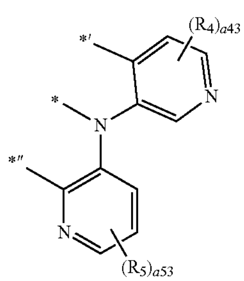
Formula A4-1(25)
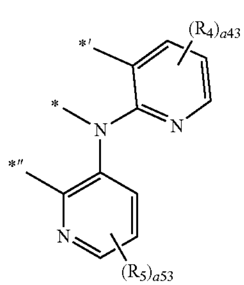
-continued
Formula A4-1(26)
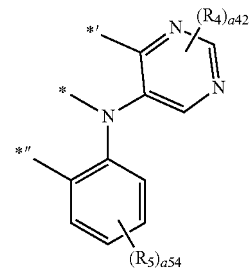
Formula A4-1(27)
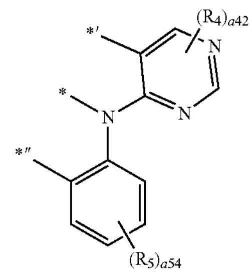
Formula A4-1(28)
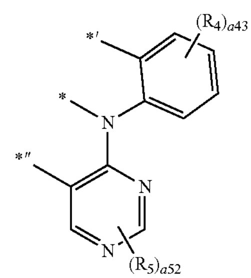
Formula A4-1(29)
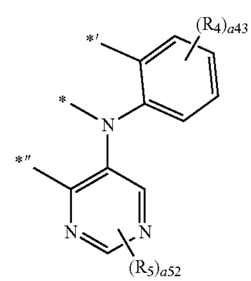
Formula A4-1(30)
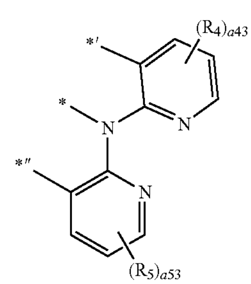
Formula A4-1(31)
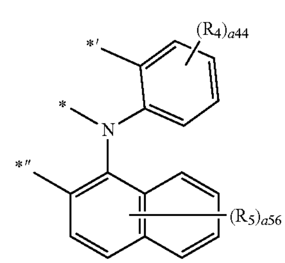

-continued

Formula A4-1(32)

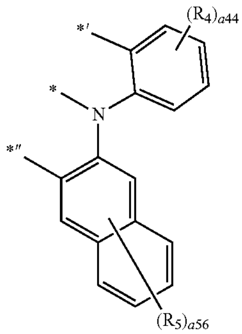

Formula A4-1(33)

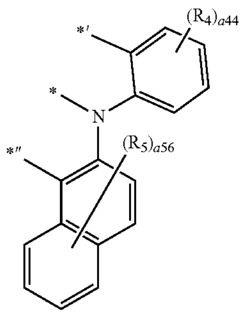

Formula A4-1(34)

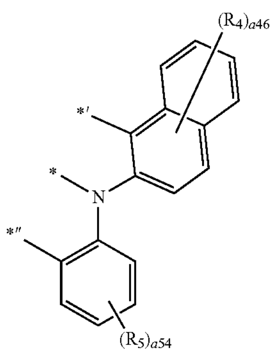

Formula A4-1(35)

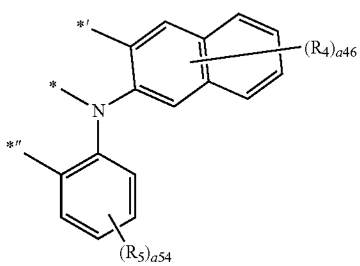

Formula A4-1(36)

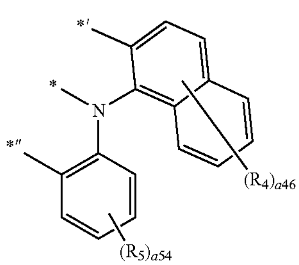

In Formulae A4-1(1) to A4-1(36), $R_4$ and $R_5$ are the same as described herein, a46 and a56 may each independently be an integer from 0 to 6, a44 and a54 may each independently be an integer from 0 to 4, a43 and a53 may each independently be an integer from 0 to 3, a42 and a52 may each independently be an integer from 0 to 2, and

*, *', and *" are the same as described in connection with *, *', and *" in Formula A4.

In one or more embodiments, in Formula 1, $A_1$ may be represented by one of Formulae CY1-1 to CY1-25, and/or $A_2$ may be represented by one of Formulae CY2-1 to CY2-15, and/or $A_3$ may be represented by one of Formulae CY3-1 to CY3-41, and/or $A_4$ may be represented by one of Formulae CY4-1 to CY4-27:

Formula CY1-1

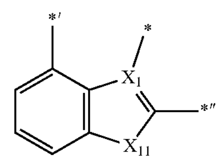

Formula CY1-2

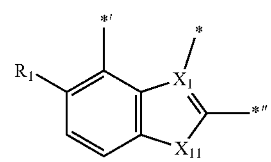

Formula CY1-3

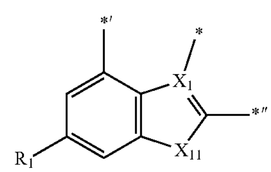

Formula CY1-4

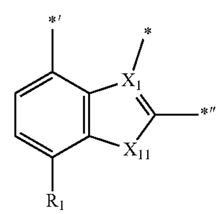

Formula CY1-5

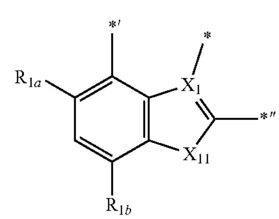

Formula CY1-6

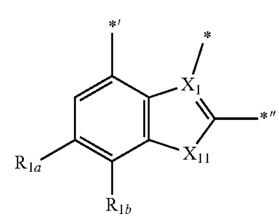

-continued
Formula CY1-7
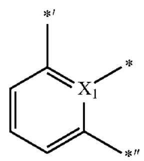
Formula CY1-8
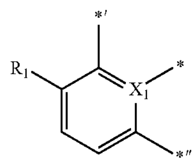
Formula CY1-9
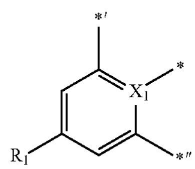
Formula CY1-10
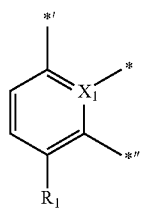
Formula CY1-11
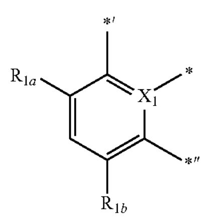
Formula CY1-12
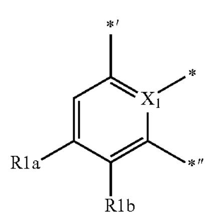
Formula CY1-13
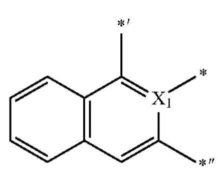
Formula CY1-14
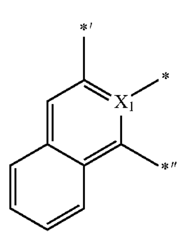
-continued
Formula CY1-15
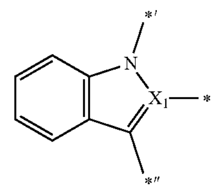
Formula CY1-16
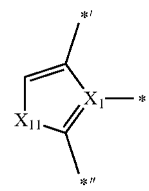
Formula CY1-17
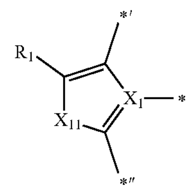
Formula CY1-18
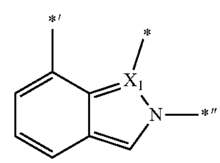
Formula CY1-19
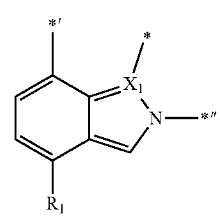
Formula CY1-20
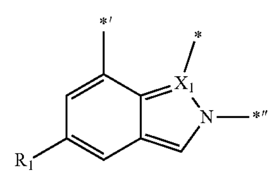
Formula CY1-21
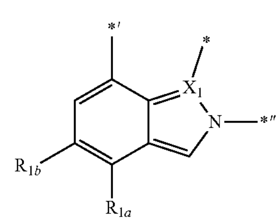
Formula CY1-22
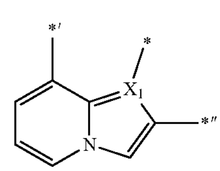

-continued
Formula CY1-23
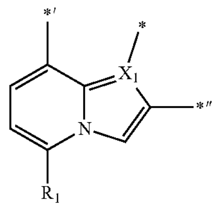
Formula CY1-24
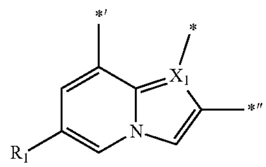
Formula CY1-25
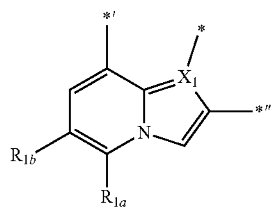
Formula CY2-1
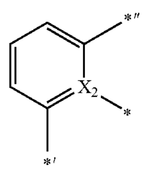
Formula CY2-2
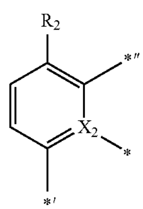
Formula CY2-3
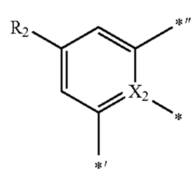
Formula CY2-4
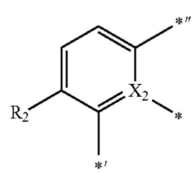
Formula CY2-5
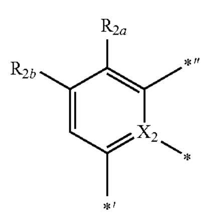
-continued
Formula CY2-6
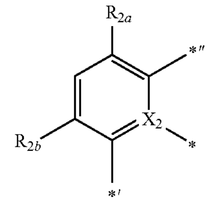
Formula CY2-7
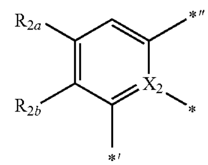
Formula CY2-8
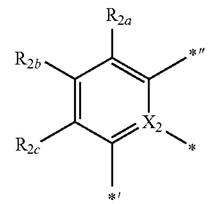
Formula CY2-9
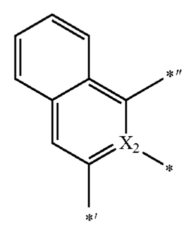
Formula CY2-10
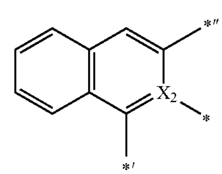
Formula CY2-11
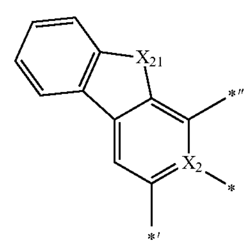
Formula CY2-12
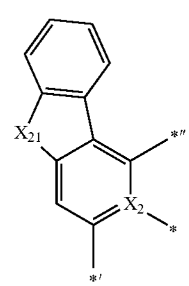

-continued
Formula CY2-13
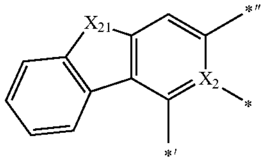
Formula CY2-14
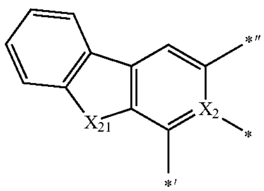
Formula CY2-15
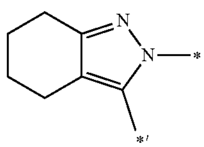
Formula CY3-1
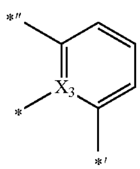
Formula CY3-2
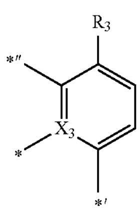
Formula CY3-3
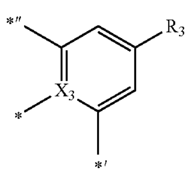
Formula CY3-4
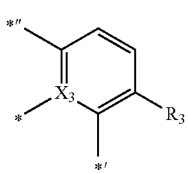
Formula CY3-5
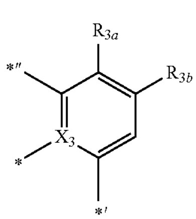
-continued
Formula CY3-6
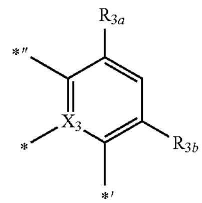
Formula CY3-7
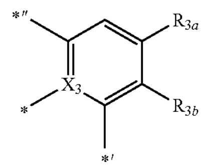
Formula CY3-8
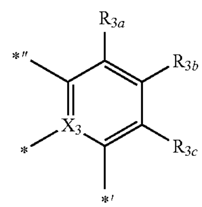
Formula CY3-9
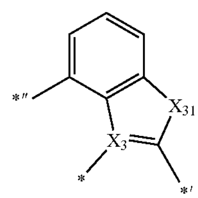
Formula CY3-10
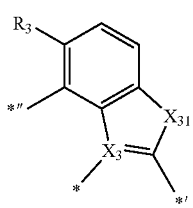
Formula CY3-11
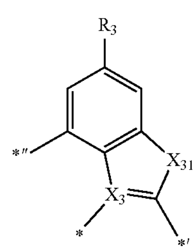
Formula CY3-12
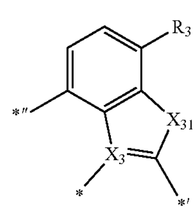

-continued
Formula CY3-13
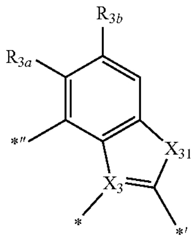
Formula CY3-14
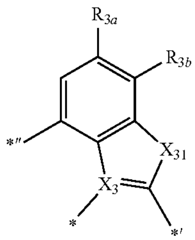
Formula CY3-15
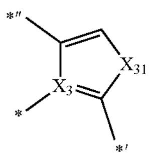
Formula CY3-16
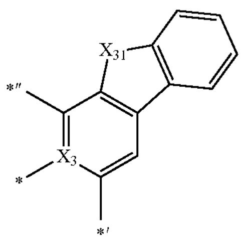
Formula CY3-17
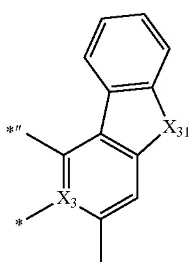
Formula CY3-18
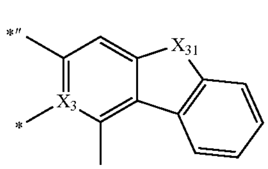
Formula CY3-19
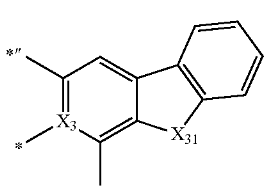
-continued
Formula CY3-20
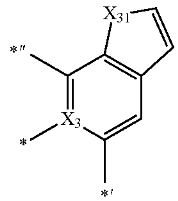
Formula CY3-21
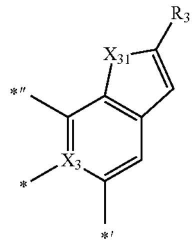
Formula CY3-22
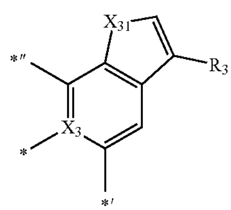
Formula CY3-23
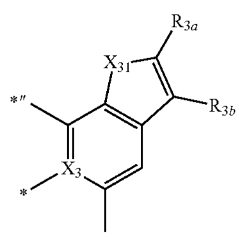
Formula CY3-24
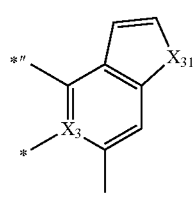
Formula CY3-25
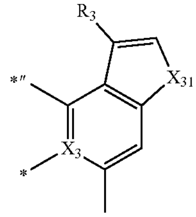

-continued
Formula CY3-26
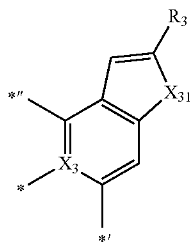
Formula CY3-27
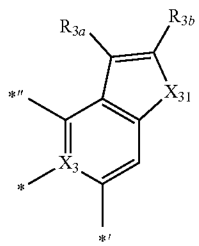
Formula CY3-28
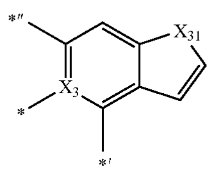
Formula CY3-29
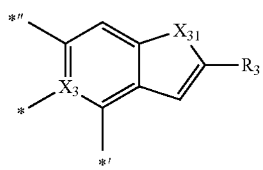
Formula CY3-30
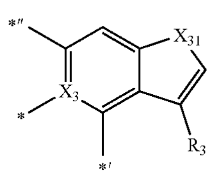
Formula CY3-31
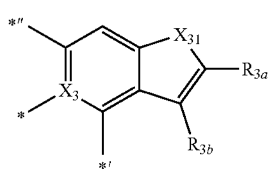
Formula CY3-32
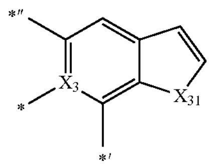
-continued
Formula CY3-33
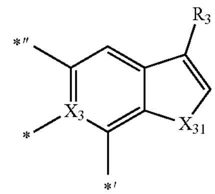
Formula CY3-34
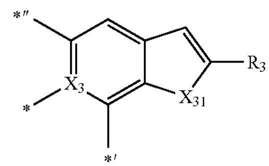
Formula CY3-35
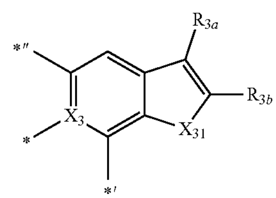
Formula CY3-36
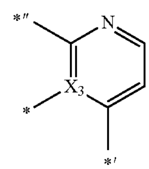
Formula CY3-37
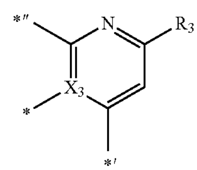
Formula CY3-38
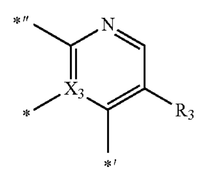
Formula CY3-39
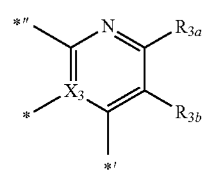
Formula CY3-40
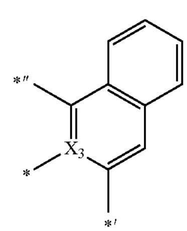

-continued
Formula CY3-41
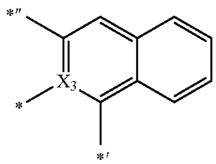
Formula CY4-1
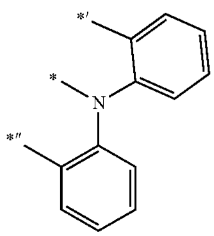
Formula CY4-2
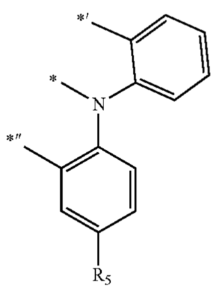
Formula CY4-3
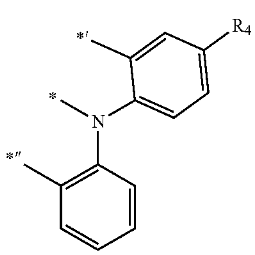
Formula CY4-4
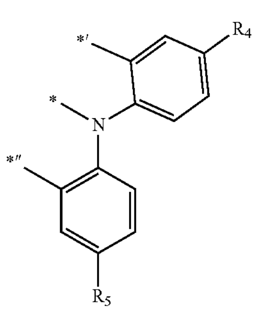
Formula CY4-5
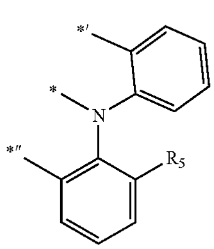
-continued
Formula CY4-6
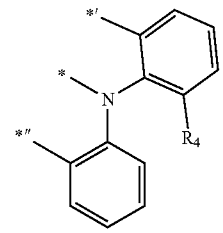
Formula CY4-7
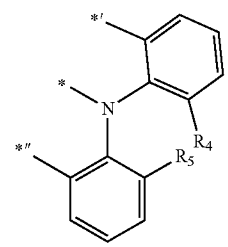
Formula CY4-8
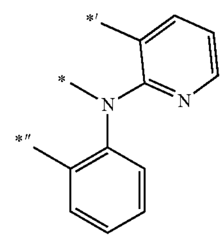
Formula CY4-9
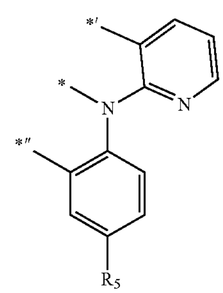
Formula CY4-10
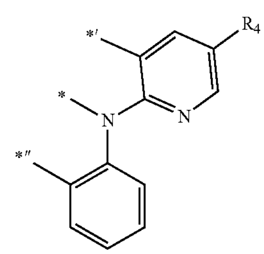
Formula CY4-11
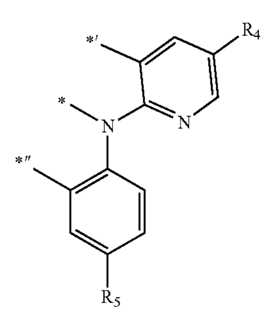

-continued
Formula CY4-12
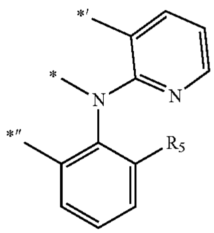
Formula CY4-13
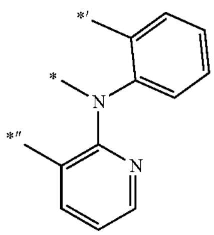
Formula CY4-14
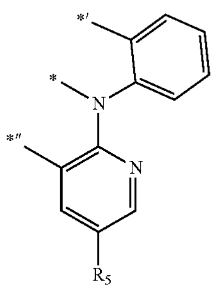
Formula CY4-15
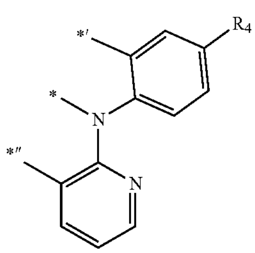
Formula CY4-16
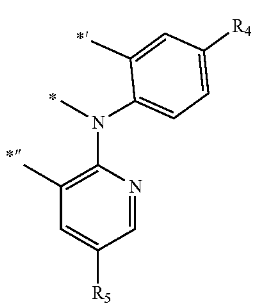
Formula CY4-17
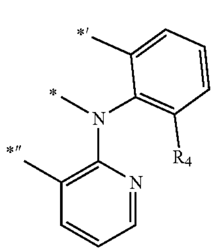
-continued
Formula CY4-18
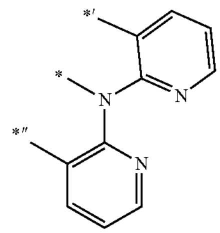
Formula CY4-19
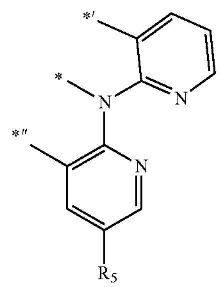
Formula CY4-20
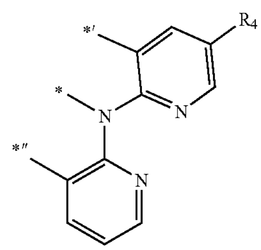
Formula CY4-21
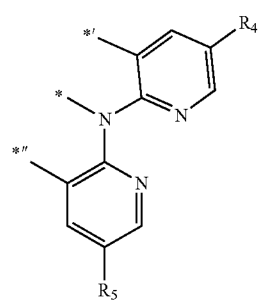
Formula CY4-22
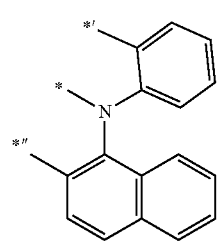
Formula CY4-23
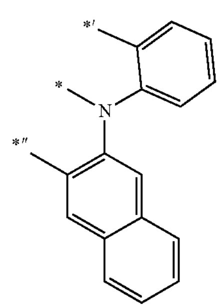

-continued

Formula CY4-24

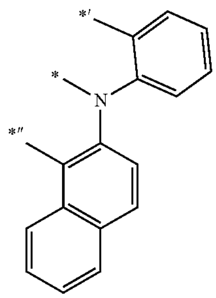

Formula CY4-25

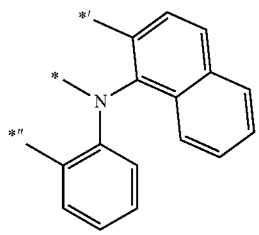

Formula CY4-26

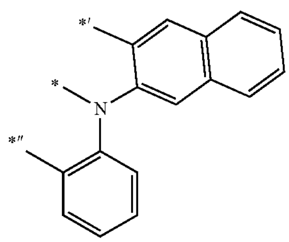

Formula CY4-27

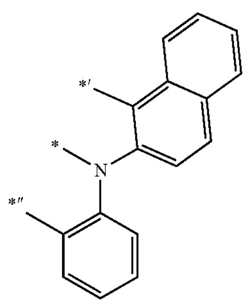

In Formulae CY1-1 to CY1-25, CY2-1 to CY2-15, CY3-1 to CY3-41, and CY4-1 to CY4-27, $X_1$ to $X_3$ and $R_1$ to $R_5$ are each independently the same described herein, $X_{11}$ may be O, S, $N(R_{11})$, $C(R_{11})(R_{12})$, or $Si(R_{11})(R_{12})$, $X_{21}$ may be O, S, $N(R_{21})$, $C(R_{21})(R_{22})$, or $Si(R_{21})(R_{22})$, $X_{31}$ may be O, S, $N(R_{31})$, $C(R_{31})(R_{32})$, or $Si(R_{31})(R_{32})$, $R_{1a}$, $R_{1b}$, $R_{11}$, and $R_{12}$ are each independently the same as described in connection with $R_1$, $R_{2a}$ to $R_{2c}$, $R_{21}$, and $R_{22}$ are each independently the same as described in connection with $R_2$, $R_{3a}$ to $R_{3c}$, $R_{31}$, and $R_{32}$ are each independently the same as described in connection with $R_3$,

*, *', and *" in Formulae CY1-1 to CY1-25 are the same as described in connection with *, *', and *" in Formula A1-1,

*, *', and *" in Formulae CY2-1 to CY2-15 are the same as described in connection with *, *', and *" in Formula A2-1,

*, *', and *" in Formulae CY3-1 to CY3-41 are the same as described in connection with *, *', and *" in Formula A3-1, and

*, *', and *" in Formulae CY4-1 to CY4-27 are the same as described in connection with *, *', and *" in Formula A4.

In one or more embodiments, in Formula 1, i) one of groups $R_1$ in the number of a1 and one of groups $R_2$ in the number of a2 may be linked to form a substituted or unsubstituted $C_5$-$C_{30}$ carbocyclic group or a substituted or unsubstituted $C_1$-$C_{30}$ heterocyclic group, ii) one of groups $R_2$ in the number of a2 and one of groups $R_3$ in the number of a3 may be linked to form a substituted or unsubstituted $C_5$-$C_{30}$ carbocyclic group or a substituted or unsubstituted $C_1$-$C_{30}$ heterocyclic group, iii) one of groups $R_3$ in the number of a3 and one of groups $R_4$ in the number of a4 may be linked to form a substituted or unsubstituted $C_5$-$C_{30}$ carbocyclic group or a substituted or unsubstituted $C_1$-$C_{30}$ heterocyclic group, or iv) one of groups $R_4$ in the number of a4 and one of groups $R_1$ in the number of a1 may be linked to form a substituted or unsubstituted $C_5$-$C_{30}$ carbocyclic group or a substituted or unsubstituted $C_1$-$C_{30}$ heterocyclic group.

In one or more embodiments, the organometallic compound may be represented by one of Formulae 1-1 to 1-4:

Formula 1-1

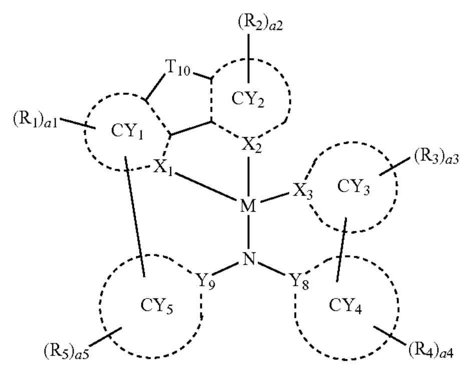

Formula 1-2

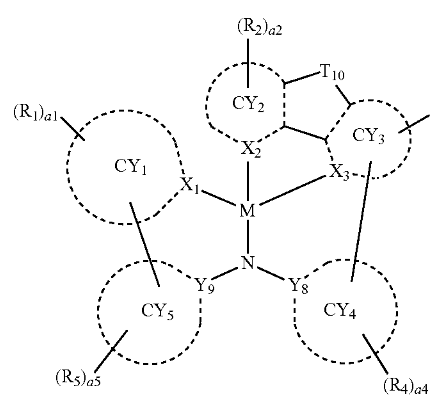

-continued

Formula 1-3

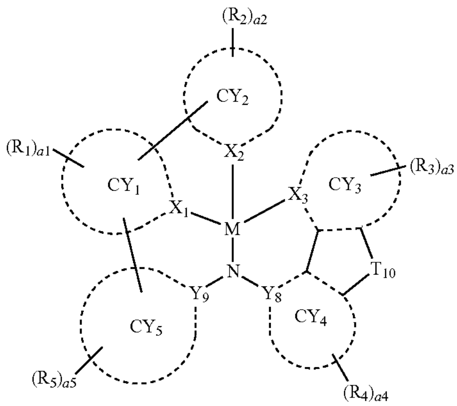

Formula 1-4

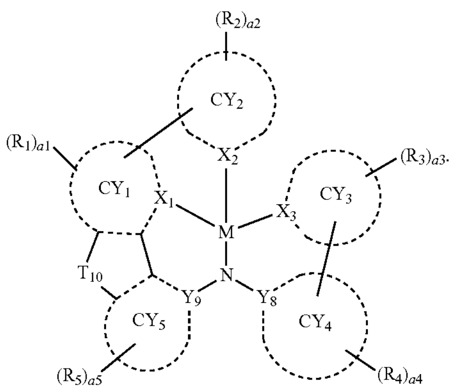

In Formulae 1-1 to 1-4,

M, $X_1$ to $X_3$, rings $CY_1$ to $CY_5$, $R_1$ to $R_5$, and a1 to a5 are each independently the same as described herein, $Y_8$ and $Y_9$ may each independently be N or C, $T_{10}$ may be selected from a single bond, a double bond, *—N(R')—*', *—B(R')—*', *—P(R')—*', *—C(R')(R")—*', *—Si(R')(R")—*', *—Ge(R')(R")—*', *—S—*', *—Se—*', *—O—*', *—C(═O)—*', *—S(═O)—*', *—S(═O)$_2$—*', *—C(R')═*', *═C(R')—*', *—C(R')═C(R")—*', *—C(═S)—*', and *—C≡C—*', and R' and R" are the same as described in connection with $R_7$ and $R_8$.

The organometallic compound represented by Formula 1 may be one of Compounds 1 to 78:

1

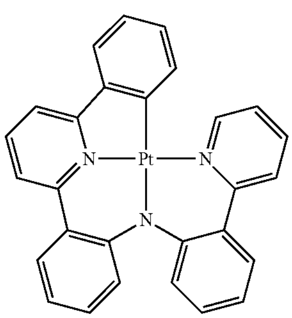

-continued

2

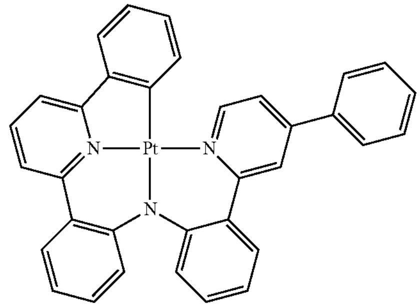

3

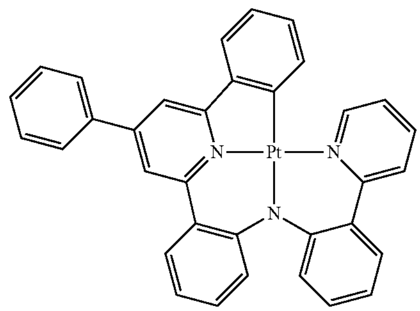

4

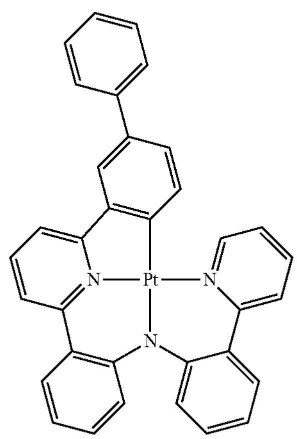

5

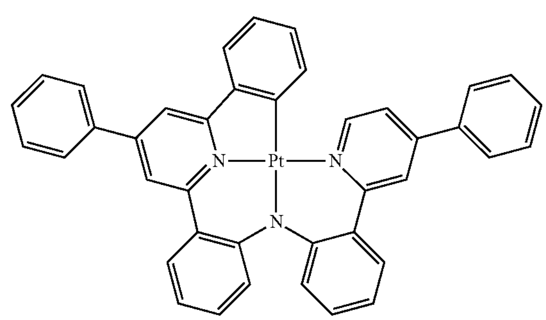

-continued
6
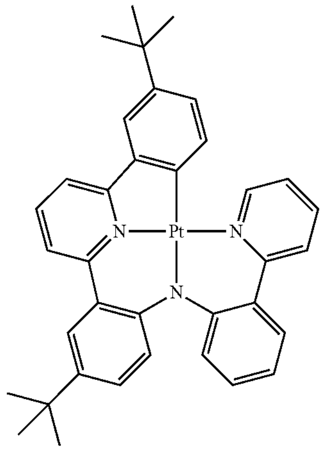
7
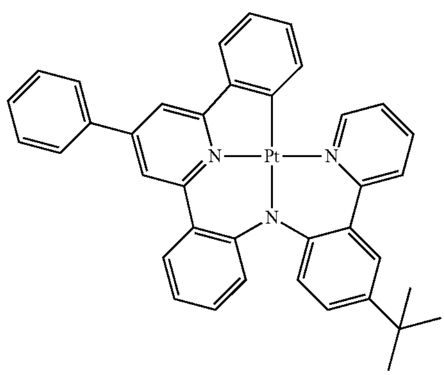
8
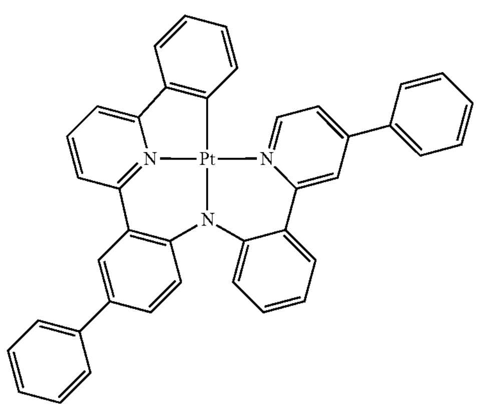
9
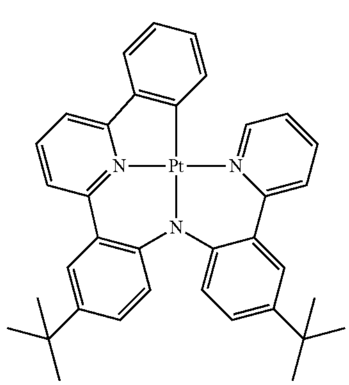
-continued
10
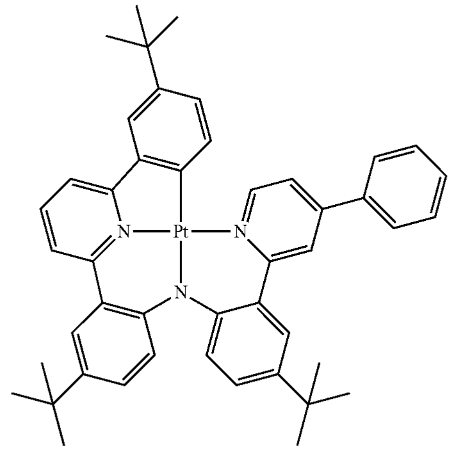
11
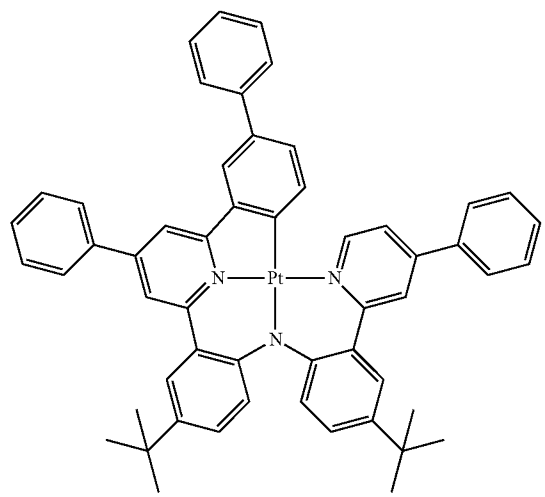
12
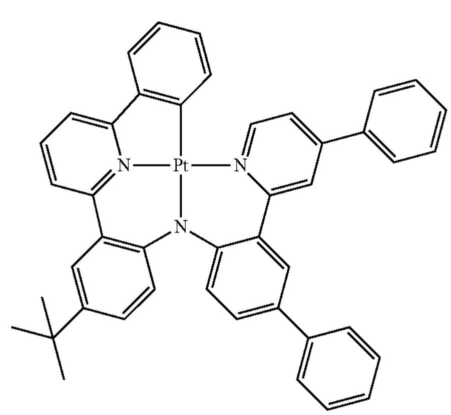

13
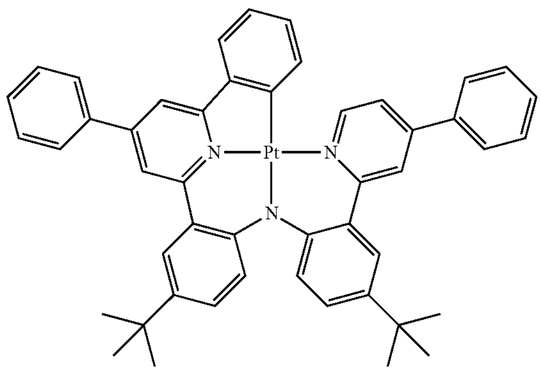
14
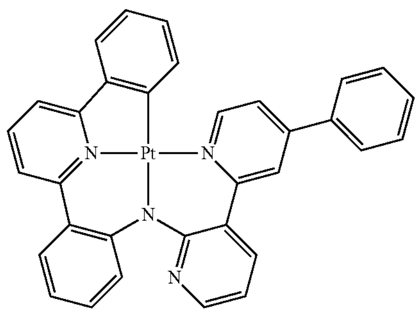
15
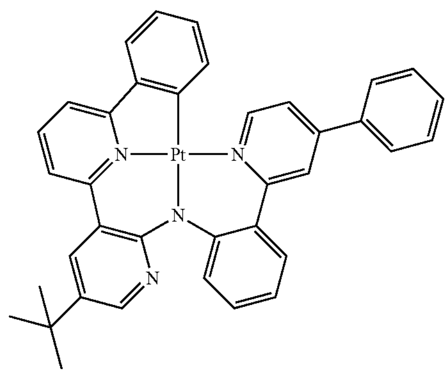
16
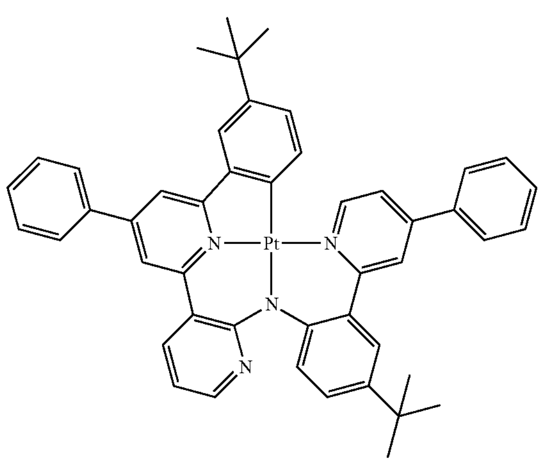
17
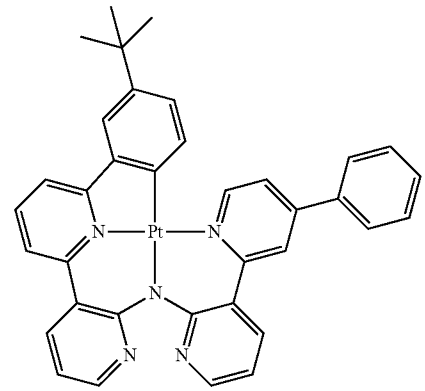
18
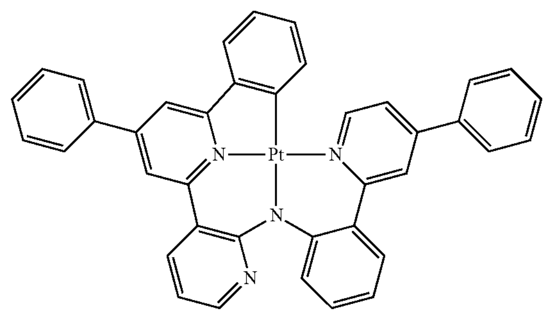
19
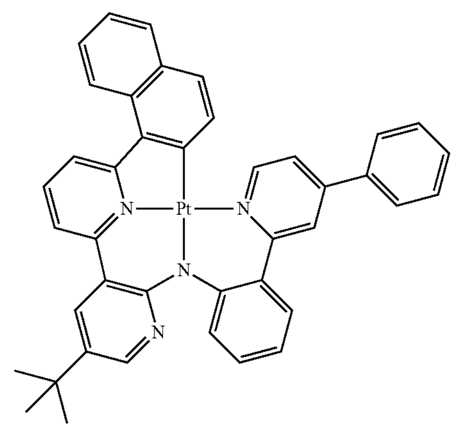
20
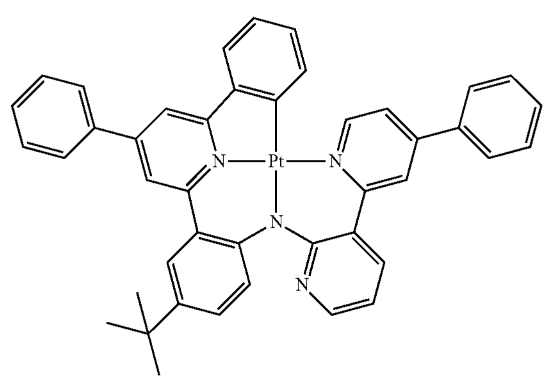

-continued
21
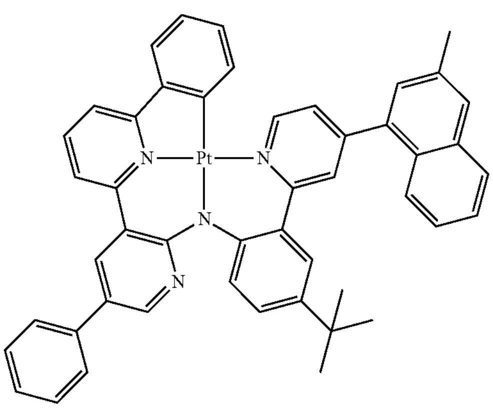
22
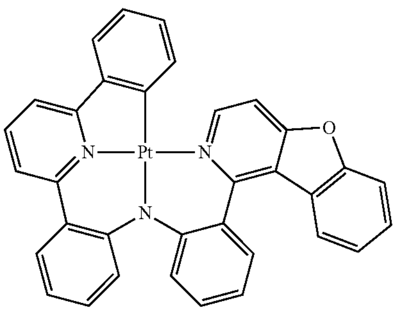
23
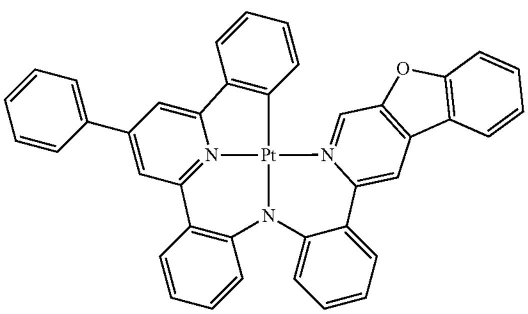
24
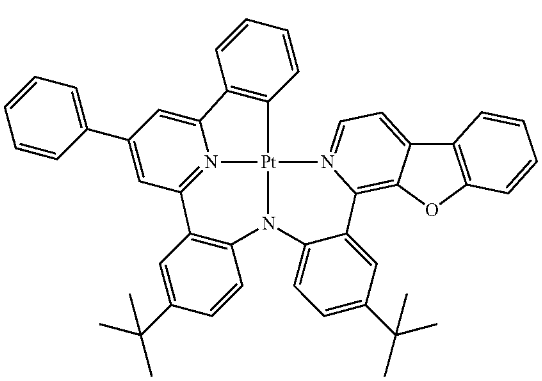
-continued
25
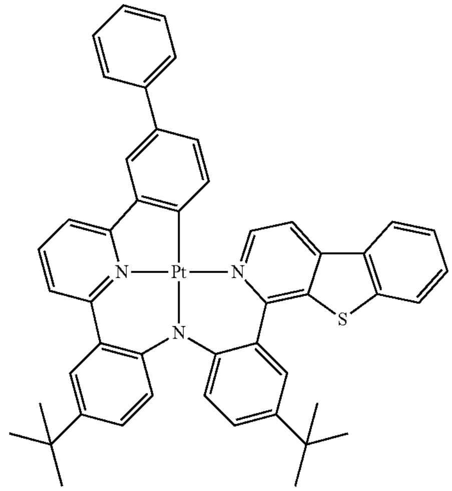
26
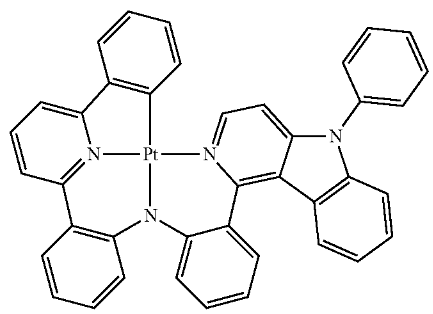
27
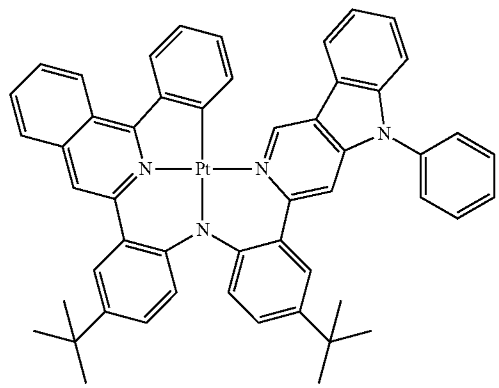
28
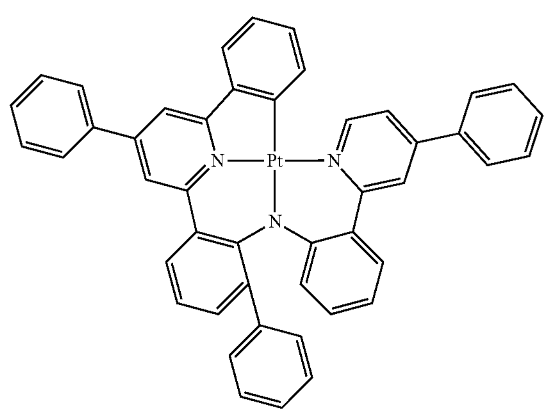

-continued
29
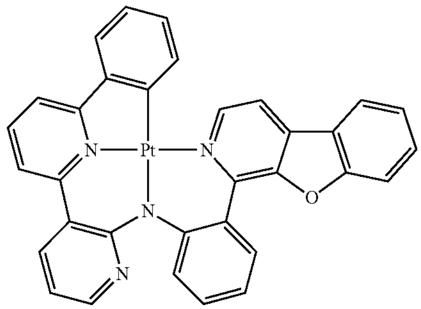
30
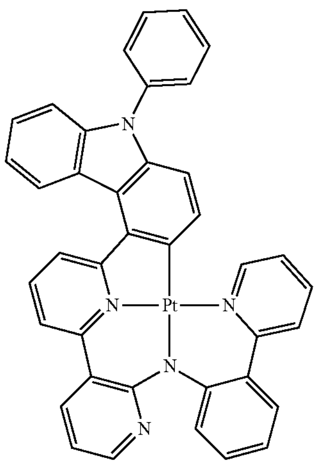
31
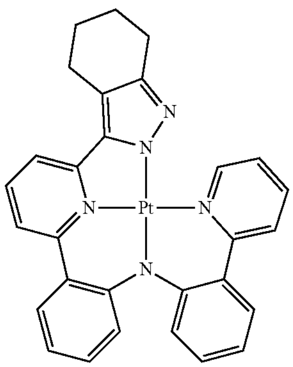
32
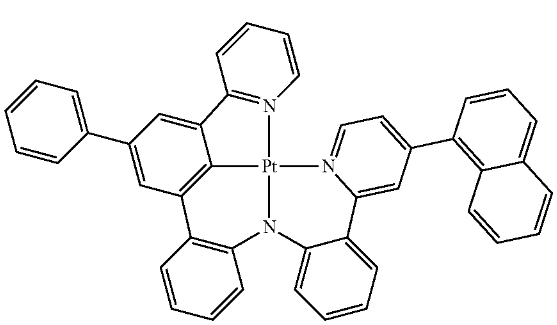
-continued
33
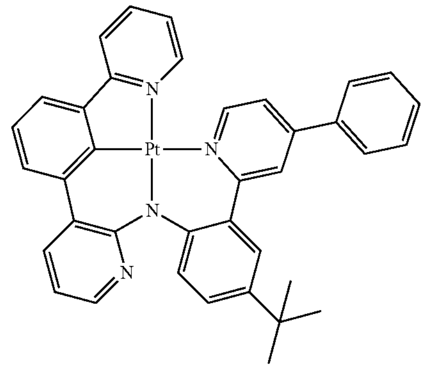
34
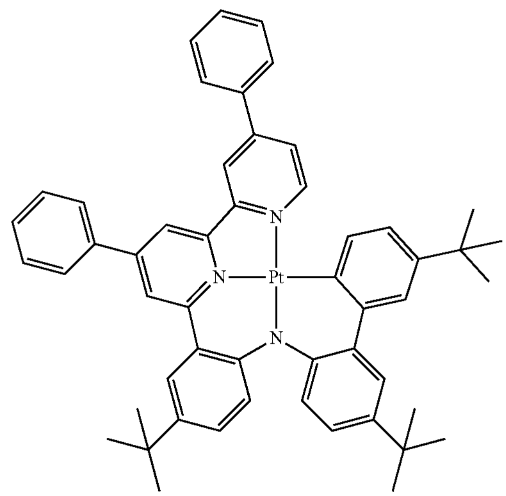
35
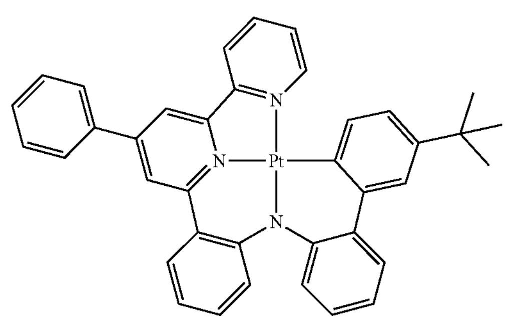
36
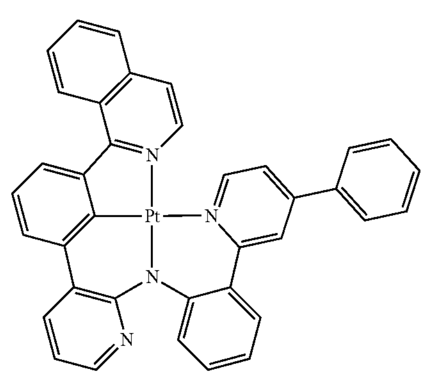

-continued
37
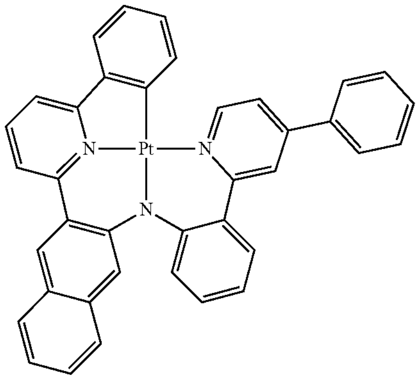
38
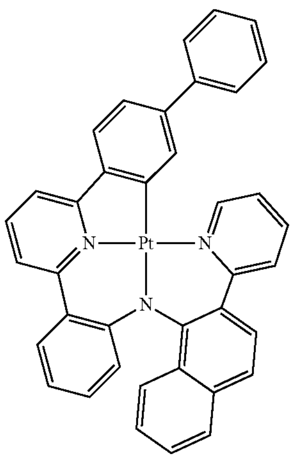
39
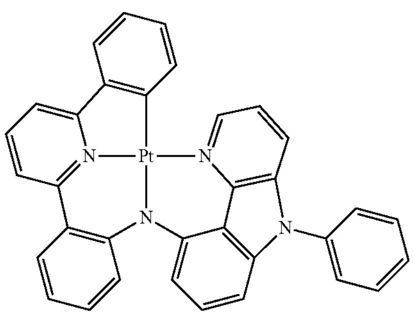
40
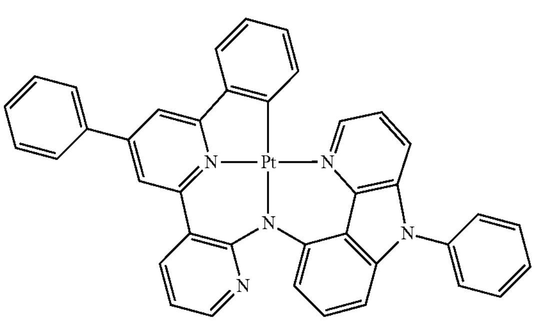
-continued
41
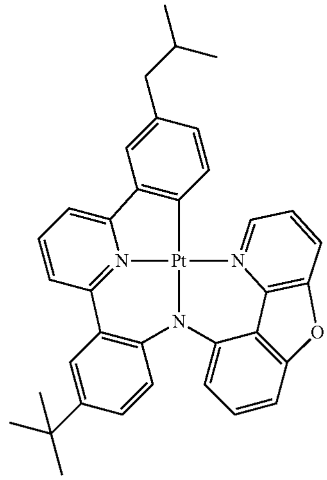
42
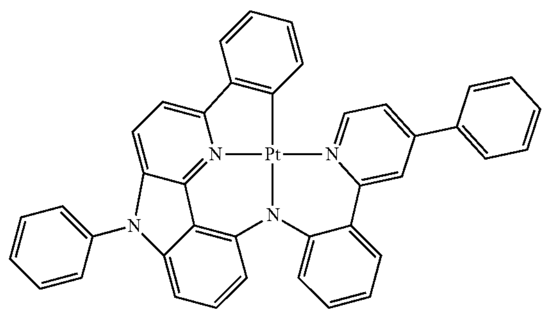
43
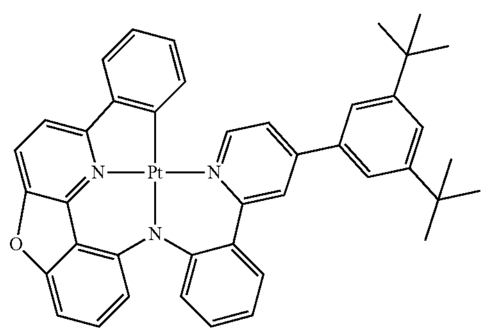
44
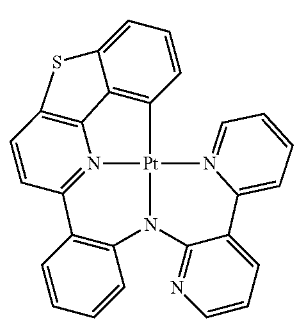

45
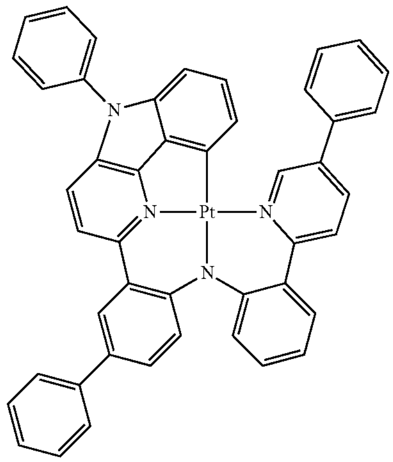
46
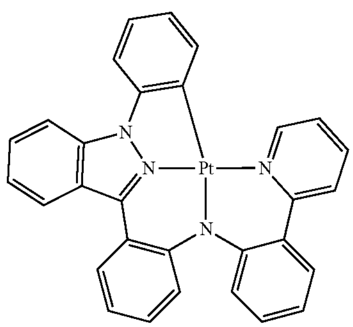
47
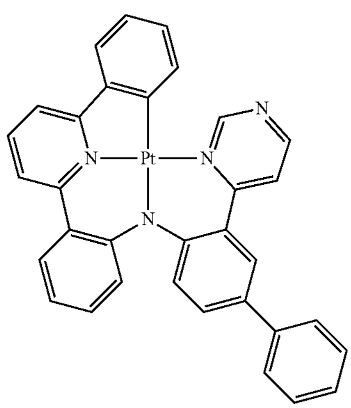
48
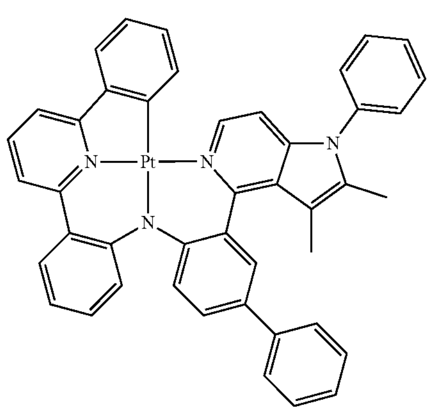
49
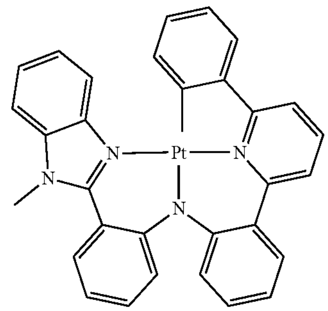
50
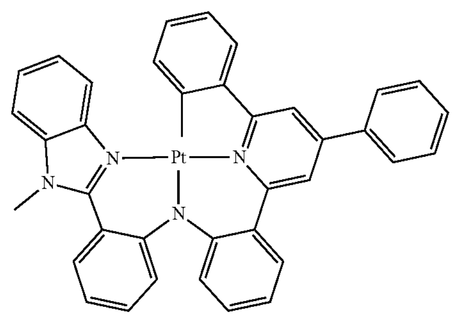
51
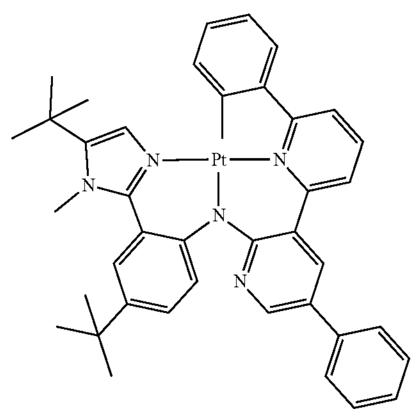
52
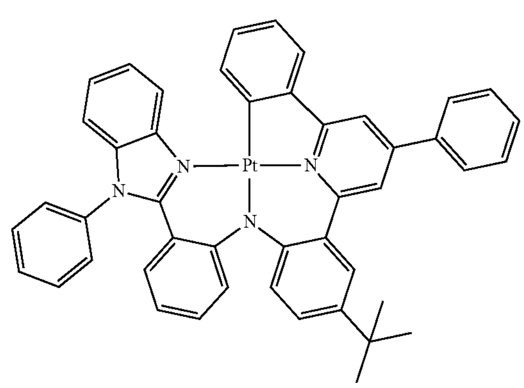

53
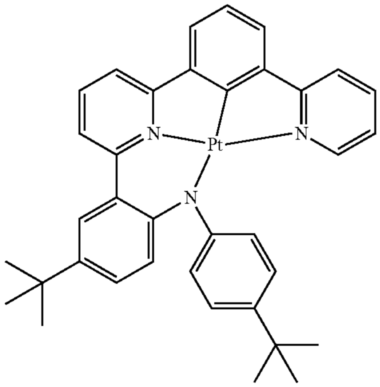
54
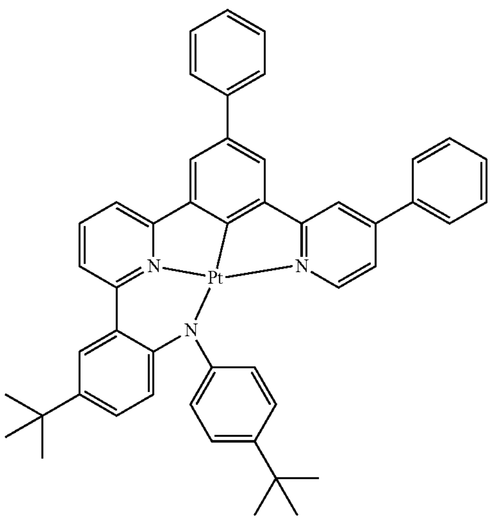
55
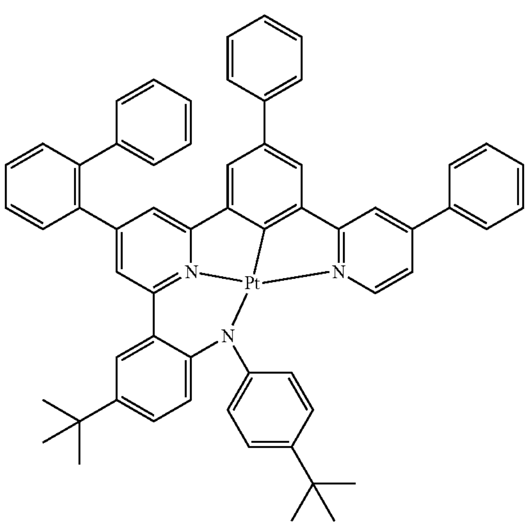
56
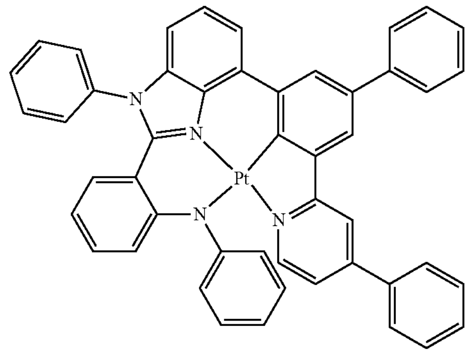
57
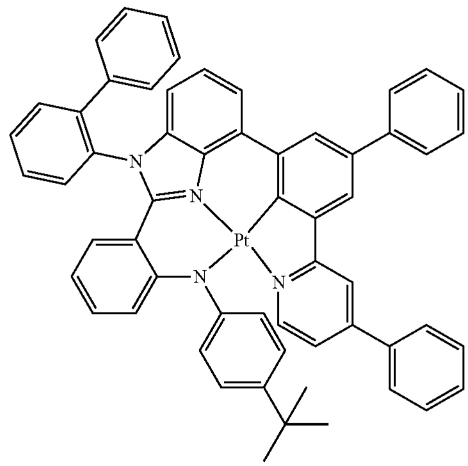
58
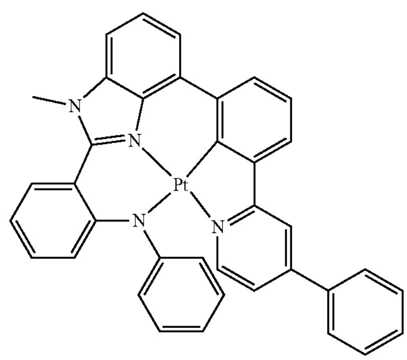
59
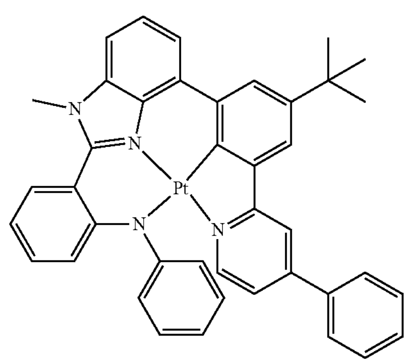

60
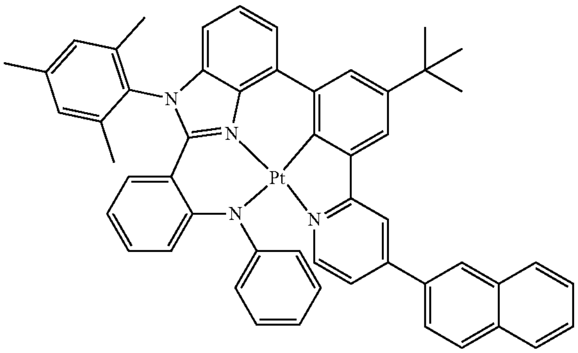
61
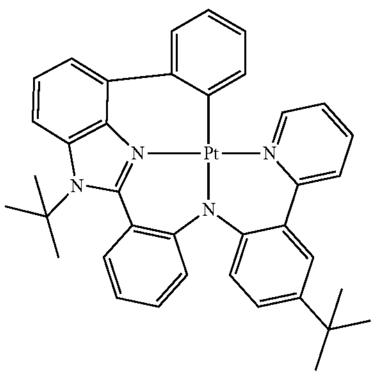
62
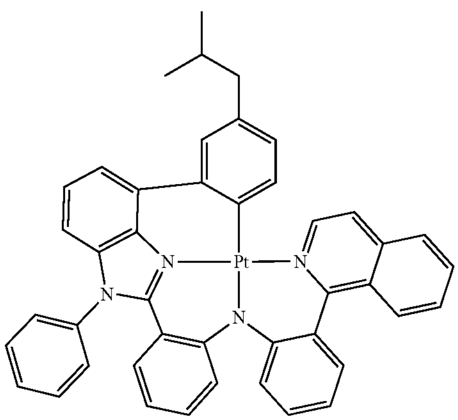
63
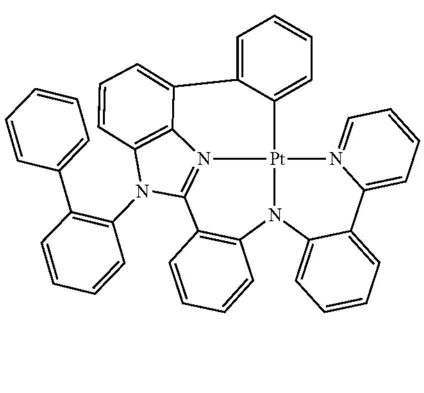
64
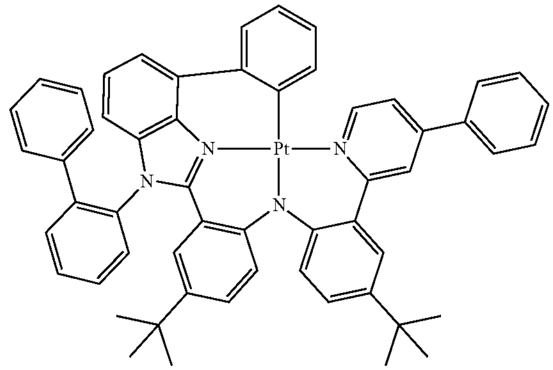
65
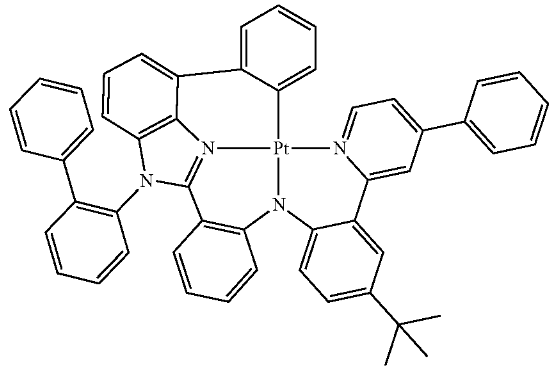
66
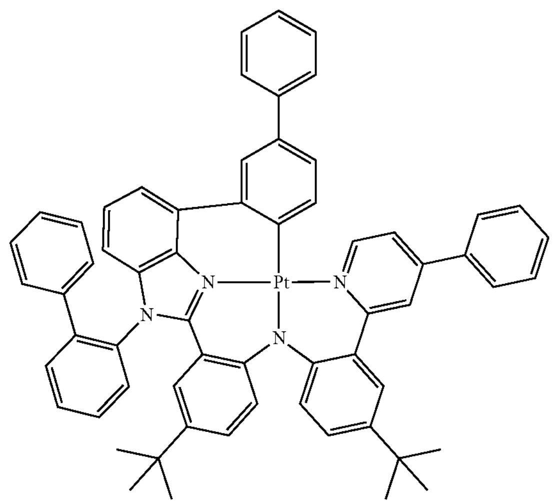
67
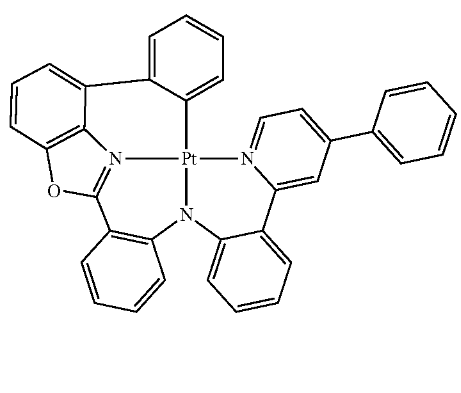

68
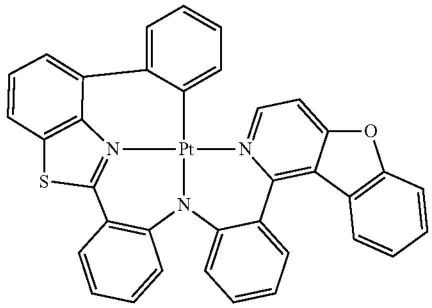
69
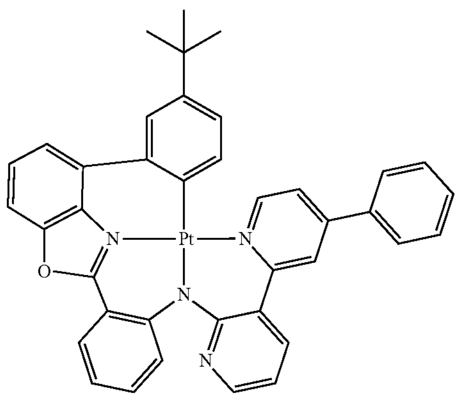
70
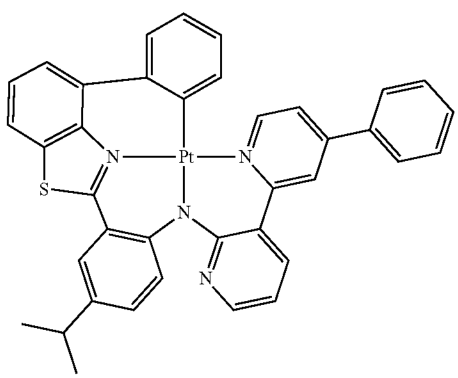
71
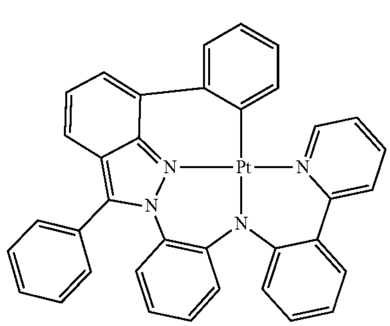
72
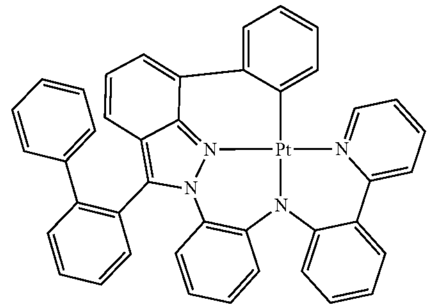
73
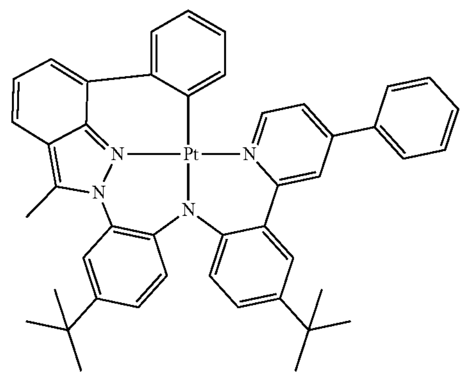
74
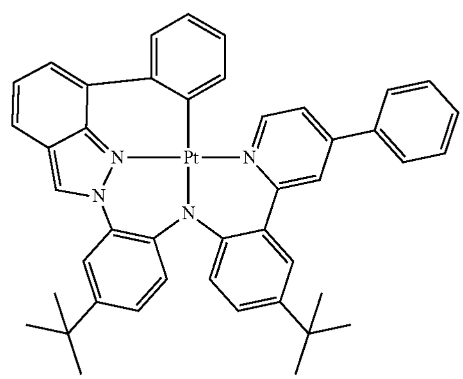
75
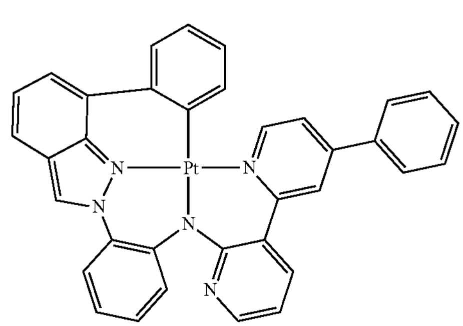

-continued

76

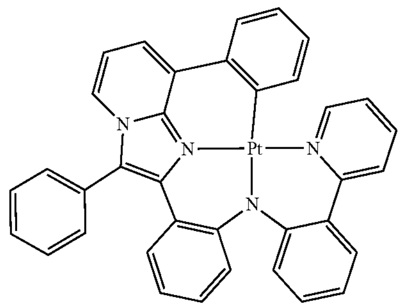

77

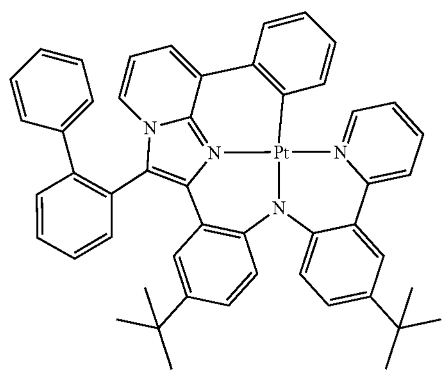

78

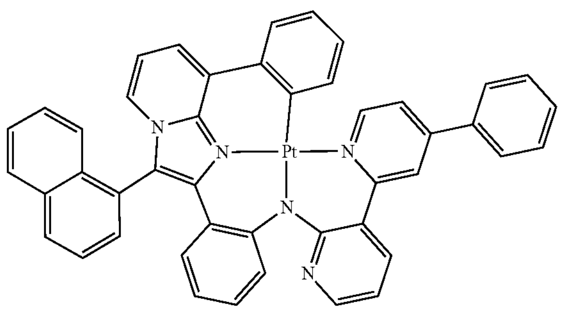

As described above, $A_4$ in Formula 1 is represented by Formula A4. That is, the amine represented by Formula A4 is introduced into a moiety that affects the highest occupied molecular orbital (HOMO) energy level in the organometallic compound represented by Formula 1. Due to this, electron donating characteristics of the organometallic compound represented by Formula 1 may be improved. Therefore, an electronic device, for example, an organic light-emitting device, which includes the organometallic compound, may have improved efficiency and a controlled emission wavelength.

For example, the highest occupied molecular orbital (HOMO), the lowest unoccupied molecular orbital (LUMO), and triplet ($T_1$) energy levels of some of the organometallic compounds illustrated above were evaluated by using a DFT method of Gaussian program (structurally optimized at a level of B3LYP, 6-31G(d,p)). Evaluation results are shown in Table 1 below.

TABLE 1

| Compound No. | HOMO (eV) | LUMO (eV) | $T_1$ energy level (eV) |
|---|---|---|---|
| 1 | −4.430 | −1.534 | 2.012 |
| 5 | −4.369 | −1.748 | 1.865 |

TABLE 1-continued

| Compound No. | HOMO (eV) | LUMO (eV) | $T_1$ energy level (eV) |
|---|---|---|---|
| 13 | −4.275 | −1.709 | 1.813 |
| 18 | −4.506 | −1.775 | 1.990 |
| 23 | −4.341 | −1.894 | 1.780 |
| 49 | −4.481 | −1.367 | 2.214 |
| 56 | −4.414 | −1.706 | 2.094 |
| 63 | −4.418 | −1.438 | 2.109 |
| 64 | −4.266 | −1.656 | 1.900 |

From Table 1, it is confirmed that the organometallic compound represented by Formula 1 has such electrical characteristics that are suitable for use in an electronic device, for example, for use as a dopant for an organic light-emitting device.

Synthesis methods of the organometallic compound represented by Formula 1 may be apparent to one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect of the present disclosure provides an organic light-emitting device that includes:

a first electrode;

a second electrode; and an organic layer that is disposed between the first electrode and the second electrode, wherein the organic layer includes an emission layer and at least one organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one organometallic compound" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this embodiment, Compound 1 may be included in an emission layer of the organic light-emitting device. In one or more embodiments, the organic layer may include, as the organometallic compound, Compound 1 and Compound 2. In this embodiment, Compound 1 and Compound 2 may be included in an identical layer (for example, Compound 1 and Compound 2 may both be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, or any combination thereof, and wherein the electron transport region includes a hole blocking layer, an electron transport layer, an electron injection layer, or any combination thereof.

The term "organic layer" as used herein refers to a single layer and/or a plurality of layers disposed between the first electrode and the second electrode of the organic light-emitting device. The "organic layer" may include, in addition to an organic compound, an organometallic complex including metal.

FIG. 1 is a schematic view of an organic light-emitting device 10 according to an embodiment. Hereinafter, the structure of an organic light-emitting device according to an embodiment and a method of manufacturing an organic light-emitting device according to an embodiment will be described in connection with FIG. 1. The organic light-emitting device 10 includes a first electrode 11, an organic layer 15, and a second electrode 19, which are sequentially stacked.

A substrate may be additionally disposed under the first electrode 11 or above the second electrode 19. As the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary depending on a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Angstroms per second (Å/sec) to about 0 Å/sec, but embodiments of the present disclosure are not limited thereto.

When the hole injection layer is formed using spin coating, coating conditions may vary depending on the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

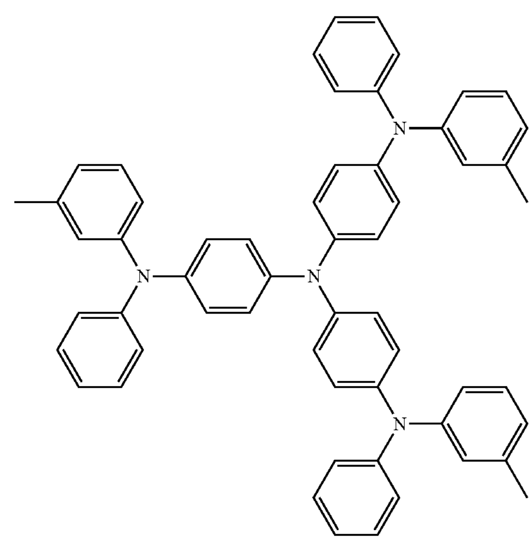

m-MTDATA

-continued
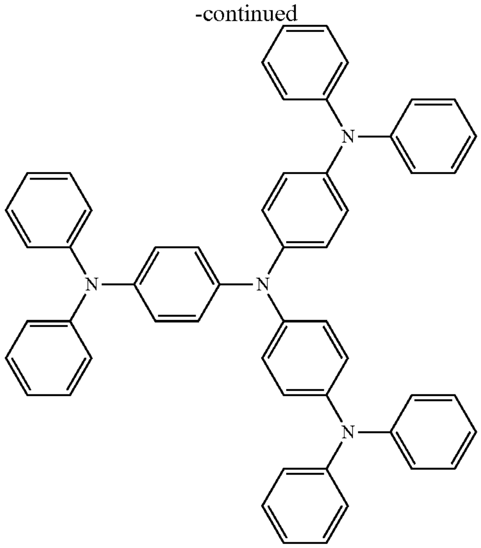
TDATA
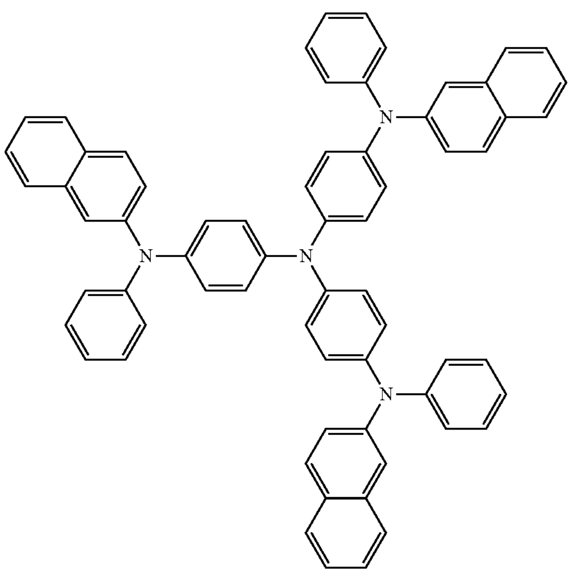
2-TNATA
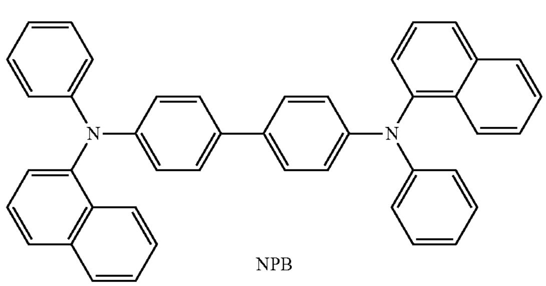
NPB
-continued
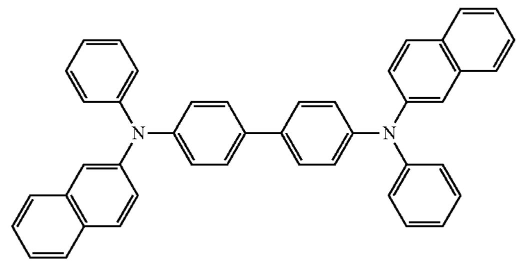
β-NPB
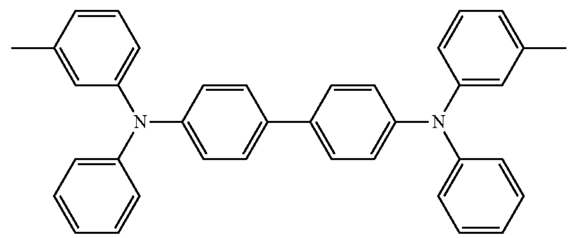
TPD
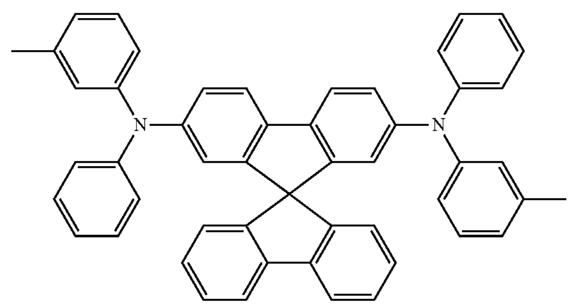
Spiro-TPD
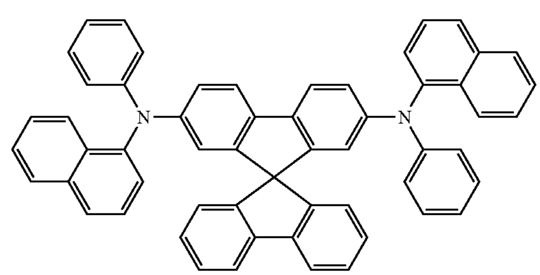
Spiro-NPB
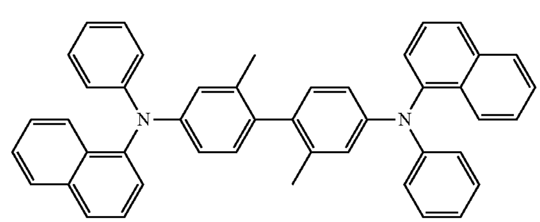
methylated NPB -continued

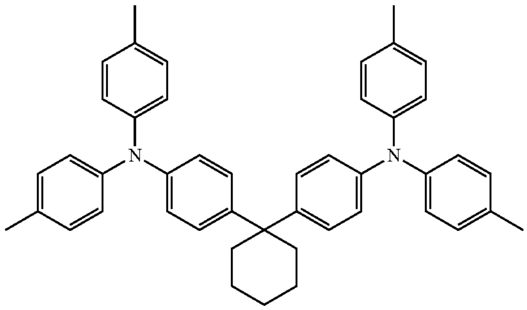

TAPC

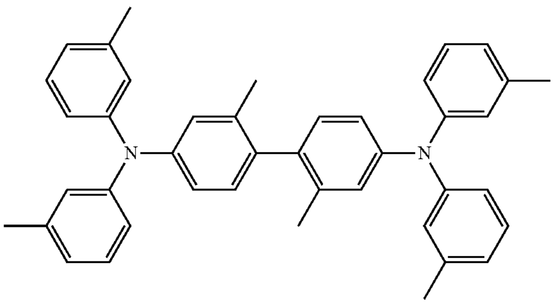

HMTPD

Formula 201

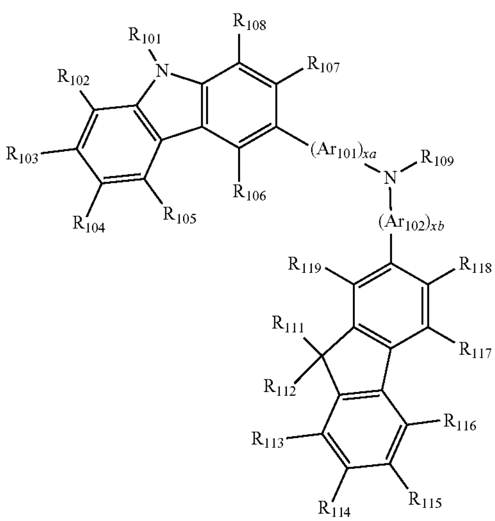

Formula 202

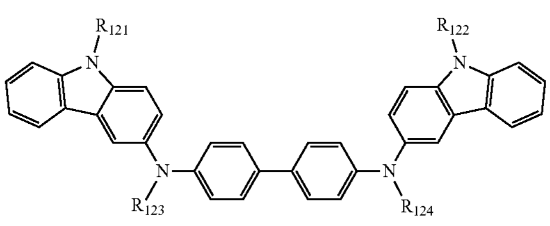

$Ar_{101}$ and $Ar_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

xa and xb in Formula 201 may each independently be an integer from 0 to 5, or may be 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), and a $C_1$-$C_{10}$ alkoxy group (for example, a methoxy group, an ethoxy group, a propoxy group, a butoxy group, a pentoxy group, and so on);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

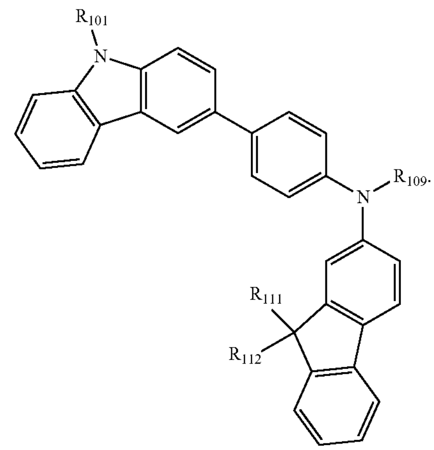

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto:

HT1

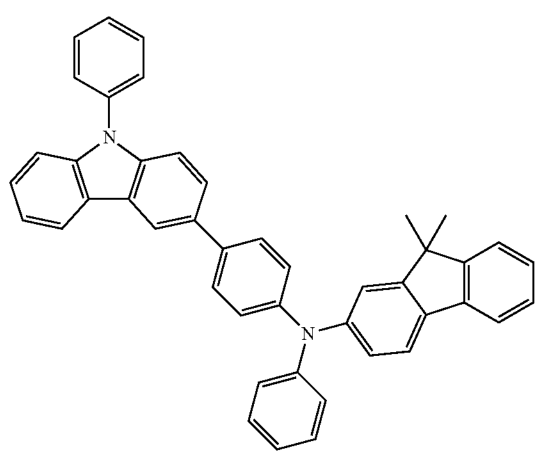

HT2

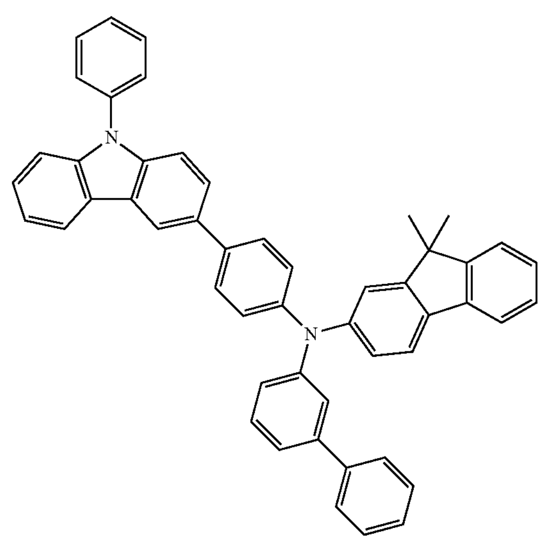

-continued
HT3
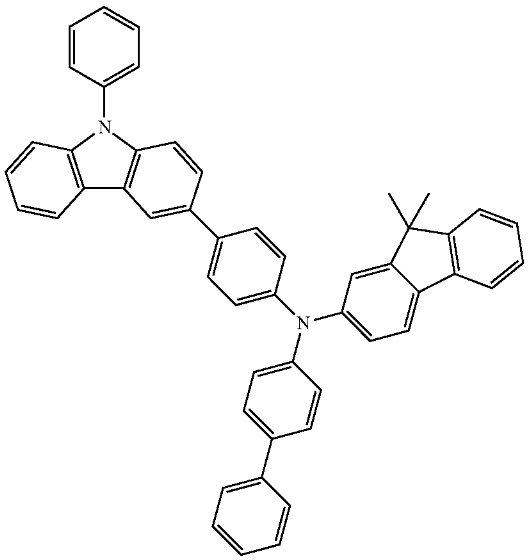
HT4
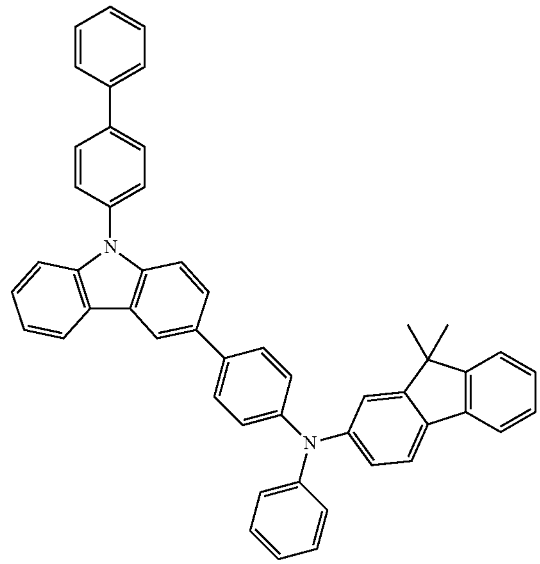
HT5
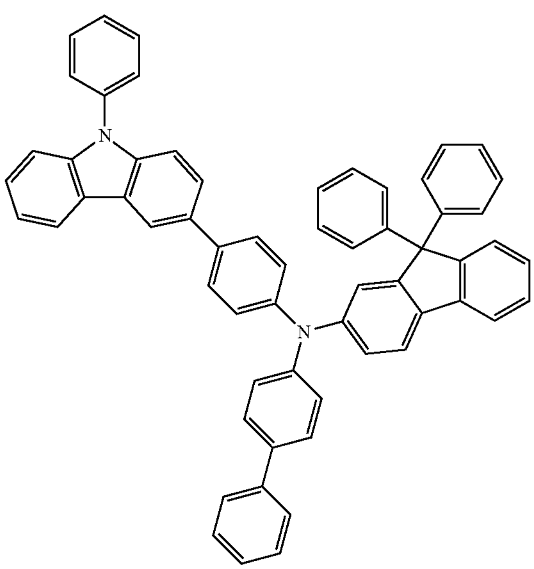
HT6
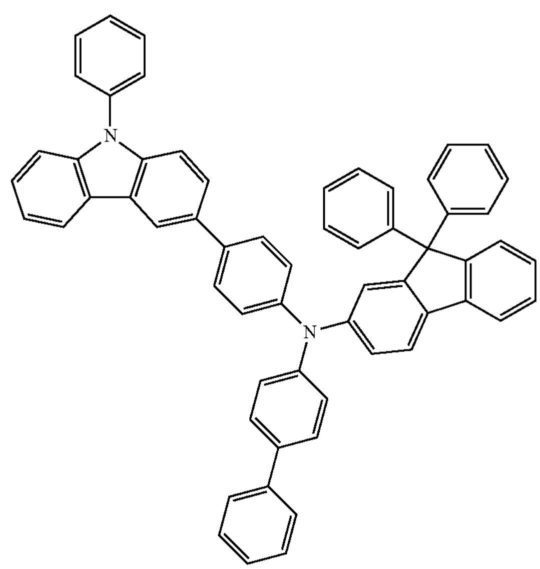

-continued
HT7
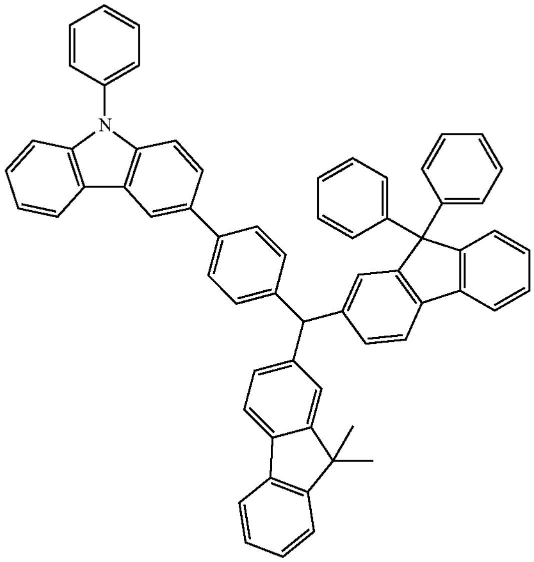
HT8
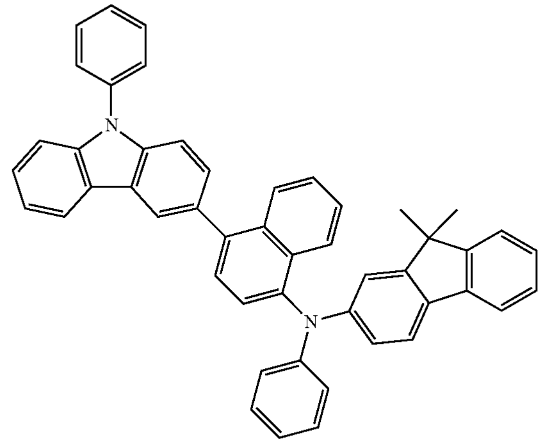
HT9
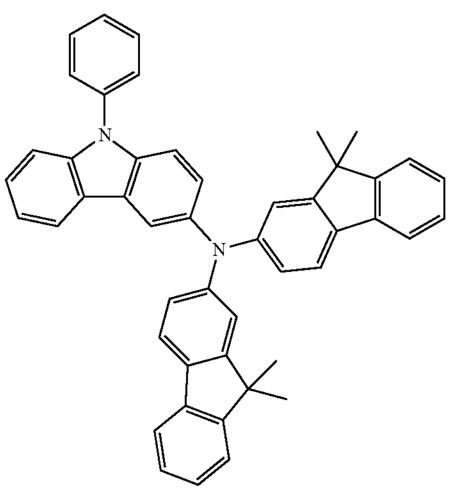
HT10
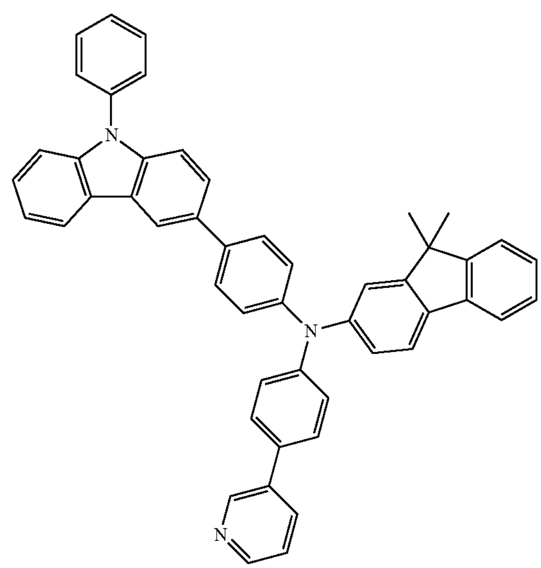

-continued
HT11
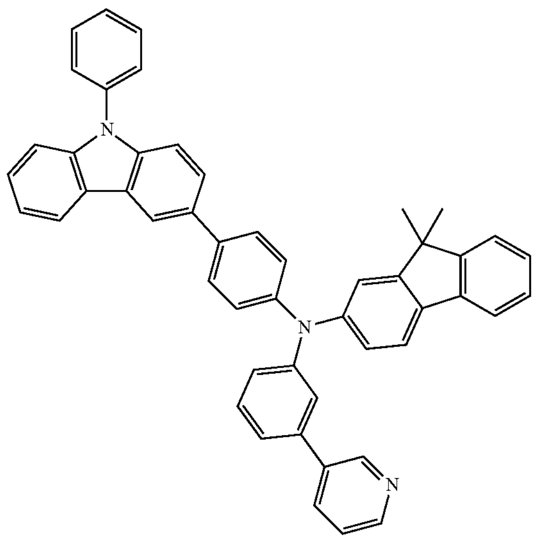
HT12
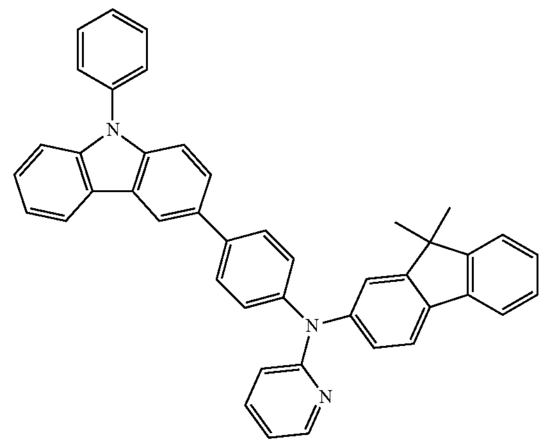
HT13
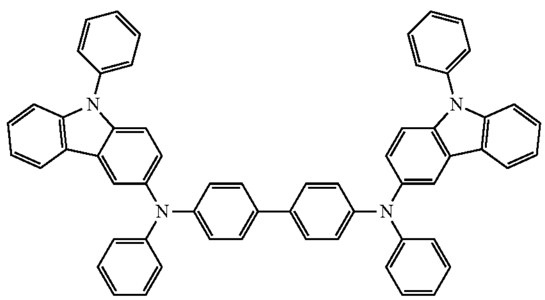
HT14
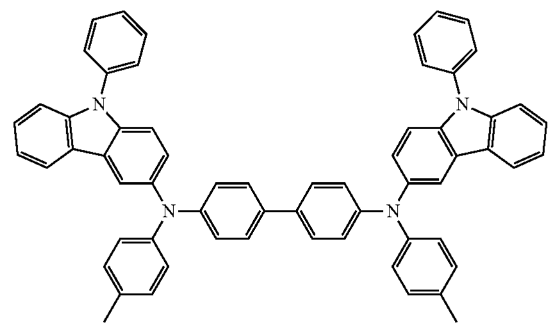
HT15
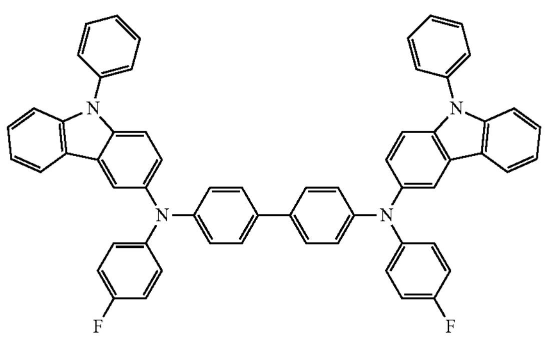
HT16
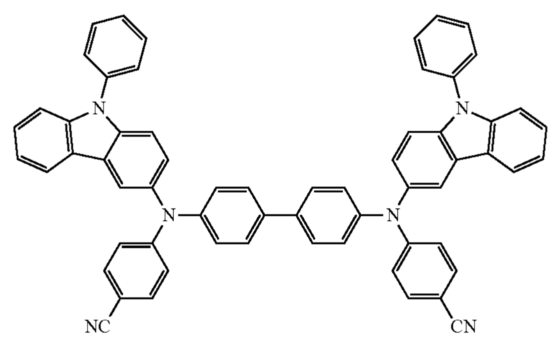
HT17
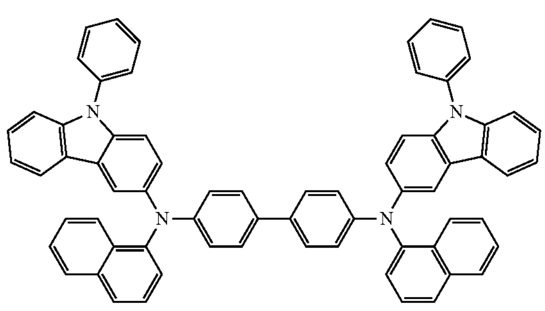
HT18
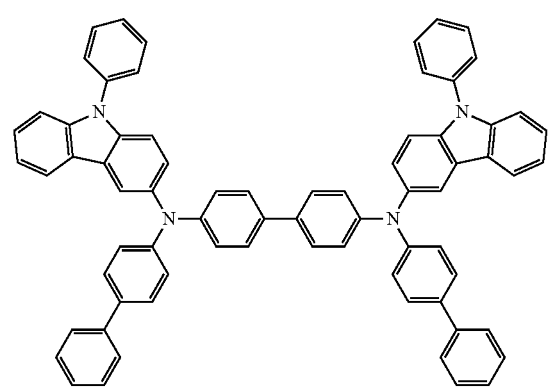

-continued

HT19

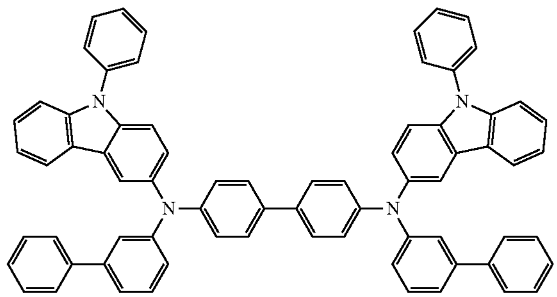

HT20

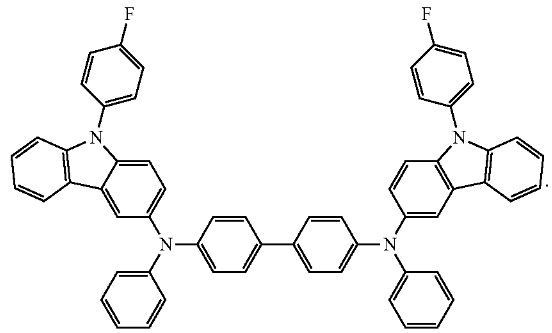

A thickness of the hole transport region may be in a range of about 100 Å to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto:

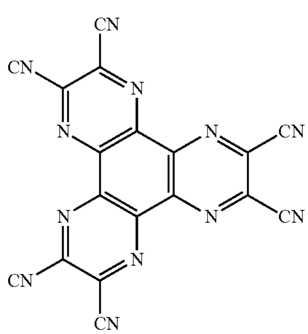

HT-D1

-continued

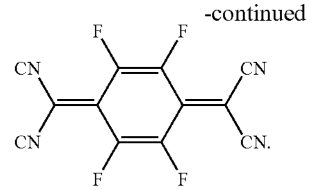

F4-TCNQ

The hole transport region may include a buffer layer.

Also, the buffer layer may compensate for an optical resonance distance depending on a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

-continued
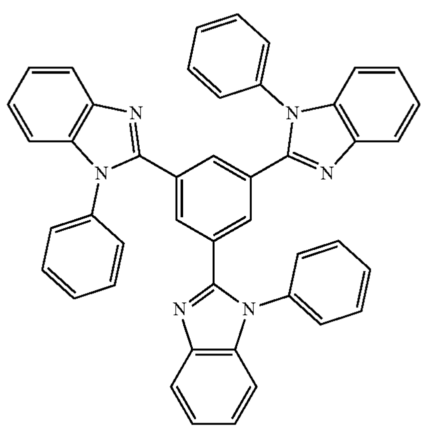
TPBi
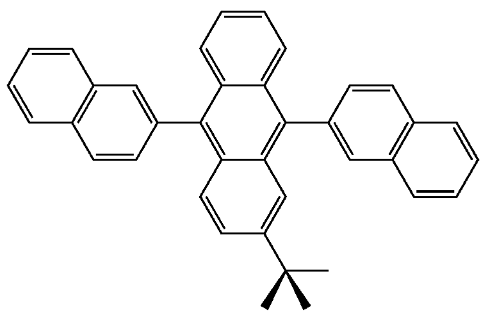
TBADN
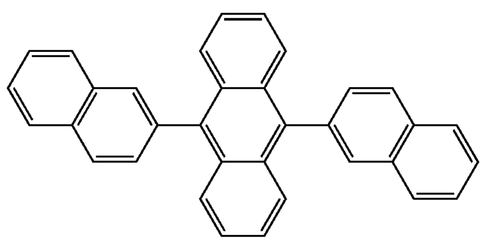
ADN
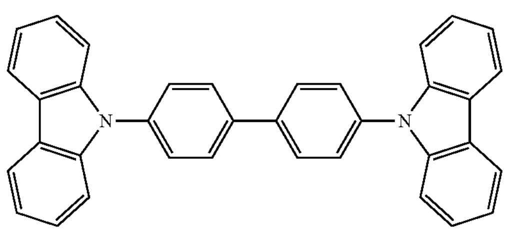
CBP
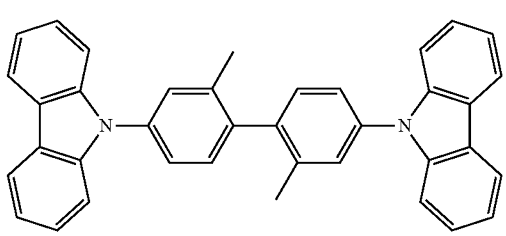
CDBP
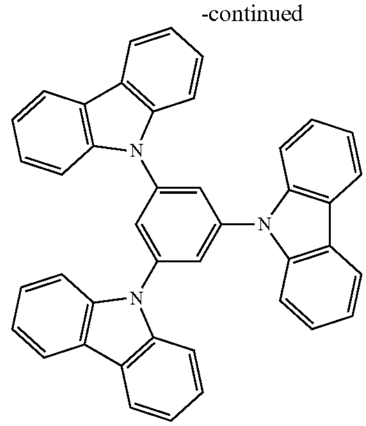
TCP
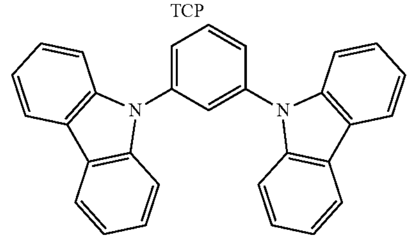
mCP
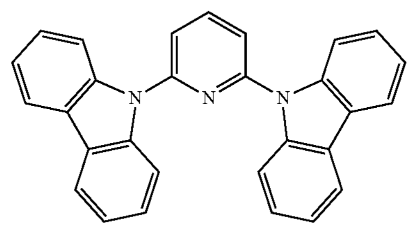
H50
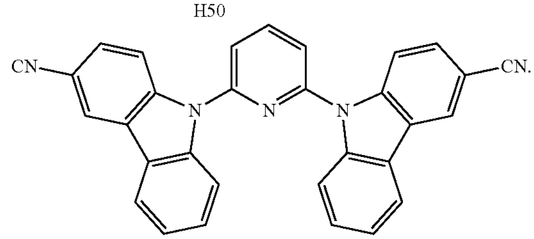
H51
In one or more embodiments, the host may further include a compound represented by Formula 301 below:
Formula 301
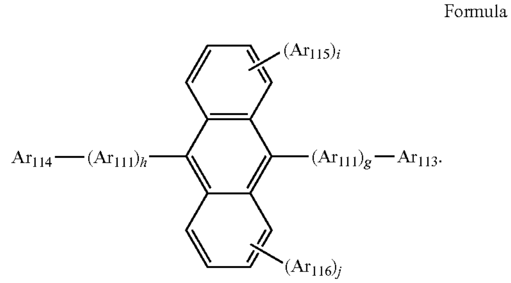
$Ar_{111}$ and $Ar_{112}$ in Formula 301 may each independently be selected from:
a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, I, and j in Formula 301 may each independently be an integer from 0 to 4, for example, 0, 1, or 2.

$Ar_{113}$ to $Ar_{116}$ in Formula 301 may each independently be selected from:

a $C_1$-$C_{10}$ alkyl group substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

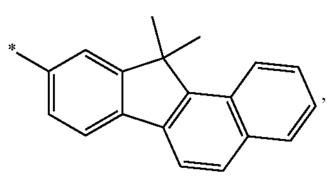 [SMILES: *c1ccc2c(c1)C(C)(C)c1c-2ccc2ccccc12]

but embodiments of the present disclosure are not limited thereto.

In one or more embodiments, the host may include a compound represented by Formula 302:

Formula 302

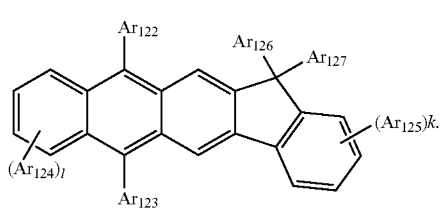

$Ar_{122}$ to $Ar_{125}$ in Formula 302 are the same as described in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be typically in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

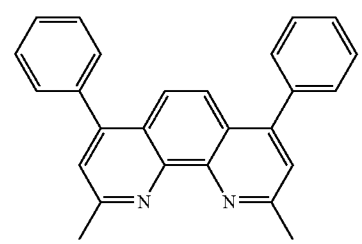

BCP

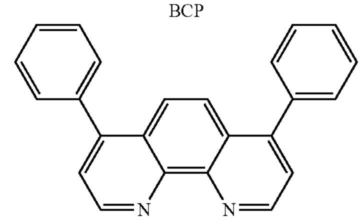

Bphen

A thickness of the hole blocking layer may be in a range of about 20 Å to about 1,000 Å, for example, about 30 Å to about 300 Å. When the thickness of the hole blocking layer is within these ranges, the hole blocking layer may have improved hole blocking ability without a substantial increase in driving voltage.

The electron transport layer may further include at least one selected from BCP, Bphen, $Alq_3$, BAlq, TAZ, and NTAZ.

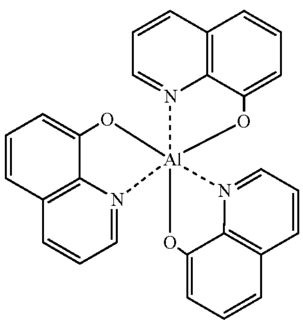

$Alq_3$

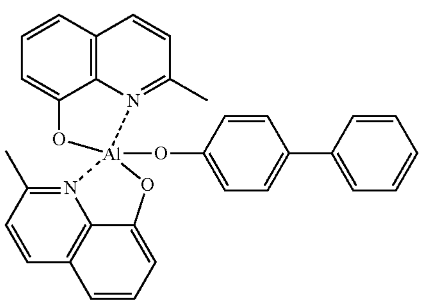

BAlq

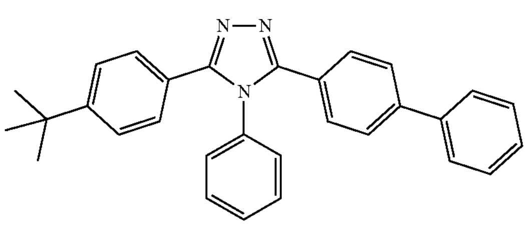

TAZ

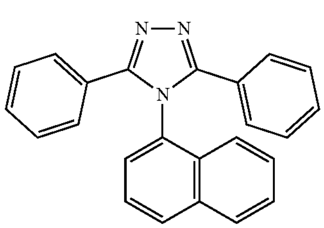

NTAZ

In one or more embodiments, the electron transport layer may include at least one of ET1 to ET25, but are not limited thereto:

ET1

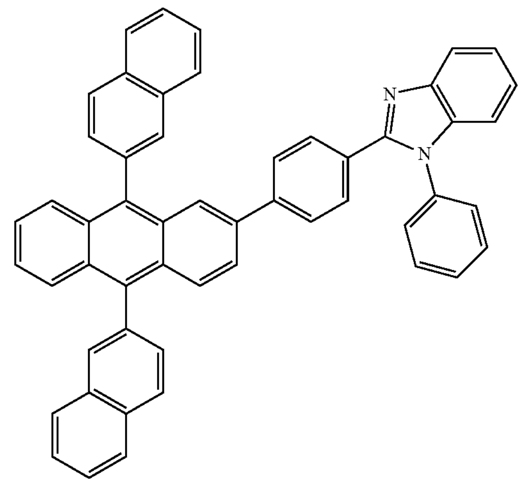

ET2

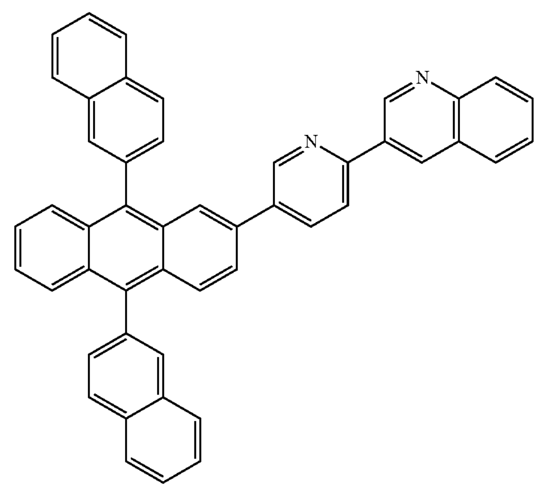

ET3

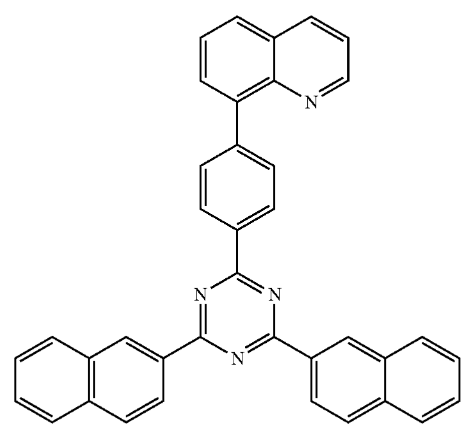

ET4
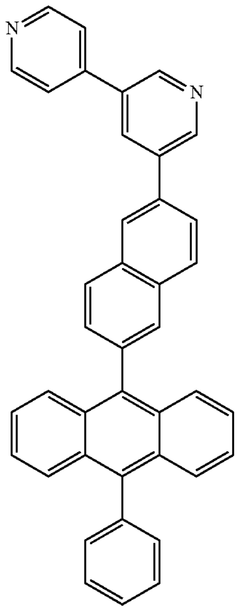
ET5
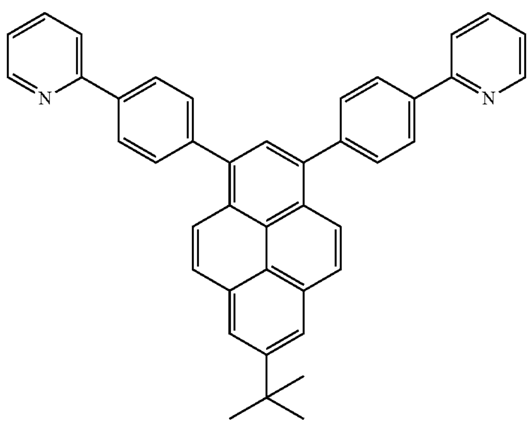
ET6
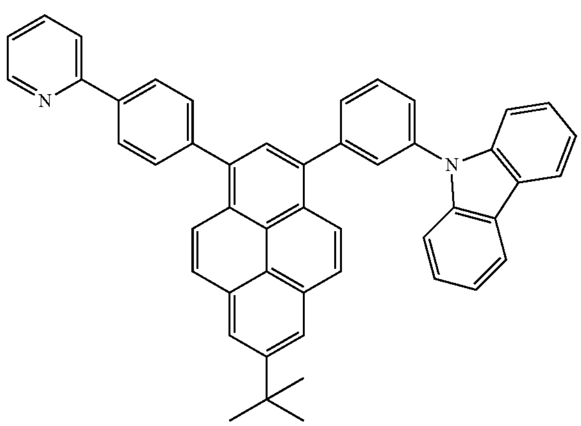
ET7
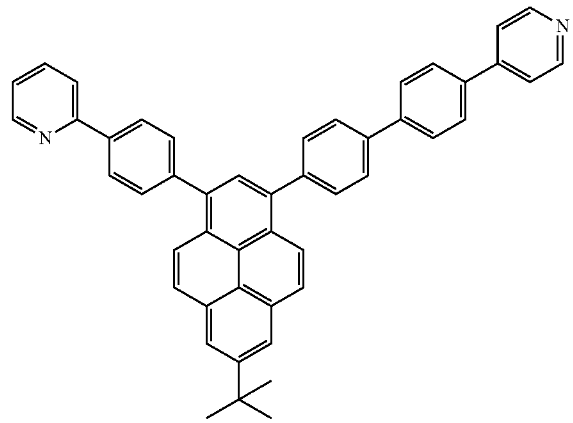
ET8
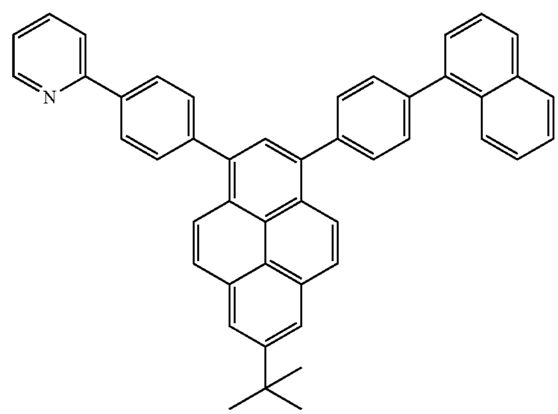
ET9
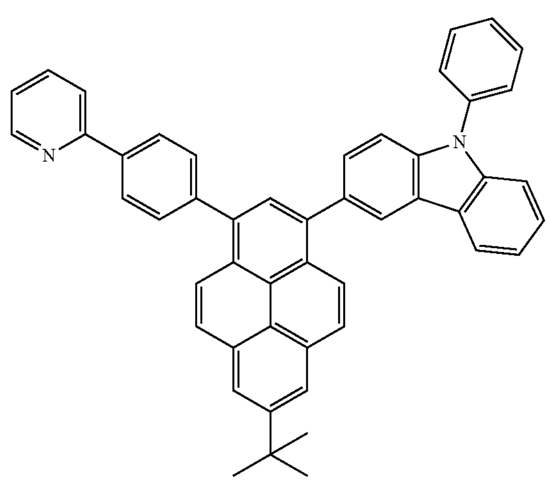

-continued
ET10
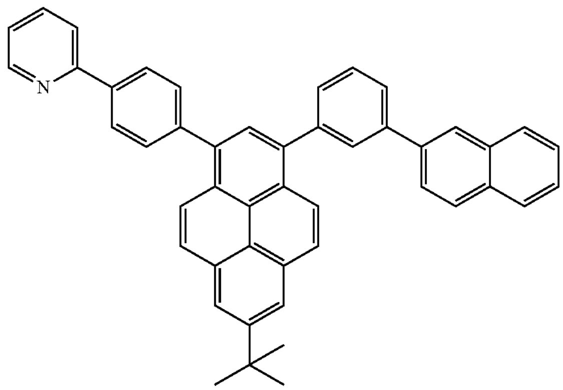
ET11
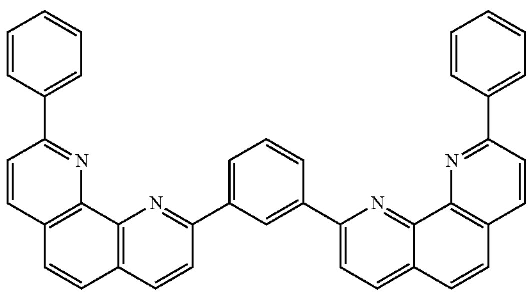
ET12
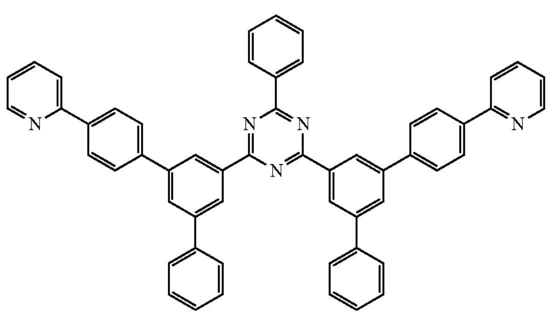
ET13
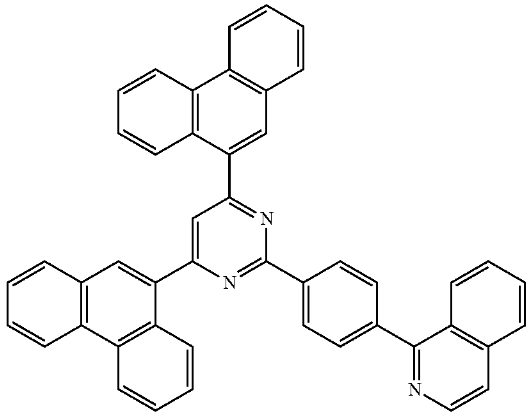
-continued
ET14
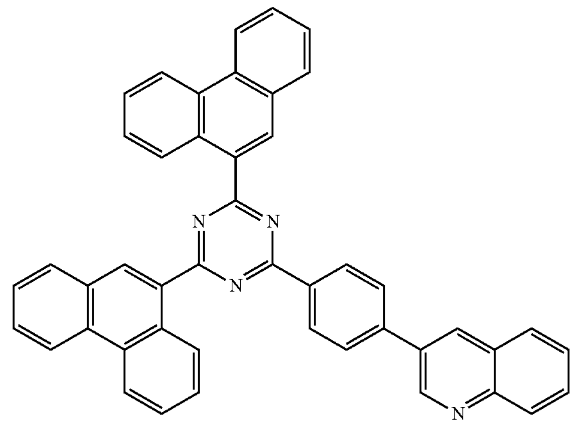
ET15
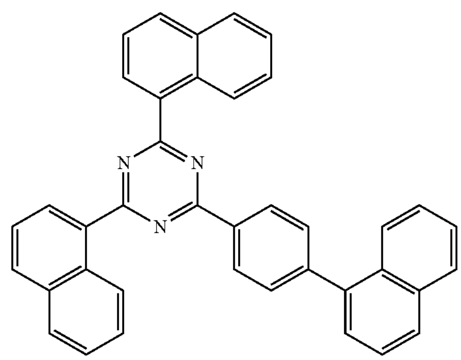
ET16
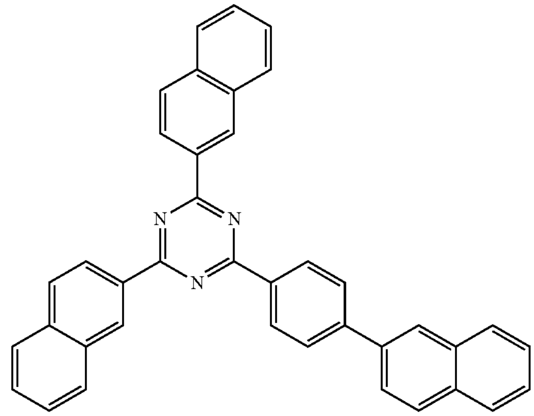

-continued
ET17
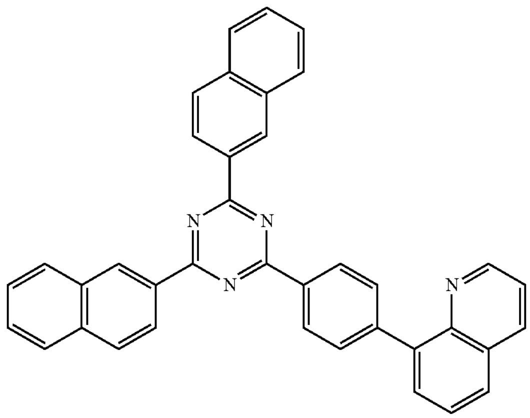
ET18
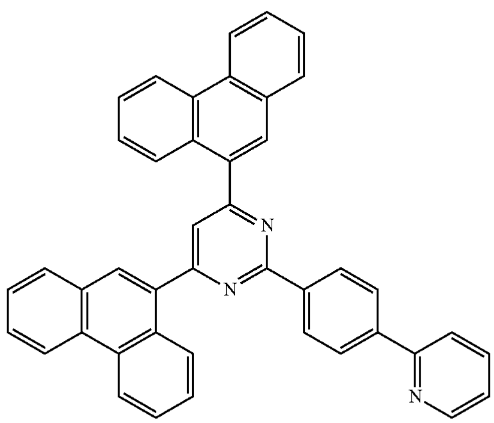
ET19
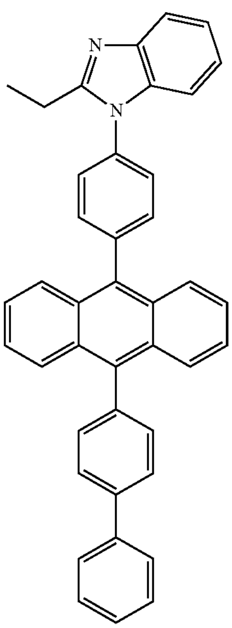
-continued
ET20
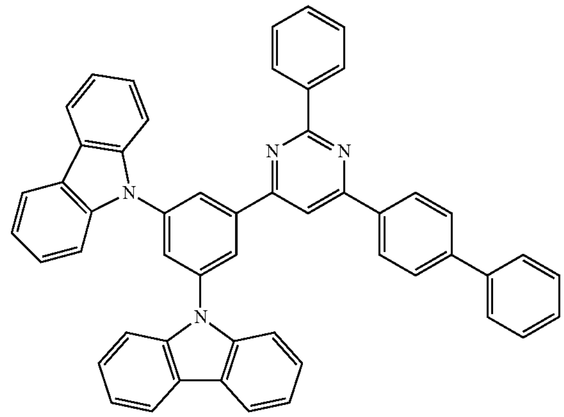
ET21
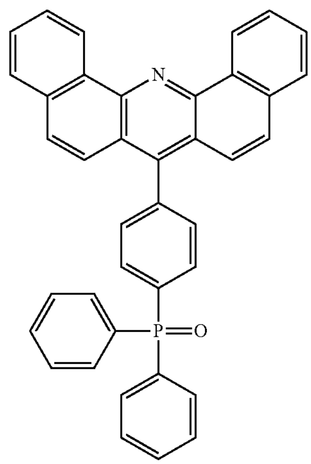
ET22
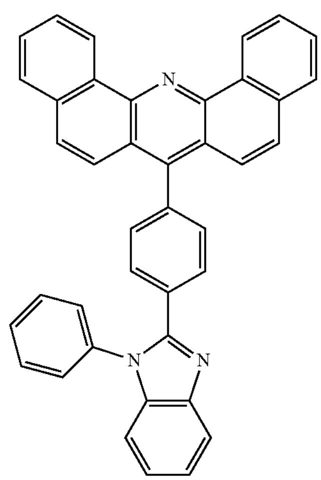

-continued

ET23

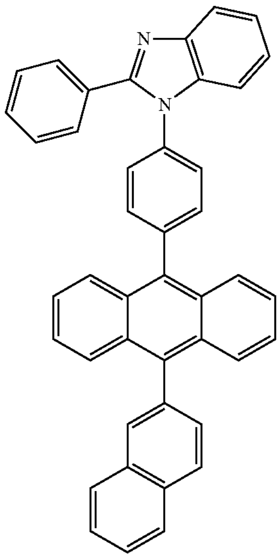

ET24

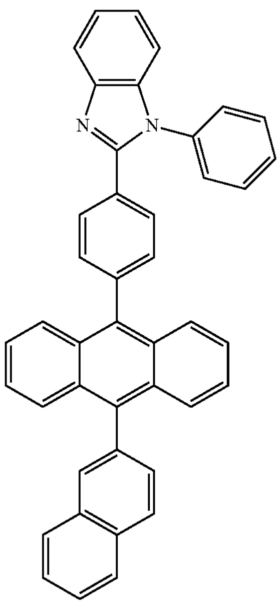

ET25

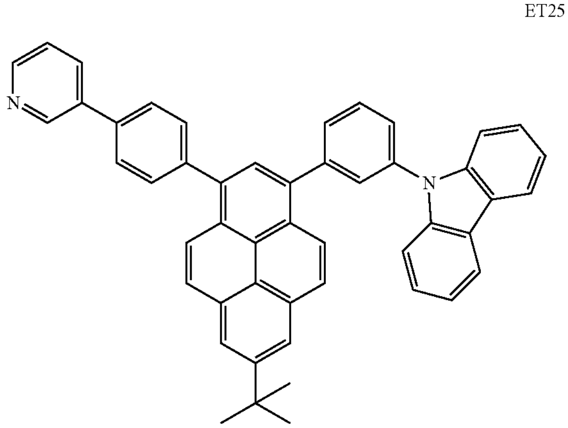

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

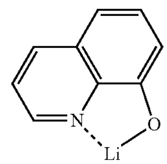

ET-D1

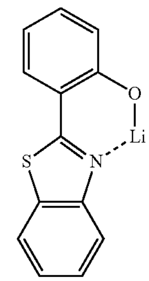

ET-D2

The electron transport region may include an electron injection layer (EIL) that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

Another aspect of the present disclosure provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and that has no aromaticity. Non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and a $C_6$-$C_{60}$ arylthio group as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group," as used herein, refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{30}$ alkyl" refers to a $C_1$-$C_{30}$ alkyl group substituted with $C_6$-$C_{30}$ aryl group, the total number of carbon atoms in the resulting aryl substituted alkyl group is $C_7$-$C_{60}$.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1

Synthesis of Compound 5

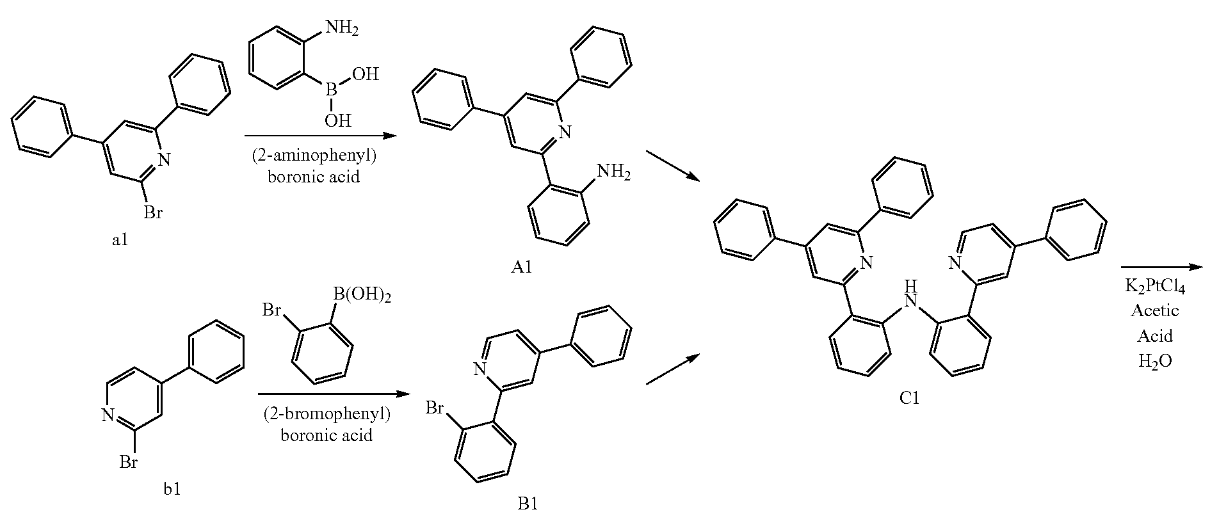

-continued

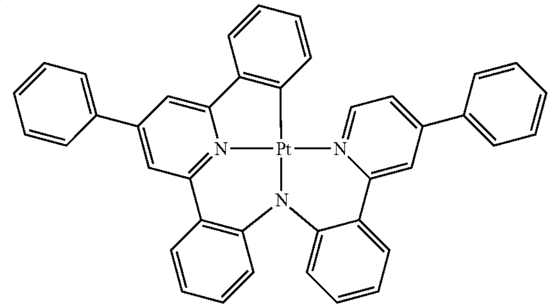

Compound 5

Synthesis of Intermediate A1

5.00 grams (g) (16.12 millimoles (mmol), 1.0 equivalents (equiv.)) of Intermediate a1, 2.65 g (19.34 mmol, 1.2 equiv.) of (2-aminophenyl)boronic acid, 1.30 g (1.13 mmol, 0.07 equiv.) of tetrakis(triphenylphosphine)palladium(0), and 6.683 g (48.36 mmol, 3.0 equiv.) of potassium carbonate were mixed with a solvent (0.6 molar (M)) in which tetrahydrofuran (THF) and distilled water ($H_2O$) were mixed at a ratio of 2:1, and the resulting mixture was refluxed for 18 hours. The mixture obtained therefrom was cooled to room temperature, and a precipitate was filtered therefrom to obtain a solid. The obtained solid was washed with ethyl acetate (EA)/$H_2O$ and purified by column chromatography (while increasing a rate of methylene/hexane (MC/Hex) to between 25% and 50%) to obtain 4.42 g (yield: 85%) of Intermediate A1. The obtained product was identified by Mass and HPLC analysis.

HRMS (MALDI) calcd for $C_{23}H_{18}N_2$: m/z 322.1470, Found: 322.1471.

Synthesis of Intermediate B1

4.00 g (17.1 mmol, 1.0 equiv.) of Intermediate b1, 4.12 g (20.51 mmol, 1.2 equiv.) of (2-bromophenyl)boronic acid, 1.38 g (1.20 mmol, 0.07 equiv.) of tetrakis(triphenylphosphine)palladium(0), and 4.53 g (42.72 mmol, 2.5 equiv.) of sodium carbonate were mixed with a solvent (0.6 M) in which toluene, ethanol, and distilled water ($H_2O$) were mixed at a ratio of 3:1:1, and the resulting mixture was refluxed for 18 hours. The mixture obtained therefrom was cooled to room temperature, and a precipitate was filtered therefrom to obtain a solid. The obtained solid was washed with EA/$H_2O$ and purified by column chromatography (while increasing a rate of EA/Hex to between 5% and 10%) to obtain 4.24 g (yield: 80%) of Intermediate B1. The obtained product was identified by Mass and HPLC analysis.

HRMS (MALDI) calcd for $C_{17}H_{12}BrN$: m/z 309.0153, Found: 309.0154.

Synthesis of Intermediate C1

2.5 g (8.06 mmol, 1.0 equiv.) of Intermediate B1, 3.12 g (9.67 mmol, 1.2 equiv.) of Intermediate A1, 0.52 g (0.057 mmol, 0.07 equiv.) of tris(dibenzylideneacetone)dipalladium(0), and 2.32 g (24.18 mmol, 3 equiv.) of sodium tert-butoxide were mixed with 80 milliliters (mL) of toluene, and the resulting mixture was refluxed for 12 hours. The mixture obtained therefrom was cooled to room temperature, and a precipitate was filtered therefrom to obtain a solid. The obtained solid was washed with EA/$H_2O$ and purified by column chromatography (while increasing a rate of EA/Hex to between 10% and 30%) to obtain 3.02 g (yield: 68%) of Intermediate C1. The obtained product was identified by Mass and HPLC analysis.

HRMS (MALDI) calcd for $C_{40}H_{29}N_3$: m/z 551.2361, Found: 551.2362.

Synthesis of Compound 5

3.02 g (5.47 mmol) of Intermediate C1 and 2.73 g (6.57 mmol, 1.2 equiv.) of $K_2PtCl_4$ were mixed with 70 mL of a solvent in which 60 mL of AcOH and 10 mL of $H_2O$ were mixed, and the resulting mixture was refluxed for 16 hours. The mixture obtained therefrom was cooled to room temperature, and a precipitate was filtered therefrom to obtain a solid. The obtained solid was dissolved again in MC, washed with $H_2O$, and purified by column chromatography (MC 30%, Hex 70%) to obtain 1.83 g (yield: 45%) of Compound 5. The obtained product was identified by Mass and HPLC analysis.

HRMS (MALDI) calcd for $C_{40}H_{27}N_3Pt$: m/z 744.1853, Found: 744.1855.

Synthesis Example 2

Synthesis of Compound 13

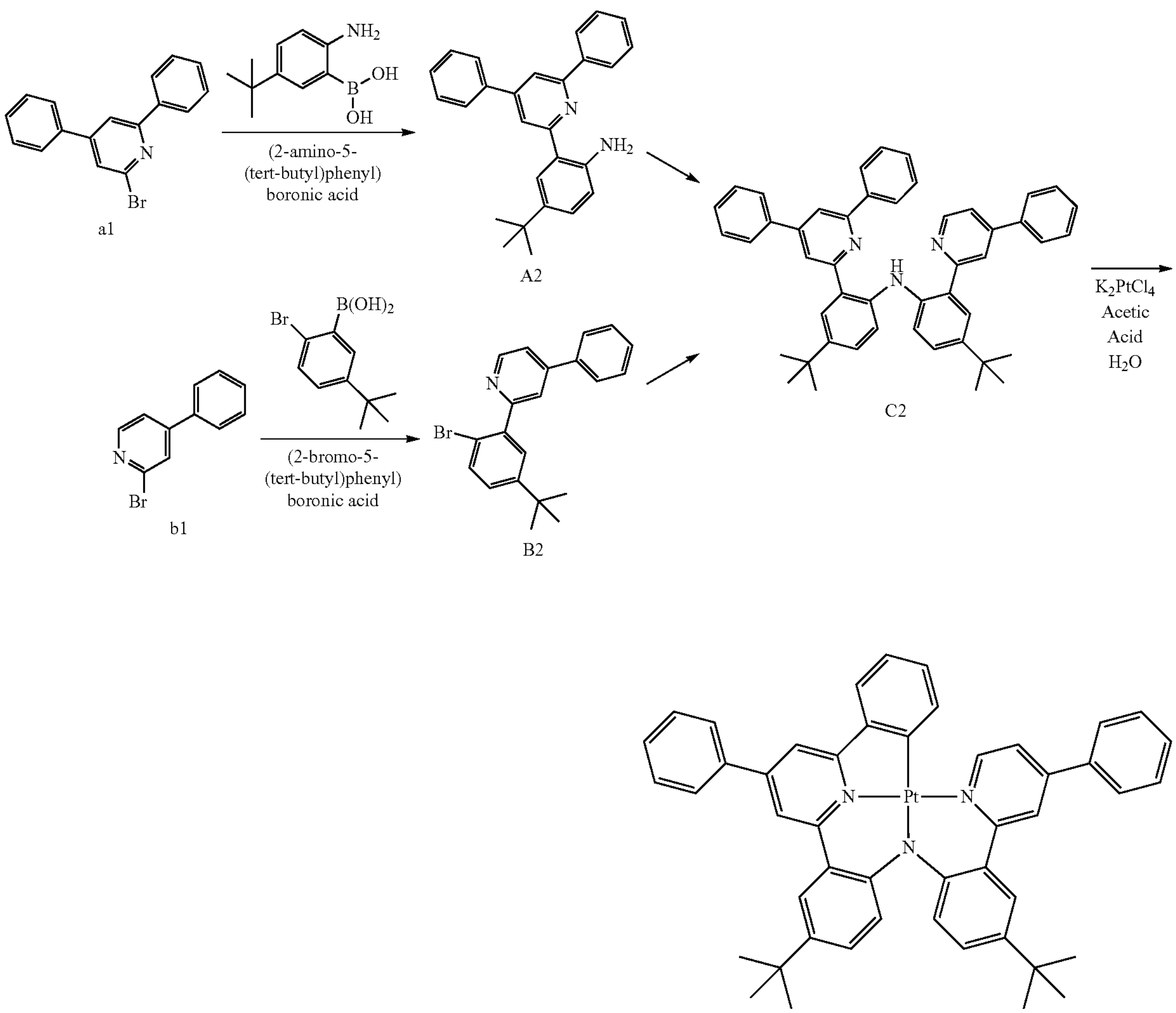

Compound 13

Synthesis of Intermediate A2

5.0 g (yield: 82%) of Intermediate A2 was synthesized in the same manner as Intermediate A1 in Synthesis Example 1, except that 3.73 g (19.34 mmol) of (2-amino-5-(tert-butyl)phenyl)boronic acid was used instead of (2-aminophenyl)boronic acid.

HRMS (MALDI) calcd for $C_{27}H_{26}N_2$: m/z 378.2096, Found: 378.2098.

Synthesis of Intermediate B2

4.5 g (yield: 72%) of Intermediate B2 was synthesized in the same manner as Intermediate B1 in Synthesis Example 1, except that 5.27 g (20.50 mmol) of (2-bromo-5-(tert-butyl)phenyl)boronic acid was used instead of (2-bromophenyl)boronic acid.

HRMS (MALDI) calcd for $C_{21}H_{20}BrN$: m/z 365.0779, Found: 365.0780.

Synthesis of Intermediate C2

3.58 g (yield: 68%) of Intermediate C2 was synthesized in the same manner as Intermediate C1 in Synthesis Example 1, except that Intermediate A2 and Intermediate B2 were respectively used instead of Intermediate A1 and Intermediate B1.

HRMS (MALDI) calcd for $C_{48}H_{45}N_3$: m/z 663.3613, Found: 663.3614.

Synthesis of Compound 13

1.63 g (yield: 42%) of Compound 13 was synthesized in the same manner as Compound 5 in Synthesis Example 1, except that Intermediate C2 was used instead of Intermediate C1.

HRMS (MALDI) calcd for $C_{48}H_{43}N_3Pt$: m/z 856.3105, Found: 856.3107.

Synthesis Example 3

Synthesis of Compound 18

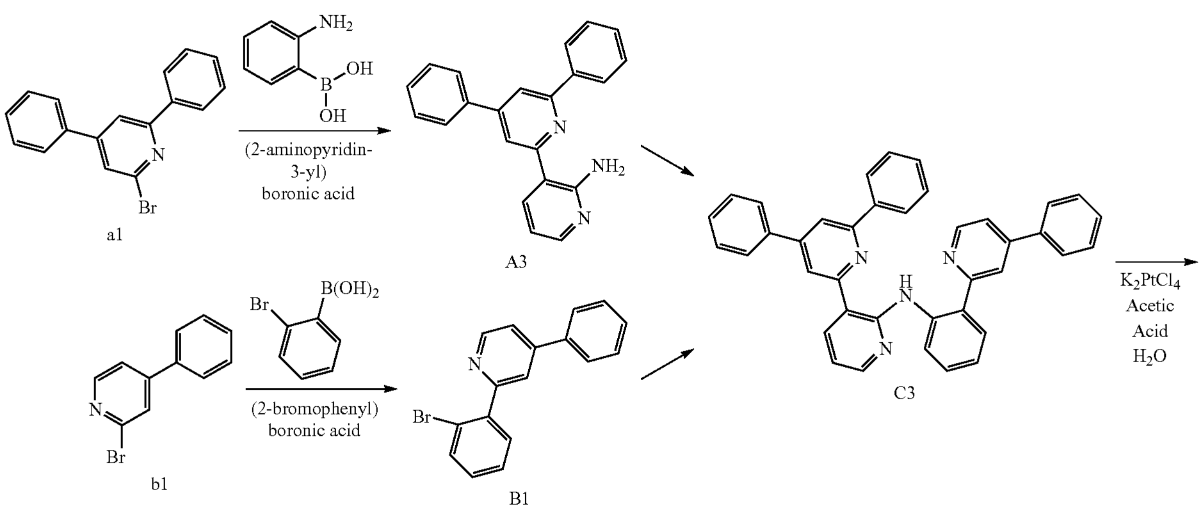

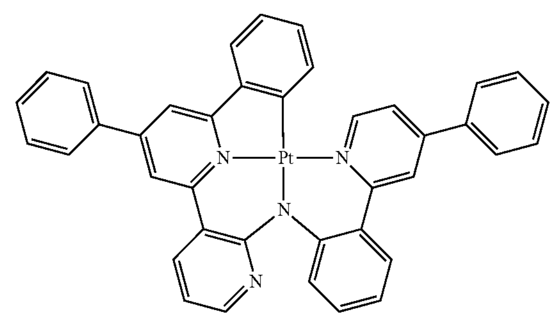
Compound 18

Synthesis of Intermediate A3

4.07 g (yield: 78%) of Intermediate A3 was synthesized in the same manner as Intermediate A1 in Synthesis Example 1, except that 2.22 g (16.09 mmol) of (2-aminopyridin-3-yl)boronic acid was used instead of (2-aminophenyl)boronic acid.

HRMS (MALDI) calcd for $C_{22}H_{17}N_3$: m/z 323.1422, Found: 323.1426.

Synthesis of Intermediate C3

3.59 g (yield: 70%) of Intermediate C3 was synthesized in the same manner as Intermediate C1 in Synthesis Example 1, except that Intermediate A3 was used instead of Intermediate A1.

HRMS (MALDI) calcd for $C_{39}H_{28}N_4$: m/z 552.2314, Found: 552.2316.

Synthesis of Compound 18

1.42 g (yield: 35%) of Compound 18 was synthesized in the same manner as Compound 5 in Synthesis Example 5, except that Intermediate C3 was used instead of Intermediate C1.

HRMS (MALDI) calcd for $C_{39}H_{26}N_4Pt$: m/z 745.1805, Found: 745.1809.

Synthesis Example 4

Synthesis of Compound 23

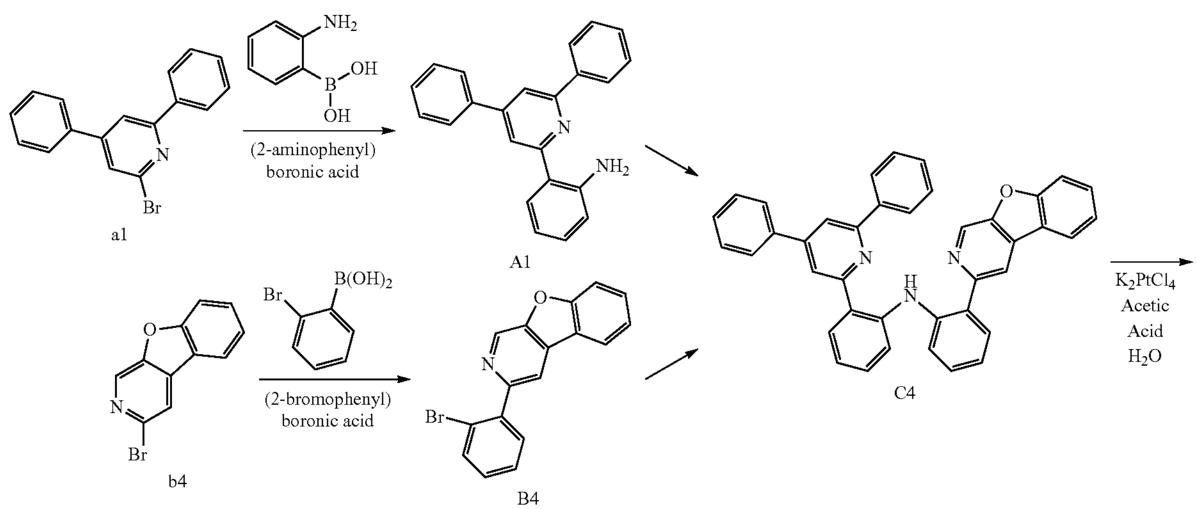

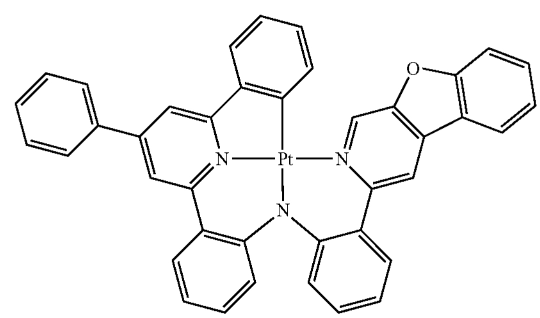

Compound 23

Synthesis of Intermediate B4

4.13 g (yield: 79%) of Intermediate B4 was synthesized in the same manner as Intermediate B1 in Synthesis Example 1, except that 4.00 g (16.12 mmol) of Intermediate b4 (3-bromobenzofuro[2,3-c]pyridine) was used instead of Intermediate b1.

HRMS (MALDI) calcd for $C_{17}H_{10}BrNO$: m/z 322.9946, Found: 322.9950.

Synthesis of Intermediate C4

3.59 g (yield: 70%) of Intermediate C4 was synthesized in the same manner as Intermediate C1 in Synthesis Example 1, except that Intermediate B4 was used instead of Intermediate B1.

HRMS (MALDI) calcd for $C_{39}H_{28}N_4$: m/z 552.2314, Found: 552.2316.

Synthesis of Compound 23

1.41 g (yield: 35%) of Compound 23 was synthesized in the same manner as Compound 5 in Synthesis Example 1, except that Intermediate C4 was used instead of Intermediate C1.

HRMS (MALDI) calcd for $C_{40}H_{25}N_3OPt$: m/z 758.1645, Found: 758.1649.

Synthesis Example 5

Synthesis of Compound 64

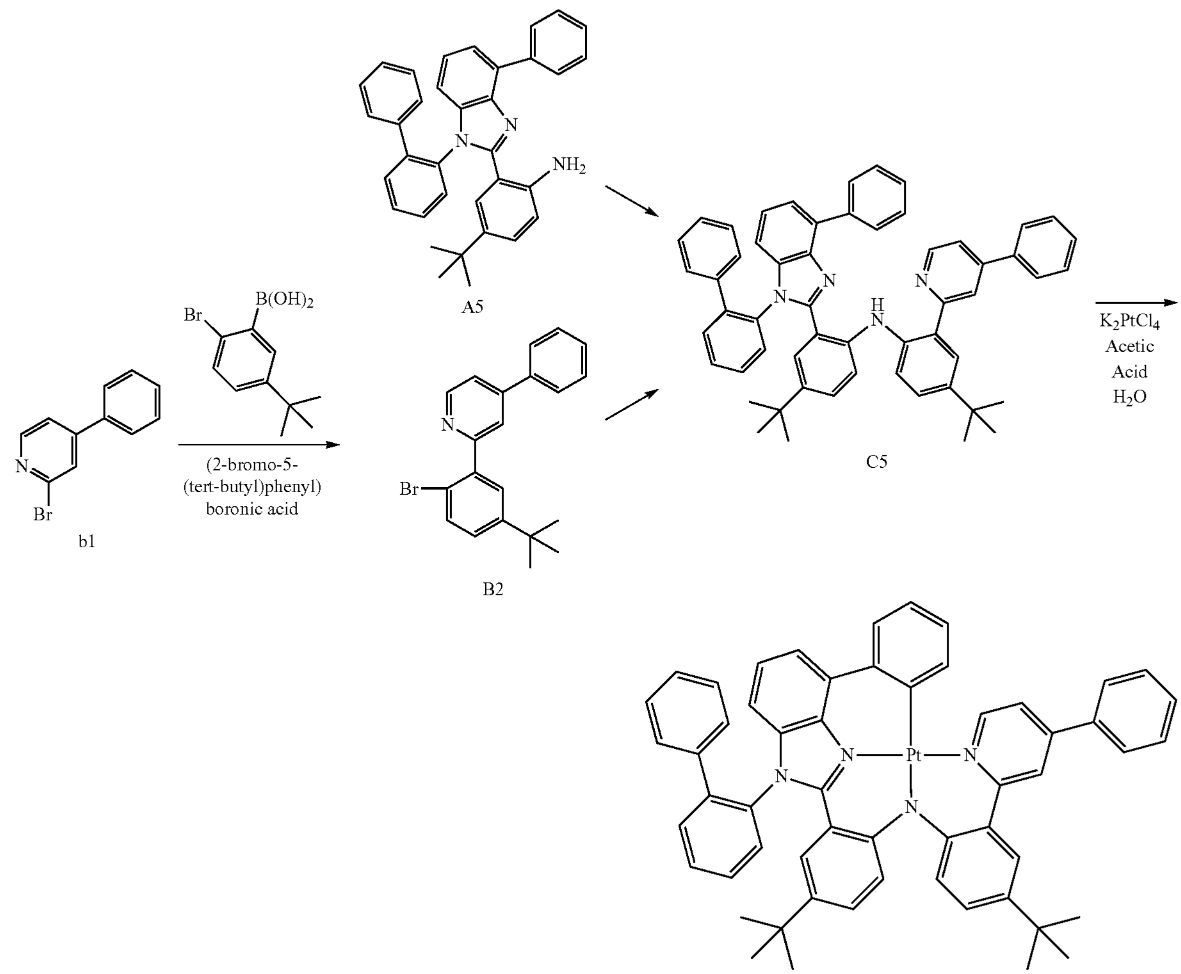

Compound 64

Synthesis of Intermediate C5

3.91 g (yield: 62%) of Intermediate C5 was synthesized in the same manner as Intermediate C1 in Synthesis Example 1, except that Intermediate A5 and Intermediate B2 were respectively used instead of Intermediate A1 and Intermediate B1.

HRMS (MALDI) calcd for $C_{56}H_{50}N_4$: m/z 778.4035, Found: 778.4039.

Synthesis of Compound 64

1.12 g (yield: 30%) of Compound 64 was synthesized in the same manner as Compound 5 in Synthesis Example 1, except that Intermediate C5 was used instead of Intermediate C1.

HRMS (MALDI) calcd for $C_{56}H_{48}N_4Pt$: m/z 971.3527, Found: 971.3529.

Evaluation Example 1

Evaluation of Photoluminescence (PL) Spectrum

Figure 2:
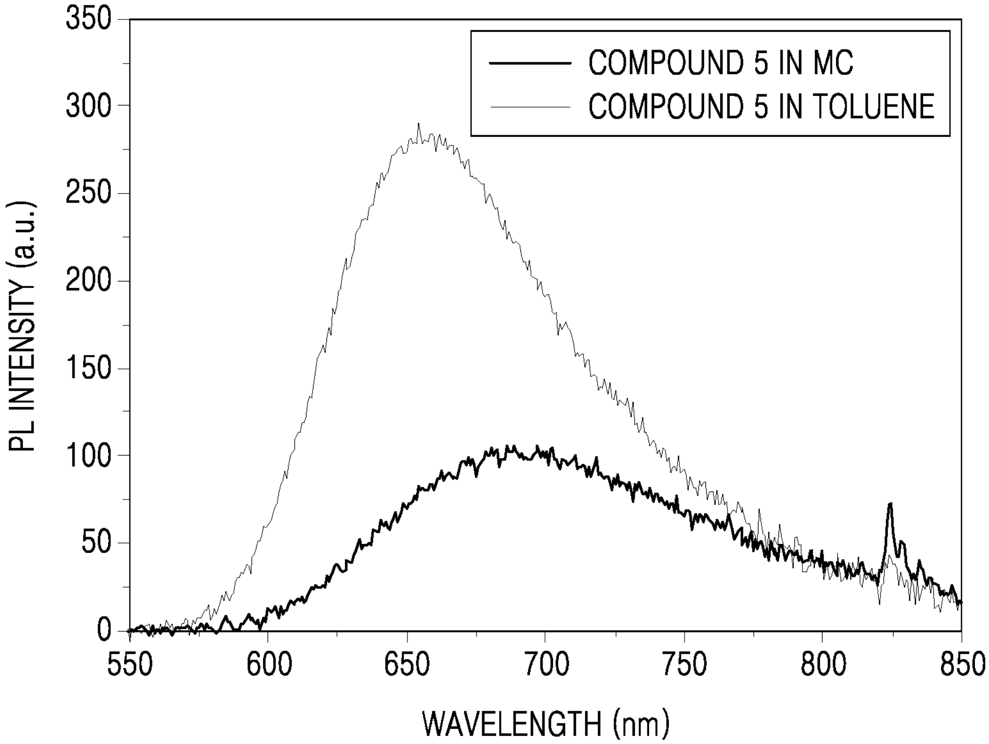
FIG. 2 is a photoluminescence (PL) spectrum of Compound 5 in methylene chloride and a PL spectrum of Compound 5 in toluene.

Compound 5 was diluted to a concentration of $10\times10^{-5}$ M in methylene chloride, and a PL spectrum of the solution was measured at room temperature by using an ISC PC1 Spectrofluorometer equipped with a xenon lamp. Then, the solvent was changed to toluene and the PL spectrum was measured again. Results thereof are shown in Table 2 and FIG. 2.

TABLE 2

| | PL characteristics of Compound 5 | |
|---|---|---|
| | methylene chloride | toluene |
| Maximum emission wavelength (nm) | 690 | 658 |
| FWHM (nm) | 133.1 | 104.0 |

Referring to Table 2, it is confirmed that Compound 5 has PL characteristics suitable for use in an electronic device, for example, an organic light-emitting device.

Example 1

As an anode, a glass substrate, on which ITO/Ag/ITO were respectively deposited to thicknesses of 70 Å/1,000 Å/70 Å, was cut to a size of 50 mm×50 mm×0.5 mm (mm=millimeter), sonicated with iso-propyl alcohol and pure water each for 5 minutes, and then cleaned by exposure to ultraviolet (UV) rays and ozone for 30 minutes. Then, the glass substrate was provided to a vacuum deposition apparatus.

2-TNATA was deposited on the anode to form a hole injection layer having a thickness of 600 Å, and 4,4'-bis[N-(1-naphthyl)-N-phenylamino]biphenyl (NPB) was deposited on the hole injection layer to form a hole transport layer having a thickness of 1,350 Å.

CBP (host) and Compound 5 (dopant) were co-deposited on the hole transport layer at a weight ratio of 94:6 to form an emission layer having a thickness of 400 Å, and BCP was deposited on the emission layer to form a hole blocking layer having a thickness of 50 Å. Then, $Alq_3$ was deposited on the hole blocking layer to form an electron transport layer having a thickness of 350 Å, LiF was deposited on the electron transport layer to form an electron injection layer having a thickness of 10 Å, and MgAg was deposited on the electron injection layer at a weight ratio of 90:10 to form a cathode having a thickness of 120 Å, thereby completing the manufacture of an organic light-emitting device (emitting red light) having a structure of ITO/Ag/ITO/2-TNATA (600 Å)/NPB (1,350 Å)/CBP+Compound 5 (6 wt %) (400 Å)/BCP (50 Å)/$Alq_3$ (350 Å)/LiF (10 Å)/MgAg (120 Å).

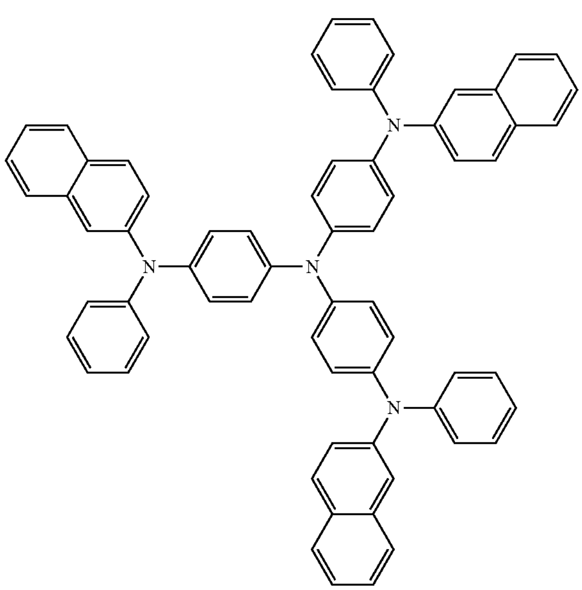

2-TNATA

-continued

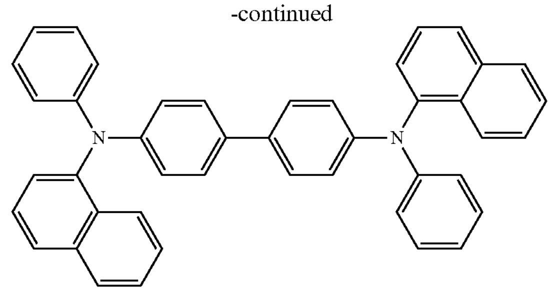

NPB

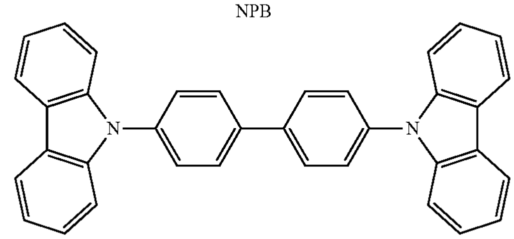

CBP

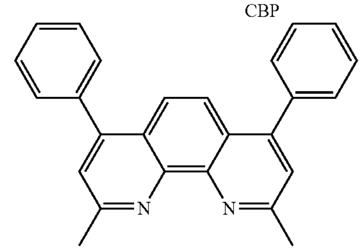

BCP

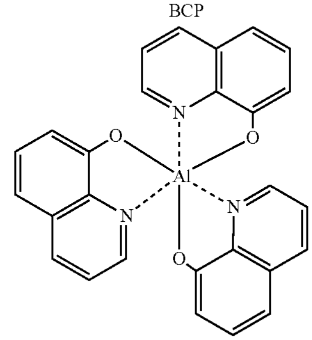

$Alq_3$

Examples 2 to 5 and Comparative Example A

Organic light-emitting devices were manufactured in the same manner as in Example 1, except that Compounds shown in Table 2 were each used instead of Compound 5 as a dopant in forming an emission layer.

Evaluation Example 2

Evaluation of Characteristics of Organic Light-Emitting Devices

The driving voltage, emission efficiency, quantum emission efficiency, roll-off ratio, and maximum emission wavelength of the organic light-emitting devices manufactured according to Examples 1 to 5 and Comparative Example A were evaluated by using a current-voltage meter (Keithley 2400) and a luminance meter (Minolta Cs-1000A), and evaluation results thereof are shown in Table 3 below. The roll-off ratio was calculated by using Equation 20 below.

Roll-off ratio={1−(efficiency (at 9000 nit)/maximum emission efficiency)}×100%    Equation 20

TABLE 3

| | Dopant compound No. | Driving voltage (V) | Emission efficiency (cd/A) | Quantum emission efficiency (%) | Roll-off ratio (%) | Maximum emission wave-length (nm) |
|---|---|---|---|---|---|---|
| Example 1 | 5 | 4.900 | 17.35 | 14.9 | 15.2 | 630 |
| Example 2 | 13 | 4.705 | 18.2 | 15.3 | 12 | 635 |
| Example 3 | 18 | 5.015 | 19.9 | 17.2 | 10.3 | 618 |
| Example 4 | 23 | 5.000 | 18.5 | 16.9 | 13.2 | 628 |
| Example 5 | 64 | 4.890 | 20.5 | 14.7 | 15.3 | 620 |
| Comparative Example A | A | 5.371 | 16.461 | 13.32 | 25.5 | 615 |

5

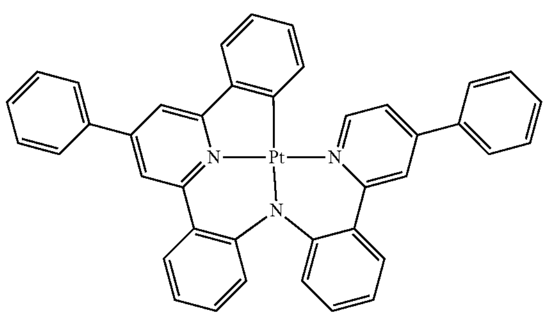

13

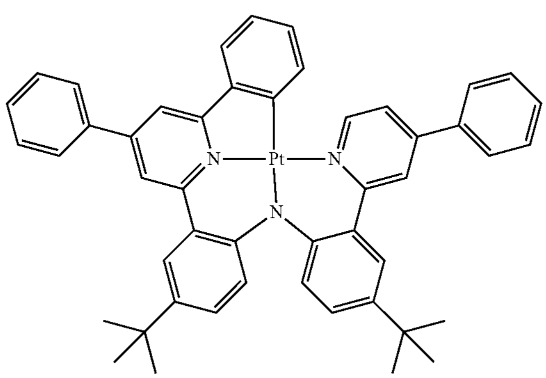

18

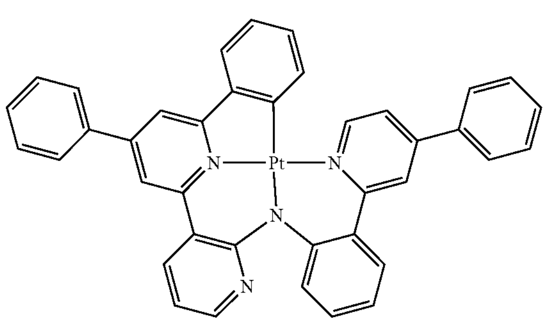

-continued

23

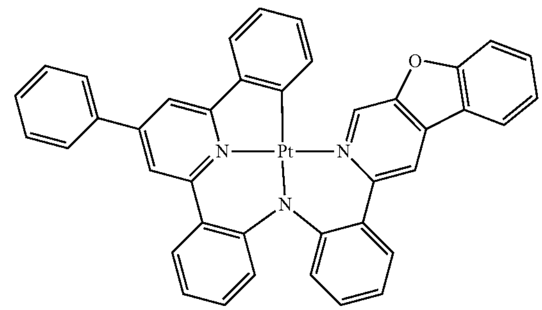

64

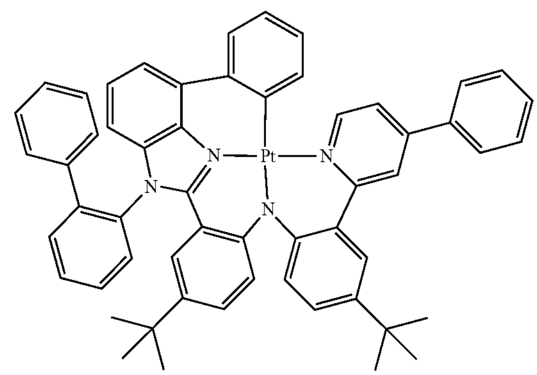

A

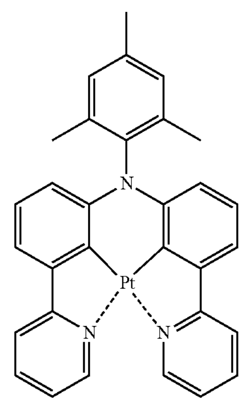

Referring to Table 3, it is confirmed that the organic light-emitting devices of Examples 1 to 5 have excellent driving voltage, emission efficiency, quantum emission efficiency, and roll-off ratio characteristics, as compared with those of the organic light-emitting device of Comparative Example A.

Since the organometallic compounds have excellent electrical characteristics and thermal stability, the organic light-emitting devices including such organometallic compounds may have excellent driving voltage, efficiency, power, color purity, and lifespan characteristics. Also, due to excellent phosphorescent luminescence characteristics, such organometallic compounds may provide diagnostic compositions having high diagnostic efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. An organometallic compound represented by Formula 1:

Formula 1

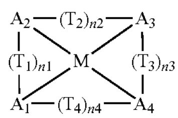

Formula A1-1

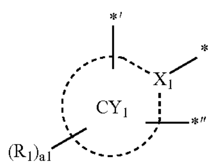

Formula A1-2

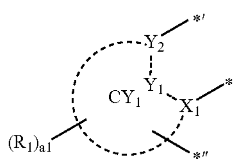

Formula A1-3

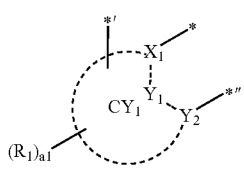

Formula A2-1

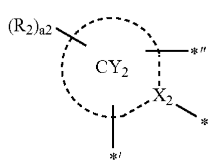

Formula A2-2

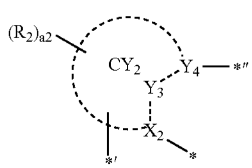

Formula A2-3

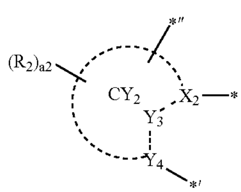

Formula A3-1

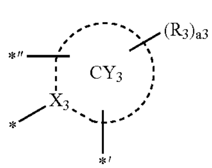

-continued

Formula A3-2

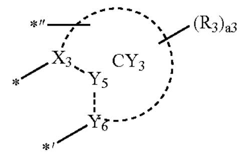

Formula A3-3

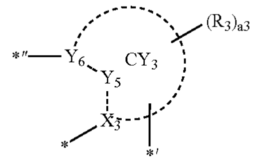

Formula A4

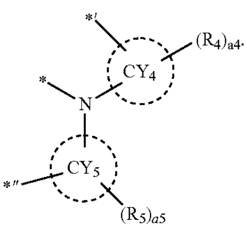

wherein M in Formula 1 is beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), in Formula 1, a bond between $A_4$ and M is a covalent bond, two bonds selected from a bond between $A_1$ and M, a bond between $A_2$ and M, and a bond between $A_3$ and M are each a coordinate bond, and the other thereof is a covalent bond, $A_1$ in Formula 1 is ring $CY_1$ represented by one of Formulae A1-1 to A1-3,

* in Formulae A1-1 to A1-3 indicates a binding site to M in Formula 1, and when n1 is 1, *' indicates a binding site to $T_1$ in Formula 1, when n1 is 0, *' is absent, when n4 is 1, *" indicates a binding site to $T_4$ in Formula 1, and when n4 is 0, *" is absent, $A_2$ in Formula 1 is ring $CY_2$ represented by one of Formulae A2-1 to A2-3,

* in Formulae A2-1 to A2-3 indicates a binding site to M in Formula 1, and when n1 is 1, *' indicates a binding site to $T_1$ in Formula 1, when n1 is 0, *' is absent, when n2 is 1, *" indicates a binding site to $T_2$ in Formula 1, and when n2 is 0, *" is absent, $A_3$ in Formula 1 is ring $CY_3$ represented by one of Formulae A3-1 to A3-3,

* in Formulae A3-1 to A3-3 indicates a binding site to M in Formula 1, and when n2 is 1, *" indicates a binding site to $T_2$ in Formula 1, when n2 is 0, *" is absent, when n3 is 1, *' indicates a binding site to $T_3$ in Formula 1, and when n3 is 0, *' is absent, $A_4$ in Formula 1 is ring $CY_4$ represented by Formula A4,

* in Formula A4 indicates a binding site to M in Formula 1, and when n3 is 1, *' indicates a binding site to $T_3$ in Formula 1, when n3 is 0, *' is absent, when n4 is 1, *" indicates a binding site $T_4$ in Formula 1, and when n4 is 0, *" is absent, $X_1$ to $X_3$ and $Y_1$ to $Y_6$ in Formulae A1-1 to A1-3, A2-1 to A2-3, and A3-1 to A3-3 are each independently C or N, rings $CY_1$ to $CY_5$ in Formulae A1-1 to A1-3, A2-1 to A2-3, A3-1 to A3-3, and A4 are each independently a $C_5$-$C_{30}$ carbocyclic group or a $C_1$-$C_{30}$ heterocyclic group, $T_1$ to $T_4$ in Formula 1 are each independently selected from a single bond, a double bond, *—N($R_7$)—*', *—B($R_7$)—*', *—P($R_7$)—*', *—C($R_7$)($R_8$)—*', *—Si($R_7$)($R_8$)—*', *—Ge($R_7$)($R_8$)—*', *—S—*', *—Se—*', *—O—*', *—C(═O)—*', *—S(═O)—*', *—S(═O)$_2$—*', *—C($R_7$)═*', *═C($R_7$)—*', *—C($R_7$)═C($R_8$)—*', *—C(═S)—*', and *—C≡C—*', and * and *' each indicate a binding site to a neighboring atom, $R_7$ and $R_8$ are optionally linked via a single bond, a double bond, or a first linking group to form a substituted or unsubstituted $C_5$-$C_{30}$ carbocyclic group or a substituted or unsubstituted $C_1$-$C_{30}$ heterocyclic group, n1 to n4 are each independently 0 or 1, wherein, when n1 is 0, $T_1$ is absent and $A_1$ and $A_2$ are not linked to each other, when n2 is 0, $T_2$ is absent and $A_2$ and $A_3$ are not linked to each other, when n3 is 0, $T_3$ is absent and $A_3$ and $A_4$ are not linked to each other, and when n4 is 0, $T_4$ is absent and $A_4$ and $A_1$ are not linked to each other, the sum of n1, n2, n3, and n4 is 3, $R_1$ to $R_5$, $R_7$, and $R_8$ are each independently selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(═O)($Q_8$)($Q_9$), a1 to a5 in Formulae A1-1 to A1-3, A2-1 to A2-3, A3-1 to A3-3, and A4 are each independently an integer from 0 to 20, two of a plurality of neighboring groups $R_1$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_2$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_3$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_4$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_5$ are optionally linked to form a substituted or unsubstituted $C_5$-$C_{30}$ carbocyclic group or a substituted or unsubstituted $C_1$-$C_{30}$ heterocyclic group, two or more neighboring groups selected from $R_1$ to $R_4$ are optionally linked to form a substituted or unsubstituted $C_5$-$C_{30}$ carbocyclic group or a substituted or unsubstituted $C_1$-$C_{30}$ heterocyclic group, two or more neighboring groups selected from $R_1$ to $R_3$ and $R_5$ are optionally linked to form a substituted or unsubstituted $C_5$-$C_{30}$ carbocyclic group or a substituted or unsubstituted $C_1$-$C_{30}$ heterocyclic group, rings $CY_4$ and $CY_5$ are not linked to or condensed with each other, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(═O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

2. The organometallic compound of claim 1, wherein the bond between $A_2$ and M is a covalent bond, and the bond between $A_1$ and M and the bond between $A_3$ and M are each a coordinate bond.

3. The organometallic compound of claim 1, wherein rings $CY_1$ to $CY_5$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, a 4,5,6,7-tetrahydroindazole group, a pyrrolopyridine group, an imidazopyridine group, and an imidazopyrimidine group.

4. The organometallic compound of claim 1, wherein at least one of rings $CY_1$ to $CY_3$ is a condensed ring with at least one 5-membered ring or at least one 6-membered ring, the 5-membered ring is selected from a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the 6-membered ring is selected from a cyclohexane group, a cyclohexene group, an adamantane group, a norbornane group, a norbornene group, a benzene group, a pyridine group, a pyrimidine group, a pyrazine group, a pyridazine group, and a triazine group.

5. The organometallic compound of claim 1, wherein $T_1$ to $T_4$ are each a single bond.

6. The organometallic compound of claim 1, wherein n2, n3, and n4 are each 1, and n1 is 0, or n1, n3, and n4 are each 1, and n2 is 0.

7. The organometallic compound of claim 1, wherein $R_1$ to $R_5$, $R_7$, and $R_8$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyradazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and $—Si(Q_{33})(Q_{34})(Q_{35})$; and $—N(Q_1)(Q_2)$, $—Si(Q_3)(Q_4)(Q_5)$, $—B(Q_6)(Q_7)$, and $—P(=O)(Q_8)(Q_9)$, and $Q_1$ to $Q_9$ and $Q_{33}$ to $Q_{35}$ are each independently selected from:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

8. The organometallic compound of claim 1, wherein $R_1$ to $R_5$, $R_7$, and $R_8$ are each independently selected from hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, groups represented by Formulae 9-1 to 9-19, groups represented by Formulae 10-1 to 10-162, $—N(Q_1)(Q_2)$, $—Si(Q_3)(Q_4)(Q_5)$, $—B(Q_6)(Q_7)$, and $—P(=O)(Q_8)(Q_9)$:

Formula 9-1

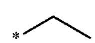

Formula 9-2

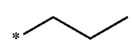

Formula 9-3

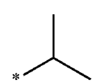

Formula 9-4

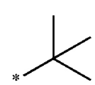

Formula 9-5

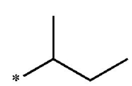

Formula 9-6

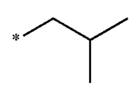

Formula 9-7

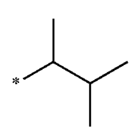

Formula 9-8

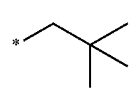

Formula 9-9

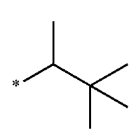

-continued
Formula 9-10
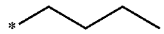
Formula 9-11
Formula 9-12
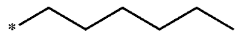
Formula 9-13
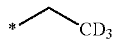
Formula 9-14
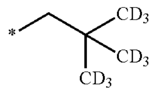
Formula 9-15
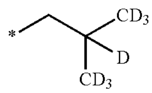
Formula 9-16
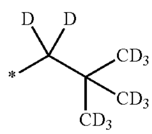
Formula 9-17
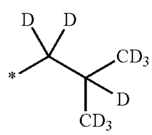
Formula 9-18
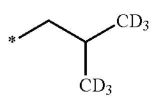
Formula 9-19
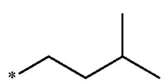
Formula 10-1
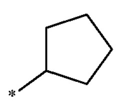
Formula 10-2
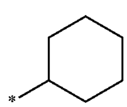
Formula 10-3
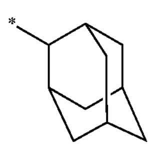
Formula 10-4
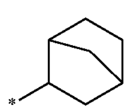
Formula 10-5
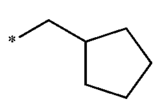
Formula 10-6
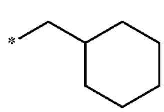
-continued
Formula 10-7
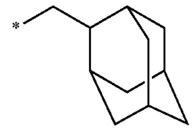
Formula 10-8
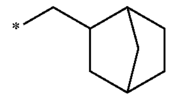
Formula 10-9
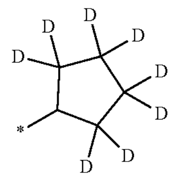
Formula 10-10
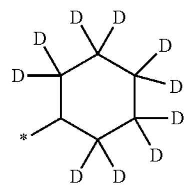
Formula 10-11
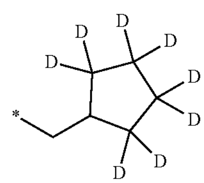
Formula 10-12
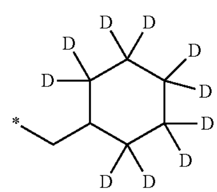
Formula 10-13
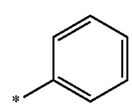
Formula 10-14
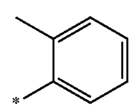
Formula 10-15
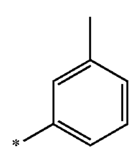
Formula 10-16
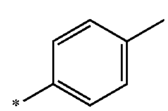
Formula 10-17
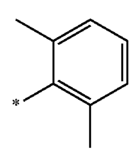

-continued
Formula 10-18
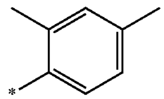
Formula 10-19
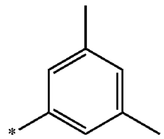
Formula 10-20
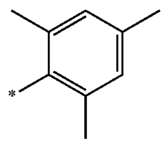
Formula 10-21
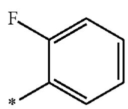
Formula 10-22
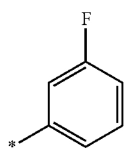
Formula 10-23
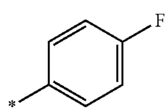
Formula 10-24
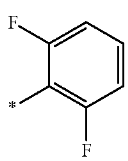
Formula 10-25
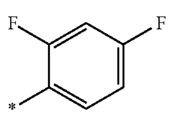
Formula 10-26
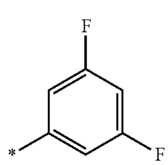
Formula 10-27
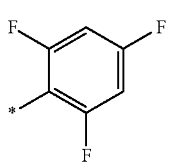
Formula 10-28
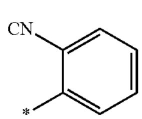
-continued
Formula 10-29
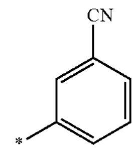
Formula 10-30
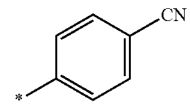
Formula 10-31
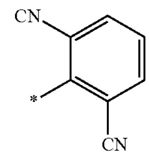
Formula 10-32
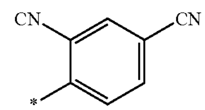
Formula 10-33
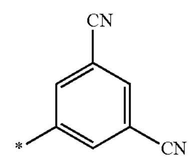
Formula 10-34
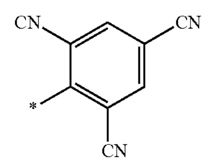
Formula 10-35
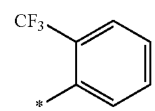
Formula 10-36
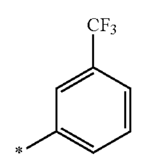
Formula 10-37
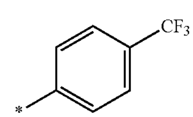
Formula 10-38
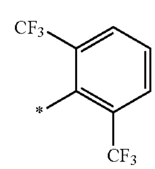
Formula 10-39
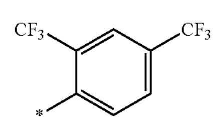

-continued
Formula 10-40
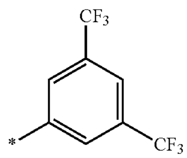
Formula 10-41
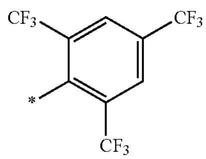
Formula 10-42
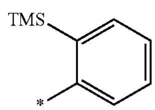
Formula 10-43
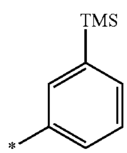
Formula 10-44
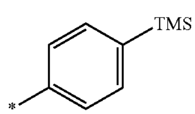
Formula 10-45
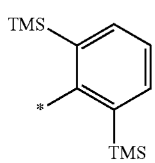
Formula 10-46
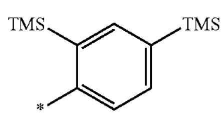
Formula 10-47
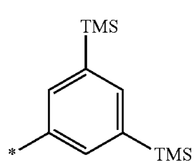
Formula 10-48
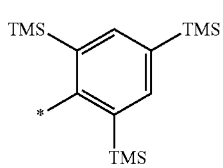
Formula 10-49
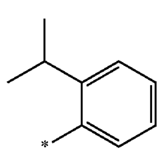
-continued
Formula 10-50
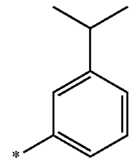
Formula 10-51
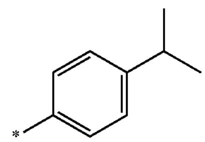
Formula 10-52
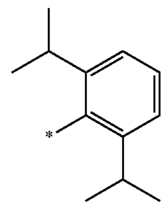
Formula 10-53
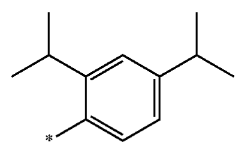
Formula 10-54
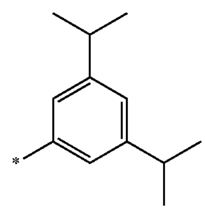
Formula 10-55
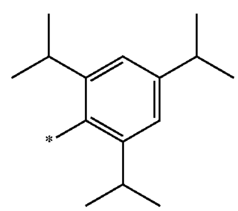
Formula 10-56
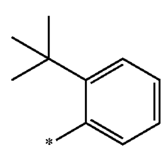
Formula 10-57
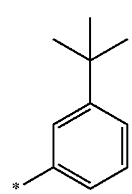
Formula 10-58
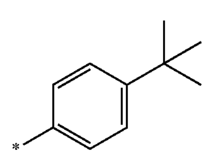

-continued
Formula 10-59
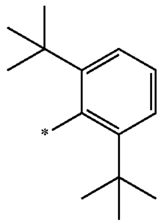
Formula 10-60
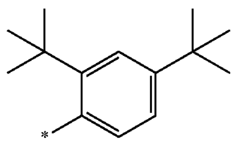
Formula 10-61
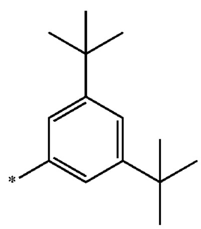
Formula 10-62
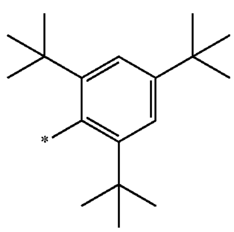
Formula 10-63
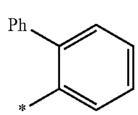
Formula 10-64
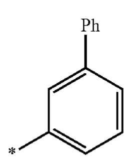
Formula 10-65
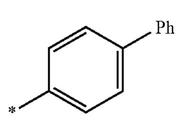
Formula 10-66
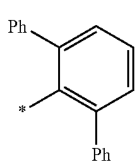
Formula 10-67
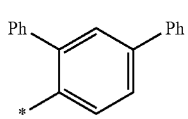
-continued
Formula 10-68
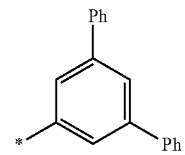
Formula 10-69
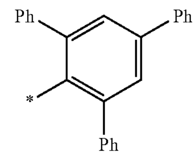
Formula 10-70
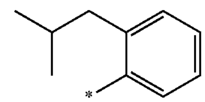
Formula 10-71
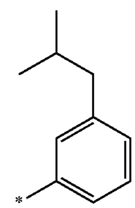
Formula 10-72
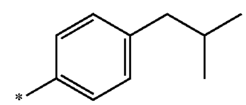
Formula 10-73
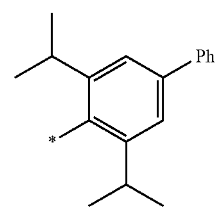
Formula 10-74
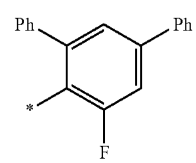
Formula 10-75
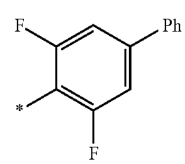
Formula 10-76
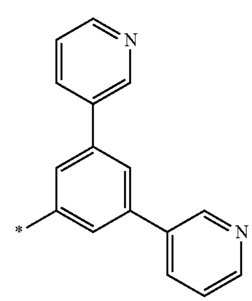

-continued
Formula 10-77
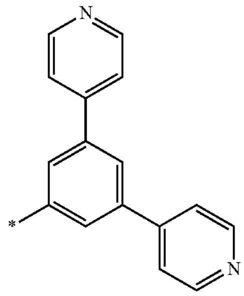
Formula 10-78
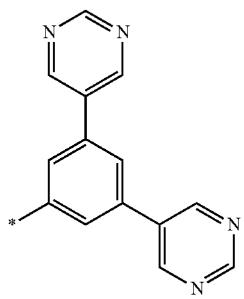
Formula 10-79
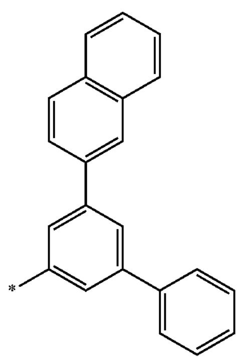
Formula 10-80
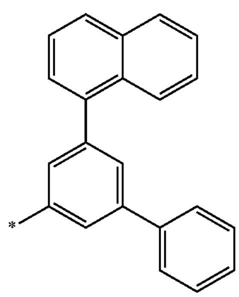
Formula 10-81
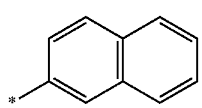
Formula 10-82
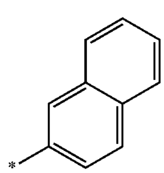
Formula 10-83
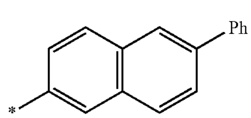
-continued
Formula 10-84
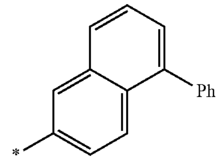
Formula 10-85
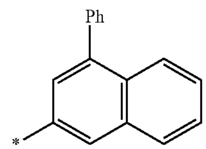
Formula 10-86
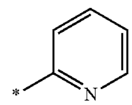
Formula 10-87
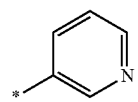
Formula 10-88
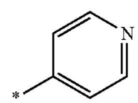
Formula 10-89
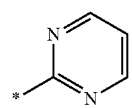
Formula 10-90
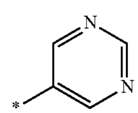
Formula 10-91
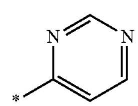
Formula 10-92
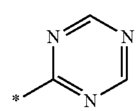
Formula 10-93
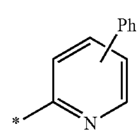
Formula 10-94
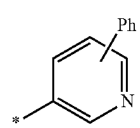
Formula 10-95
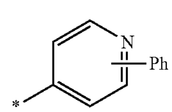
Formula 10-96
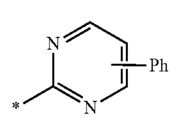

-continued
Formula 10-97
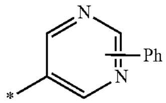
Formula 10-98
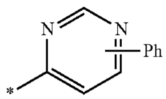
Formula 10-99
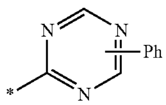
Formula 10-100
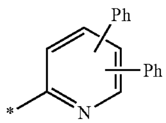
Formula 10-101
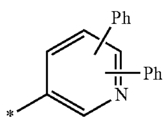
Formula 10-102
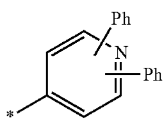
Formula 10-103
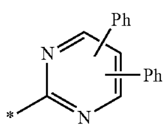
Formula 10-104
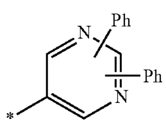
Formula 10-105
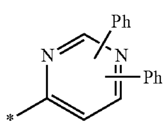
Formula 10-106
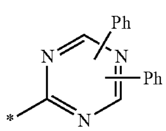
Formula 10-107
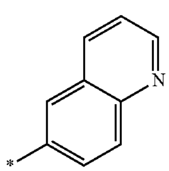
Formula 10-108
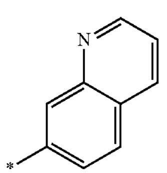
-continued
Formula 10-109
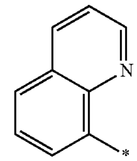
Formula 10-110
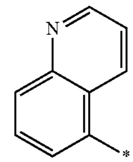
Formula 10-111
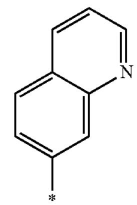
Formula 10-112
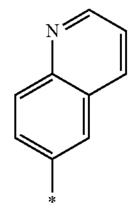
Formula 10-113
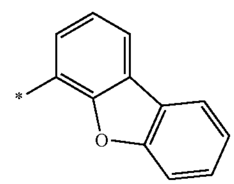
Formula 10-114
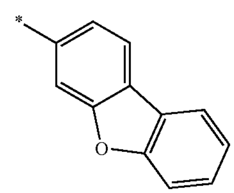
Formula 10-115
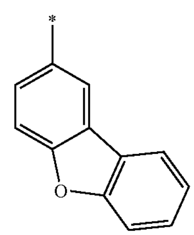
Formula 10-116
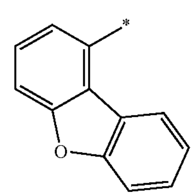

-continued
Formula 10-117
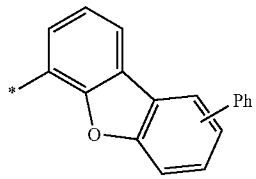
Formula 10-118
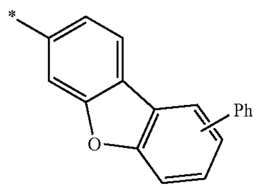
Formula 10-119
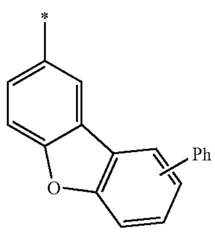
Formula 10-120
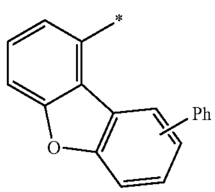
Formula 10-121
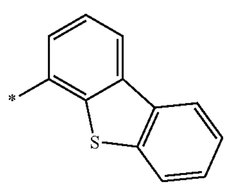
Formula 10-122
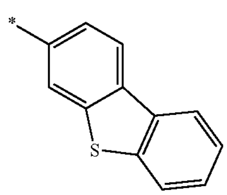
Formula 10-123
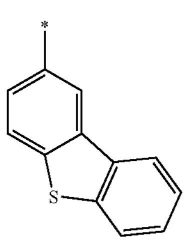
Formula 10-124
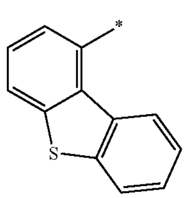
-continued
Formula 10-125
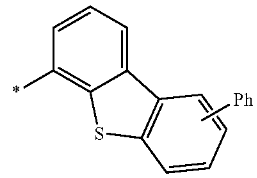
Formula 10-126
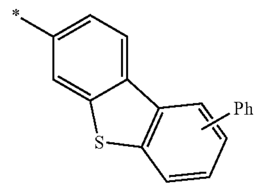
Formula 10-127
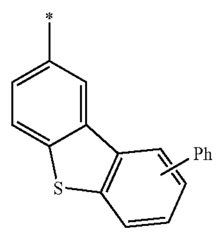
Formula 10-128
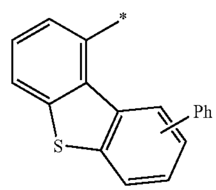
Formula 10-129
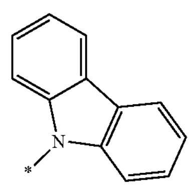
Formula 10-130
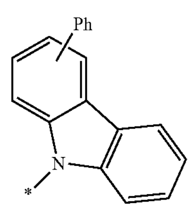
Formula 10-131
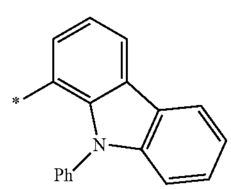
Formula 10-132
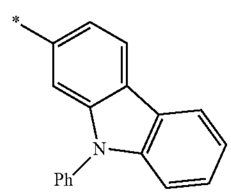

-continued
Formula 10-133
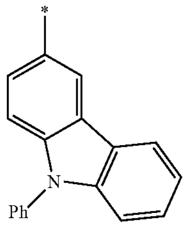
Formula 10-134
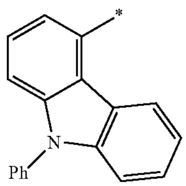
Formula 10-135
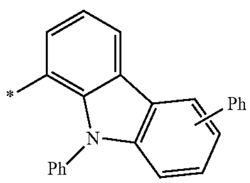
Formula 10-136
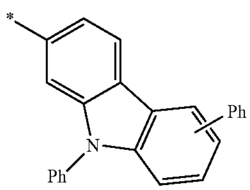
Formula 10-137
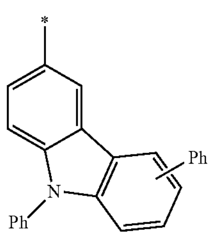
Formula 10-138
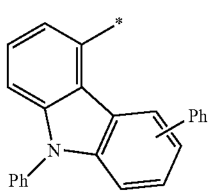
Formula 10-139
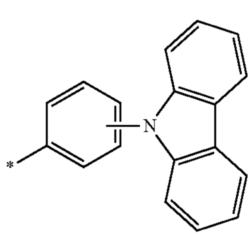
-continued
Formula 10-140
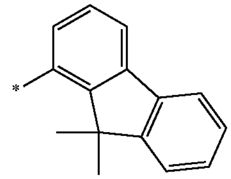
Formula 10-141
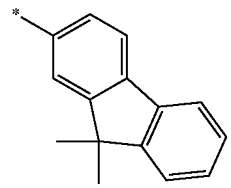
Formula 10-142
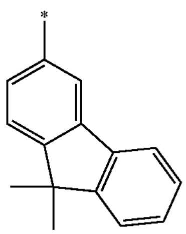
Formula 10-143
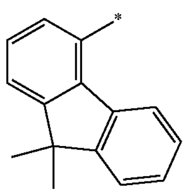
Formula 10-144
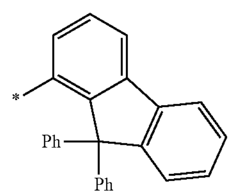
Formula 10-145
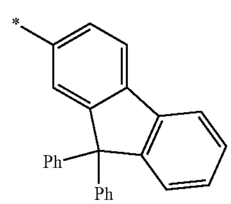
Formula 10-146
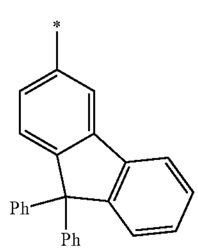

-continued

Formula 10-147

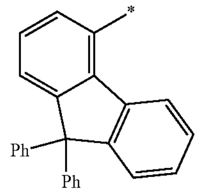

Formula 10-148

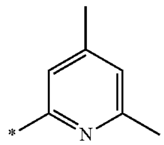

Formula 10-149

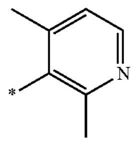

Formula 10-150

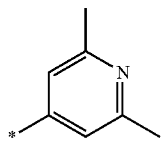

Formula 10-151

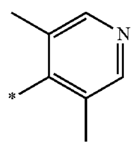

Formula 10-152

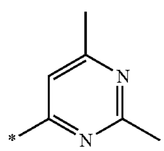

Formula 10-153

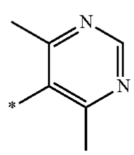

Formula 10-154

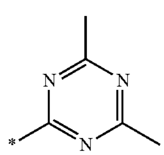

Formula 10-155

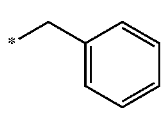

Formula 10-156

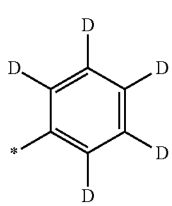

-continued

Formula 10-157

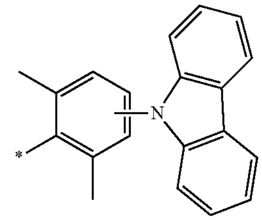

Formula 10-158

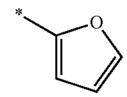

Formula 10-159

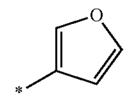

Formula 10-160

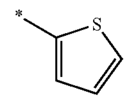

Formula 10-161

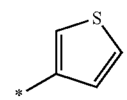

Formula 10-162

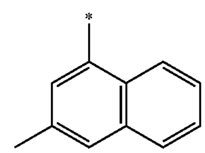

wherein, in Formulae 9-1 to 9-19 and 10-1 to 10-162, "Ph" indicates a phenyl group, "TMS" indicates a trimethylsilyl group, and "*" indicates a binding site to a neighboring atom.

9. The organometallic compound of claim 1, wherein $A_1$ is represented by one of Formulae A1-1(1) to A1-1(51), A1-2(1) to A1-2(58), and A1-3(1) to A1-3(58):

Formula A1-1(1)

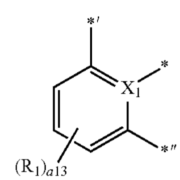

Formula A1-1(2)

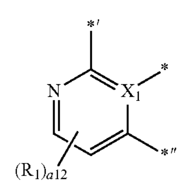

Formula A1-1(3)

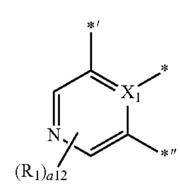

-continued
Formula A1-1(4)
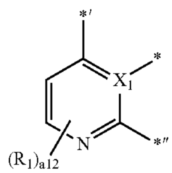
Formula A1-1(5)
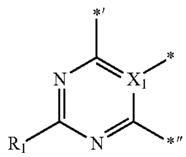
Formula A1-1(6)
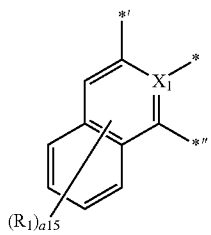
Formula A1-1(7)
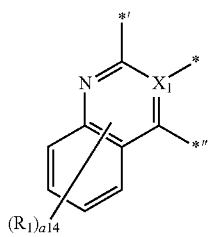
Formula A1-1(8)
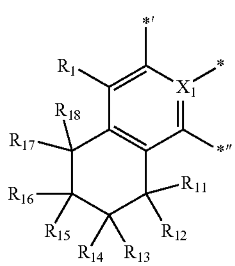
Formula A1-1(9)
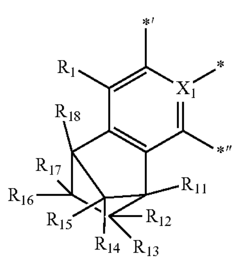
Formula A1-1(10)
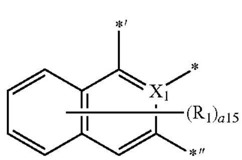
-continued
Formula A1-1(11)
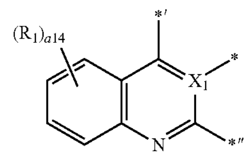
Formula A1-1(12)
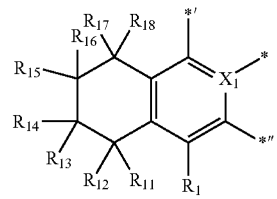
Formula A1-1(13)
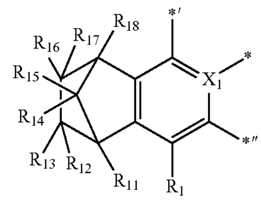
Formula A1-1(14)
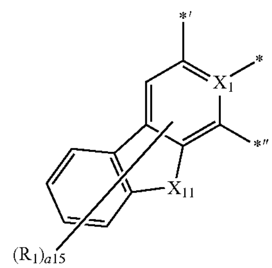
Formula A1-1(15)
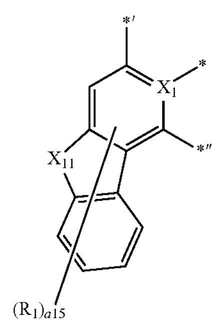
Formula A1-1(16)
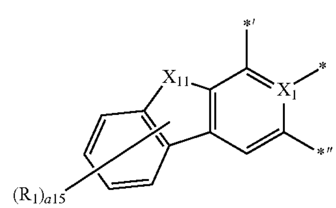
Formula A1-1(17)
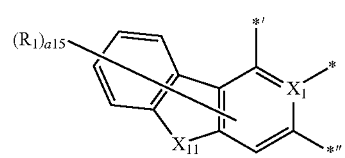

Formula A1-1(18)
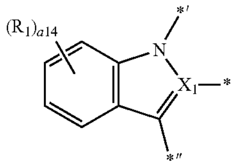
Formula A1-1(19)
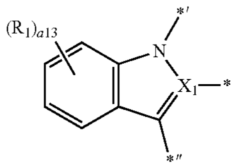
Formula A1-1(20)
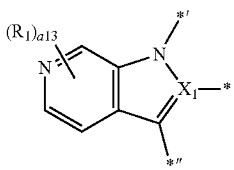
Formula A1-1(21)
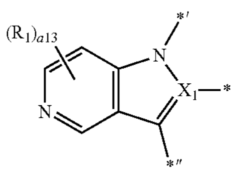
Formula A1-1(22)
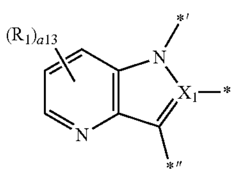
Formula A1-1(23)
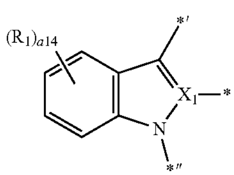
Formula A1-1(24)
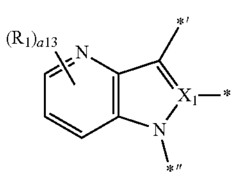
Formula A1-1(25)
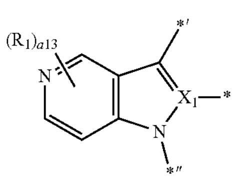
Formula A1-1(26)
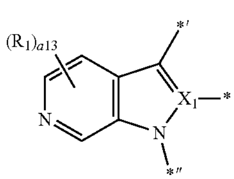
Formula A1-1(27)
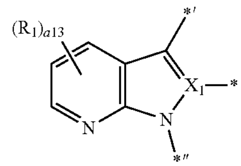
Formula A1-1(28)
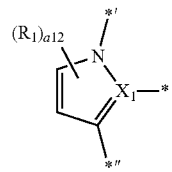
Formula A1-1(29)
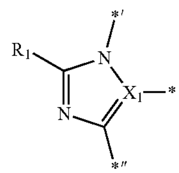
Formula A1-1(30)
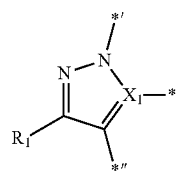
Formula A1-1(31)
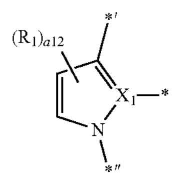
Formula A1-1(32)
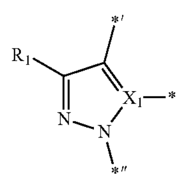
Formula A1-1(33)
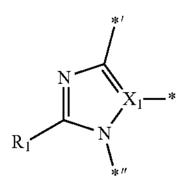
Formula A1-1(34)
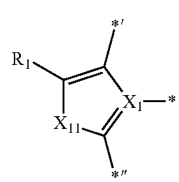
Formula A1-1(35)
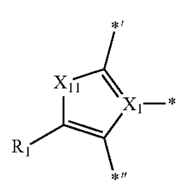

-continued
Formula A1-1(36)
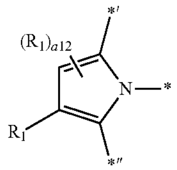
Formula A1-1(37)
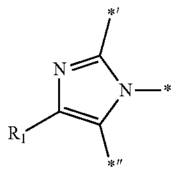
Formula A1-1(38)
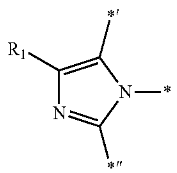
Formula A1-1(39)
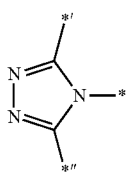
Formula A1-1(40)
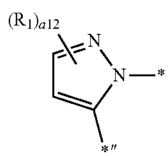
Formula A1-1(41)
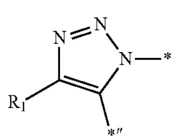
Formula A1-1(42)
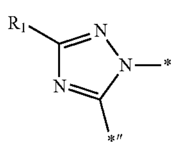
Formula A1-1(43)
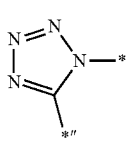
Formula A1-1(44)
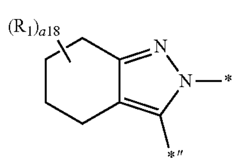
Formula A1-1(45)
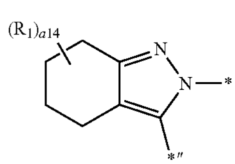
-continued
Formula A1-1(46)
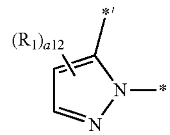
Formula A1-1(47)
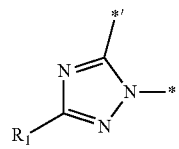
Formula A1-1(48)
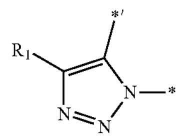
Formula A1-1(49)
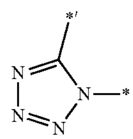
Formula A1-1(50)
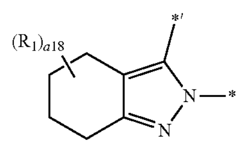
Formula A1-1(51)
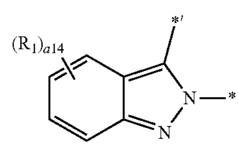
Formula A1-2(1)
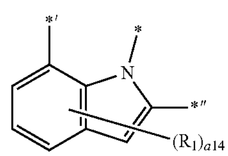
Formula A1-2(2)
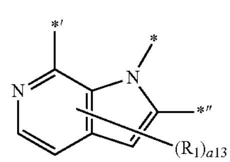
Formula A1-2(3)
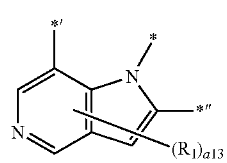
Formula A1-2(4)
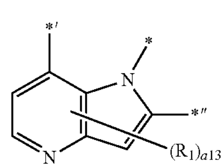

-continued
Formula A1-2(5)
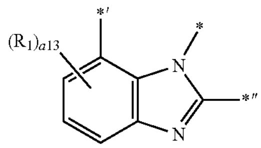
Formula A1-2(6)
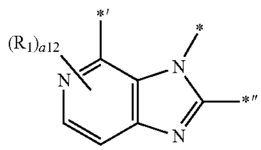
Formula A1-2(7)
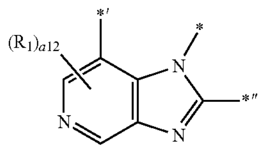
Formula A1-2(8)
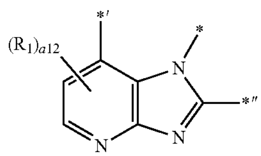
Formula A1-2(9)
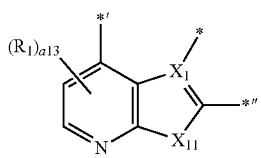
Formula A1-2(10)
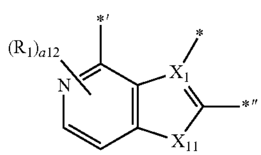
Formula A1-2(11)
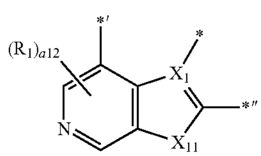
Formula A1-2(12)
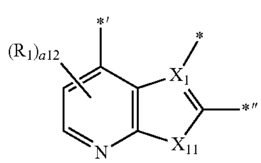
Formula A1-2(13)
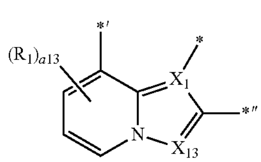
Formula A1-2(14)
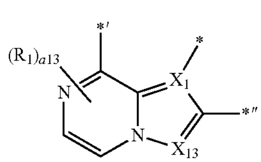
-continued
Formula A1-2(15)
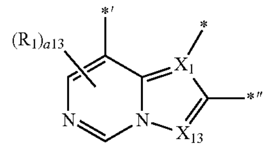
Formula A1-2(16)
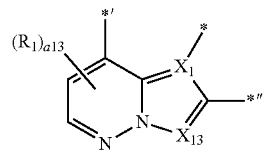
Formula A1-2(17)
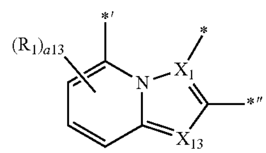
Formula A1-2(18)
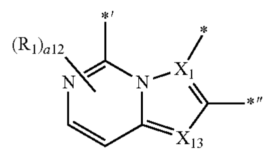
Formula A1-2(19)
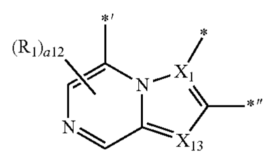
Formula A1-2(20)
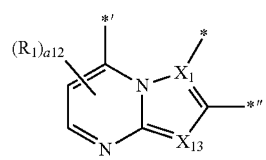
Formula A1-2(21)
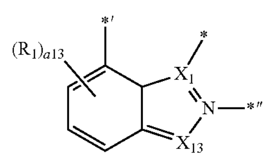
Formula A1-2(22)
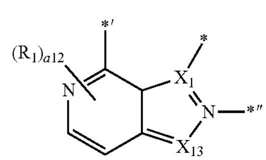
Formula A1-2(23)
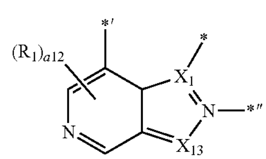
Formula A1-2(24)
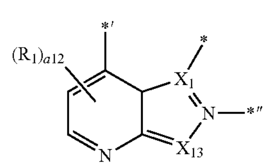

Formula A1-2(25)
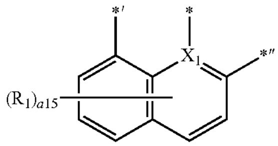
Formula A1-2(26)
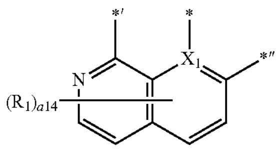
Formula A1-2(27)
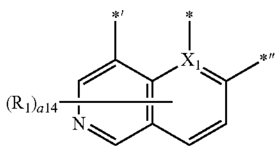
Formula A1-2(28)
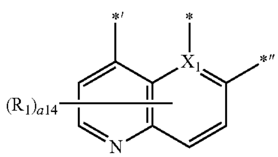
Formula A1-2(29)
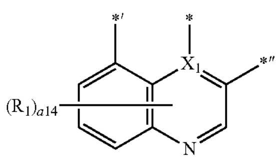
Formula A1-2(30)
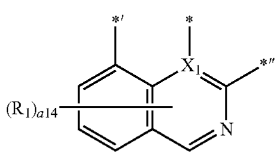
Formula A1-2(31)
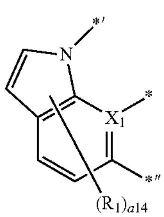
Formula A1-2(32)
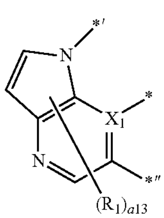
Formula A1-2(33)
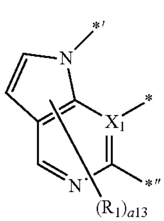
Formula A1-2(34)
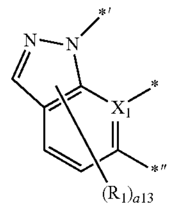
Formula A1-2(35)
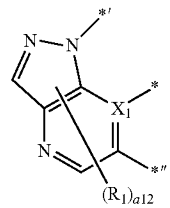
Formula A1-2(36)
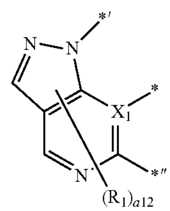
Formula A1-2(37)
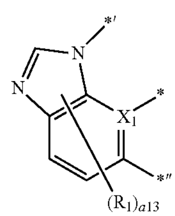
Formula A1-2(38)
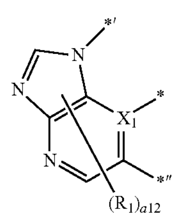
Formula A1-2(39)
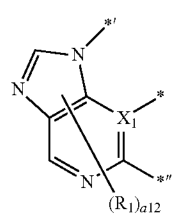
Formula A1-2(40)
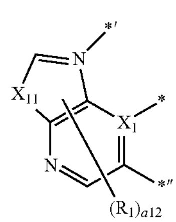

Formula A1-2(41)
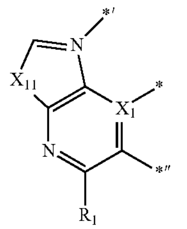
Formula A1-2(42)
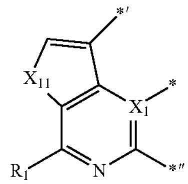
Formula A1-2(43)
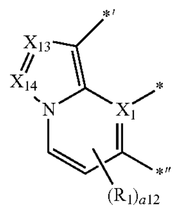
Formula A1-2(44)
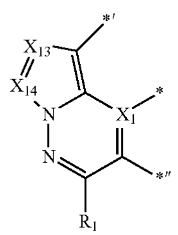
Formula A1-2(45)
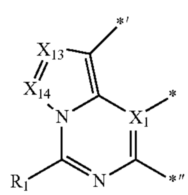
Formula A1-2(46)
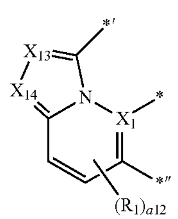
Formula A1-2(47)
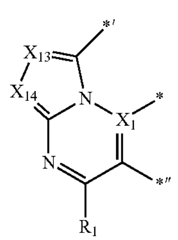
Formula A1-2(48)
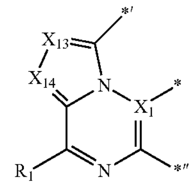
Formula A1-2(49)
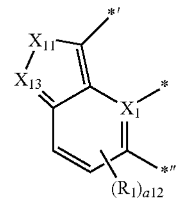
Formula A1-2(50)
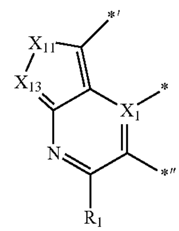
Formula A1-2(51)
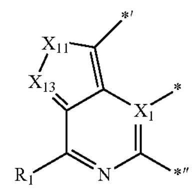
Formula A1-2(52)
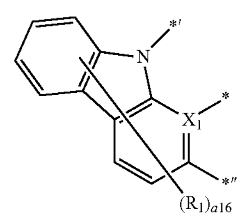
Formula A1-2(53)
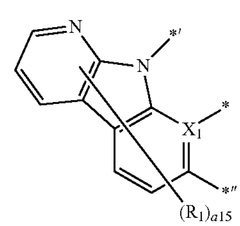
Formula A1-2(54)
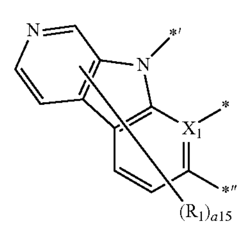

-continued
Formula A1-2(55)
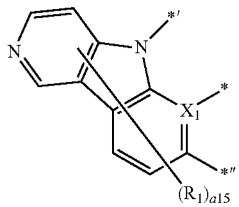
Formula A1-2(56)
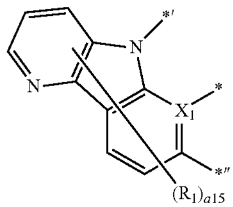
Formula A1-2(57)
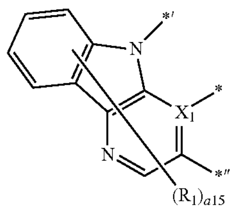
Formula A1-2(58)
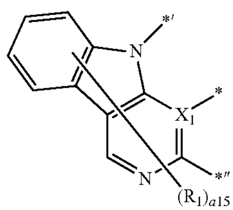
Formula A1-3(1)
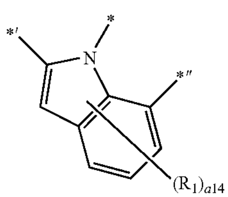
Formula A1-3(2)
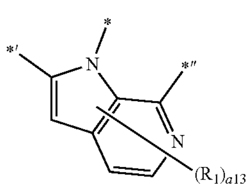
Formula A1-3(3)
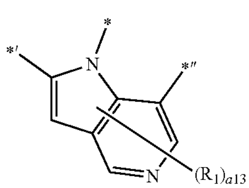
Formula A1-3(4)
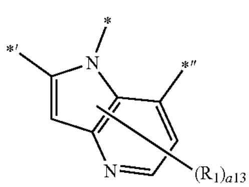
-continued
Formula A1-3(5)
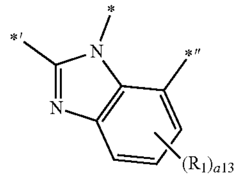
Formula A1-3(6)
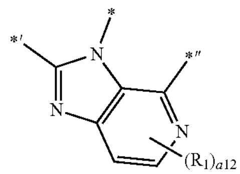
Formula A1-3(7)
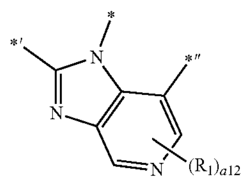
Formula A1-3(8)
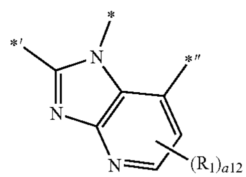
Formula A1-3(9)
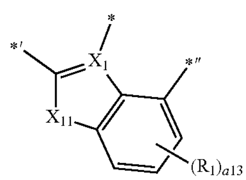
Formula A1-3(10)
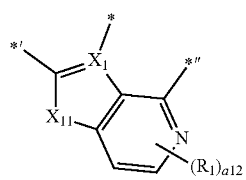
Formula A1-3(11)
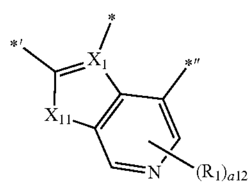
Formula A1-3(12)
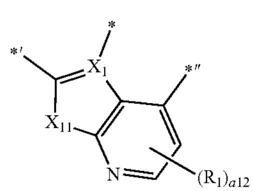

-continued
Formula A1-3(13)
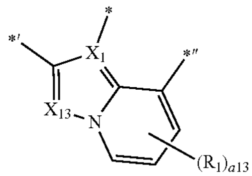
Formula A1-3(14)
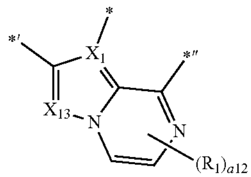
Formula A1-3(15)
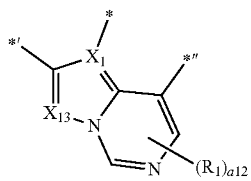
Formula A1-3(16)
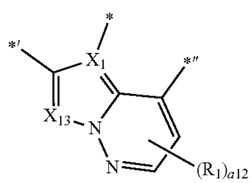
Formula A1-3(17)
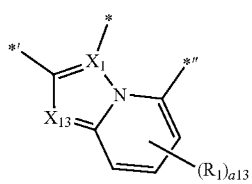
Formula A1-3(18)
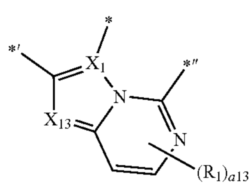
Formula A1-3(19)
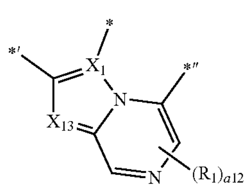
Formula A1-3(20)
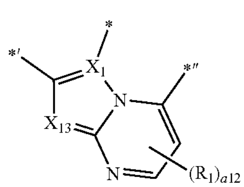
-continued
Formula A1-3(21)
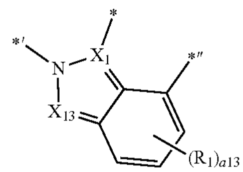
Formula A1-3(22)
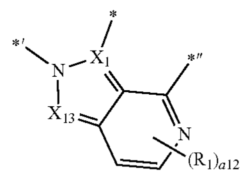
Formula A1-3(23)
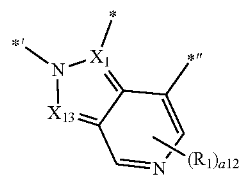
Formula A1-3(24)
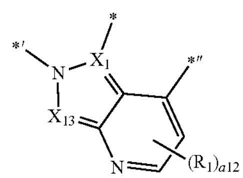
Formula A1-3(25)
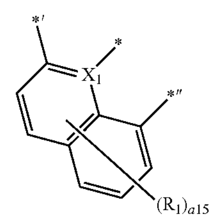
Formula A1-3(26)
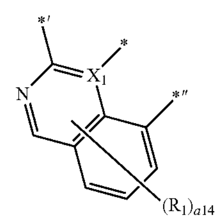
Formula A1-3(27)
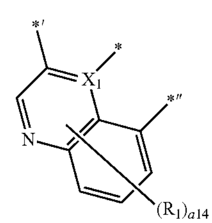
Formula A1-3(28)
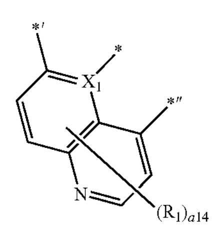

-continued
Formula A1-3(29)
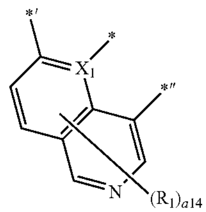
Formula A1-3(30)
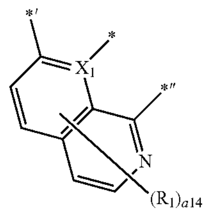
Formula A1-3(31)
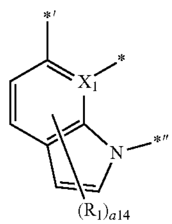
Formula A1-3(32)
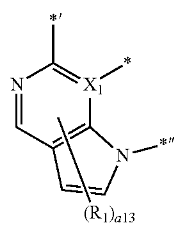
Formula A1-3(33)
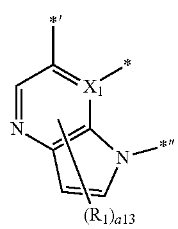
Formula A1-3(34)
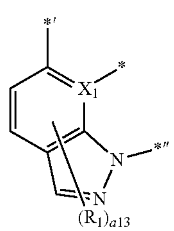
Formula A1-3(35)
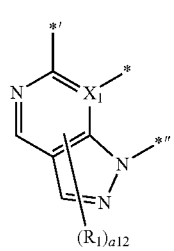
-continued
Formula A1-3(36)
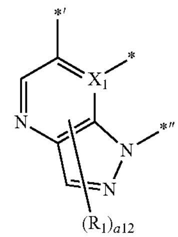
Formula A1-3(37)
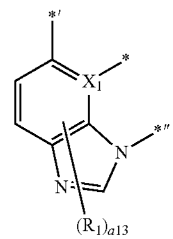
Formula A1-3(38)
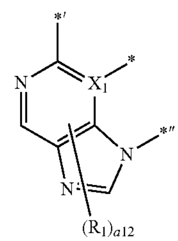
Formula A1-3(39)
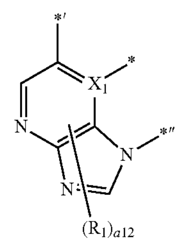
Formula A1-3(40)
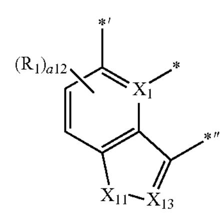
Formula A1-3(41)
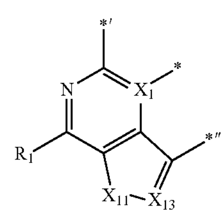
Formula A1-3(42)
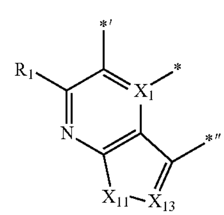

-continued
Formula A1-3(43)
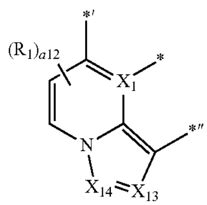
Formula A1-3(44)
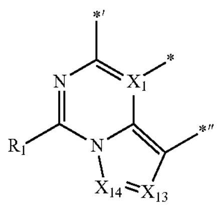
Formula A1-3(45)
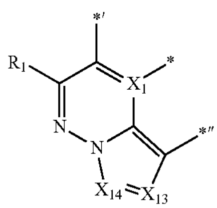
Formula A1-3(46)
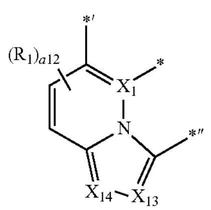
Formula A1-3(47)
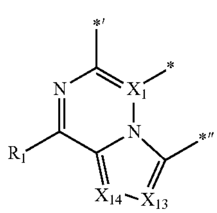
Formula A1-3(48)
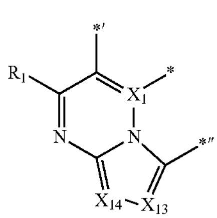
Formula A1-3(49)
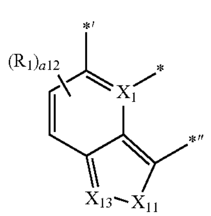
-continued
Formula A1-3(50)
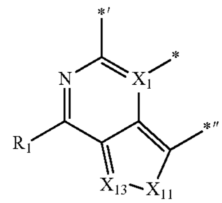
Formula A1-3(51)
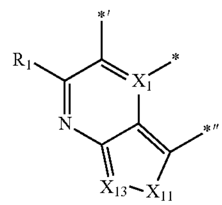
Formula A1-3(52)
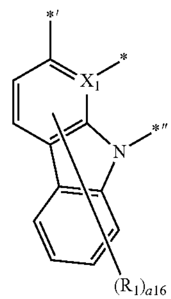
Formula A1-3(53)
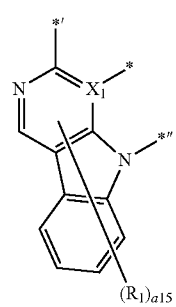
Formula A1-3(54)
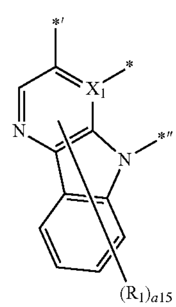
Formula A1-3(55)
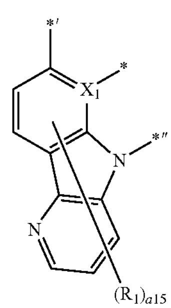

-continued

Formuka A1-3(56)
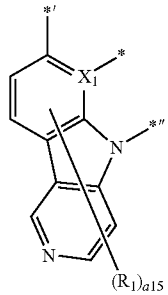
Formuka A1-3(57)
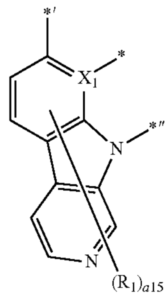
Formuka A1-3(58)
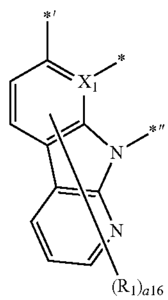

wherein, in Formulae A1-1(1) to A1-1(51), A1-2(1) to A1-2(58), and A1-3(1) to A1-3(58), $X_1$ and $R_1$ are each independently the same as in claim 1, $X_{11}$ is O, S, $N(R_{11})$, $C(R_{11})(R_{12})$, or $Si(R_{11})(R_{12})$, $X_{13}$ is N or $C(R_{13})$, $X_{14}$ is N or $C(R_{14})$, $R_{11}$ to $R_{18}$ are each independently the same as $R_1$ in claim 1, a18 is an integer from 0 to 8, a17 is an integer from 0 to 7, a16 is an integer from 0 to 6, a15 is an integer from 0 to 5, a14 is an integer from 0 to 4, a13 is an integer from 0 to 3, a12 is an integer from 0 to 2, and

*, *', and *" are the same as *, *', and *" in Formula A1-1.

10. The organometallic compound of claim 1, wherein $A_2$ is represented by one of Formulae A2-1(1) to A2-1(51), A2-2(1) to A2-2(58), and A2-3(1) to A2-3(58):

Formula A2-1(1)
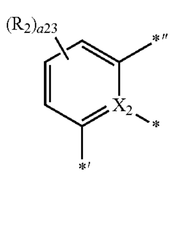

-continued

Formula A2-1(2)
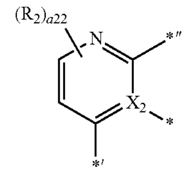
Formula A2-1(3)
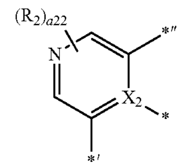
Formula A2-1(4)
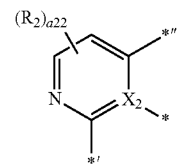
Formula A2-1(5)
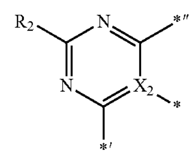
Formula A2-1(6)
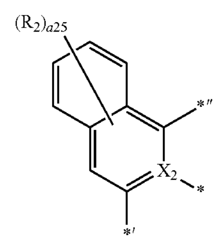
Formula A2-1(7)
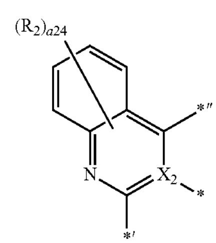
Formula A2-1(8)
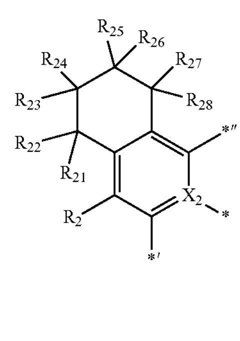

-continued
Formula A2-1(9)
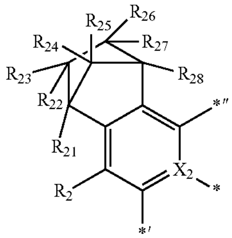
Formula A2-1(10)
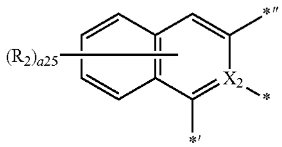
Formula A2-1(11)
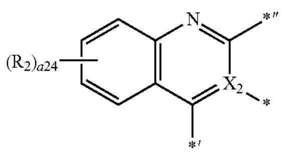
Formula A2-1(12)
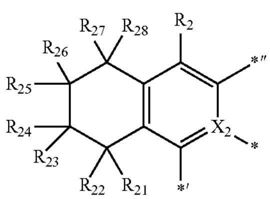
Formula A2-1(13)
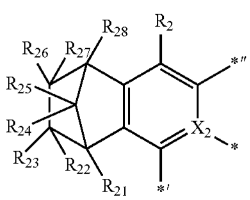
Formula A2-1(14)
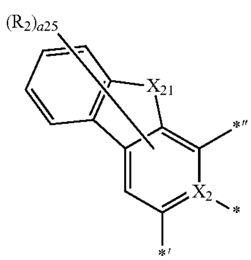
Formula A2-1(15)
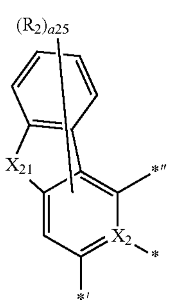
-continued
Formula A2-1(16)
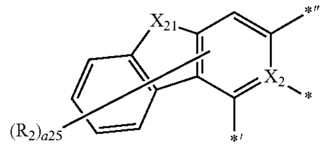
Formula A2-1(17)
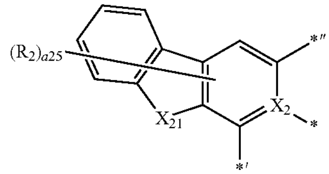
Formula A2-1(18)
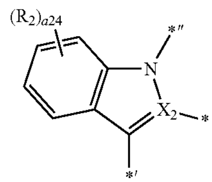
Formula A2-1(19)
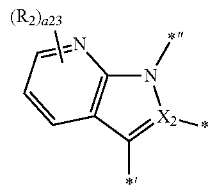
Formula A2-1(20)
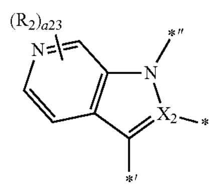
Formula A2-1(21)
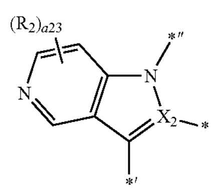
Formula A2-1(22)
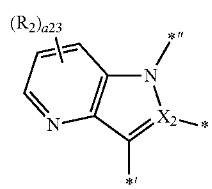
Formula A2-1(23)
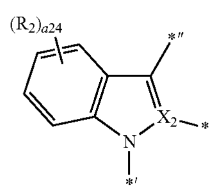

-continued
Formula A2-1(24)
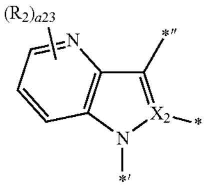
Formula A2-1(25)
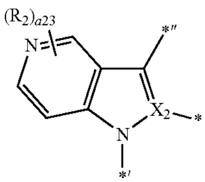
Formula A2-1(26)
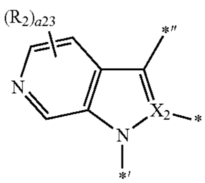
Formula A2-1(27)
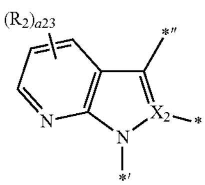
Formula A2-1(28)
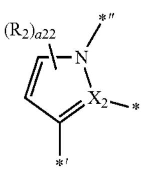
Formula A2-1(29)
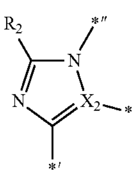
Formula A2-1(30)
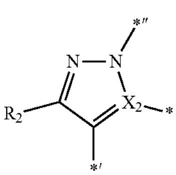
Formula A2-1(31)
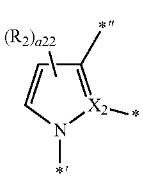
Formula A2-1(32)
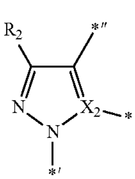
-continued
Formula A2-1(33)
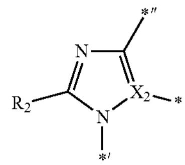
Formula A2-1(34)
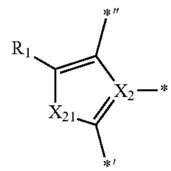
Formula A2-1(35)
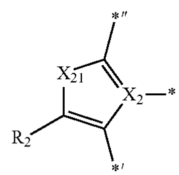
Formula A2-1(36)
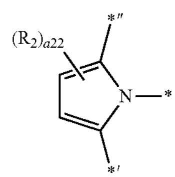
Formula A2-1(37)
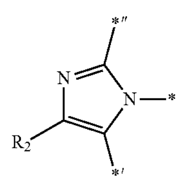
Formula A2-1(38)
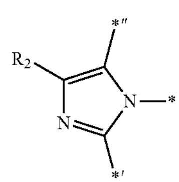
Formula A2-1(39)
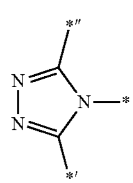
Formula A2-1(40)
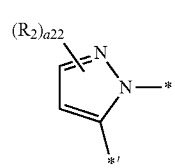
Formula A2-1(41)
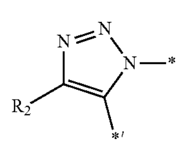

-continued
Formula A2-1(42)
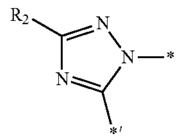
Formula A2-1(43)
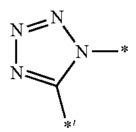
Formula A2-1(44)
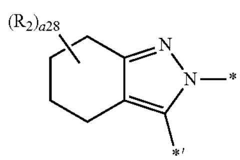
Formula A2-1(45)
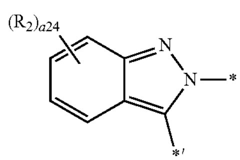
Formula A2-1(46)
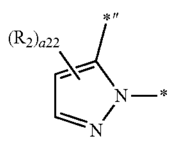
Formula A2-1(47)
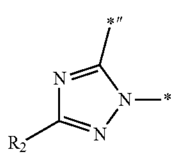
Formula A2-1(48)
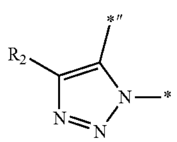
Formula A2-1(49)
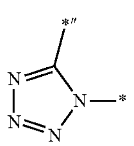
Formula A2-1(50)
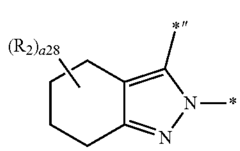
Formula A2-1(51)
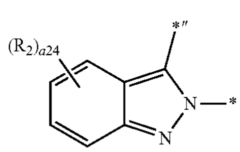
-continued
Formula A2-2(1)
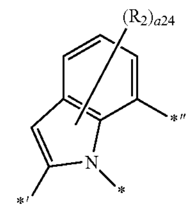
Formula A2-2(2)
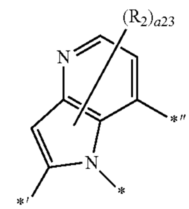
Formula A2-2(3)
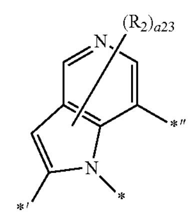
Formula A2-2(4)
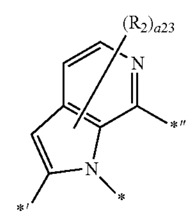
Formula A2-2(5)
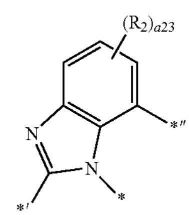
Formula A2-2(6)
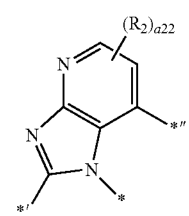
Formula A2-2(7)
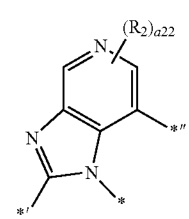

-continued
Formula A2-2(8)
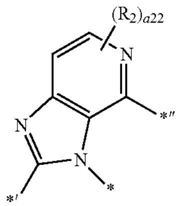
Formula A2-2(9)
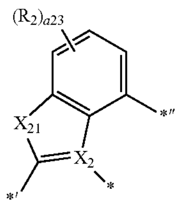
Formula A2-2(10)
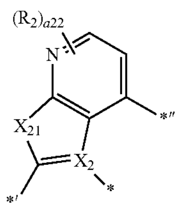
Formula A2-2(11)
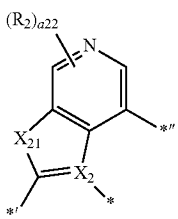
Formula A2-2(12)
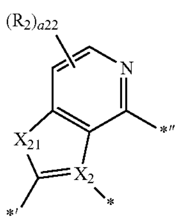
Formula A2-2(13)
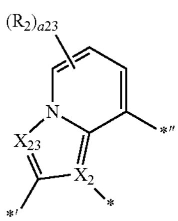
Formula A2-2(14)
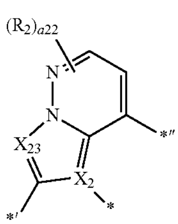
-continued
Formula A2-2(15)
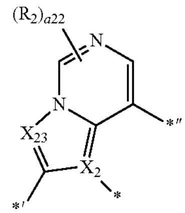
Formula A2-2(16)
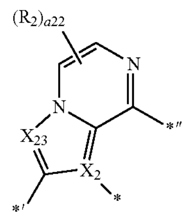
Formula A2-2(17)
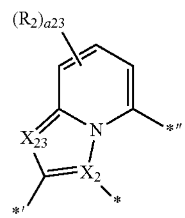
Formula A2-2(18)
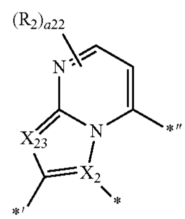
Formula A2-2(19)
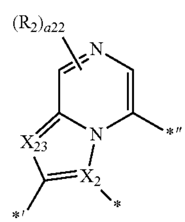
Formula A2-2(20)
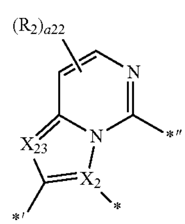
Formula A2-2(21)
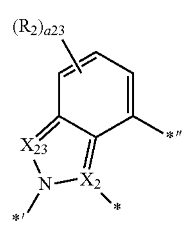

-continued
Formula A2-2(22)
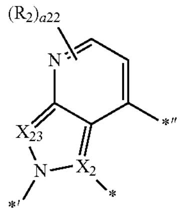
Formula A2-2(23)
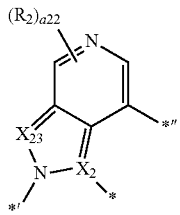
Formula A2-2(24)
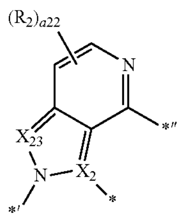
Formula A2-2(25)
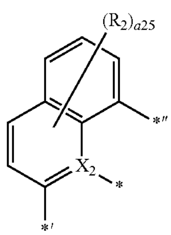
Formula A2-2(26)
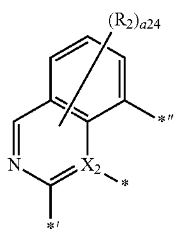
Formula A2-2(27)
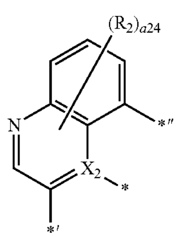
Formula A2-2(28)
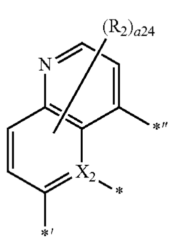
-continued
Formula A2-2(29)
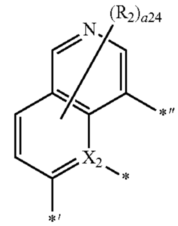
Formula A2-2(30)
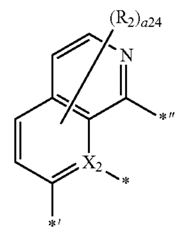
Formula A2-2(31)
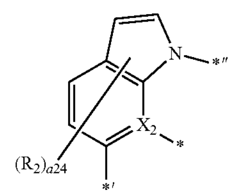
Formula A2-2(32)
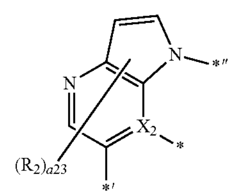
Formula A2-2(33)
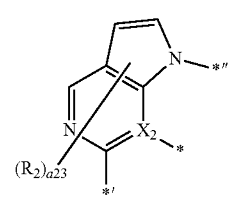
Formula A2-2(34)
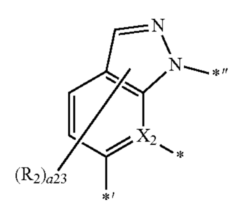
Formula A2-2(35)
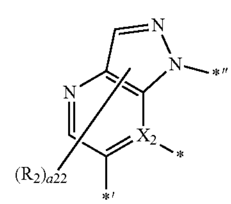

-continued
Formula A2-2(36)
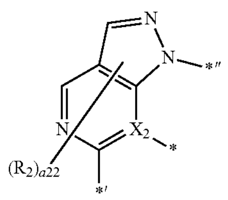
Formula A2-2(37)
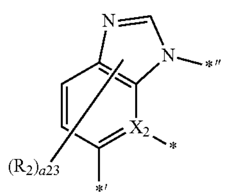
Formula A2-2(38)
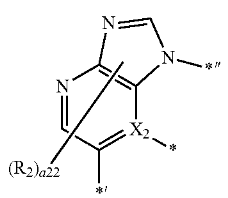
Formula A2-2(39)
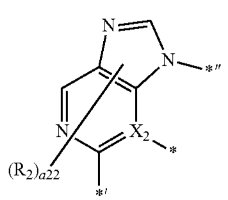
Formula A2-2(40)
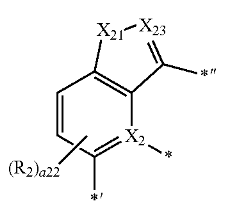
Formula A2-2(41)
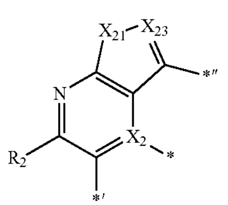
Formula A2-2(42)
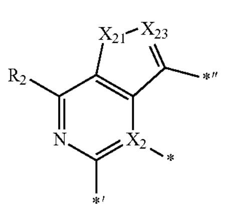
Formula A2-2(43)
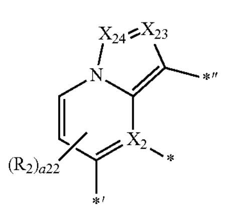
-continued
Formula A2-2(44)
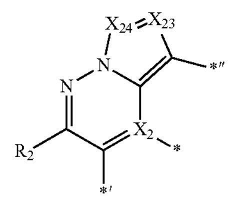
Formula A2-2(45)
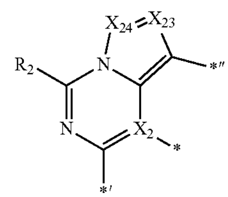
Formula A2-2(46)
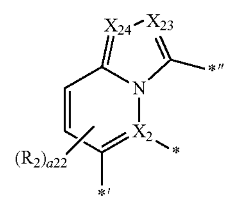
Formula A2-2(47)
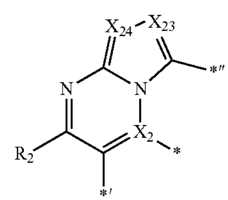
Formula A2-2(48)
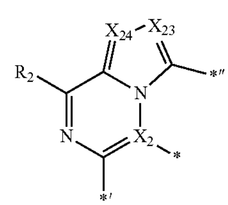
Formula A2-2(49)
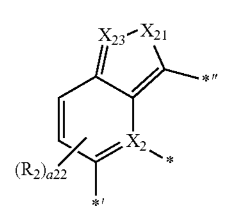
Formula A2-2(50)
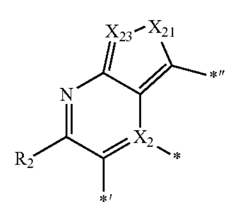
Formula A2-2(51)
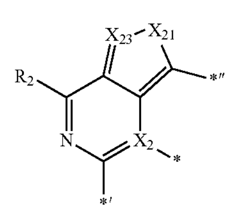

-continued
Formula A2-2(52)
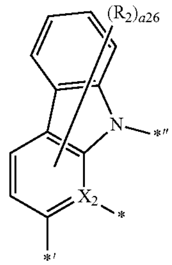
Formula A2-2(53)
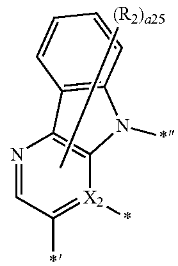
Formula A2-2(54)
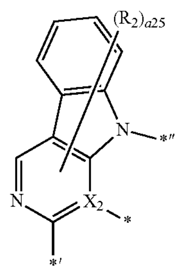
Formula A2-2(55)
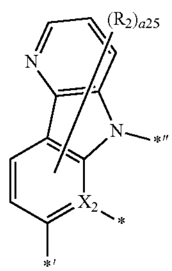
Formula A2-2(56)
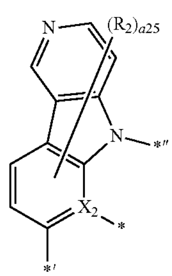
Formula A2-2(57)
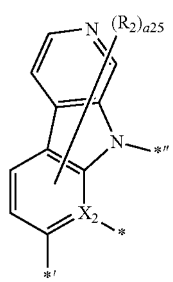
-continued
Formula A2-2(58)
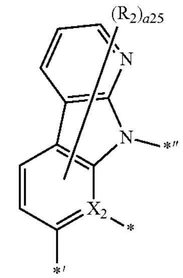
Formula A2-3(1)
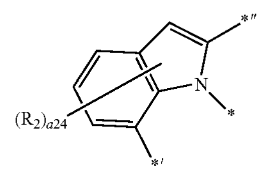
Formula A2-3(2)
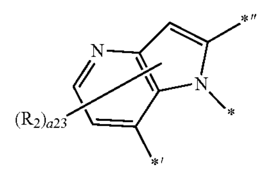
Formula A2-3(3)
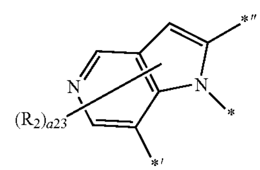
Formula A2-3(4)
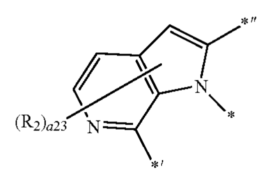
Formula A2-3(5)
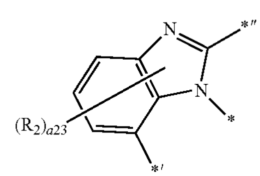
Formula A2-3(6)
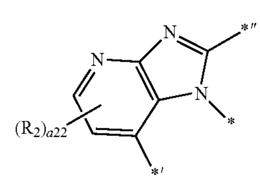
Formula A2-3(7)
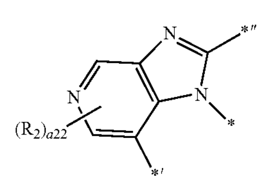

-continued
Formula A2-3(8)
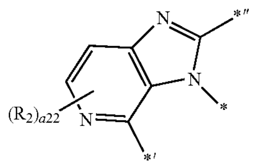
Formula A2-3(9)
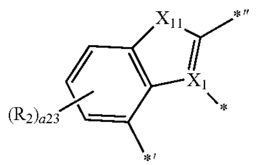
Formula A2-3(10)
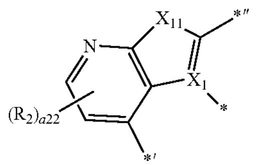
Formula A2-3(11)
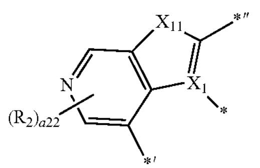
Formula A2-3(12)
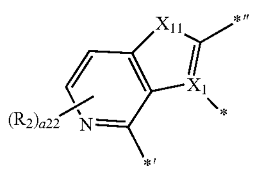
Formula A2-3(13)
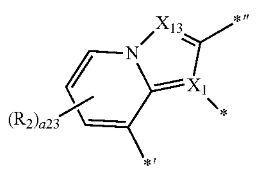
Formula A2-3(14)
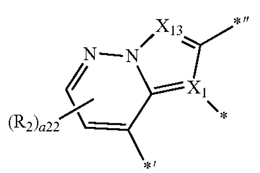
Formula A2-3(15)
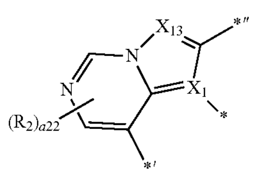
Formula A2-3(16)
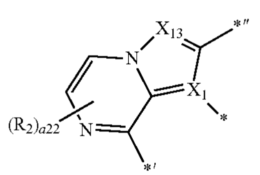
-continued
Formula A2-3(17)
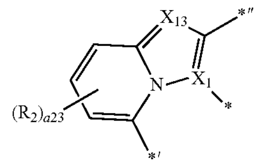
Formula A2-3(18)
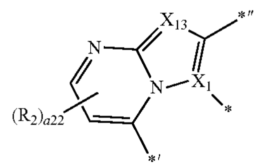
Formula A2-3(19)
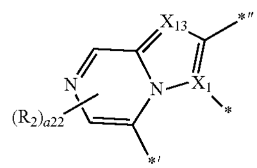
Formula A2-3(20)
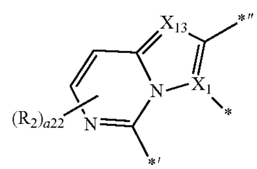
Formula A2-3(21)
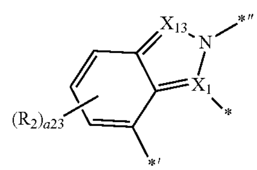
Formula A2-3(22)
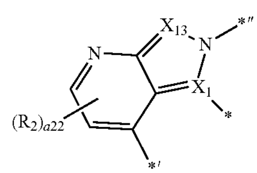
Formula A2-3(23)
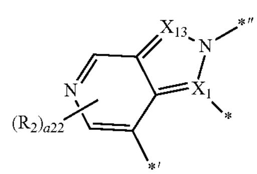
Formula A2-3(24)
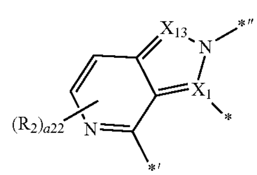
Formula A2-3(25)
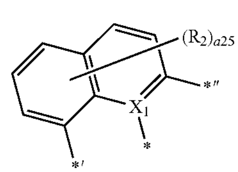

-continued
Formula A2-3(26)
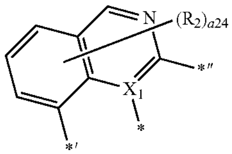
Formula A2-3(27)
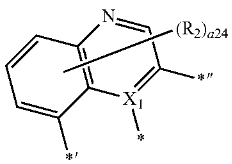
Formula A2-3(28)
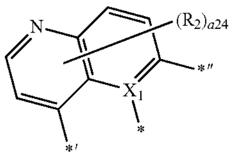
Formula A2-3(29)
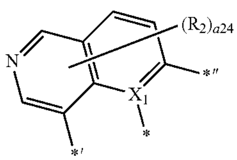
Formula A2-3(30)
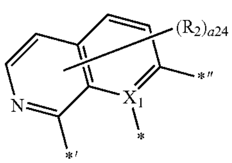
Formula A2-3(31)
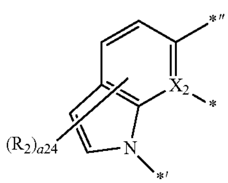
Formula A2-3(32)
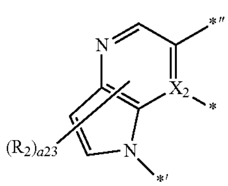
Formula A2-3(33)
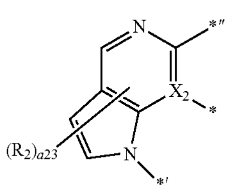
Formula A2-3(34)
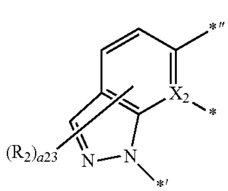
-continued
Formula A2-3(35)
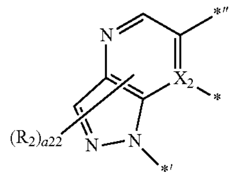
Formula A2-3(36)
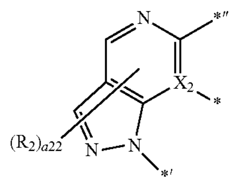
Formula A2-3(37)
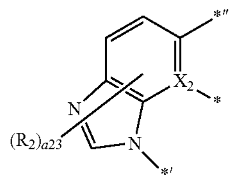
Formula A2-3(38)
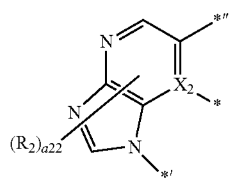
Formula A2-3(39)
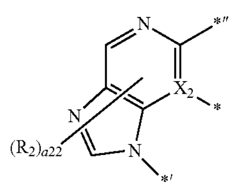
Formula A2-3(40)
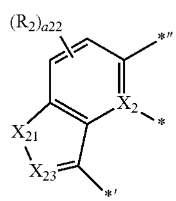
Formula A2-3(41)
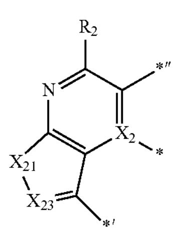
Formula A2-3(42)
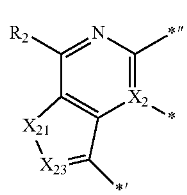

-continued
Formula A2-3(43)
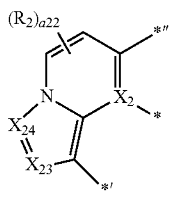
Formula A2-3(44)
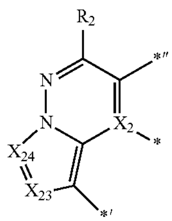
Formula A2-3(45)
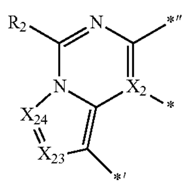
Formula A2-3(46)
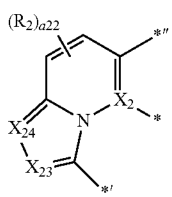
Formula A2-3(47)
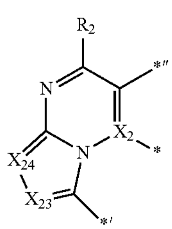
Formula A2-3(48)
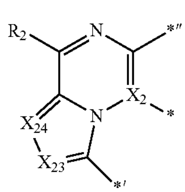
Formula A2-3(49)
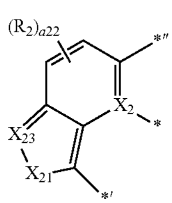
-continued
Formula A2-3(50)
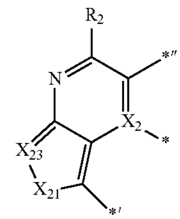
Formula A2-3(51)
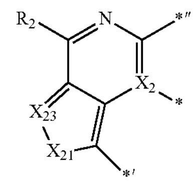
Formula A2-3(52)
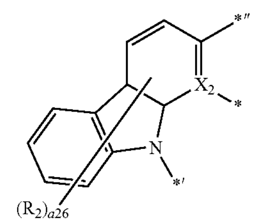
Formula A2-3(53)
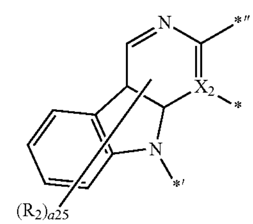
Formula A2-3(54)
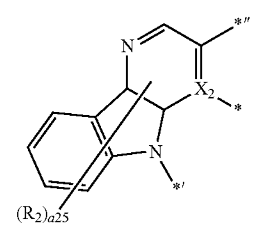
Formula A2-3(55)
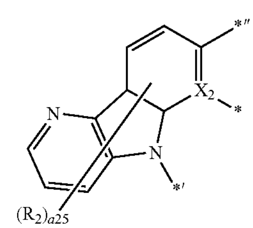
Formula A2-3(56)
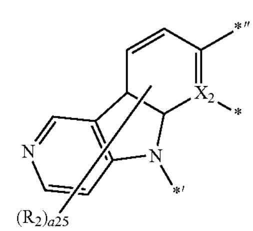

-continued

Formula A2-3(57)

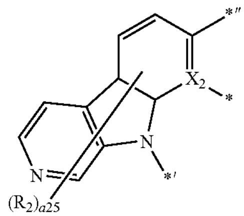

Formula A2-3(58)

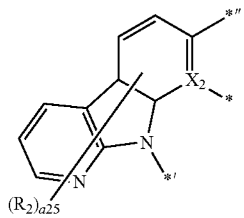

, wherein, in Formulae A2-1(1) to A2-1(51), A2-2(1) to A2-2(58), and A2-3(1) to A2-3(58), $X_2$ and $R_2$ are each independently the same as in claim 1, $X_{21}$ is O, S, $N(R_{21})$, $C(R_{21})(R_{22})$, or $Si(R_{21})(R_{22})$, $X_{23}$ is N or $C(R_{23})$, $X_{24}$ is N or $C(R_{24})$, $R_{21}$ to $R_{28}$ are each independently the same as $R_2$ in claim 1, a28 is an integer from 0 to 8, a26 is an integer from 0 to 6, a25 is an integer from 0 to 5, a24 is an integer from 0 to 4, a23 is an integer from 0 to 3, a22 is an integer from 0 to 2, and

*, *', and *" are the same as *, *', and *" in Formula A2-1.

11. The organometallic compound of claim 1, wherein $A_3$ is represented by one of Formulae A3-1(1) to A3-1(25), A3-2(1) to A3-2(58), and A3-3(1) to A3-3(58):

Formula A3-1(1)

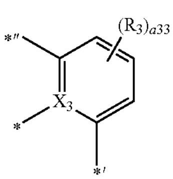

Formula A3-1(2)

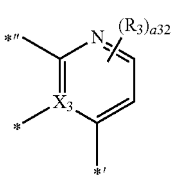

Formula A3-1(3)

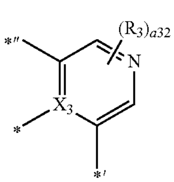

-continued

Formula A3-1(4)

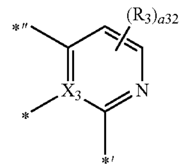

Formula A3-1(5)

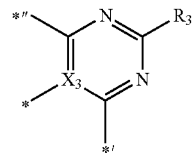

Formula A3-1(6)

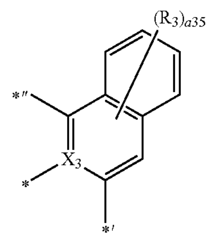

Formula A3-1(7)

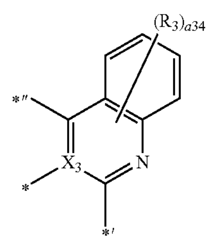

Formula A3-1(8)

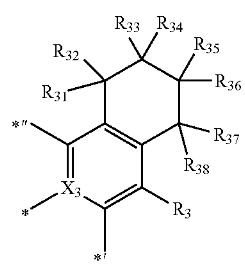

Formula A3-1(9)

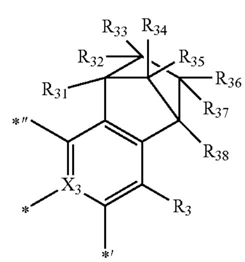

Formula A3-1(10)

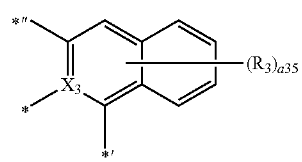

-continued
Formula A3-1(11)
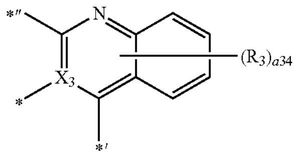
Formula A3-1(12)
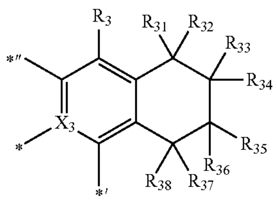
Formula A3-1(13)
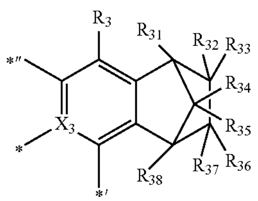
Formula A3-1(14)
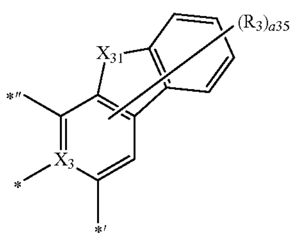
Formula A3-1(15)
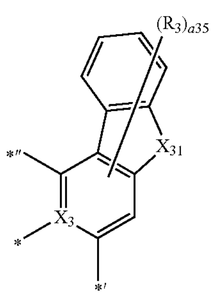
Formula A3-1(16)
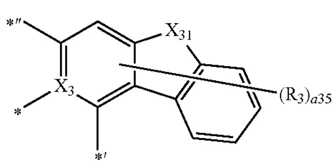
Formula A3-1(17)
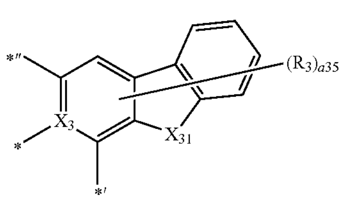
-continued
Formula A3-1(18)
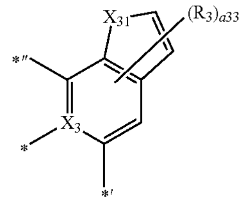
Formula A3-1(19)
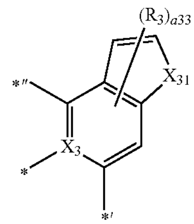
Formula A3-1(20)
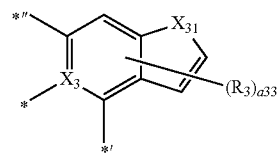
Formula A3-1(21)
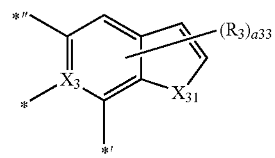
Formula A3-1(22)
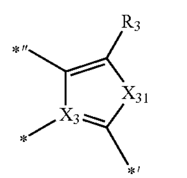
Formula A3-1(23)
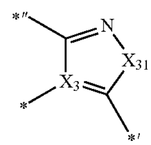
Formula A3-1(24)
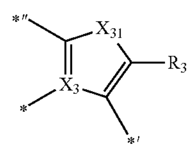
Formula A3-1(25)
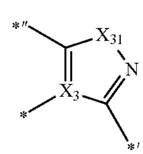

-continued
Formula A3-2(1)
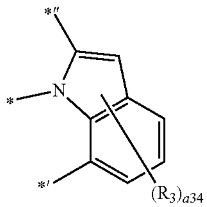
Formula A3-2(2)
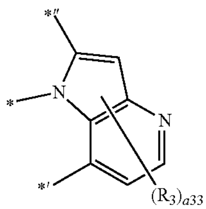
Formula A3-2(3)
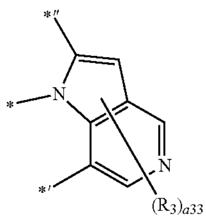
Formula A3-2(4)
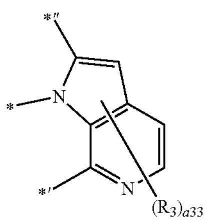
Formula A3-2(5)
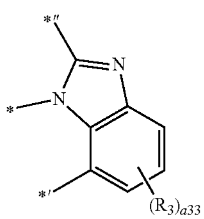
Formula A3-2(6)
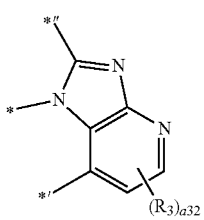
Formula A3-2(7)
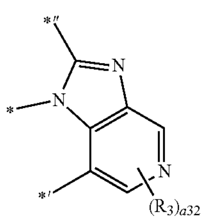
-continued
Formula A3-2(8)
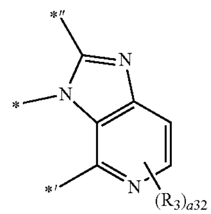
Formula A3-2(9)
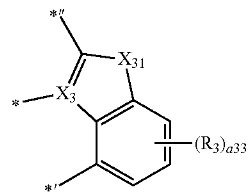
Formula A3-2(10)
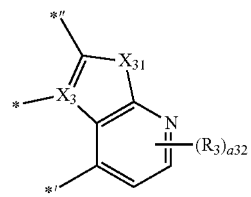
Formula A3-2(11)
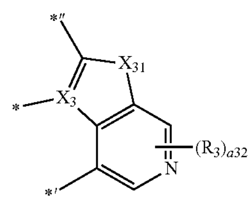
Formula A3-2(12)
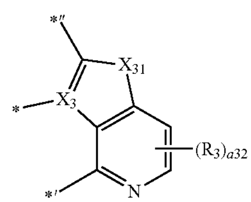
Formula A3-2(13)
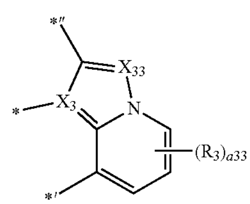
Formula A3-2(14)
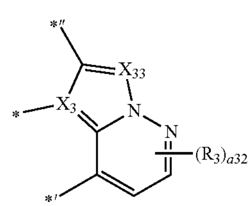

-continued
Formula A3-2(15)
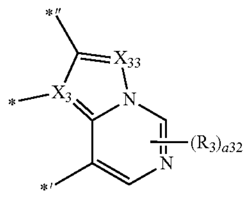
Formula A3-2(16)
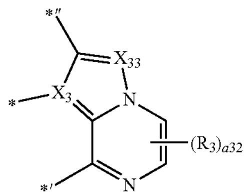
Formula A3-2(17)
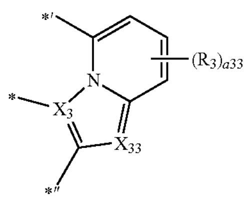
Formula A3-2(18)
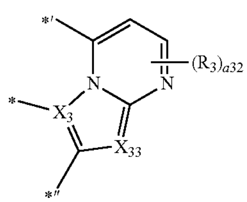
Formula A3-2(19)
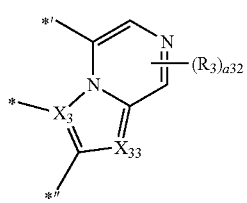
Formula A3-2(20)
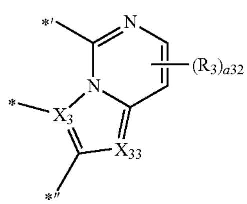
Formula A3-2(21)
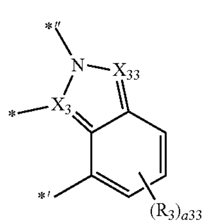
-continued
Formula A3-2(22)
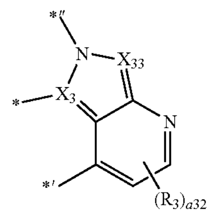
Formula A3-2(23)
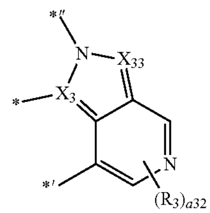
Formula A3-2(24)
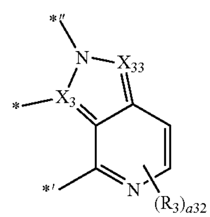
Formula A3-2(25)
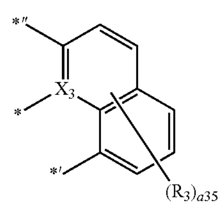
Formula A3-2(26)
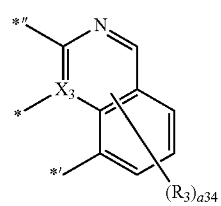
Formula A3-2(27)
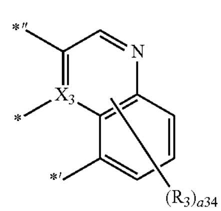
Formula A3-2(28)
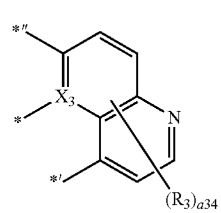

-continued
Formula A3-2(29)
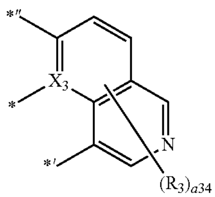
Formula A3-2(30)
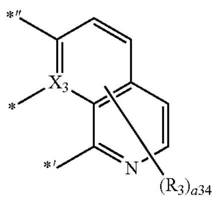
Formula A3-2(31)
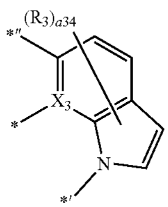
Formula A3-2(32)
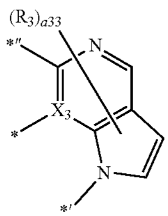
Formula A3-2(33)
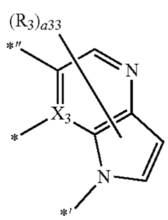
Formula A3-2(34)
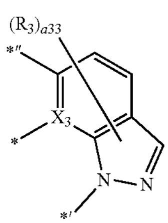
Formula A3-2(35)
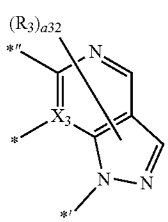
-continued
Formula A3-2(36)
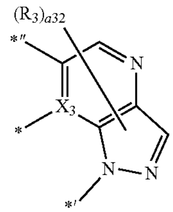
Formula A3-2(37)
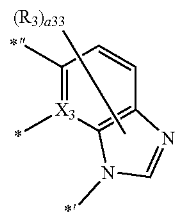
Formula A3-2(38)
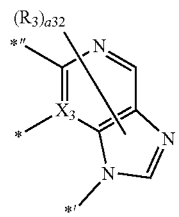
Formula A3-2(39)
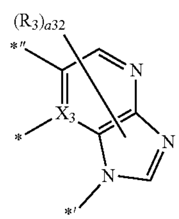
Formula A3-2(40)
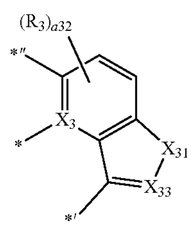
Formula A3-2(41)
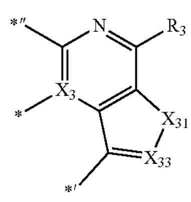
Formula A3-2(42)
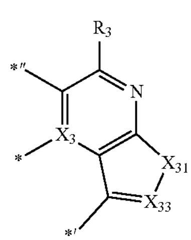

-continued
Formula A3-2(43)
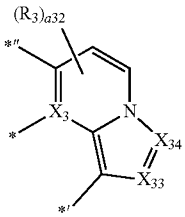
Formula A3-2(44)
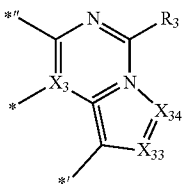
Formula A3-2(45)
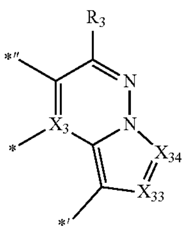
Formula A3-2(46)
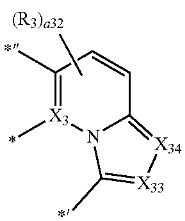
Formula A3-2(47)
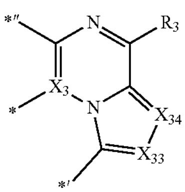
Formula A3-2(48)
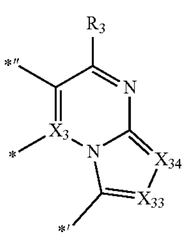
Formula A3-2(49)
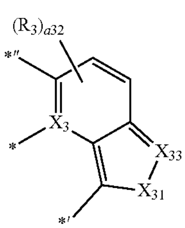
-continued
Formula A3-2(50)
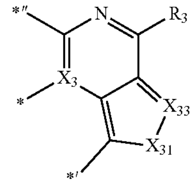
Formula A3-2(51)
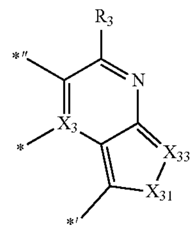
Formula A3-2(52)
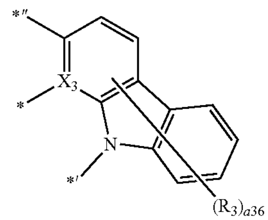
Formula A3-2(53)
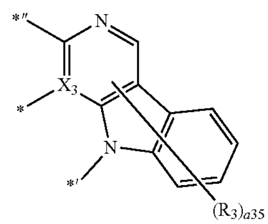
Formula A3-2(54)
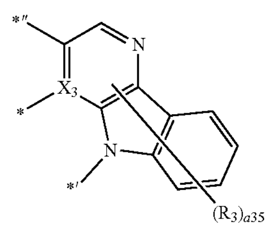
Formula A3-2(55)
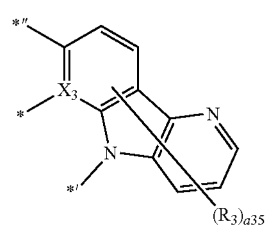
Formula A3-2(56)
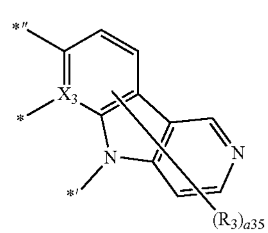

-continued
Formula A3-2(57)
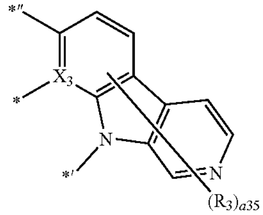
Formula A3-2(58)
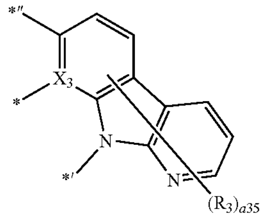
Formula A3-3(1)
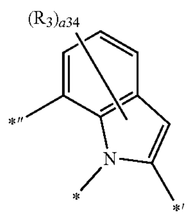
Formula A3-3(2)
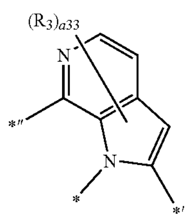
Formula A3-3(3)
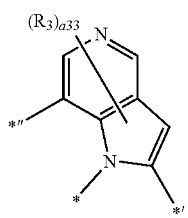
Formula A3-3(4)
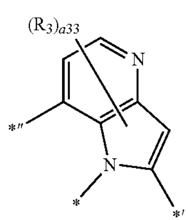
Formula A3-3(5)
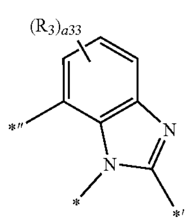
-continued
Formula A3-3(6)
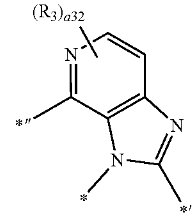
Formula A3-3(7)
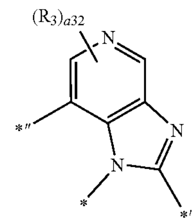
Formula A3-3(8)
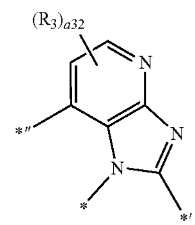
Formula A3-3(9)
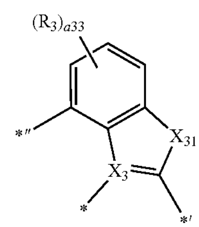
Formula A3-3(10)
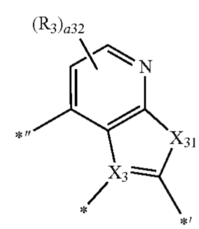
Formula A3-3(11)
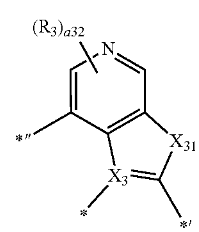

-continued
Formula A3-3(12)
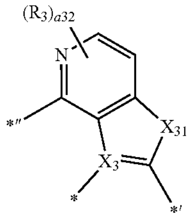
Formula A3-3(13)
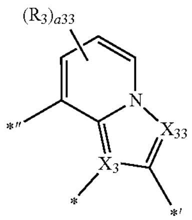
Formula A3-3(14)
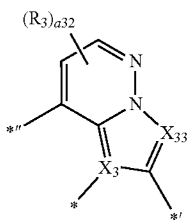
Formula A3-3(15)
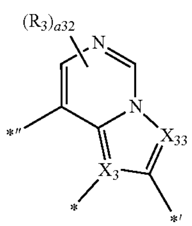
Formula A3-3(16)
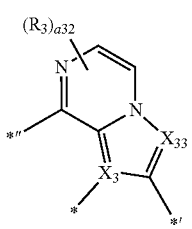
Formula A3-3(17)
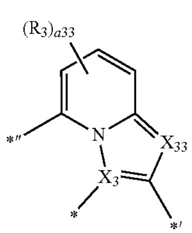
-continued
Formula A3-3(18)
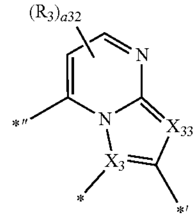
Formula A3-3(19)
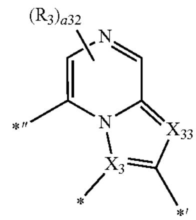
Formula A3-3(20)
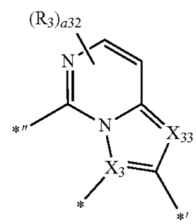
Formula A3-3(21)
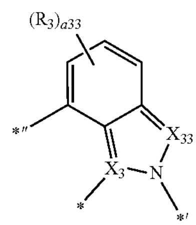
Formula A3-3(22)
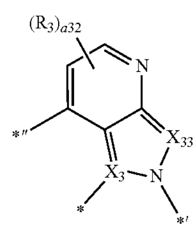
Formula A3-3(23)
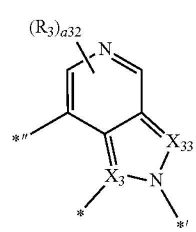

Formula A3-3(24)
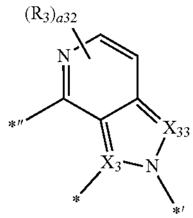
Formula A3-3(25)
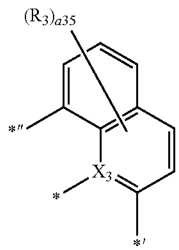
Formula A3-3(26)
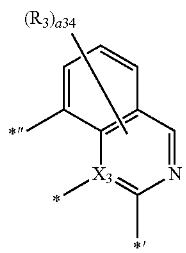
Formula A3-3(27)
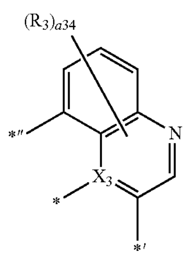
Formula A3-3(28)
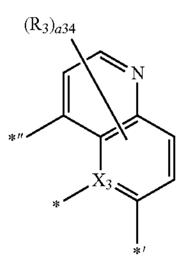
Formula A3-3(29)
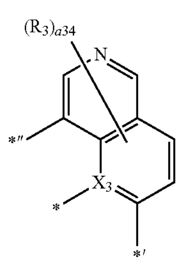
Formula A3-3(30)
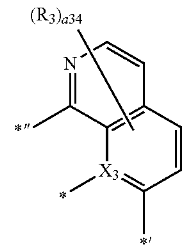
Formula A3-3(31)
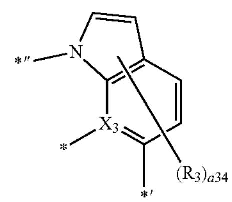
Formula A3-3(32)
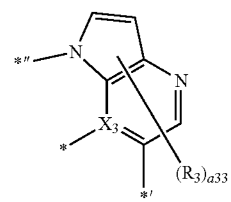
Formula A3-3(33)
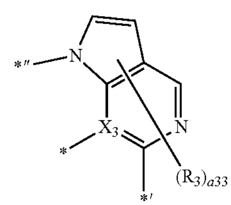
Formula A3-3(34)
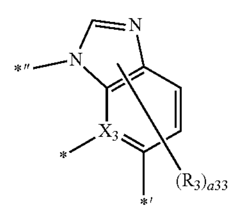
Formula A3-3(35)
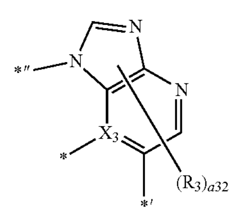
Formula A3-3(36)
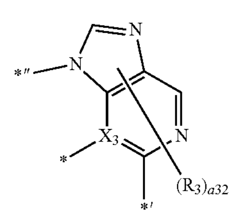

-continued
Formula A3-3(37)
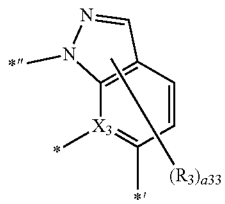
Formula A3-3(38)
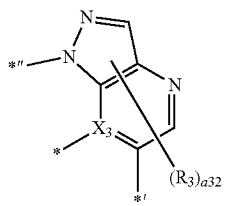
Formula A3-3(39)
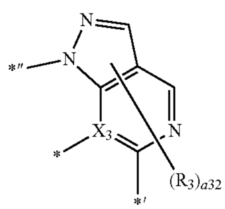
Formula A3-3(40)
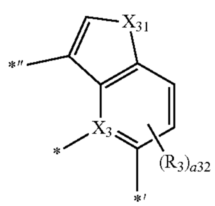
Formula A3-3(41)
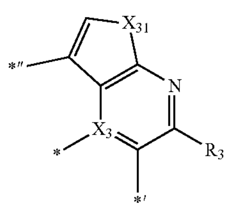
Formula A3-3(42)
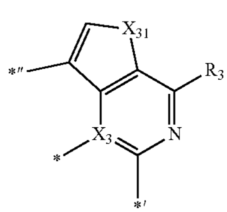
Formula A3-3(43)
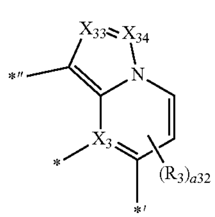
-continued
Formula A3-3(44)
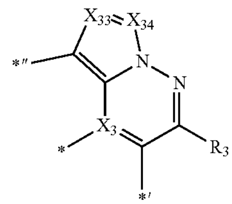
Formula A3-3(45)
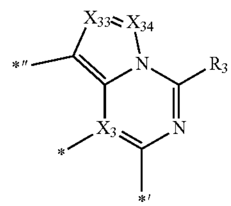
Formula A3-3(46)
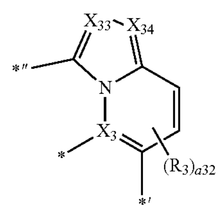
Formula A3-3(47)
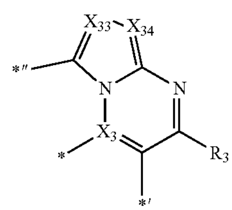
Formula A3-3(48)
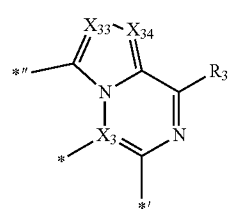
Formula A3-3(49)
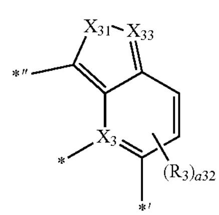
Formula A3-3(50)
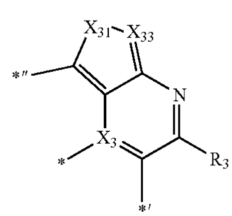

-continued

Formula A3-3(51)

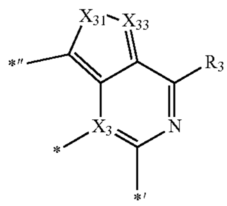

Formula A3-3(52)

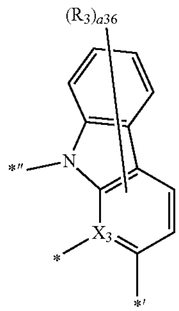

Formula A3-3(53)

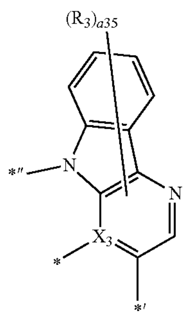

Formula A3-3(54)

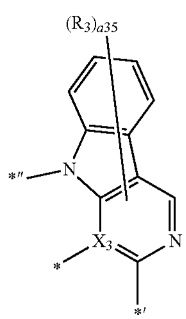

Formula A3-3(55)

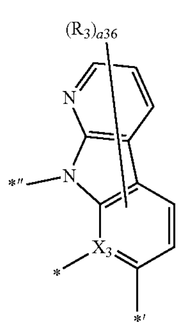

-continued

Formula A3-3(56)

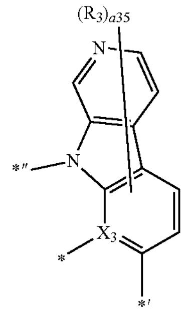

Formula A3-3(57)

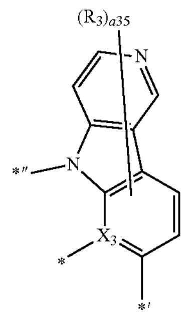

Formula A3-3(58)

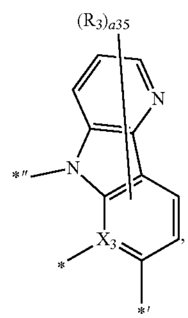

wherein, in Formulae A3-1(1) to A3-1(25), A3-2(1) to A3-2(58), and A3-3(1) to A3-3(58), $X_3$ and $R_3$ are each independently the same as in claim 1, $X_{31}$ is O, S, $N(R_{31})$, $C(R_{31})(R_{32})$, or $Si(R_{31})(R_{32})$, $X_{33}$ is N or $C(R_{33})$, $X_{34}$ is N or $C(R_{34})$, $R_{31}$ to $R_{38}$ are each independently the same as $R_3$ in claim 1, a36 is an integer from 0 to 6, a35 is an integer from 0 to 5, a34 is an integer from 0 to 4, a33 is an integer from 0 to 3, a32 is an integer from 0 to 2, and

*, *', and *" are the same as *, *', and *" in Formula A3-1.

12. The organometallic compound of claim 1, wherein $A_4$ is represented by one of Formulae A4-1(1) to A4-1(36):
Formula A4-1(1)
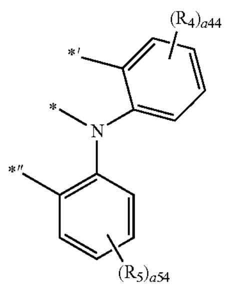
Formula A4-1(2)
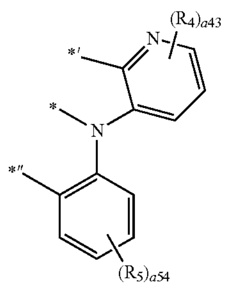
Formula A4-1(3)
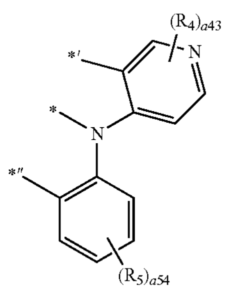
Formula A4-1(4)
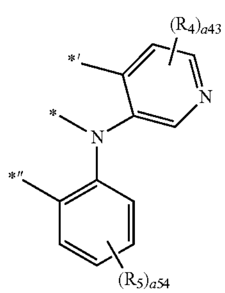
Formula A4-1(5)
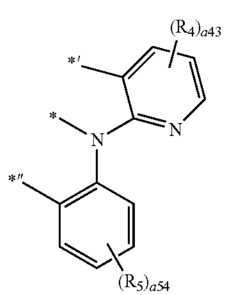
-continued
Formula A4-1(6)
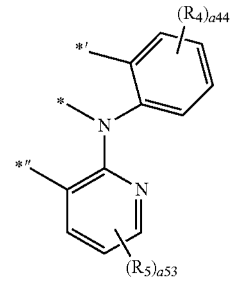
Formula A4-1(7)
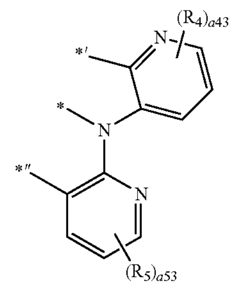
Formula A4-1(8)
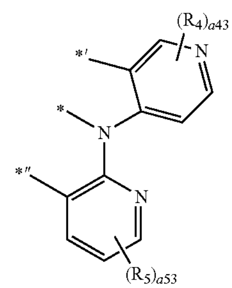
Formula A4-1(9)
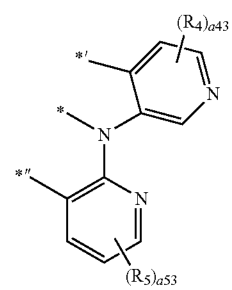
Formula A4-1(10)
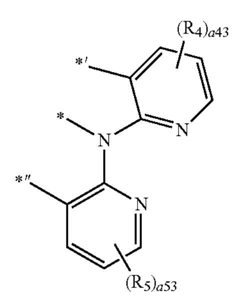

Formula A4-1(11)
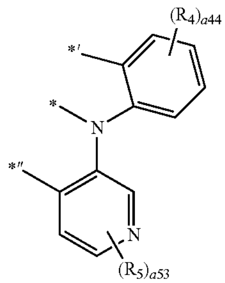
Formula A4-1(12)
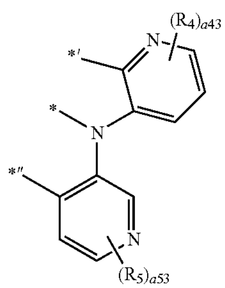
Formula A4-1(13)
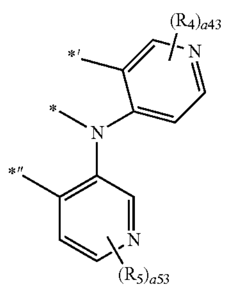
Formula A4-1(14)
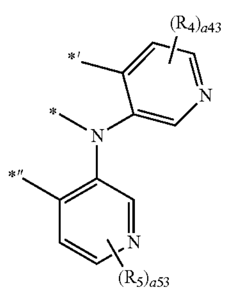
Formula A4-1(15)
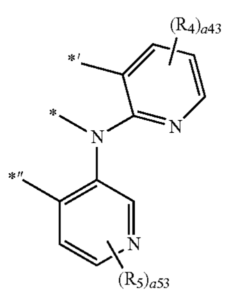
Formula A4-1(16)
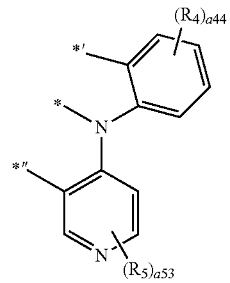
Formula A4-1(17)
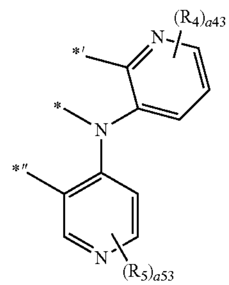
Formula A4-1(18)
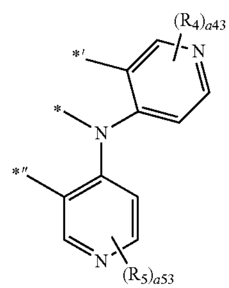
Formula A4-1(19)
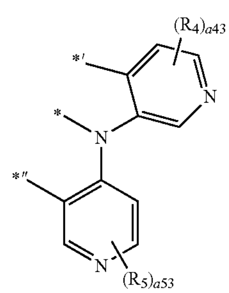
Formula A4-1(20)
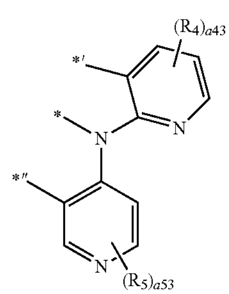

-continued
Formula A4-1(21)
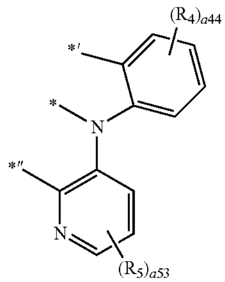
Formula A4-1(22)
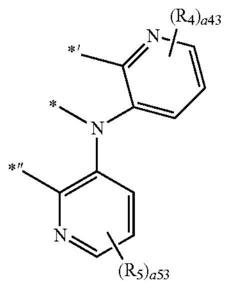
Formula A4-1(23)
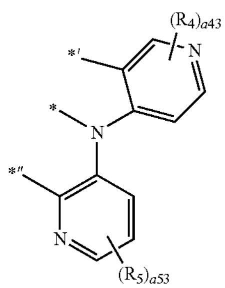
Formula A4-1(24)
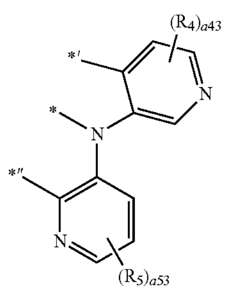
Formula A4-1(25)
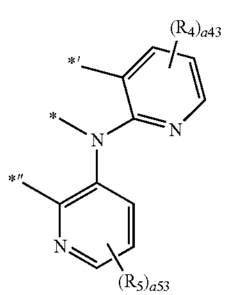
-continued
Formula A4-1(26)
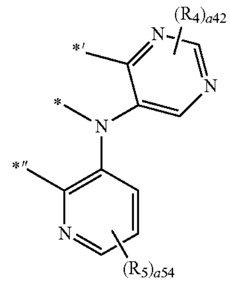
Formula A4-1(27)
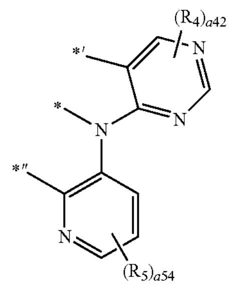
Formula A4-1(28)
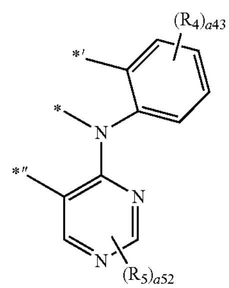
Formula A4-1(29)
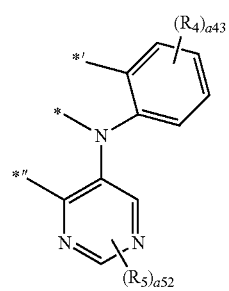
Formula A4-1(30)
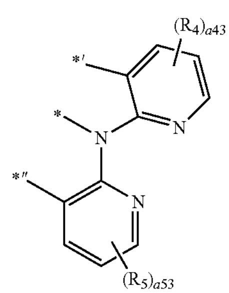

-continued

Formula A4-1(31)

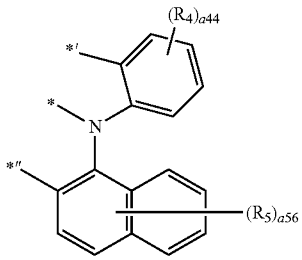

Formula A4-1(32)

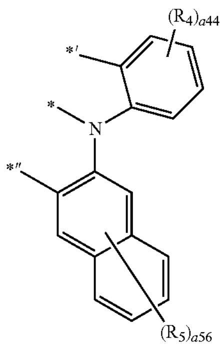

Formula A4-1(33)

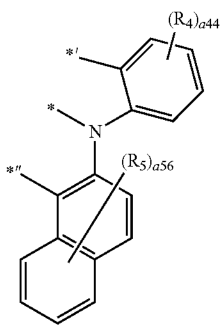

Formula A4-1(34)

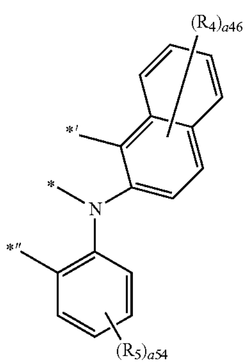

Formula A4-1(35)

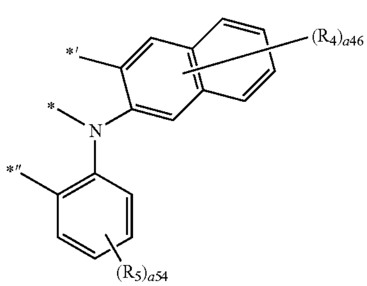

-continued

Formula A4-1(36)

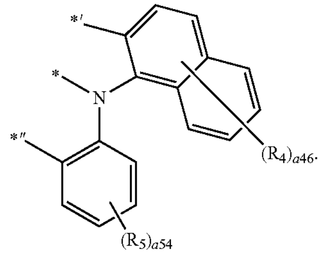

wherein, in Formulae A4-1(1) to A4-1(36), $R_4$ and $R_5$ are each independently the same as in claim 1, a46 and a56 are each independently an integer from 0 to 6, a44 and a54 are each independently an integer from 0 to 4, a43 and a53 are each independently an integer from 0 to 3, a42 and a52 are each independently an integer from 0 to 2, and

*, *', and *" are the same as *, *', and *" in Formula A4.

13. The organometallic compound of claim 1, wherein $A_1$ is represented by one of Formulae CY1-1 to CY1-25, $A_2$ is represented by one of Formulae CY2-1 to CY2-15, $A_3$ is represented by one of Formulae CY3-1 to CY3-41, and $A_4$ is represented by one of Formulae CY4-1 to CY4-27:

Formula CY1-1

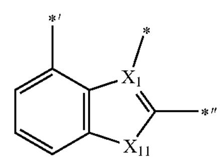

Formula CY1-2

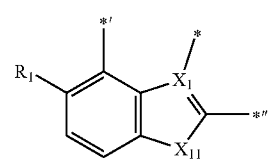

Formula CY1-3

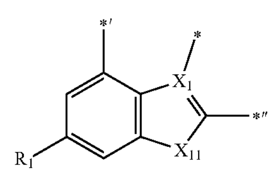

Formula CY1-4

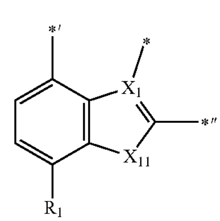

-continued
Formula CY1-5
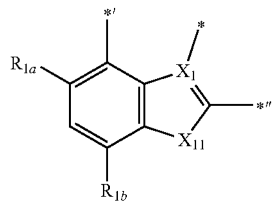
Formula CY1-6
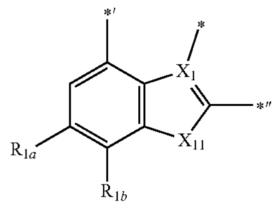
Formula CY1-7
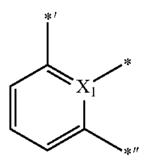
Formula CY1-8
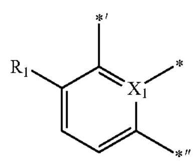
Formula CY1-9
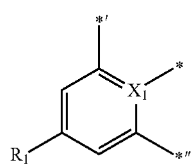
Formula CY1-10
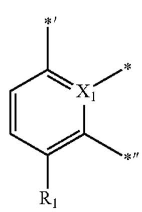
Formula CY1-11
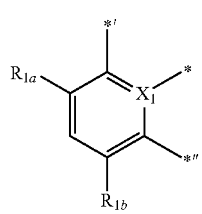
Formula CY1-12
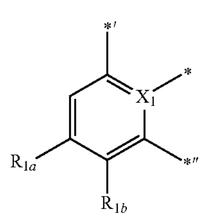
-continued
Formula CY1-13
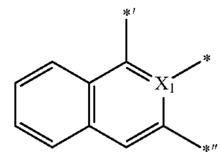
Formula CY1-14
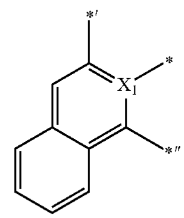
Formula CY1-15
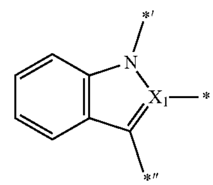
Formula CY1-16
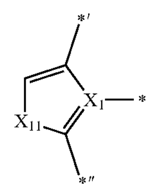
Formula CY1-17
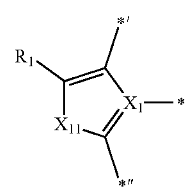
Formula CY1-18
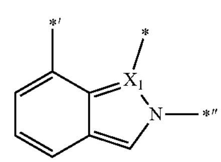
Formula CY1-19
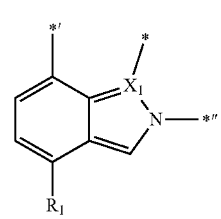
Formula CY1-20
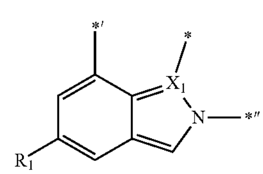

Formula CY1-21
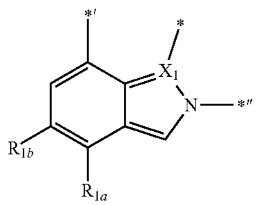
Formula CY1-22
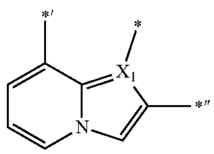
Formula CY1-23
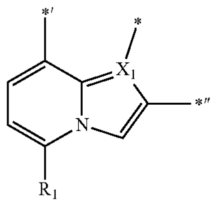
Formula CY1-24
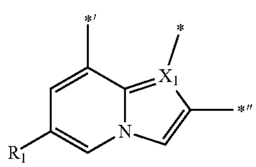
Formula CY1-25
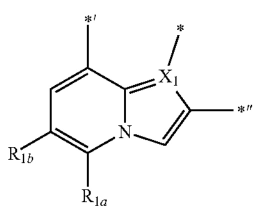
Formula CY2-1
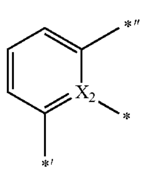
Formula CY2-2
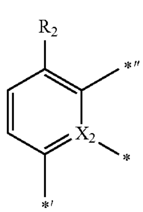
Formula CY2-3
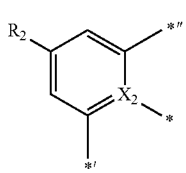
Formula CY2-4
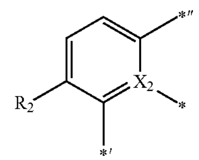
Formula CY2-5
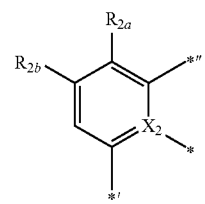
Formula CY2-6
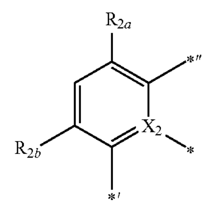
Formula CY2-7
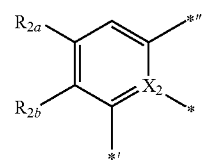
Formula CY2-8
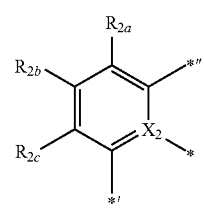
Formula CY2-9
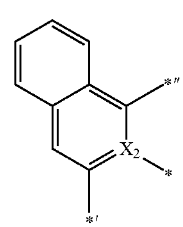
Formula CY2-10
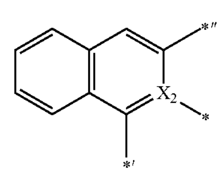

-continued
Formula CY2-11
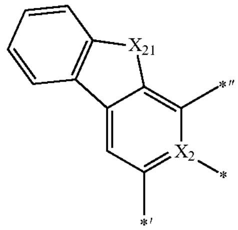
Formula CY2-12
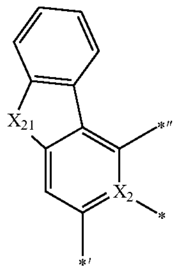
Formula CY2-13
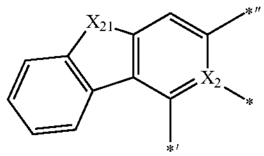
Formula CY2-14
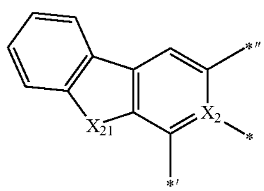
Formula CY2-15
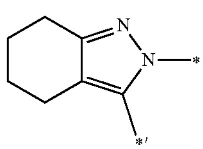
Formula CY3-1
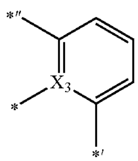
Formula CY3-2
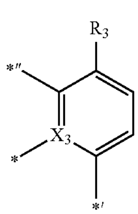
-continued
Formula CY3-3
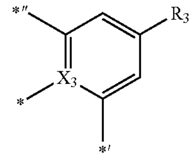
Formula CY3-4
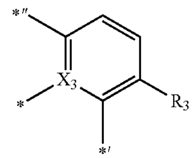
Formula CY3-5
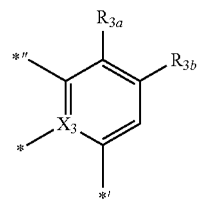
Formula CY3-6
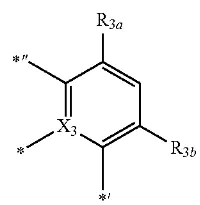
Formula CY3-7
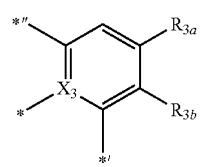
Formula CY3-8
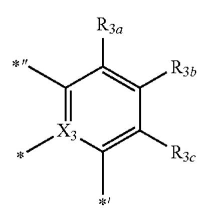
Formula CY3-9
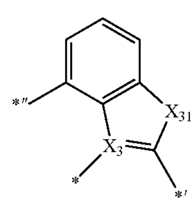
Formula CY3-10
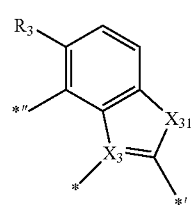

-continued
Formula CY3-11
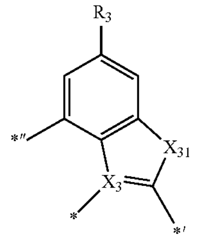
Formula CY3-12
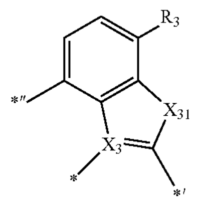
Formula CY3-13
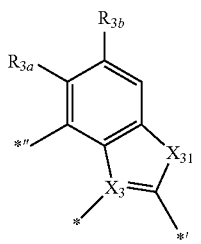
Formula CY3-14
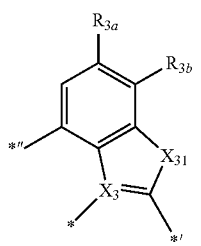
Formula CY3-15
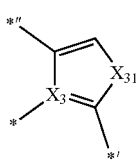
Formula CY3-16
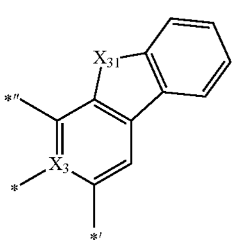
-continued
Formula CY3-17
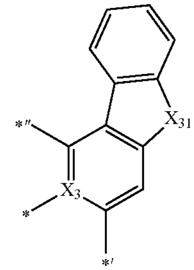
Formula CY3-18
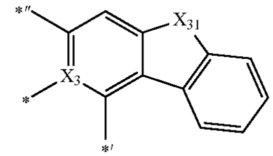
Formula CY3-19
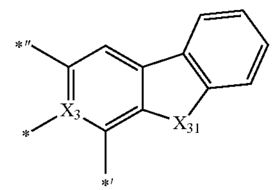
Formula CY3-20
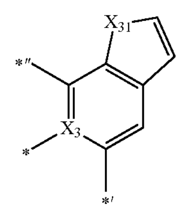
Formula CY3-21
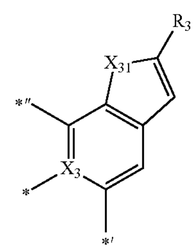
Formula CY3-22
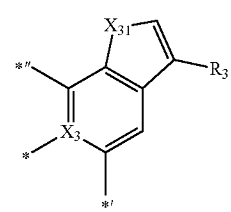
Formula CY3-23
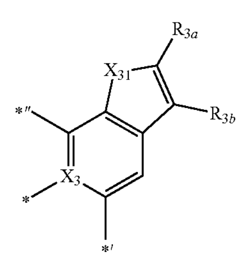

-continued
Formula CY3-24
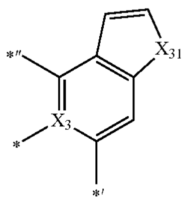
Formula CY3-25
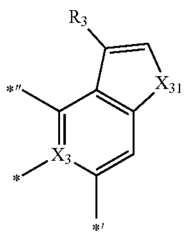
Formula CY3-26
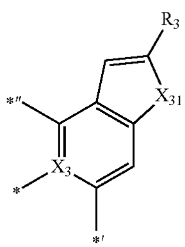
Formula CY3-27
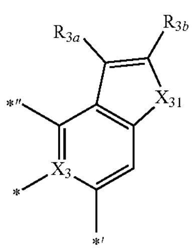
Formula CY3-28
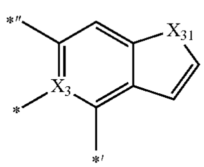
Formula CY3-29
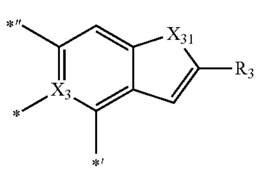
Formula CY3-30
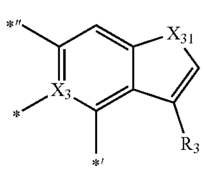
-continued
Formula CY3-31
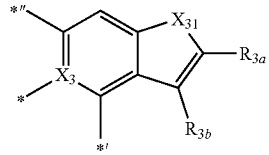
Formula CY3-32
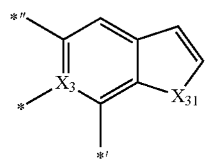
Formula CY3-33
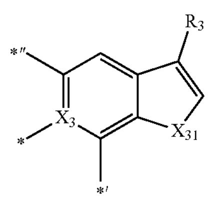
Formula CY3-34
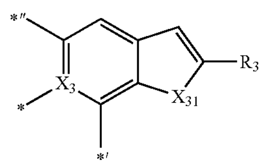
Formula CY3-35
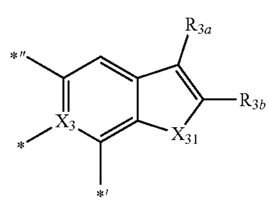
Formula CY3-36
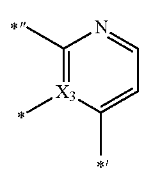
Formula CY3-37
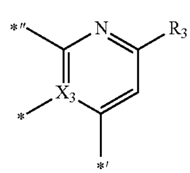
Formula CY3-38
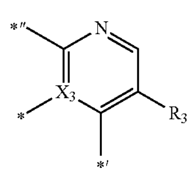

-continued
Formula CY3-39
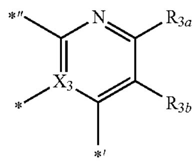
Formula CY3-40
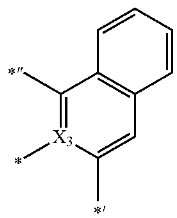
Formula CY3-41
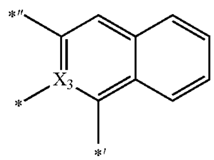
Formula CY4-1
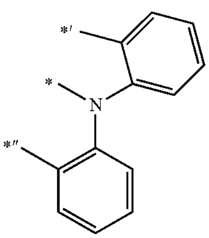
Formula CY4-2
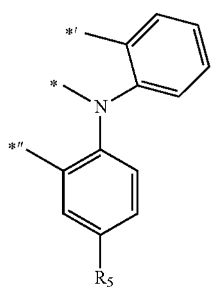
Formula CY4-3
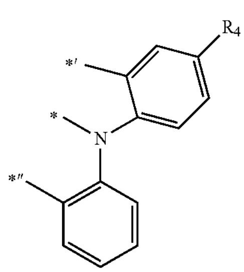
-continued
Formula CY4-4
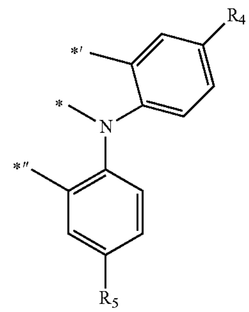
Formula CY4-5
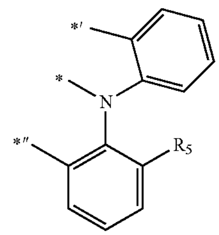
Formula CY4-6
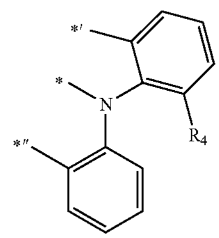
Formula CY4-7
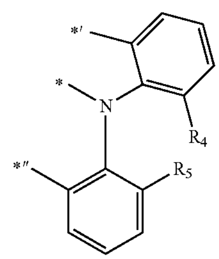
Formula CY4-8
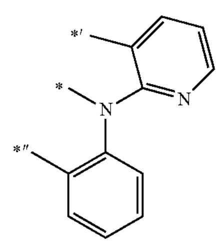
Formula CY4-9
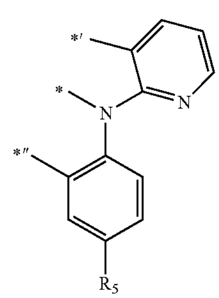

Formula CY4-10
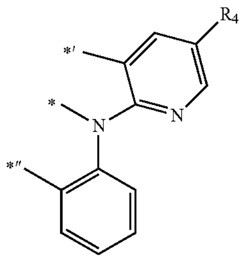
Formula CY4-11
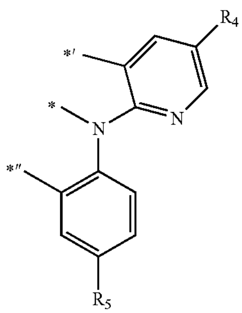
Formula CY4-12
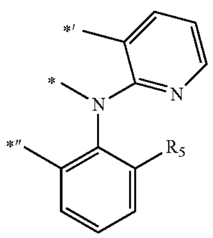
Formula CY4-13
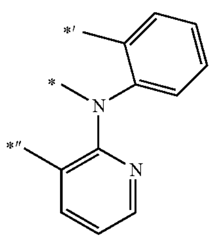
Formula CY4-14
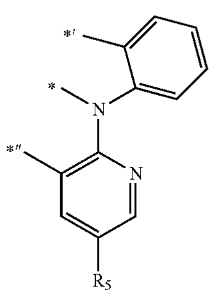
Formula CY4-15
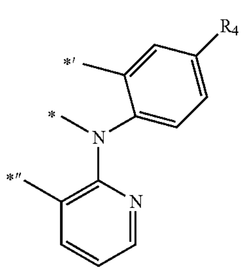
Formula CY4-16
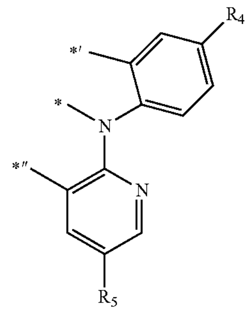
Formula CY4-17
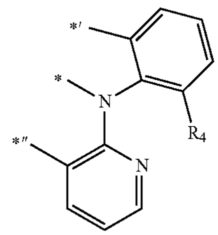
Formula CY4-18
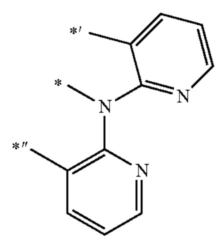
Formula CY4-19
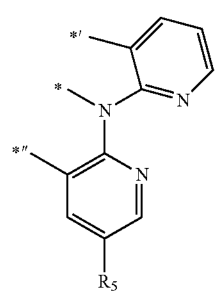
Formula CY4-20
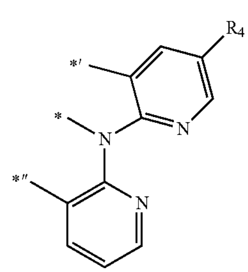

-continued

Formula CY4-21

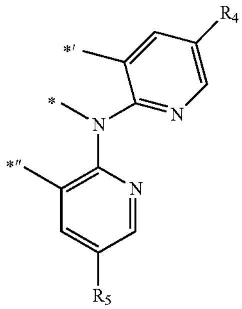

Formula CY4-22

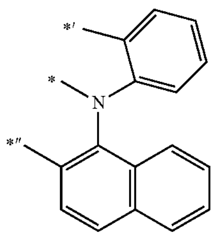

Formula CY4-23

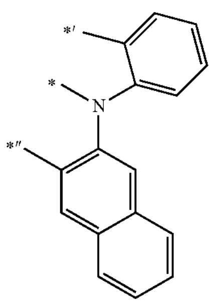

Formula CY4-24

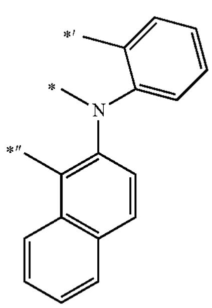

Formula CY4-25

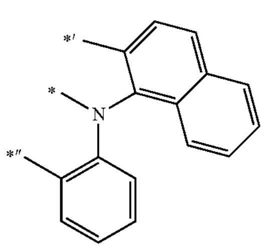

-continued

Formula CY4-26

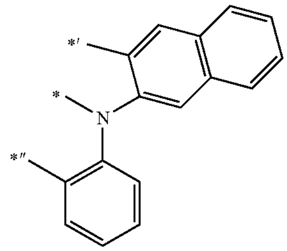

Formula CY4-27

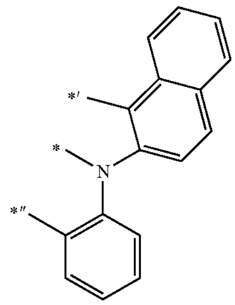

wherein, in Formulae CY1-1 to CY1-25, CY2-1 to CY2-15, CY3-1 to CY3-41, and CY4-1 to CY4-27, $X_1$ to $X_3$ and $R_1$ to $R_5$ are each independently the same as in claim 1, $X_{11}$ is O, S, $N(R_{11})$, $C(R_{11})(R_{12})$, or $Si(R_{11})(R_{12})$, $X_{21}$ is O, S, $N(R_{21})$, $C(R_{21})(R_{22})$, or $Si(R_{21})(R_{22})$, $X_{31}$ is O, S, $N(R_{31})$, $C(R_{31})(R_{32})$, or $Si(R_{31})(R_{32})$, $R_{1a}$, $R_{1b}$, $R_{11}$, and $R_{12}$ are each independently the same as $R_1$ in claim 1, $R_{2a}$ to $R_{2c}$, $R_{21}$, and $R_{22}$ are each independently the same as $R_2$ in claim 1, $R_{3a}$ to $R_{3c}$, $R_{31}$, and $R_{32}$ are each independently the same as $R_3$ in claim 1,

*, *', and *" in Formulae CY1-1 to CY1-25 are the same as *, *', and *" in Formula A1-1,

*, *', and *" in Formulae CY2-1 to CY2-15 are the same as *, *', and *" in Formula A2-1,

*, *', and *" in Formulae CY3-1 to CY3-41 are the same as *, *', and *" in Formula A3-1, and

*, *', and *" in Formulae CY4-1 to CY4-27 are the same as *, *', and *" in Formula A4.

14. The organometallic compound of claim 1, wherein the organometallic compound is represented by one of Formulae 1-1 to 1-4:

Formula 1-1

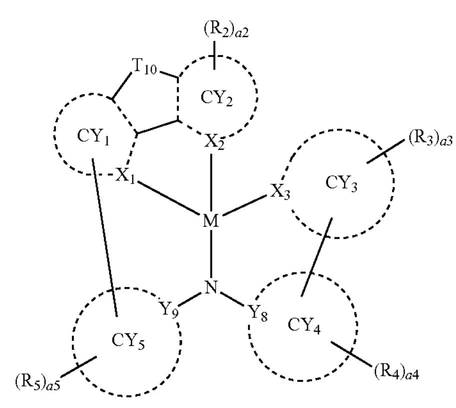

-continued

Formula 1-2

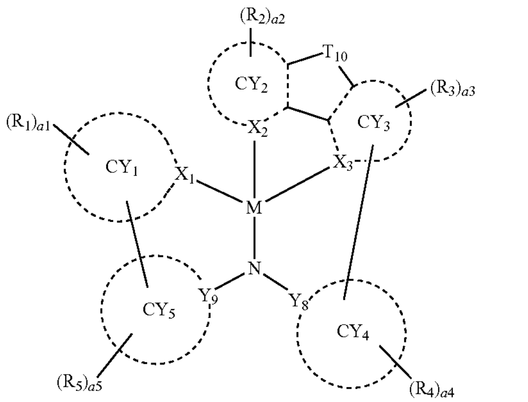

Formula 1-3

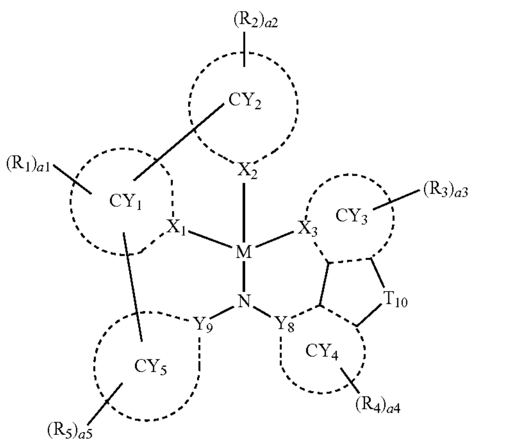

Formula 1-4

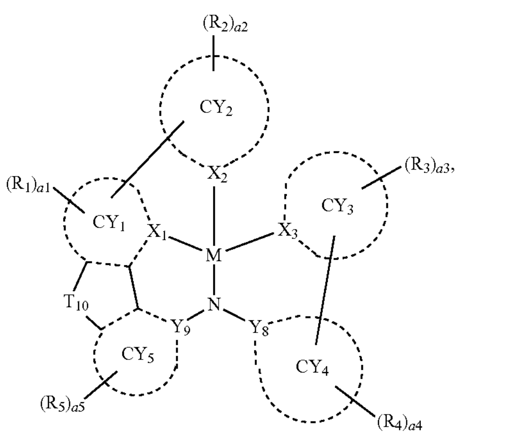

wherein, in Formulae 1-1 to 1-4,

M, $X_1$ to $X_3$, rings $CY_1$ to $CY_5$, $R_1$ to $R_5$, and a1 to a5 are each independently the same as in claim 1, $Y_8$ and $Y_9$ are each independently N or C, $T_{10}$ is selected from a single bond, a double bond, *—N(R')—*', *—B(R')—*', *—P(R)—*', *—C(R')(R")—*', *—Si(R')(R")—*', *—Ge(R')(R")—*', *—S—*', *—Se—*', *—C(═O)—*', *—S(═O)—*', *—S(═O)$_2$—*', *—C(R')═*', *═C(R')—*', *—C(R')═C(R")—*', *—C(═S)—*', and *—C≡C—*', and R' and R" are the same as $R_7$ and $R_8$ in claim 1.

15. The organometallic compound of claim 1, wherein the organometallic compound is one of Compounds 1 to 78:

1

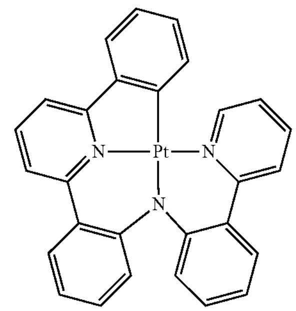

2

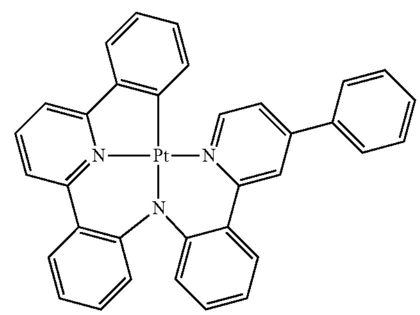

3

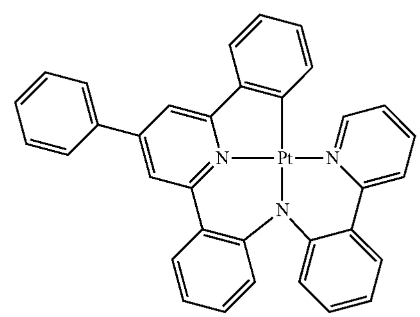

4

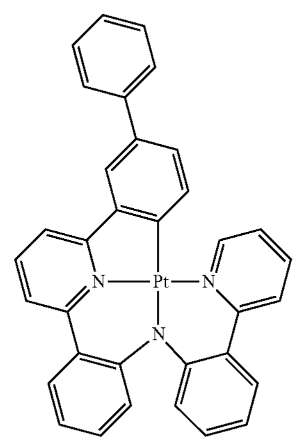

-continued
5
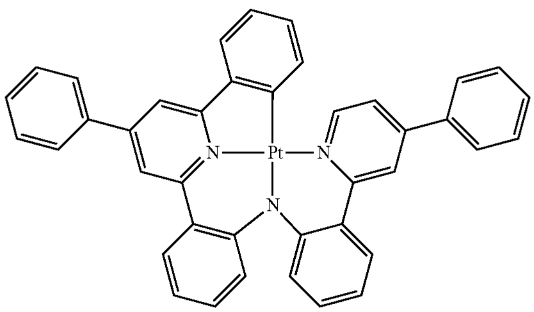
6
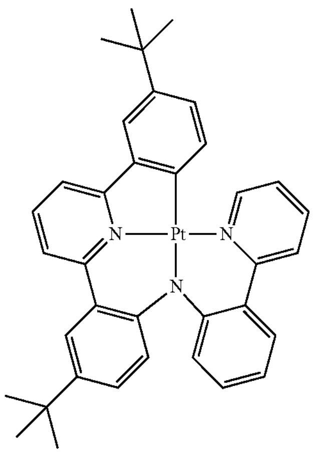
7
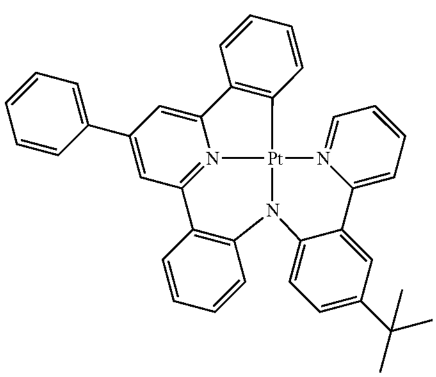
8
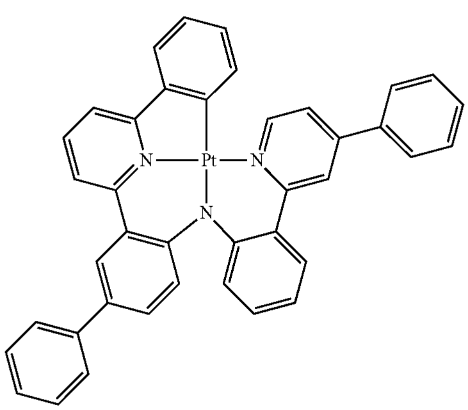
-continued
9
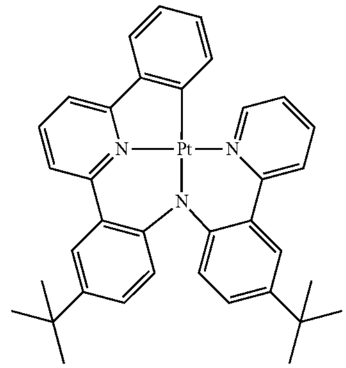
10
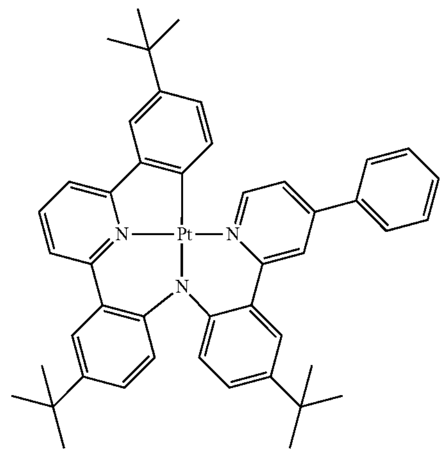
11
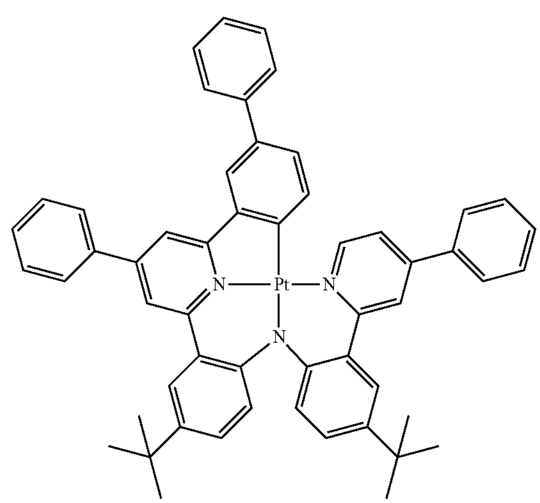

12
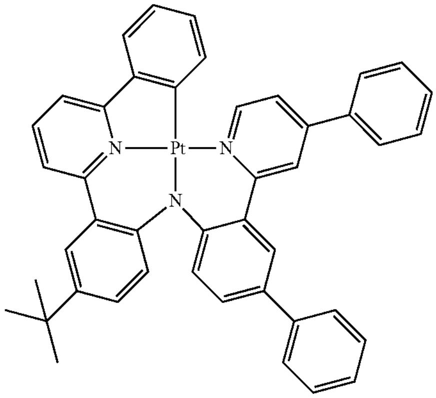
13
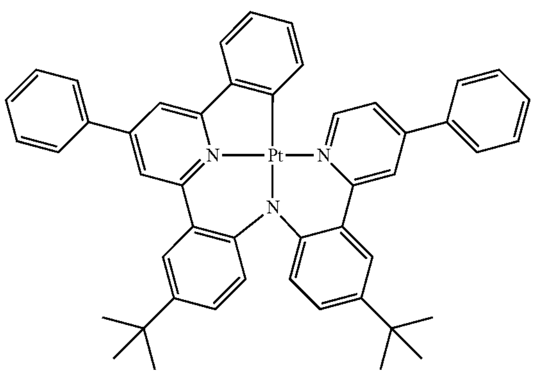
14
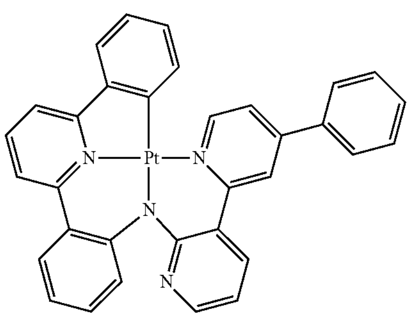
15
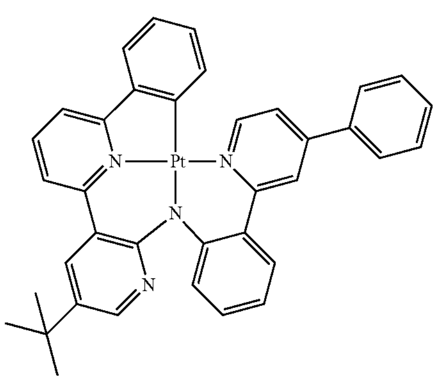
16
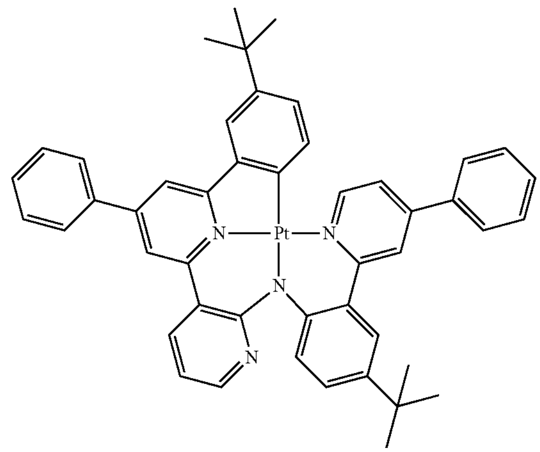
17
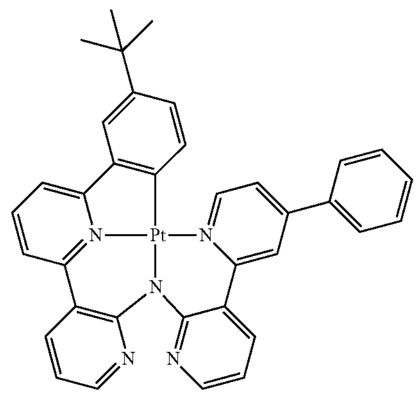
18
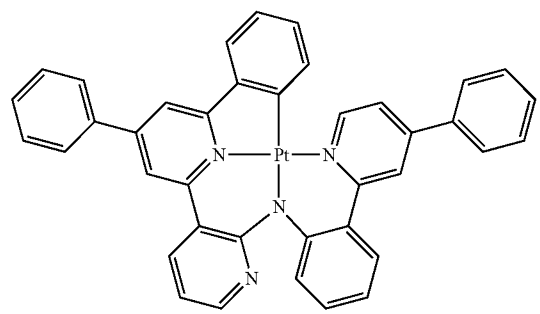
19
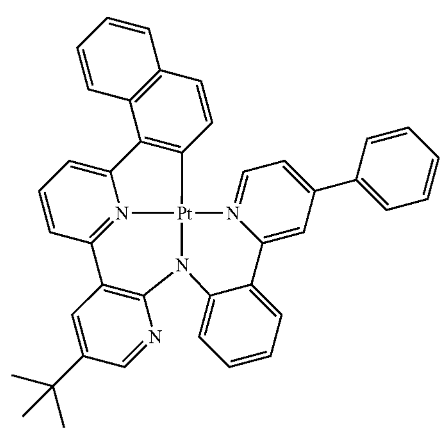

20
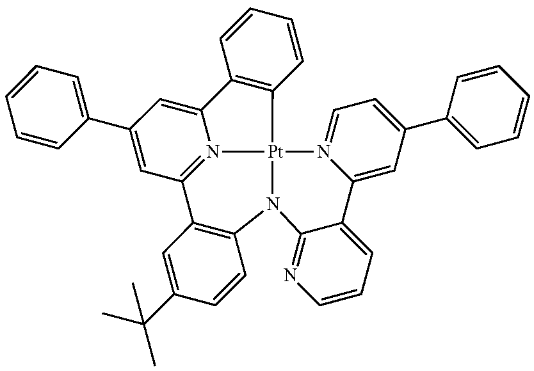
21
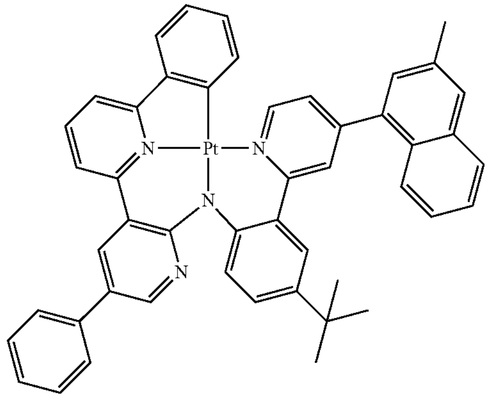
22
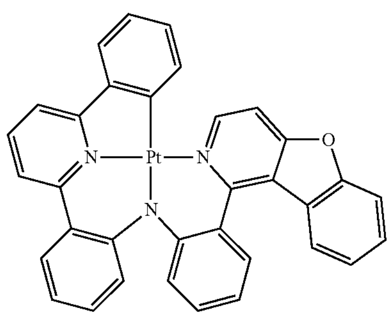
23
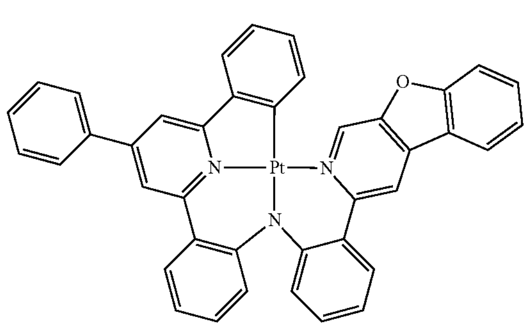
24
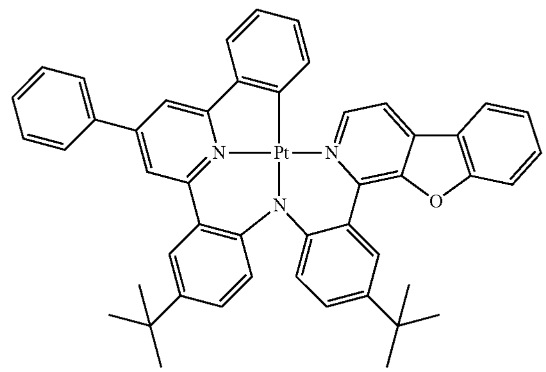
25
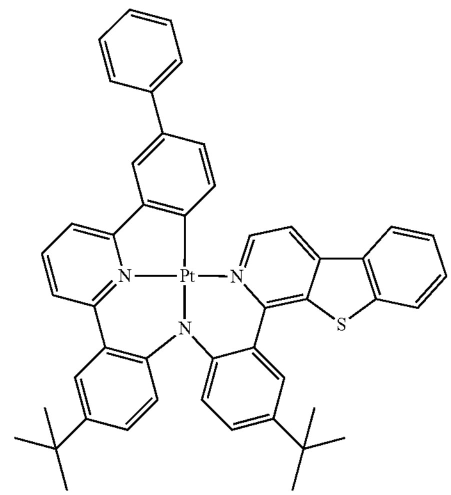
26
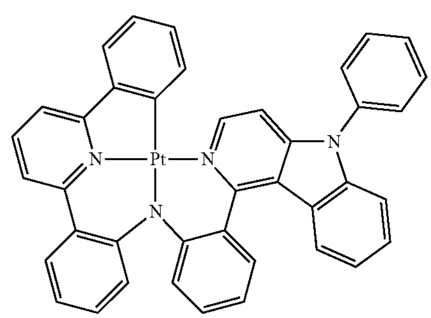
27
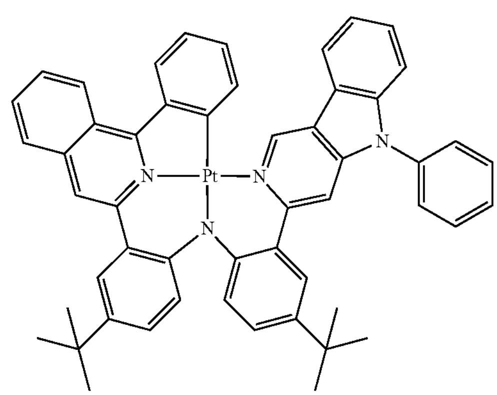

-continued
28
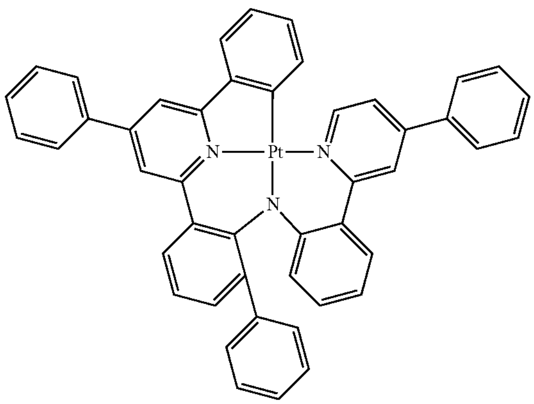
29
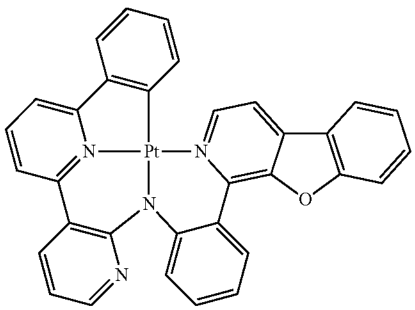
30
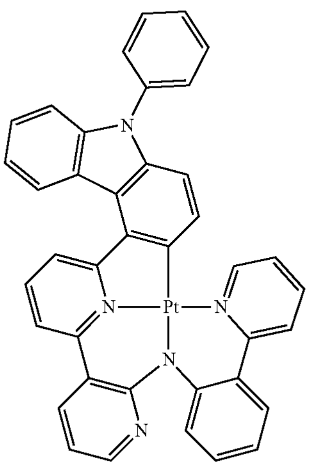
31
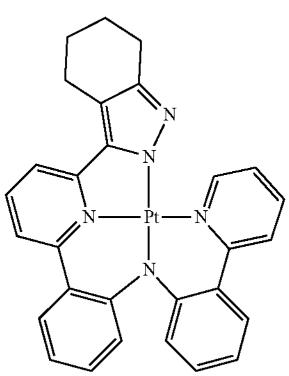
-continued
32
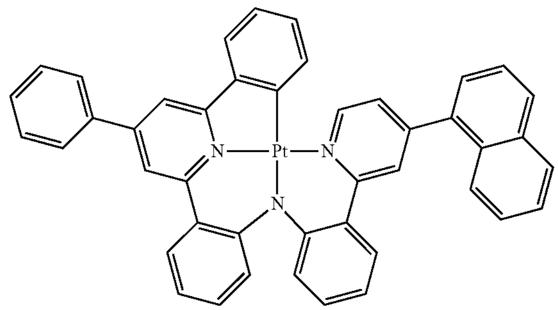
33
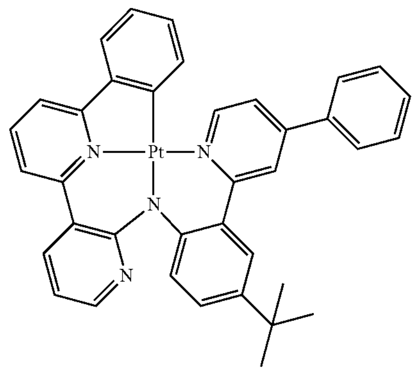
34
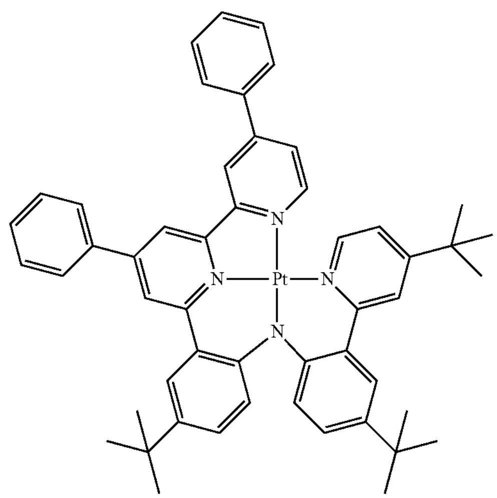
35
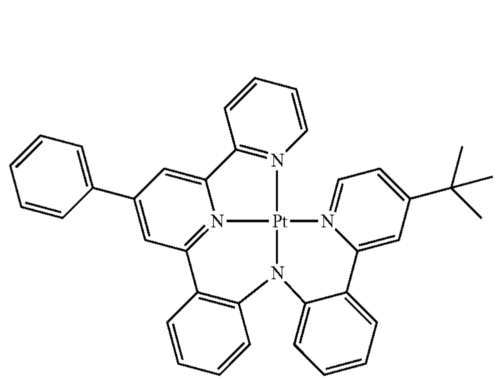

-continued
36
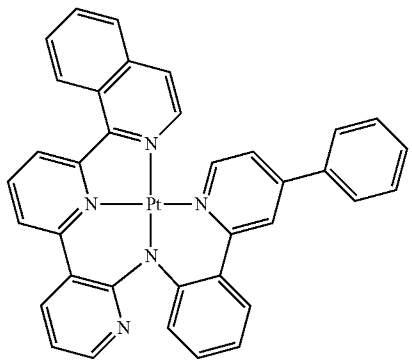
37
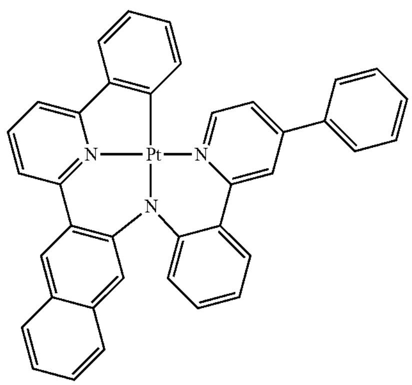
38
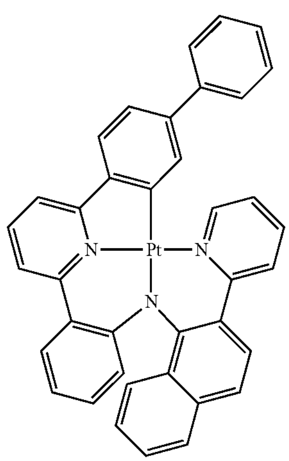
39
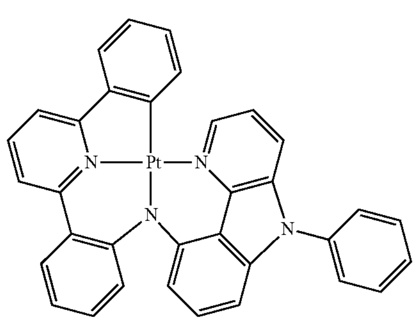
-continued
40
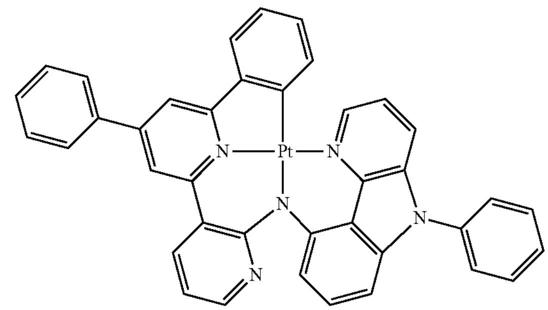
41
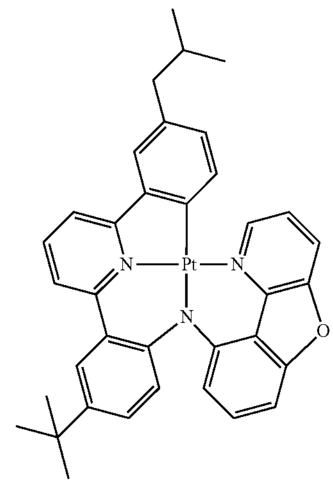
42
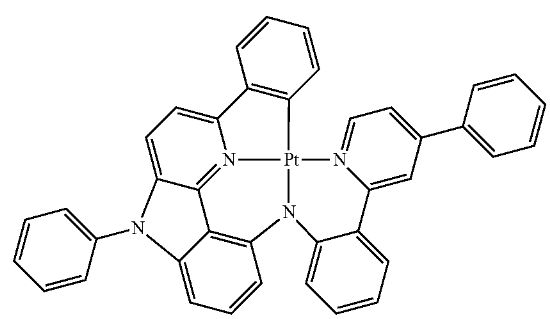
43
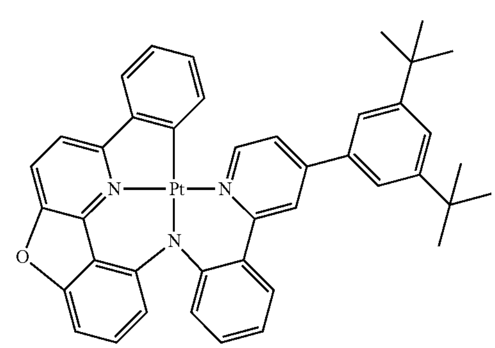

-continued
44
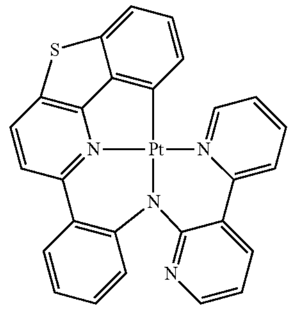
45
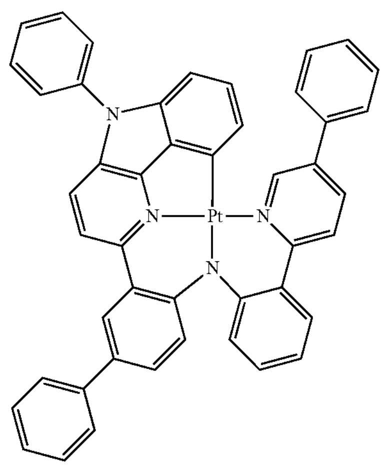
46
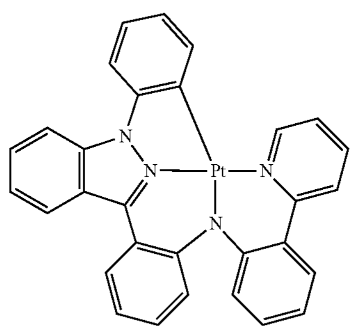
47
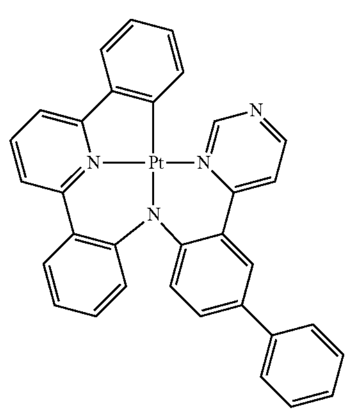
-continued
48
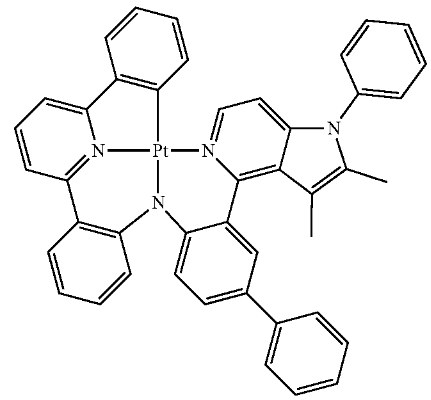
49
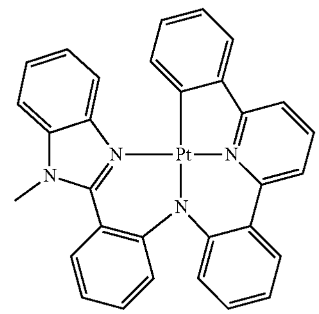
50
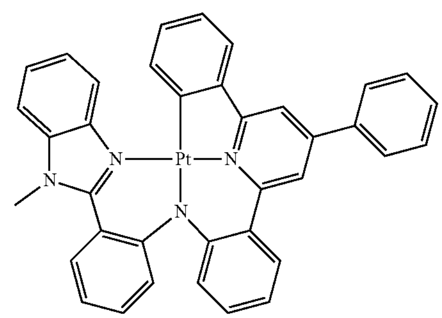
51
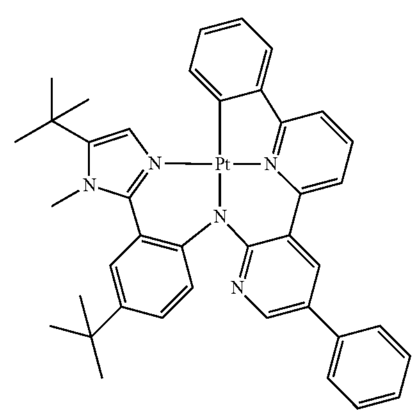

-continued
52
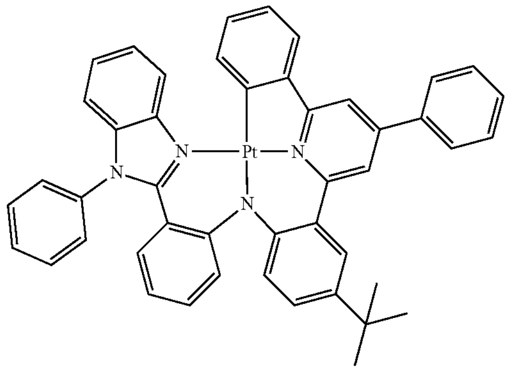
53
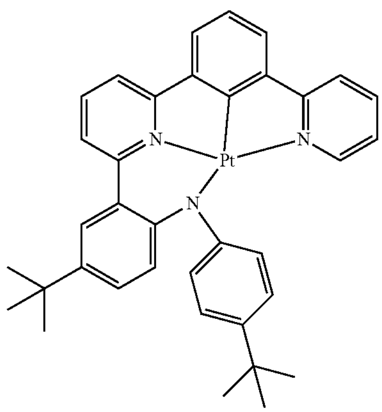
54
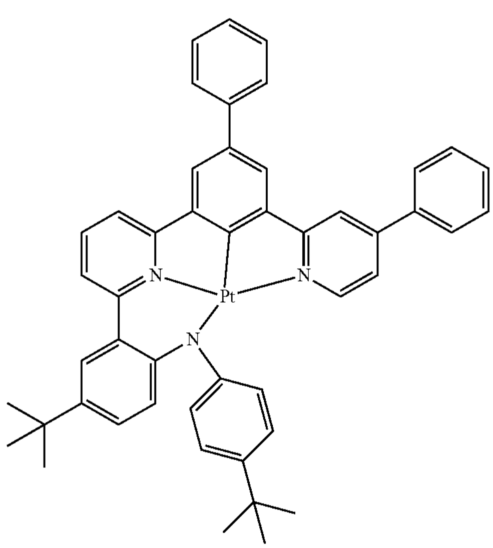
-continued
55
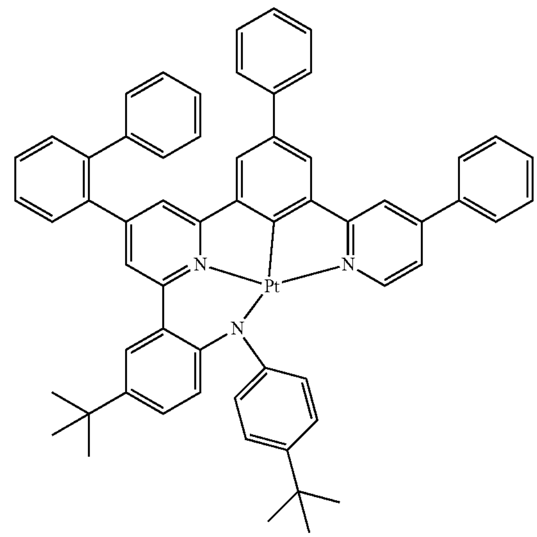
56
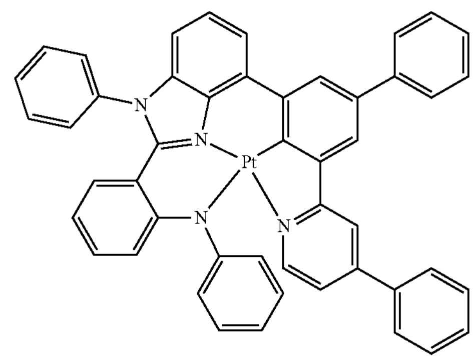
57
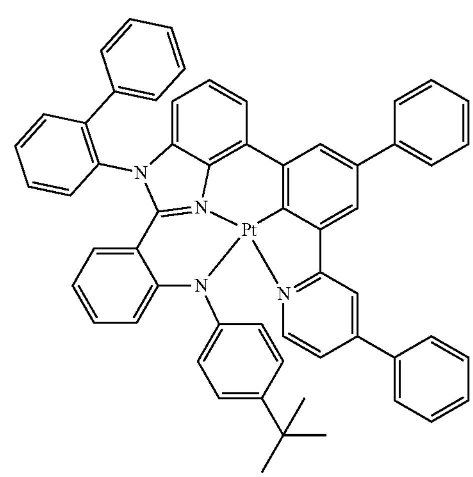

-continued
58
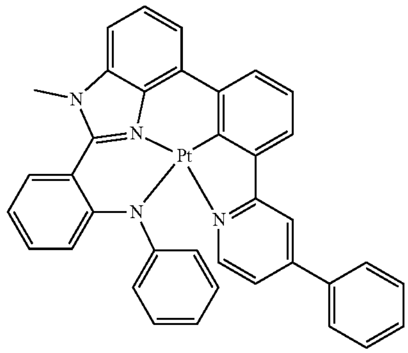
59
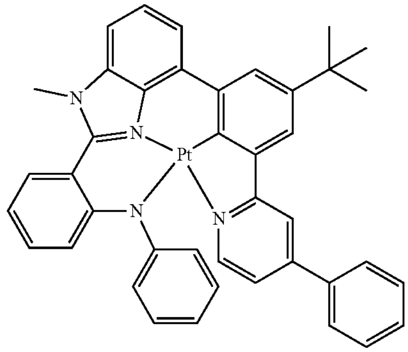
60
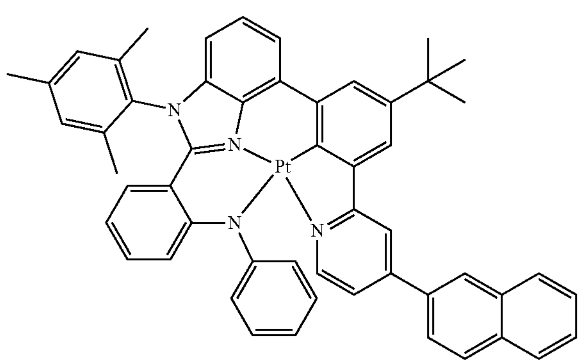
61
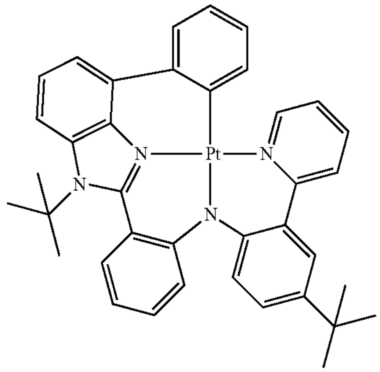
-continued
62
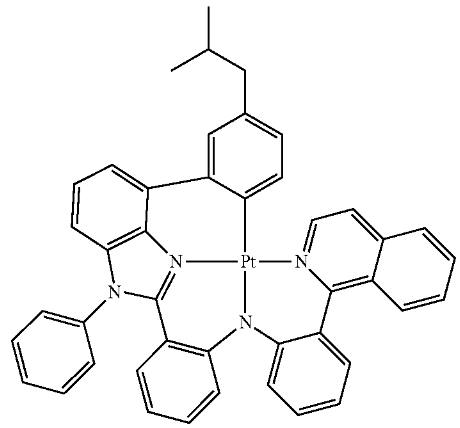
63
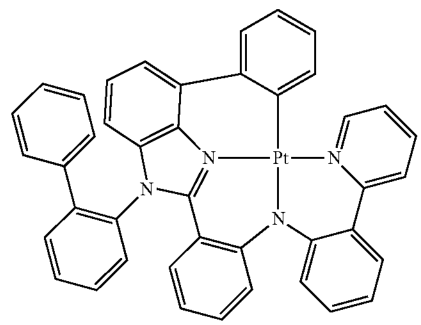
64
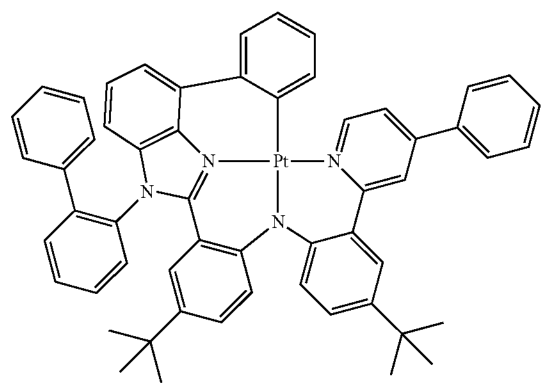
65
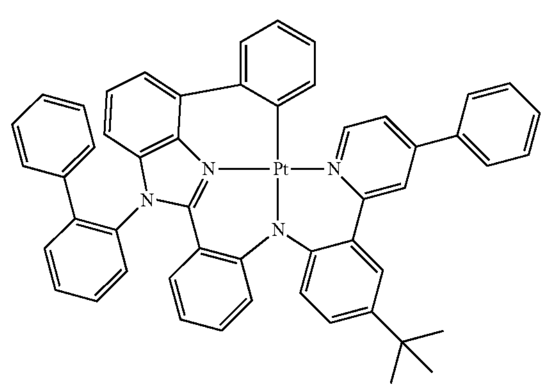

-continued
66
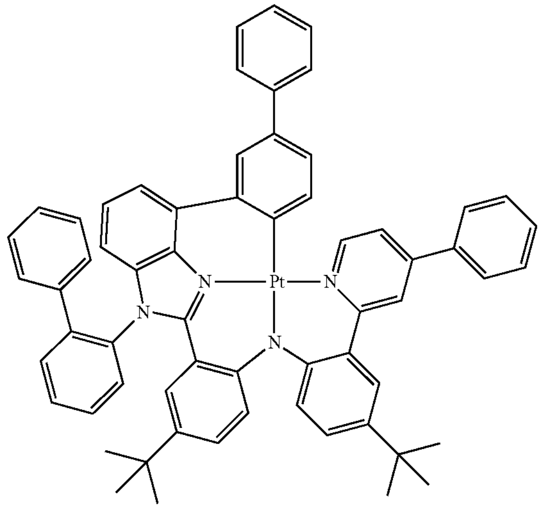
67
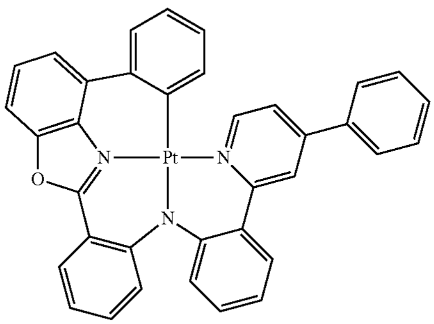
68
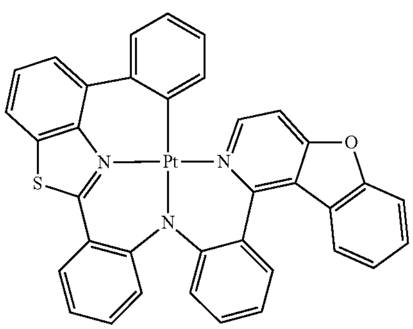
69
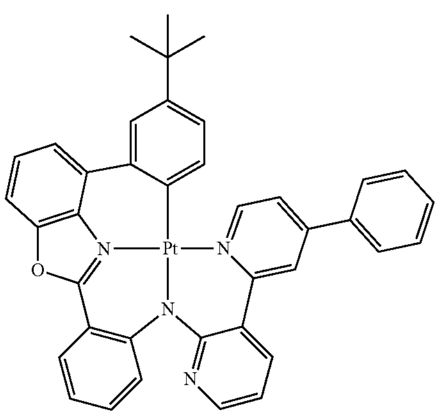
-continued
70
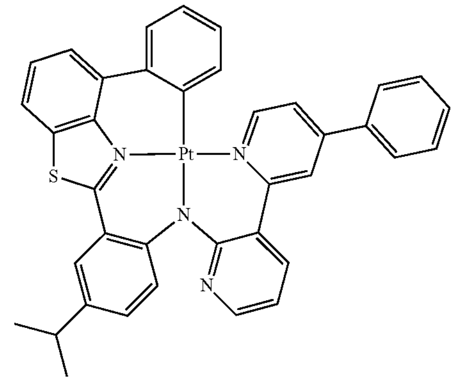
71
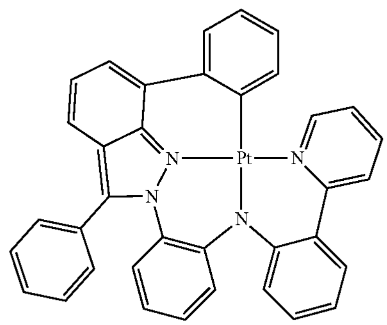
72
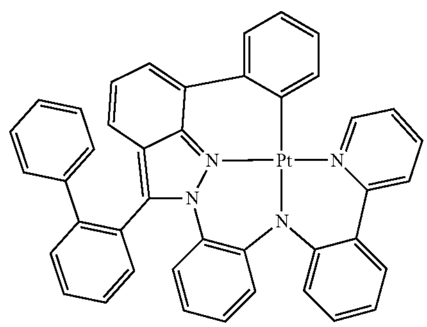
73
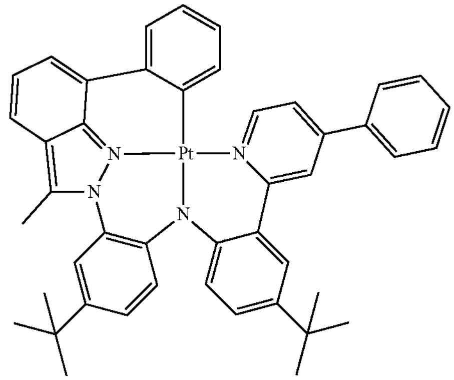

-continued

74

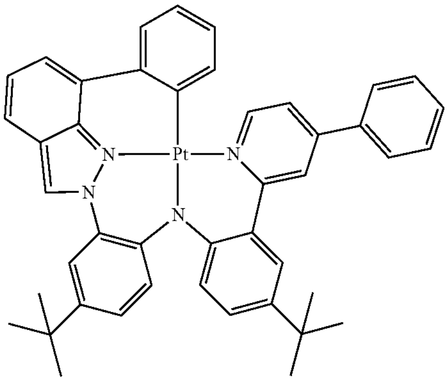

75

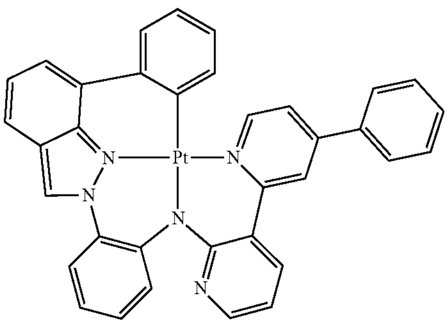

76

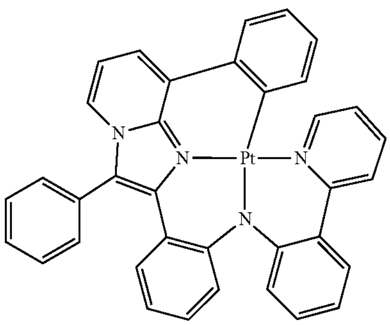

77

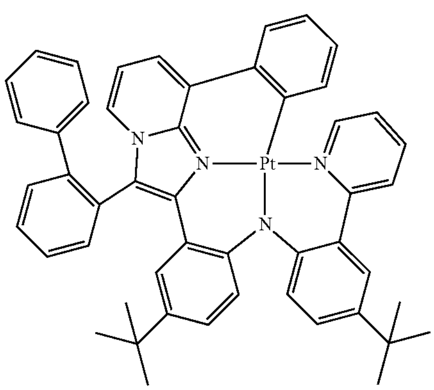

-continued

78

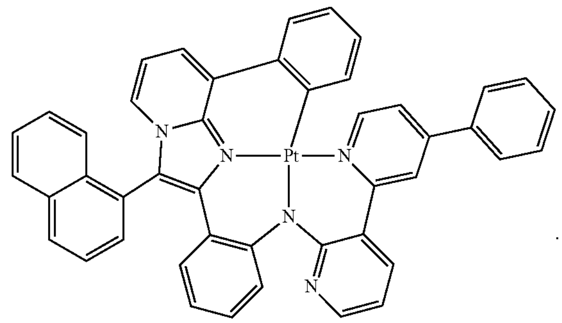

16. An organic light-emitting device comprising:

a first electrode;

a second electrode; and an organic layer disposed between the first electrode and the second electrode, wherein the organic layer comprises an emission layer and at least one of the organometallic compound of claim 1.

17. The organic light-emitting device of claim 16, wherein the first electrode is an anode, the second electrode is a cathode, and the organic layer further comprises a hole transport region disposed between the first electrode and the emission layer and an electron transport region disposed between the emission layer and the second electrode, wherein the hole transport region comprises a hole injection layer, a hole transport layer, an electron blocking layer, or any combination thereof, and wherein the electron transport region comprises a hole blocking layer, an electron transport layer, an electron injection layer, or any combination thereof.

18. The organic light-emitting device of claim 16, wherein the emission layer comprises the organometallic compound.

19. The organic light-emitting device of claim 18, wherein the emission layer further comprises a host, and wherein an amount of the host is larger than an amount of the organometallic compound.

20. A diagnostic composition comprising at least one organometallic compound of claim 1.

* * * * *